(12) United States Patent
Huitema et al.

(10) Patent No.: US 10,834,822 B2
(45) Date of Patent: Nov. 10, 2020

(54) SUPPORT STRUCTURES FOR A FLEXIBLE ELECTRONIC COMPONENT

(71) Applicant: FLEXTERRA, INC., Skokie, IL (US)

(72) Inventors: Hjalmar Edzer Ayco Huitema, Belmont, CA (US); Philippe Inagaki, Skokie, IL (US); Kwok Wah Mok, Valkenswaard (NL); Johannes Cornelis Adriaan Hamers, Breugel (NL)

(73) Assignee: FLEXTERRA, INC., Skokie, IL (US)

( * ) Notice: Subject to any disclaimer, the term of this patent is extended or adjusted under 35 U.S.C. 154(b) by 0 days.

(21) Appl. No.: 15/794,242

(22) Filed: Oct. 26, 2017

(65) Prior Publication Data

US 2018/0054897 A1 Feb. 22, 2018

Related U.S. Application Data

(60) Division of application No. 14/847,693, filed on Sep. 8, 2015, now Pat. No. 9,848,494, which is a continuation of application No. PCT/US2014/072313, filed on Dec. 24, 2014.

(60) Provisional application No. 62/003,549, filed on May 28, 2014, provisional application No. 61/979,668, filed on Apr. 15, 2014, provisional application No.
(Continued)

(51) Int. Cl.
| | |
|---|---|
| *G06F 1/16* | (2006.01) |
| *H05K 1/18* | (2006.01) |
| *G09F 9/30* | (2006.01) |
| *G09F 21/02* | (2006.01) |

(Continued)

(52) U.S. Cl.
CPC ............ *H05K 1/189* (2013.01); *G06F 1/163* (2013.01); *G06F 1/1652* (2013.01); *G09F 9/301* (2013.01); *G09F 21/02* (2013.01); *H05K 1/0281* (2013.01); *H05K 1/183* (2013.01); *H05K 5/0017* (2013.01); *H05K 5/0086* (2013.01); *H05K 2201/051* (2013.01)

(58) Field of Classification Search
CPC ........................................................ G06F 1/16
See application file for complete search history.

(56) References Cited

U.S. PATENT DOCUMENTS

| | | |
|---|---|---|
| 4,834,376 A | 5/1989 | Steinberg |
| 5,065,376 A | 11/1991 | Choulat |

(Continued)

FOREIGN PATENT DOCUMENTS

| | | |
|---|---|---|
| CN | 1306636 A | 8/2001 |
| CN | 101180669 A | 5/2008 |

(Continued)

OTHER PUBLICATIONS

Extended European Search Report for Application No. 14875486.4, dated Sep. 19, 2017.
(Continued)

*Primary Examiner* — Jerry Wu
(74) *Attorney, Agent, or Firm* — Marshall, Gerstein & Borun LLP

(57) ABSTRACT

A dynamically flexible article or device, such as a wristband, an armband, a rollable e-reader, or a belt, includes a flexible electronic component (e.g., a flexible display) and a support structure coupled to the flexible electronic component. The support structure is configured to limit bending of the flexible electronic component to a range within a bending tolerance of the flexible electronic component.

18 Claims, 65 Drawing Sheets

Related U.S. Application Data

61/969,531, filed on Mar. 24, 2014, provisional application No. 61/920,705, filed on Dec. 24, 2013.

(51) Int. Cl.
  *H05K 1/02* (2006.01)
  *H05K 5/00* (2006.01)

(56) References Cited

U.S. PATENT DOCUMENTS

| | | |
|---|---|---|
| 5,162,696 A | 11/1992 | Goodrich |
| 5,438,488 A | 8/1995 | Dion |
| 5,438,851 A | 8/1995 | Geissbuhler |
| 5,644,858 A | 7/1997 | Bemis |
| 5,707,745 A | 1/1998 | Forrest et al. |
| 5,844,363 A | 12/1998 | Gu et al. |
| 5,889,737 A | 3/1999 | Alameh et al. |
| 5,930,026 A | 7/1999 | Jacobson et al. |
| 5,930,921 A | 8/1999 | Sorofman et al. |
| 5,931,764 A | 8/1999 | Freeman et al. |
| 6,011,309 A | 1/2000 | Ahn |
| 6,097,147 A | 8/2000 | Baldo et al. |
| 6,134,965 A | 10/2000 | Somville |
| 6,196,932 B1 | 3/2001 | Marsh et al. |
| 6,212,133 B1 | 4/2001 | McCoy et al. |
| 6,303,238 B1 | 10/2001 | Thompson et al. |
| 6,369,865 B2 | 4/2002 | Hinata |
| 6,503,188 B1 | 1/2003 | August |
| 6,577,496 B1 | 6/2003 | Gioscia et al. |
| 6,585,914 B2 | 7/2003 | Marks et al. |
| 6,608,323 B2 | 8/2003 | Marks et al. |
| 6,619,835 B2 | 9/2003 | Kita |
| 6,750,607 B2 | 6/2004 | Huitema et al. |
| 6,831,769 B2 | 12/2004 | Holman et al. |
| 6,837,590 B2 | 1/2005 | Marston |
| 6,839,158 B2 | 1/2005 | Albert et al. |
| 6,991,749 B2 | 1/2006 | Marks et al. |
| 7,170,670 B2 | 1/2007 | Webber |
| 7,180,665 B2 | 2/2007 | Daniel et al. |
| 7,209,114 B2 | 4/2007 | Radley-Smith |
| 7,278,093 B2 | 10/2007 | Jablonski et al. |
| 7,374,702 B2 | 5/2008 | Marks et al. |
| 7,384,814 B2 | 6/2008 | Huitema et al. |
| 7,446,945 B2 | 11/2008 | Kuiper et al. |
| 7,453,452 B2 | 11/2008 | Huitema et al. |
| 7,528,176 B2 | 5/2009 | Marks et al. |
| 7,564,436 B2 | 7/2009 | Huitema et al. |
| 7,569,693 B2 | 8/2009 | Marks et al. |
| 7,605,225 B2 | 10/2009 | Marks et al. |
| 7,618,260 B2 | 11/2009 | Daniel et al. |
| 7,667,962 B2 | 2/2010 | Mullen |
| 7,671,202 B2 | 3/2010 | Marks et al. |
| 7,710,370 B2 | 5/2010 | Slikkerveer et al. |
| 7,714,801 B2 | 5/2010 | Kimmel |
| 7,755,605 B2 | 7/2010 | Daniel et al. |
| 7,786,951 B2 | 8/2010 | Huitema et al. |
| 7,787,097 B2 | 8/2010 | Satoh |
| 7,787,917 B2 | 8/2010 | Aoki et al. |
| 7,816,480 B2 | 10/2010 | Marks et al. |
| 7,842,198 B2 | 11/2010 | Marks et al. |
| 7,892,454 B2 | 2/2011 | Facchetti et al. |
| 7,893,265 B2 | 2/2011 | Facchetti et al. |
| 7,902,363 B2 | 3/2011 | Facchetti et al. |
| 7,947,837 B2 | 5/2011 | Marks et al. |
| 7,956,820 B2 | 6/2011 | Huitema et al. |
| 7,965,258 B2 | 6/2011 | Aoki |
| 7,982,039 B2 | 7/2011 | Marks et al. |
| 8,017,458 B2 | 9/2011 | Marks et al. |
| 8,022,214 B2 | 9/2011 | Facchetti et al. |
| 8,077,283 B2 | 12/2011 | Van Veenendaal et al. |
| 8,097,877 B2 | 1/2012 | Marks et al. |
| 8,111,465 B2 | 2/2012 | Heikenfeld et al. |
| 8,117,903 B2 | 2/2012 | Golden et al. |
| 8,125,434 B2 | 2/2012 | Huitema et al. |
| 8,151,501 B2 | 4/2012 | Bemelmans et al. |
| 8,196,267 B2 * | 6/2012 | Nalley .................. A44C 5/24 24/265 WS |
| 8,199,471 B2 | 6/2012 | Bemelmans et al. |
| 8,237,909 B2 | 8/2012 | Ostreko et al. |
| 8,279,166 B2 | 10/2012 | Huitema et al. |
| 8,325,143 B2 | 12/2012 | Destura et al. |
| 8,329,855 B2 | 12/2012 | Usta et al. |
| 8,334,545 B2 | 12/2012 | Levermore et al. |
| 8,358,275 B2 | 1/2013 | Huitema |
| 8,380,327 B2 | 2/2013 | Park |
| 8,395,150 B2 | 3/2013 | Marks et al. |
| 8,404,844 B2 | 3/2013 | Kastler et al. |
| 8,414,411 B2 | 4/2013 | Stites et al. |
| 8,440,828 B2 | 5/2013 | Quinn et al. |
| 8,446,549 B2 | 5/2013 | Huitema et al. |
| 8,466,851 B2 | 6/2013 | Huitema et al. |
| D686,217 S | 7/2013 | Andre |
| 8,474,146 B2 | 7/2013 | Hartford et al. |
| 8,477,250 B2 | 7/2013 | Schellingerhout et al. |
| 8,482,909 B2 | 7/2013 | Douglas |
| 8,493,714 B2 | 7/2013 | Visser et al. |
| 8,502,788 B2 | 8/2013 | Cho |
| 8,508,468 B2 | 8/2013 | Huitema |
| 8,508,920 B2 | 8/2013 | Huitema et al. |
| 8,514,213 B2 | 8/2013 | van Veenendaal et al. |
| 8,536,579 B2 | 9/2013 | Sele et al. |
| 8,537,104 B2 | 9/2013 | Markvoort et al. |
| 8,547,293 B2 | 10/2013 | Van Lieshout et al. |
| 8,547,325 B2 | 10/2013 | Huitema |
| 8,618,448 B2 | 12/2013 | Alexander |
| 9,030,419 B1 | 5/2015 | Freed |
| 9,176,530 B2 | 11/2015 | Rothkopf et al. |
| 9,223,494 B1 | 12/2015 | DeSalvo et al. |
| 9,510,470 B2 | 11/2016 | Huitema et al. |
| 9,560,751 B2 | 1/2017 | Huitema et al. |
| 9,629,120 B2 | 4/2017 | Ryu et al. |
| 9,642,241 B2 | 5/2017 | Huitema et al. |
| 2001/0004808 A1 | 6/2001 | Hurwitz |
| 2002/0019296 A1 | 2/2002 | Freeman et al. |
| 2002/0027634 A1 | 3/2002 | Kang et al. |
| 2002/0070926 A1 | 6/2002 | Kavanagh |
| 2003/0030595 A1 * | 2/2003 | Radley-Smith ...... A44C 5/0007 345/1.3 |
| 2003/0046849 A1 | 3/2003 | Lin |
| 2003/0182924 A1 | 10/2003 | Tsutsumi et al. |
| 2003/0197597 A1 | 10/2003 | Bahl et al. |
| 2004/0052044 A1 | 3/2004 | Mochizuki et al. |
| 2004/0189605 A1 | 9/2004 | Shih |
| 2004/0212968 A1 | 10/2004 | Lin |
| 2004/0266496 A1 | 12/2004 | Kauhaniemi et al. |
| 2005/0110785 A1 | 5/2005 | Ochiai et al. |
| 2006/0020469 A1 | 1/2006 | Rast |
| 2006/0055691 A1 | 3/2006 | Bursett |
| 2006/0077127 A1 | 4/2006 | Sampsell et al. |
| 2006/0096392 A1 | 5/2006 | Inkster et al. |
| 2006/0132025 A1 | 6/2006 | Gao et al. |
| 2006/0202618 A1 | 9/2006 | Ishii et al. |
| 2006/0204675 A1 | 9/2006 | Gao et al. |
| 2006/0209218 A1 | 9/2006 | Lee et al. |
| 2006/0238494 A1 | 10/2006 | Narayanaswami et al. |
| 2006/0262098 A1 | 11/2006 | Okamoto |
| 2006/0273304 A1 | 12/2006 | Cok |
| 2007/0090420 A1 | 4/2007 | Chu et al. |
| 2007/0117600 A1 | 5/2007 | Robertson et al. |
| 2007/0120813 A1 | 5/2007 | Huitema et al. |
| 2007/0195067 A1 | 8/2007 | Zotov et al. |
| 2007/0205997 A1 | 9/2007 | Lieshout et al. |
| 2007/0228952 A1 | 10/2007 | Kwon et al. |
| 2007/0279852 A1 | 12/2007 | Daniel et al. |
| 2008/0018631 A1 | 1/2008 | Hioki et al. |
| 2008/0037374 A1 | 2/2008 | Chu et al. |
| 2008/0094314 A1 | 4/2008 | Huitema et al. |
| 2008/0094322 A1 | 4/2008 | Sarma et al. |
| 2008/0100636 A1 | 5/2008 | Lai et al. |
| 2008/0150928 A1 | 6/2008 | Van Der Hoef et al. |
| 2008/0198184 A1 | 8/2008 | Schellingerhout et al. |
| 2008/0204367 A1 | 8/2008 | Lafarre et al. |
| 2008/0212271 A1 | 9/2008 | Misawa |
| 2008/0218369 A1 | 9/2008 | Krans et al. |

(56) References Cited

U.S. PATENT DOCUMENTS

| | | |
|---|---|---|
| 2008/0223708 A1* | 9/2008 | Joo .................. G06F 1/165 200/600 |
| 2008/0223746 A1 | 9/2008 | Van Rens et al. |
| 2008/0248838 A1 | 10/2008 | Chiang |
| 2008/0278472 A1 | 11/2008 | Huitema et al. |
| 2008/0291225 A1 | 11/2008 | Arneson |
| 2008/0316580 A1 | 12/2008 | Gillies et al. |
| 2009/0067123 A1 | 3/2009 | Huitema et al. |
| 2009/0122007 A1 | 5/2009 | Tsuzaki et al. |
| 2009/0189878 A1 | 7/2009 | Goertz et al. |
| 2009/0197749 A1 | 8/2009 | Merkel et al. |
| 2009/0219225 A1 | 9/2009 | Cope |
| 2009/0251888 A1 | 10/2009 | Douglas |
| 2009/0267969 A1 | 10/2009 | Sakamoto |
| 2009/0290117 A1 | 11/2009 | Watanabe et al. |
| 2009/0296249 A1 | 12/2009 | van Lieshout et al. |
| 2010/0033435 A1 | 2/2010 | Huitema |
| 2010/0045705 A1 | 2/2010 | Vertegaal et al. |
| 2010/0050133 A1 | 2/2010 | Nishihara et al. |
| 2010/0117975 A1 | 5/2010 | Cho |
| 2010/0127965 A1 | 5/2010 | Park |
| 2010/0156868 A1 | 6/2010 | Hirayama |
| 2010/0164973 A1 | 7/2010 | Huitema et al. |
| 2010/0194785 A1 | 8/2010 | Huitema et al. |
| 2010/0231544 A1 | 9/2010 | Lu et al. |
| 2010/0238098 A1 | 9/2010 | Watanabe |
| 2010/0238612 A1 | 9/2010 | Hsiao et al. |
| 2010/0252112 A1 | 10/2010 | Watson |
| 2010/0259524 A1 | 10/2010 | Markvoort et al. |
| 2010/0283047 A1 | 11/2010 | Facchetti et al. |
| 2010/0295761 A1 | 11/2010 | van Lieshout et al. |
| 2010/0315225 A1 | 12/2010 | Teague |
| 2010/0320448 A1 | 12/2010 | Sele et al. |
| 2010/0326527 A1 | 12/2010 | Facchetti et al. |
| 2011/0003665 A1 | 1/2011 | Burton et al. |
| 2011/0043976 A1 | 2/2011 | Visser et al. |
| 2011/0048619 A1 | 3/2011 | Meinders et al. |
| 2011/0090155 A1 | 4/2011 | Caskey et al. |
| 2011/0109654 A1 | 5/2011 | Van Veenendaal et al. |
| 2011/0120558 A1 | 5/2011 | Facchetti et al. |
| 2011/0122593 A1 | 5/2011 | van Lieshout et al. |
| 2011/0124375 A1 | 5/2011 | Stuivenwold |
| 2011/0128260 A1 | 6/2011 | Huitema et al. |
| 2011/0128266 A1 | 6/2011 | Chiu et al. |
| 2011/0136333 A1 | 6/2011 | Facchetti et al. |
| 2011/0148797 A1 | 6/2011 | Huitema et al. |
| 2011/0157046 A1 | 6/2011 | Lee et al. |
| 2011/0185612 A1 | 8/2011 | Waggoner |
| 2011/0187681 A1 | 8/2011 | Kim et al. |
| 2011/0227080 A1 | 9/2011 | Roh et al. |
| 2011/0227855 A1 | 9/2011 | Kim et al. |
| 2011/0256649 A1 | 10/2011 | Huitema et al. |
| 2011/0279418 A1 | 11/2011 | Han et al. |
| 2011/0279442 A1 | 11/2011 | Hage et al. |
| 2011/0310035 A1 | 12/2011 | Kim et al. |
| 2012/0007796 A1 | 1/2012 | Jokinen et al. |
| 2012/0038861 A1 | 2/2012 | van Lieshout et al. |
| 2012/0080462 A1 | 4/2012 | Hajarian |
| 2012/0083705 A1 | 4/2012 | Yuen et al. |
| 2012/0086691 A1 | 4/2012 | van Lieshout et al. |
| 2012/0105333 A1 | 5/2012 | Maschmeyer et al. |
| 2012/0122519 A1 | 5/2012 | Jochheim |
| 2012/0162088 A1 | 6/2012 | van Lieshout et al. |
| 2012/0162876 A1 | 6/2012 | Kim |
| 2012/0182282 A1 | 7/2012 | van Veenendaal et al. |
| 2012/0182755 A1 | 7/2012 | Wildner |
| 2012/0188750 A1 | 7/2012 | Marston |
| 2012/0194448 A1 | 8/2012 | Rothkopf |
| 2012/0194478 A1 | 8/2012 | Liu et al. |
| 2012/0212433 A1 | 8/2012 | Lee et al. |
| 2012/0223314 A1 | 9/2012 | Marks et al. |
| 2012/0242599 A1 | 9/2012 | Seo et al. |
| 2012/0264489 A1 | 10/2012 | Choi et al. |
| 2012/0283799 A1 | 11/2012 | Fan |
| 2012/0314546 A1 | 12/2012 | Brewer et al. |
| 2012/0327048 A1 | 12/2012 | Ramrattan et al. |
| 2013/0005404 A1 | 1/2013 | Bremer |
| 2013/0010405 A1 | 1/2013 | Rothkopf et al. |
| 2013/0025647 A1 | 1/2013 | Bouten et al. |
| 2013/0027853 A1 | 1/2013 | Chen et al. |
| 2013/0038622 A1 | 2/2013 | Yang |
| 2013/0044215 A1 | 2/2013 | Rothkopf et al. |
| 2013/0054997 A1 | 2/2013 | Wyatt et al. |
| 2013/0058063 A1 | 3/2013 | O'Brien |
| 2013/0062598 A1 | 3/2013 | Usta et al. |
| 2013/0070431 A1 | 3/2013 | Fukuma et al. |
| 2013/0076612 A1 | 3/2013 | Myers |
| 2013/0076649 A1 | 3/2013 | Myers et al. |
| 2013/0083496 A1 | 4/2013 | Franklin et al. |
| 2013/0106603 A1 | 5/2013 | Weast et al. |
| 2013/0113761 A1 | 5/2013 | van Lieshout et al. |
| 2013/0120106 A1 | 5/2013 | Cauwels et al. |
| 2013/0127690 A1 | 5/2013 | Tsai |
| 2013/0127748 A1 | 5/2013 | Vertegaal et al. |
| 2013/0127765 A1 | 5/2013 | Behdasht et al. |
| 2013/0128439 A1 | 5/2013 | Walters et al. |
| 2013/0131887 A1 | 5/2013 | Park |
| 2013/0141405 A1 | 6/2013 | Huitema et al. |
| 2013/0145522 A1 | 6/2013 | da Silva |
| 2013/0145795 A1 | 6/2013 | Asami |
| 2013/0154826 A1 | 6/2013 | Ratajczyk |
| 2013/0172068 A1 | 7/2013 | Zhou et al. |
| 2013/0182382 A1 | 7/2013 | Vardi et al. |
| 2013/0191741 A1 | 7/2013 | Dickinson et al. |
| 2013/0197680 A1 | 8/2013 | Cobbett et al. |
| 2013/0219332 A1 | 8/2013 | Woley et al. |
| 2013/0222208 A1 | 8/2013 | Gorilovsky et al. |
| 2013/0222270 A1 | 8/2013 | Winkler et al. |
| 2013/0222271 A1 | 8/2013 | Alberth et al. |
| 2013/0229373 A1 | 9/2013 | Eriksson et al. |
| 2013/0235008 A1 | 9/2013 | Kwon |
| 2013/0265257 A1 | 10/2013 | Jung et al. |
| 2013/0286466 A1 | 10/2013 | Lieshout et al. |
| 2013/0300779 A1 | 11/2013 | Van Baarsen et al. |
| 2013/0326790 A1 | 12/2013 | Cauwels et al. |
| 2013/0335929 A1 | 12/2013 | Cavallaro |
| 2014/0042406 A1 | 2/2014 | Degner et al. |
| 2014/0049487 A1 | 2/2014 | Konertz et al. |
| 2014/0062892 A1 | 3/2014 | Dickinson et al. |
| 2014/0123015 A1 | 5/2014 | Sako et al. |
| 2014/0123436 A1 | 5/2014 | Griffin et al. |
| 2014/0138637 A1 | 5/2014 | Yang et al. |
| 2014/0226275 A1 | 8/2014 | Ko et al. |
| 2014/0257050 A1 | 9/2014 | Kuroda et al. |
| 2015/0020081 A1 | 1/2015 | Cho et al. |
| 2015/0084892 A1 | 3/2015 | Shirota et al. |
| 2015/0089974 A1 | 4/2015 | Seo et al. |
| 2015/0124566 A1 | 5/2015 | Lake et al. |
| 2015/0131222 A1 | 5/2015 | Kauhaniemi et al. |
| 2015/0162751 A1 | 6/2015 | Leabman et al. |
| 2015/0169011 A1 | 6/2015 | Bibl et al. |
| 2015/0185766 A1 | 7/2015 | Otsuka et al. |
| 2015/0185944 A1 | 7/2015 | Magi et al. |
| 2015/0227245 A1 | 8/2015 | Inagaki et al. |
| 2015/0333572 A1 | 11/2015 | Leabman |
| 2015/0334069 A1 | 11/2015 | Winston et al. |
| 2015/0378391 A1 | 12/2015 | Huitema et al. |
| 2015/0381793 A1 | 12/2015 | Cerda et al. |
| 2016/0014919 A1 | 1/2016 | Huitema et al. |
| 2016/0019703 A1 | 1/2016 | Tian |
| 2016/0034742 A1 | 2/2016 | Kim et al. |
| 2016/0037625 A1 | 2/2016 | Huitema et al. |
| 2016/0041581 A1 | 2/2016 | Piccionelli et al. |
| 2016/0041680 A1 | 2/2016 | Chi et al. |
| 2016/0062410 A1 | 3/2016 | Ko et al. |
| 2016/0142863 A1 | 5/2016 | Lam |
| 2016/0212837 A1 | 7/2016 | Kim |
| 2016/0277891 A1 | 9/2016 | Dvortsov et al. |
| 2016/0283086 A1 | 9/2016 | Inagaki et al. |
| 2016/0299570 A1 | 10/2016 | Davydov |
| 2016/0322745 A1 | 11/2016 | Shedletsky et al. |
| 2016/0360618 A1 | 12/2016 | Elsherbini et al. |
| 2016/0379205 A1 | 12/2016 | Margadoudakis |
| 2017/0046931 A1 | 2/2017 | Hartweg et al. |

(56) References Cited

U.S. PATENT DOCUMENTS

| | | |
|---|---|---|
| 2017/0052749 A1 | 2/2017 | Lee |
| 2017/0235341 A1 | 8/2017 | Huitema et al. |
| 2017/0236497 A1 | 8/2017 | Huitema et al. |

FOREIGN PATENT DOCUMENTS

| | | |
|---|---|---|
| CN | 101180864 A | 5/2008 |
| CN | 101796563 A | 8/2010 |
| CN | 102486906 A | 6/2012 |
| CN | 103021277 A | 4/2013 |
| DE | 202006012076 U1 | 10/2006 |
| EP | 1599110 A1 | 11/2005 |
| EP | 2551110 A1 | 1/2013 |
| FR | 2284149 A1 | 4/1976 |
| JP | 2002-278466 A | 9/2002 |
| JP | 2003-299238 A | 10/2003 |
| JP | 2008-026710 A | 2/2008 |
| JP | 2009-110780 A | 5/2009 |
| JP | 2009-170173 A | 7/2009 |
| JP | 2010-072380 A | 4/2010 |
| JP | 2010-159803 A | 7/2010 |
| JP | 2010-204377 A | 9/2010 |
| JP | 2013044293 A | 3/2013 |
| JP | 2013044294 A | 3/2013 |
| JP | 2013068292 A | 4/2013 |
| JP | 60-89448 B2 | 3/2017 |
| KR | 2011-0008118 U | 8/2011 |
| KR | 1256109 | 4/2013 |
| KR | 1278604 | 6/2013 |
| KR | 1301561 | 9/2013 |
| KR | 20150035232 A | 4/2015 |
| TW | 504127 U | 9/2002 |
| TW | M258364 U | 3/2005 |
| TW | M265636 U | 5/2005 |
| TW | 200815886 A | 4/2008 |
| TW | 201035934 A | 10/2010 |
| TW | 201301002 A | 1/2013 |
| TW | I383343 B | 1/2013 |
| WO | WO-00/25193 A2 | 5/2000 |
| WO | WO-01/64070 A1 | 9/2001 |
| WO | WO-2004/047059 A1 | 6/2004 |
| WO | WO-2006/027727 A1 | 3/2006 |
| WO | WO-2006/085271 A2 | 8/2006 |
| WO | WO-2006/090434 A1 | 8/2006 |
| WO | WO-2007/023406 A2 | 3/2007 |
| WO | WO-2007/042987 A1 | 4/2007 |
| WO | WO-2008/054206 A2 | 5/2008 |
| WO | WO-2012/156804 A1 | 11/2012 |
| WO | WO-2012/167204 A2 | 12/2012 |
| WO | WO-2013/138003 A1 | 9/2013 |
| WO | WO-2015/023804 A1 | 2/2015 |

OTHER PUBLICATIONS

Extended European Search Report for Application No. 14875752.9, dated Aug. 1, 2017.
Office Action for U.S. Appl. No. 15/054,725, dated Aug. 23, 2017.
Office Action for Taiwanese Application No. 103129521, dated Apr. 9, 2018.
First Office Action received in corresponding Chinese Application No. 2014/180076308.2 dated Jun. 29, 2018.
First Office Action received in corresponding Chinese Application No. 2014/80076314.8 dated Jun. 28, 2018.
"3M Flexible Transparent Touchscreen Concepts" video located on the Internet at <http://www.youtube.com/watch?v=kCZz4jFok_o> (uploaded Jan. 6, 2011).
"Amazin Concept Holo Computer Elodie Delassus", Art, Concepts, Design, Gadgets, downloaded from the Internet at: <http://designskings.com/amazin-concept-holo-computer-elodie-delassus/> (Jan. 18, 2012).
"Athletics and their supporters", Enlightened®: Illuminated Clothing by Janet Hansen, downloaded from the Internet at <http://enlighted.com/pages/athletics.shtml> (Aug. 8, 2013).
"E-Clock", Tokyoflash Japn Product Design Studio, downloaded from the Internet at <http://blog.tokyoflash.com/2010/03/e-clock/> (Mar. 10, 2010).
"Features", SEG Sports Entertainment Gear, downloaded from the Internet at <http://www.segshirts.com/features> (Aug. 8, 2013).
"Flex Mobile, a Flexible Phone That Becomes a Bracelet, Some Other Wearable Piece of Gear", Concept Phones, downloaded from the Internet at <http://www.concept-phones.com/tag/carolina-rebelo/> (Apr. 19, 2011).
"Flexible Smart Phone Fluid Presented by Philips", YouTube, downloaded from the Internet at <http://www.youtube.com/watch?v=Wq9montNgbM&feature=player_detailpage> (Apr. 2, 2012).
"IPING Putter App Cradle Attachment Case for iPhone 5", Carlsbad Golf Center, downloaded from the Internet at <https://www.cgcgolfshop.com/p-50-iping-putter-app-cradle-attachment-case-for-iphone-5.aspx> (Aug. 8, 2013).
"Moment Smartwatch: World's First Wrap Around Smart Watch," Momentum Labs LLC, 28 pp. (Jun. 24, 2014).
"OutEDGE iPhone 5 External 2800 mAH Battery Extender Case w/ Flip Screen Cover", outEDGEPOWER Products, downloaded from the Internet at <http://www.outedgepower.com/outedge-iphone-5-external-2800-mah-battery-extender-case-w-flip-screen-cover/> (Aug. 8, 2013).
"Philips unveils world's first 'Rollable Display' pocket e-Reader concept READIUS", PHYS.org website(Sep. 1, 2005).
"Rohm shows a flexible-OLED wristband", OLED-Info.com, downloaded from the Internet at <http://www.oled-info.com/rohm-shows-flexible-oled-wristband> (Oct. 5, 2009).
"Samsung concept video for wearables and phones", YouTube screenshot, downloaded from the Internet at <http://www.youtube.com/watch?v=ezriwGwJGOs> (Jul. 15, 2013).
"Samsung Galaxy X Concept Packs the Same Specs of teh Galaxy S II Plus a 12 MP Camera", Concept Phones website (May 15, 2011).
"Samsung Smart Watch Trademarks Filed, Wearable Internet Nearing Debut", Fox News Latino, downloaded from the Internet at <http://latino.foxnews.com/latino/money/2013/08/07/samsung-smart-watch-trademarks-filed-wearable-internet-nearing-debut/> (Aug. 7, 2013).
"Sony Smartwatch 2 goes official: water-resistant, open API", phoneArena.com, downloaded from the Internet at <http://www.phonearena.com/news/Sony-Smartwatch-2-goes-official-water-resistant-open-API_id44469> (Jun. 25, 2013).
"Taiwan Company to Begin Production of Large Format Flexible Electronic Paper Display Technology", Over the Wire, downloaded from the Internet at <http://www.naylornetwork.com/ppi-otw/articles/?aid=219054&issueID=29119> (Aug. 8, 2013).
"Thermal Image Athletic Apparel", Trendhunter Lifestyle, downloaded from the Internet at <http://www.trendhunter.com/trends/high-tech-athletic-apparel> (Mar. 16, 2013).
"Wearable Concept Phone is Not Nokia 888", Concept Phones, downloaded from the Internet at <http://www.concept-phones.com/tag/hyun-sung-lee/> (Jul. 18, 2008).
"What Will You Pop?", popSLATE, downloaded from the Internet at <http://www.popslate.com> (2012).
"Yuno Concept", TechPin, downloaded from the Internet at <http://www.techpin.com/yuno-concept/> (May 8, 2008).
Catacchio, "New OLED panel to bring bendable cell phones closer to reality?", TNW, downloaded from the Internet at <http://thenextweb.com/asia/2010/10/04/new-oled-panel-to-bring-bendable-cell-phones-closer-to-reality/> (Oct. 4, 2010).
Cochrane et al., "Flexible displays for smart clothing: Part I—Overview", Indian Journal of Fibre & Textile Research, 36:422-8 (Dec. 2011).
Cooper, "Hands-on with Polymer Vision's e-ink Readius", engadget, downloaded from the Internet at <http://www.engadget.com/2008/02/14/hands-on-with-polymer-visions-e-ink-readius/> (Feb. 14, 2008).
Crisp, "Rafael Nadal demonstrates Babolat Play & Connect interactive tennis racquet", gizmag, downloaded from the Internet at <http://www.gizmag.com/rafael-nadal-demonstrates-babolat-play-connect-interactive-tennis-racquet/22699/> (May 26, 2012).

(56) References Cited

OTHER PUBLICATIONS

Eaton, "Nokia Morph Cellphone Rolls Up, Stretches, Cleans Itself", Gizmodo, downloaded from the Internet at <http://gizmodo.com/360260/nokia-morph-cellphone-rolls-up-stretches-cleans-itself> (Feb. 25, 2008).
Fingas, "Tentative Samsung smartwatch design unearthed in Korean patents", engadget, downloaded from the Internet at <http://www.engadget.com/2013/08/03/tentative-samsung-smartwatch-designs-unearthed-in-korean-patents/> (Aug. 3, 2013).
Honig, "Pebble smartwatch review", engadget, downloaded from the Internet at <http://www.engadget.com/2013/01/25/pebble-smartwatch-review/> (Jan. 25, 2013).
Inofuentes, "Officially announced: LG G Flex and a healing factor", ars technica, downloaded from the Internet at <http://arstechnica.com/gadgets/2013/10/officially-announced-lg-g-flex-and-a-healing-factor/> (Oct. 28, 2013).
International Preliminary Report on Patentability, International Application No. PCT/US14/50972, dated Jan. 19, 2016.
International Preliminary Report on Patentability, International Application No. PCT/US14/52814, dated Mar. 1, 2016.
International Preliminary Report on Patentability, International Application No. PCT/US14/52957, dated Mar. 1, 2016.
International Preliminary Report on Patentability, International Application No. PCT/US14/55043, dated Mar. 15, 2016.
International Search Report and Written Opinion, International Application No. PCT/US14/50972, dated Jan. 14, 2015.
International Search Report and Written Opinion, International Application No. PCT/US14/52814, dated Dec. 11, 2014.
International Search Report and Written Opinion, International Application No. PCT/US14/52957, dated Dec. 9, 2014.
International Search Report and Written Opinion, International Application No. PCT/US14/71859, dated Mar. 20, 2015.
International Search Report and Written Opinion, International Application No. PCT/US14/72172, dated Mar. 18, 2015.
International Search Report and Written Opinion, International Application No. PCT/US2014/055043, dated Jan. 27, 2015.
International Search Report and Written Opinion, International Application No. PCT/US2014/072313, dated Apr. 22, 2015.
International Search Report and Written Opinion, International Application No. PCT/US2014/072328, dated Apr. 22, 2015.
International Search Report and Written Opinion, International Application No. PCT/US2015/014964, dated May 14, 2015.
International Search Report and Written Opinion, International Application No. PCT/US2015/022691, dated Jul. 8, 2015.
International Search Report and Written Opinion, International Application No. PCT/US2015/026163, dated Jul. 20, 2015.
International Search Report and Written Opinion, International Application No. PCT/US2015/030254, dated Aug. 10, 2015.
International Search Report and Written Opinion, International Application No. PCT/US2015/030724, dated Aug. 14, 2015.
International Search Report and Written Opinion, International Application No. PCT/US2015/032799, dated Aug. 31, 2015.
Johan, "ASUS Waveface Ultra", techfresh.net, downloaded from the Internet at <http://www.techfresh.net/asus-waveface-ultra/> (Jan. 19, 2010).
Kahn, "Is Apple's iWatch a slap wrist band with a flexible display?", 9to5Mac Apple Intelligence, downloaded from the Internet at <http://9to5mac.com/2013/02/21/is-apples-iwatch-a-slap-wrist-band-with-a-flexible-display/> (Feb. 21, 2013).
Kaki, "10 Beautiful Nokia Concept Phones for Future Generations", DreamsRain website, downloaded from the Internet at <http://www.dreamsrain.com/2011/09/18/10-beautiful-nokia-concept-phones-for-future-genrations/> (Sep. 18, 2011).
Kelvin, "Apple iBand Envisioned by T3: Health Features, Fitness and Watch Functions (Video)", Concept Phones, downloaded from the Internet at <http://www.concept-phones.com/apple/apple-iband-envisioned-t3-health-features-fitness-watch-functions-video/> (Feb. 18, 2014).
Kelvin, "Apple iWatch 2 Concept by Jermaine Smit Lets You Change the Watch Bracelet Easily (Video)", Concept Phones, downloaded from the Internet at <http://www.concept-phones.com/apple/apple-iwatch-2-concept-jermaine-smit-lets-change-watch-bracelet-easily-video/> (Mar. 5, 2014).
Kelvin, "Apple iWatch Concept Goes Back to Basics, Looks Like Nike Fuelband", Concept Phones, downloaded from the Internet at <http://www.concept-phones.com/apple/apple-iwatch-concept-basics-nike-fuelband/> (Oct. 22, 2013).
Kelvin, "Apple iWatch Glass Hologram is an Overpowered Smartwatch (Video)", Concept Phones, downloaded from the Internet at <http://www.concept-phones.com/apple/apple-iwatch-glass-hologram-overpowered-smartwatch-video/> (Apr. 19, 2014).
Kelvin, "Apple iWatch Goes Back to the Idea of an iPod Nano With a Belt", Concept Phones, downloaded from the Internet at <http://www.concept-phones.com/apple/apple-iwatch-idea-ipod-nano-belt/> (Mar. 2, 2014).
Kelvin, "Finally, a HTC Smartwatch! We Needed Those!", Concept Phones, downloaded from the Internet at <http://www.concept-phones.com/htc/finally-htc-smartwatch-needed/> (Feb. 4, 2014).
Kelvin, "Flexible Screen X Phone Becomes a Bracelet", Concept Phones, downloaded from the Internet at <http://www.concept-phones.com/cool-concepts/flexible-screen-phone-bracelet/> (Oct. 28, 2013).
Kelvin, "HTC One Watch Render Seems Taken out of Tron", Concept Phones, downloaded from the Internet at <http://www.concept-phones.com/htc/htc-watch-render-tron/> (Oct. 14, 2013).
Kelvin, "iPhone 6 and iWatch Pro Get Designed by Dani Yako", Concept Phones, downloaded from the Internet at <http://www.concept-phones.com/apple/iphone-6-iwatch-pro-designed-dani-yako/> (Jun. 6, 2014).
Kelvin, "iWatch Concept is a Curved Bracelet, Runs Flappy Bird", Concept Phones, downloaded from the Internet at <http://www.concept-phones.com/apple/iwatch-concept-curved-bracelet-runs-flappy-bird/> ( Feb. 13, 2014).
Kelvin, "iWatch Goliath is a Giant on Your Wrist (Video)", Concept Phones, downloaded from the Internet at <http://www.concept-phones.com/apple/iwatch-goliath-giant-wrist-video/> (May 23, 2014).
Kelvin, "iWatch Render Goes the Way of the Nike FuelBand", Concept Phones, downloaded from the Internet at <http://www.concept-phones.com/apple/iwatch-render-nike-fuelband/> (Jan. 21, 2014).
Kelvin, "Meizu MWatch Render is Exactly What Smartwatches Need", Concept Phones, downloaded from the Internet at <http://www.concept-phones.com/cool-concepts/meizu-mwatch-render-smartwatches/> (Feb. 12, 2014).
Kelvin, "MWC 2014: Kyocera Showcases Flexible Phone That Turns Into Bracelet", Concept Phones, downloaded from the Internet at <http://www.concept-phones.com/kyocera/mwc-2014-kyocera-showcases-flexible-phone-turns-bracelet/> (Feb. 27, 2014).
Kelvin, "New Apple iWatch Render Shows us an Ultrathin Bracelet", Concept Phones, downloaded from the Internet at <http://www.concept-phones.com/apple/apple-iwatch-render-shows-ultrathin-bracelet/> (Oct. 16, 2013).
Kelvin, "New iWatch Design Brings Us Back the Basics of a Watch", Concept Phones, downloaded from the Internet at <http://www.concept-phones.com/apple/iwatch-design-brings-basics-watch/> (Apr. 29, 2014).
Kelvin, "Nokia Lumia 101 Smartwatch is a Nice Little, Elegant Bracelet", Concept Phones, downloaded from the Internet at <http://www.concept-phones.com/nokia/nokia-lumia-101-smartwatch-nice-elegant-bracelet/> (Dec. 3, 2013).
Kelvin, "Superb Google Smartwatch Render Created in Cinema 4D", Concept Phones, downloaded from the Internet at <http://www.concept-phones.com/google/superb-google-smartwatch-render-created-cinema-4d/> (Jan. 31, 2014).
Kim,"Analysis of iWatch-related Patents from RitFast", IHS Technology, downloaded from the Internet at <http://www.displaybank.com/letter/letter_contents.php?nm=&email=prakash%40polyera.com&mail_id=8995> (Jul. 19, 2013).
Lilienthal, "Book? Accordian? Nope. Lumino is a Gorgeous LED Lamp the Goes Wherever You Do," Digital Trends, 6 pp. (Apr. 27, 2014).
Non-Final Office Action from U.S. Appl. No. 14/188,440 dated Aug. 14, 2015.

(56) References Cited

OTHER PUBLICATIONS

Rastogi, "Nokia Lumia 1080: The Concept Phone", 91 mobiles, downloaded from the Internet at <http://www.91mobiles.com/blog/nokia-lumia-1080-the-concept-phone.html> (Jun. 27, 2013).
Ridden, "Emopulse Smile SmartWatch goes up for pre-order", Gizmag, downloaded from the Internet at <http://www.gizmag.com/emopulse-smile-smartwatch/27984/> (Jun. 19, 2013).
Seth, "In 2020 We Can Wear Sony Computers on Our Wrist", Yanko Design Form Beyond Function, downloaded from the Internet at <http://www.yankodesign.com/2010/05/25/in-2020-we-can-wear-sony-computers-on-our-wrist/> (May 25, 2010).
Seth, "Love This iWatch!", Yanko Design Form Beyond Function, downloaded from the Internet at <http://www.yankodesign.com/2013/07/26/love-this-iwatch/> (Jul. 26, 2013).
Seth, "My Latest Fashion Accessory", Yanko Design Form Beyond Function, downloaded from the Internet at <http://www.yankodesign.com/2009/08/11/my-latest-fashion-accessory/> (Aug. 11, 2009).
Seth, "Super Sexy Roll", Yanko Design Form Beyond Function, downloaded from the Internet at <http://www.yankodesign.com/2011/03/21/super-sexy-roll/> (Mar. 21, 2011).
Smith, "Flexi E Ink screen finds home in curved world time watch", The Register, downloaded from the Internet at <http://www.theregister.co.uk/2010/10/11/phosphor_watches_world_time/> (Oct. 11, 2010).
Smith, "Samsung smartwatch concept shown in patent hints at flexible display use", Android Authority (Aug. 3, 2013).
Smith, "Samsung's curved smartphone is the Galaxy Round, launches in Korea tomorrow (video)", engadget, downloaded from the Internet at <http://www.engadget.com/2013/10/08/samsung-galaxy-round/> (Oct. 8, 2013).
Thrystan, "Apple iWatch 2 Design Appears, More Elegant Than Ever", Concept Phones, downloaded from the Internet at <http://www.concept-phones.com/apple/apple-iwatch-2-design-appears-elegant/> (Feb. 9, 2012).
Thrystan, "BenQ Siemens Snake Concept Phone is Yet Another Bracelet-Handset", Concept Phones, downloaded from the Internet at <http://www.concept-phones.com/benq-siemens/benq-siemens-snake-concept-phone-bracelethandset/> (Feb. 9, 2009).
Thrystan, "Bracelet Phone Concept Incorporates an MP3 Player, Shines Like a Diamond", Concept Phones, downloaded from the Internet at <http://www.concept-phones.com/fashion-phones/bracelet-phone-concept-incorporates-mp3-player-shines-diamond/> (Sep. 8, 2008).
Thrystan, "CEATEC 2010 Hosts TDK's Flexible OLED Displays; Hands-on Photos Here!", Concept Phones, downloaded from the Internet at <http://www.concept-phones.com/news/ceatec-2010-hosts-tdks-flexible-oled-displays-handson-photos/> (Oct. 5, 2010).
Thrystan, "Dyson Concept Phone Charger Turns Temperature Differences Into Electricity", Concept Phones, downloaded from the Internet at <http://www.concept-phones.com/cool-concepts/dyson-concept-phone-charger-turns-temperature-differences-electricity/> (Jul. 24, 2009).
Thrystan, "Email Beeper Watch is Hip, Restarts a Trend", Concept Phones, downloaded from the Internet <http://www.concept-phones.com/cool-concepts/email-beeper-watch-hip-restarts-trend/> (Mar. 3, 2009).
Thrystan, "Flux, Portable and Wearable PC Concept", Concept Phones, downloaded from the Internet at <http://www.concept-phones.com/eco-friendly/flux-portable-and-wearable-pc-concept/> (May 5, 2008).
Thrystan, "Fujitsu Concept Phones Part 2: Judge-Dredd-Like Curvy Handset", Concept Phones, downloaded from the Internet <http://www.concept-phones.com/fujitsu/fujitsu-concept-phones-part-2-judgedreddlike-curvy-handset/> (Oct. 10, 2009).
Thrystan, "iPhone 5 Bracelet Looks Out of this World", Concept Phones, downloaded from the Internet at <http://www.concept-phones.com/apple/iphone-5-bracelet-world/> (Jul. 6, 2012).
Thrystan, "iPhone Holographic Display Concept is Surreal, Could Work", Concept Phones, downloaded from the Internet at <http://www.concept-phones.com/apple/iphone-holographic-display-concept-surreal-work/> (Aug. 22, 2009).
Thrystan, "iWatch Design Created by James Ivaldi is All Metal", Concept Phones, downloaded from the Internet at <http://www.concept-phones.com/apple/iwatch-design-created-james-ivaldi-metal/> (Jul. 29, 2013).
Thrystan, "iWatch Render in the Vision of the Ciccarese Design Team: Simply Stunning (Video)", Concept Phones, downloaded from the Internet at <http://www.concept-phones.com/apple/iwatch-render-vision-ciccarese-design-team-simply-stunning-video/> (Aug. 21, 2013).
Thrystan, "Leaf Phone Features an Organic Structure, is Made of Eco-Friendly Plastic," Concept Phones, downloaded from the Internet at <http://www.concept-phones.com/eco-friendly/leaf-phone-features-organic-structure-ecofriendly-plastic/> (Nov. 4, 2009).
Thrystan, "LG Auki Bracelet Phone Is Colorful and Elegant", Concept Phones, downloaded from the Internet at <http://www.concept-phones.com/lg/lg-auki-bracelet-phone-colorful-elegant/> (Aug. 26, 2011).
Thrystan, "LG Helix Cellphone is Also a Slap Bracelet", Concept Phones, downloaded from the Internet at <http://www.concept-phones.com/lg/lg-helix-cellphone-slap-bracelet/> (Oct. 9, 2009).
Thrystan, "LG Oyster, a Bracelet-Like Mobile Phone Design", Concept Phones, downloaded from the Internet at <http://www.concept-phones.com/lg/lg-oyster-braceletlike-mobile-phone-design/> (Jul. 26, 2009).
Thrystan, "New iWatch Render by Tolga Tuncer is Fancy and Classy", Concept Phones, downloaded from the Internet at <http://www.concept-phones.com/apple/iwatch-render-tolga-tuncer-fancy-classy/> (Mar. 3, 2013).
Thrystan, "Nokia Mixed Reality Concept, Future Technology Demoed at Nokia World (Video)", Concept Phones, downloaded from the Internet at <http://www.concept-phones.com/nokia/nokia-mixed-reality-concept-future-technology-demoed-nokia-world-video/> (Sep. 9, 2009).
Thrystan, "Nokia Open Bracelet Shows Incoming Calls of the Ones You Love", Concept Phones, downloaded from the Internet at <http://www.concept-phones.com/nokia/nokia-open-bracelet-shows-incoming-calls-love/> (Dec. 13, 2008).
Thrystan, "Nokia Smart Watch Concept Looks Interesting", Concept Phones, downloaded from the Internet at <http://www.concept-phones.com/uncategorized/nokia-smart-watch-concept-interesting/> (Oct. 22, 2011).
Thrystan, "Purse Bracelet Fancy Concept Phone, Designed by Yw Li", Concept Phones, downloaded from the Internet at <http://www.concept-phones.com/fashion-phones/purse-bracelet-fancy-concept-phone-designed-yw-li/> (Oct. 19, 2008).
Thrystan, "Quartz Tele Concept Should be in a Final Fantasy Game, Because It's All About Crystals", Concept Phones, downloaded from the Internet at <http://www.concept-phones.com/fashion-phones/quartz-tele-concept-final-fantasy-game-crystals/> (Sep. 8, 2008).
Thrystan, "Samsung Finger Touching Cellphone Concept Comes in Handy", Concept Phones, downloaded from the Internet at <http://www.concept-phones.com/samsung/samsung-finger-touching-cellphone-concept-handy/> (Jan. 31, 2009).
Thrystan, "Samsung Futuristic Technology Relies on Health and Flexibility (Video)", Concept Phones, downloaded from the Internet at <http://www.concept-phones.com/samsung/samsung-futuristic-technology-relies-health-flexibility-video/> (Jul. 10, 2013).
Thrystan, "Samsung S-Health Bracelet Render is Based on Tizen OS", Concept Phones, downloaded from the Internet at <http://www.concept-phones.com/samsung/samsung-shealth-bracelet-render-based-tizen-os/> (Jun. 17, 2013).
Thrystan, "Sony Ericsson Bracelet Phone, a Design That Won't Make It Into Production", Concept Phones, downloaded from the Internet at <http://www.concept-phones.com/sony-ericsson/sony-ericsson-bracelet-phone-design-production/> (Jun. 19, 2009).
Thrystan, "Sony Ericsson Ring Phone Concept by Tao Ma Will Always Be a Winner", Concept Phones, downloaded from the Internet at <http://www.concept-phones.com/sony-ericsson/sony-ericsson-ring-phone-concept-tao-ma-winner/> (Sep. 15 2008).
Thrystan, "Speak to Me Concept Watch Phone is Hot, a Must-Have Fashion Accessory", Concept Phones, downloaded from the Internet at <http://www.concept-phones.com/fashion-phones/speak-concept-watch-phone-hot-musthave-fashion-accessory/> (Jan. 27, 2009).

(56) References Cited

OTHER PUBLICATIONS

Thrystan, "The Hook Bracelet Phone Concept Runs Windows Phone in a New Format", Concept Phones, downloaded from the Internet at <http://www.concept-phones.com/cool-concepts/hook-bracelet-phone-concept-runs-windows-phone-format/> (Jun. 21, 2013).
Thrystan, "The New iPod is iBangle . . . iLike iT", Concept Phones, downloaded from the Internet at <http://www.concept-phones.com/apple/ipod-ibangle-ilike/> (Oct. 23, 2008).
Thrystan, "Xbox 720 Concept is a Pyramid With Two Kinect "Eyes"", Concept Phones, downloaded from the Internet at <http://www.concept-phones.com/microsoft/xbox-720-concept-pyramid-kinect-eyes/> (Jul. 8, 2013).
Thrystan, "Yuxa is a Wearable Cellphone Made From Eco-Friendly Materials", Concept Phones, downloaded from the Internet at <http://www.concept-phones.com/eco-friendly/yuxa-wearable-cellphone-ecofriendly-materials/> (Jun. 24, 2010).
Thrystan, "ZTE Cube Phone, Another Mobile World Congress Concept", Concept Phones, downloaded from the Internet at <http://www.concept-phones.com/cool-concepts/zte-cube-phone-another-mobile-world-congress-concept/> (Feb. 14, 2008).
Vertegaal et al., "Organic User Interfaces have non-planar displays that may actively or passively change shape via analog physical inputs", Organic User Interfaces—Communications of the ACM (May 31, 2008).
Wei et al., Shape memory materials and hybrid composites for smart systems, Part II: Shape-memory hybrid composites, J. Mater. Sci., 33:3763-83 (1998).
First Chinese Office Action for Application No. 201480058291.8, dated Jul. 31, 2017.
Extended European Search Report for Application No. 14874426.1, dated Aug. 11, 2017.
International Preliminary Report on Patentability for Application No. PCT/US2016/019729, dated Sep. 8, 2017.
International Search Report and Written Opinion for Application No. PCT/US2016/019729, dated May 17, 2016.
European Office Action for Application No. 14874426.1, dated Mar. 7, 2019.
Notice of Reasons for Rejection for Japanese Application No. 2016-542913, dated Feb. 27, 2019.
Second Chinese Office Action for Application No. 201480076308.2, dated Mar. 11, 2019.
Second Chinese Office Action for Application No. 201480076314.8, dated Mar. 11, 2019.
European Office Action for Application No. 14875486.4, dated Apr. 25, 2019.
First Chinese Office Action for Application No. 201480056371.X, dated Apr. 3, 2019.
Office Action for Taiwanese Application No. 103127788, dated Mar. 7, 2019.
Office Action for Taiwanese Application No. 103145254, dated Mar. 18, 2019.
European Office Action for Application No. 14875752.9, dated Sep. 19, 2018.
First Office Action received in corresponding Chinese Application No. 2014/80076264.3 dated May 28, 2018.
Notice of Reasons for Rejection for Japanese Application No. 2016-543044, dated Oct. 30, 2018.
Office Action for Taiwanese Application No. 103145225, dated Jan. 7, 2019.
Office Action for Taiwanese Application No. 103145253, dated Aug. 2, 2018.
Second Chinese Office Action for Application No. 201480058291.8, dated Jun. 1, 2018.
Third Chinese Office Action for Application No. 201480058291.8, dated Jan. 14, 2019.
Notice of Reasons for Rejection for Japanese Application No. 2016-543044, dated May 29, 2019.
Office Action for Taiwanese Application No. 104109785, dated Jul. 12, 2019.
European Office Action for Application No. 14875486.4, dated Mar. 25, 2020.
European Office Action for Application No. 14875752.9, dated Mar. 25, 2020.
Notice of Final Rejection for Japanese Application No. 2016-542913, dated Oct. 29, 2019.
Second Chinese Office Action for Application No. 201480056371.X, dated Apr. 2, 2020.

\* cited by examiner

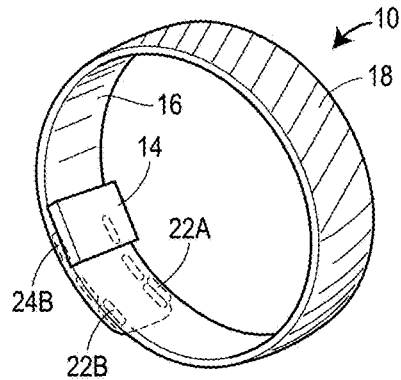
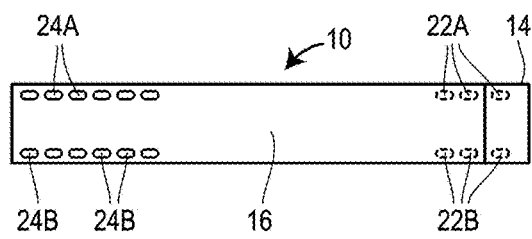
*FIG. 7A*  *FIG. 7B*
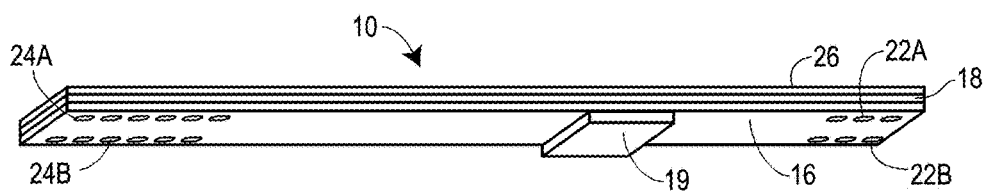
*FIG. 7C*
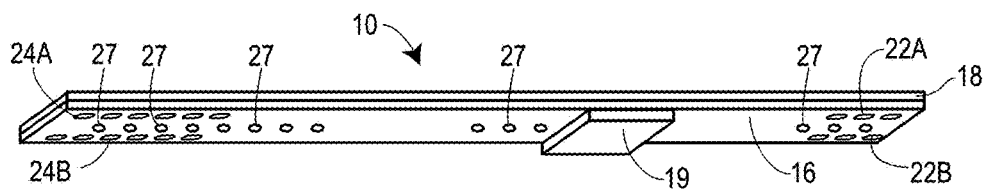
*FIG. 7D*
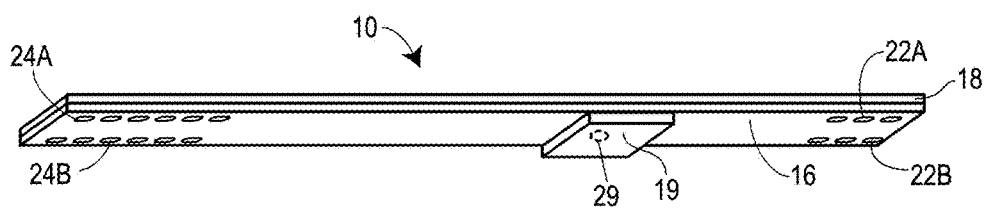
*FIG. 7E*

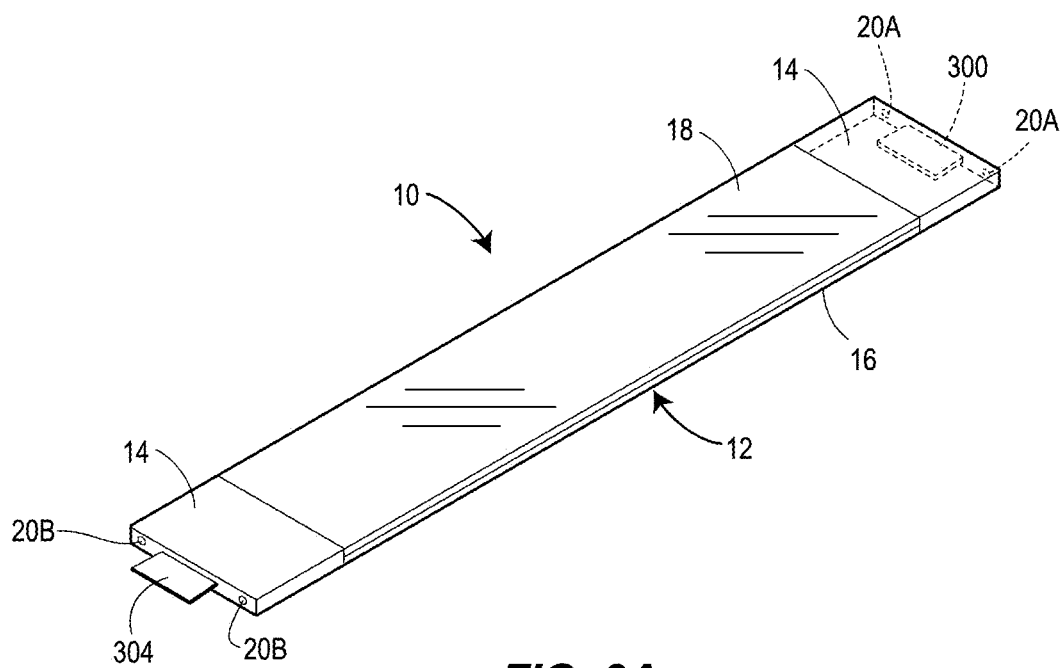
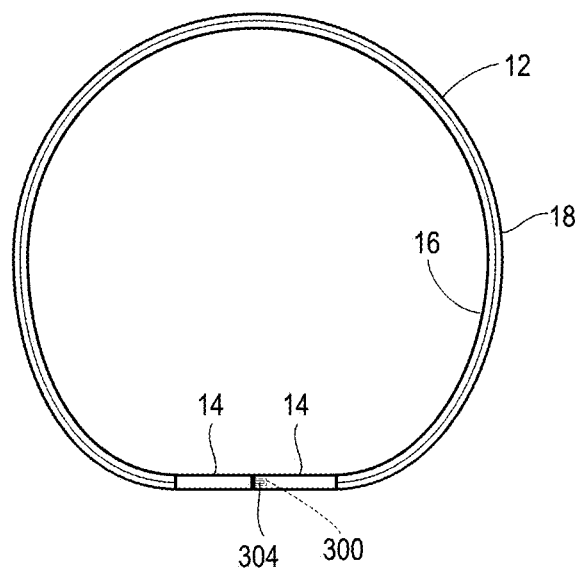
FIG. 8B

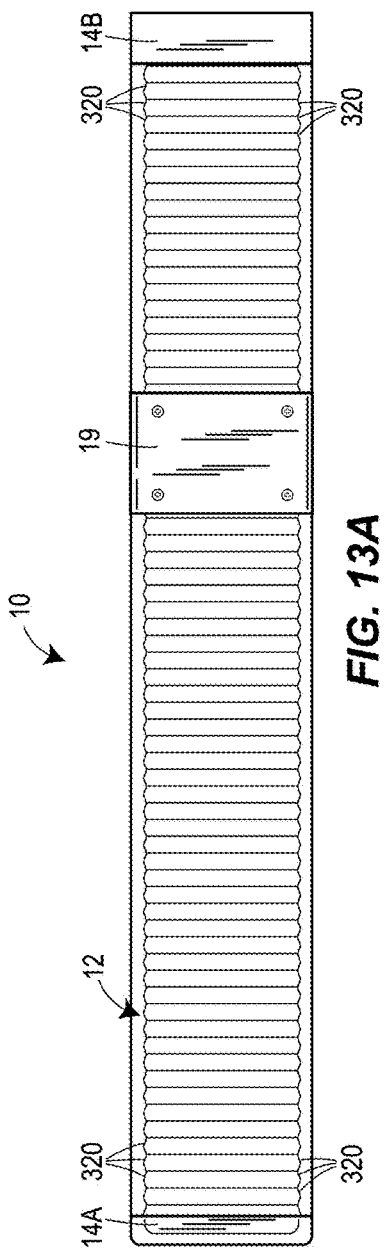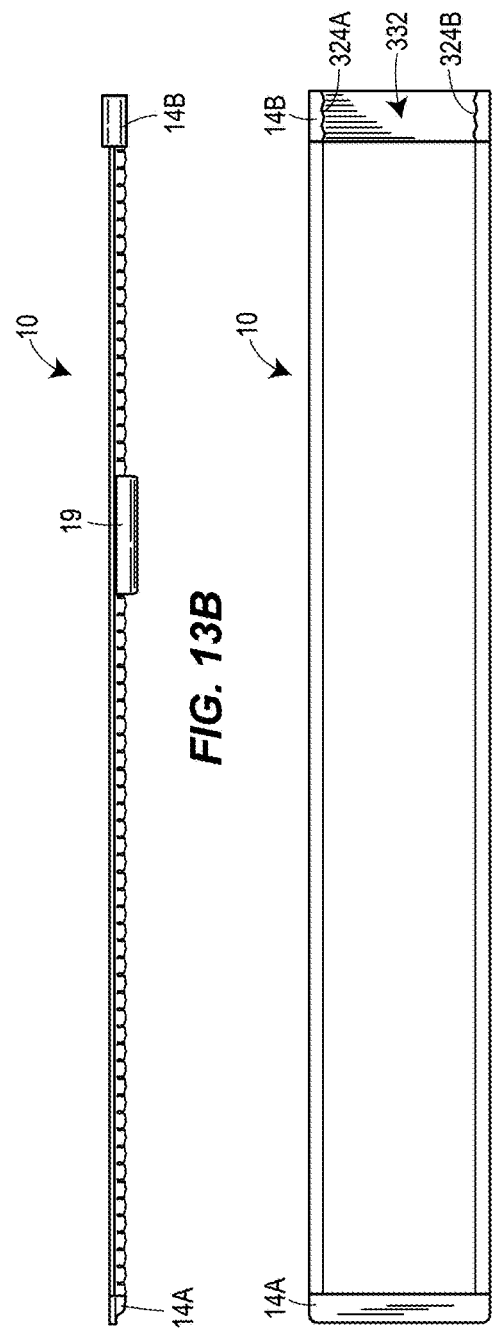
FIG. 13A  FIG. 13B  FIG. 13C

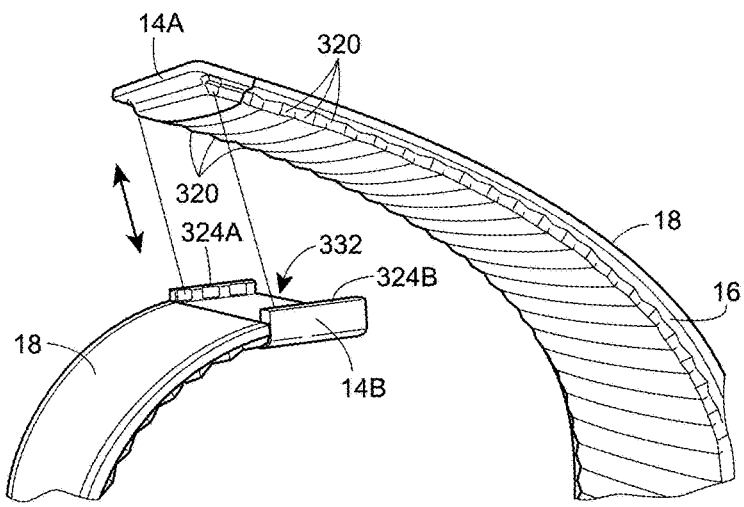
FIG. 15
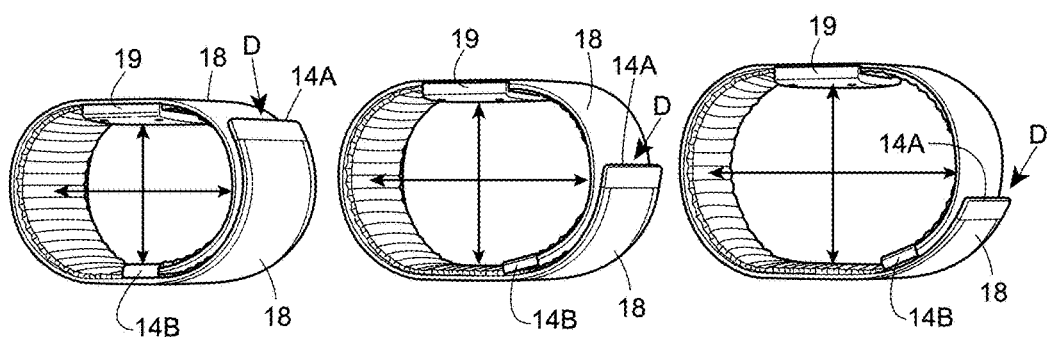
FIG. 16A  FIG. 16B  FIG. 16C

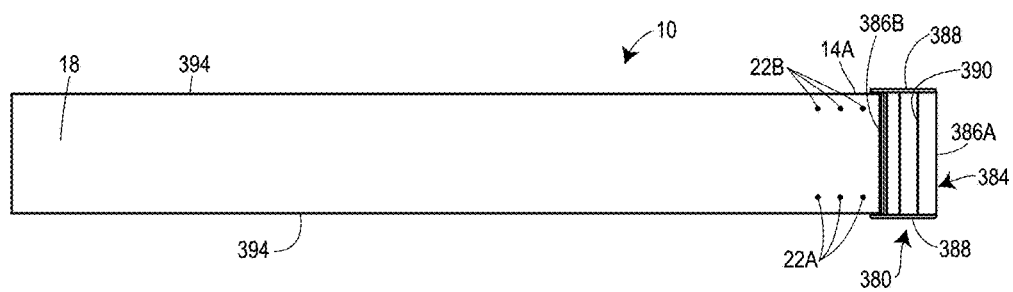
FIG. 21
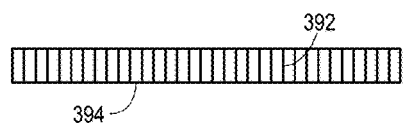
FIG. 22
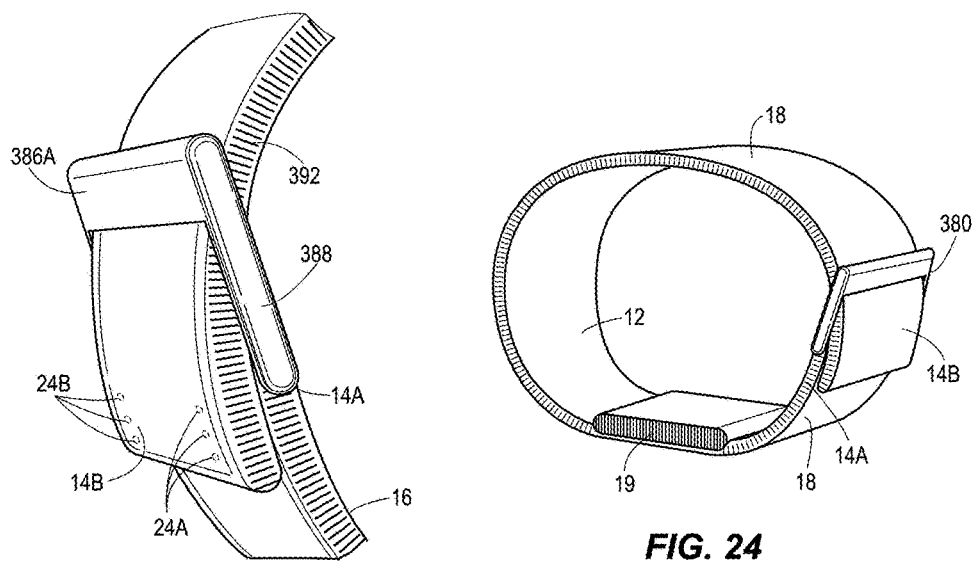
FIG. 23
FIG. 24

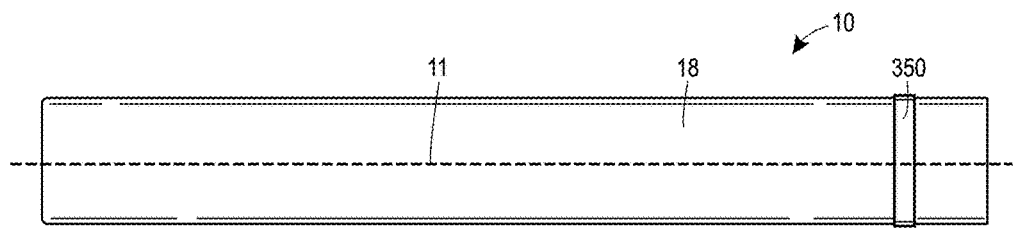
FIG. 45C
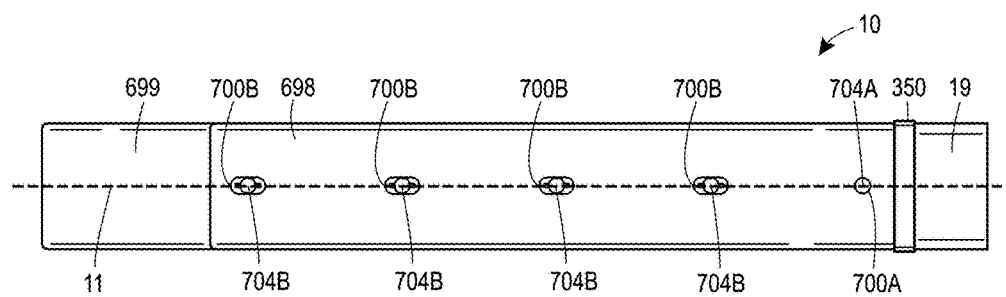
FIG. 45D
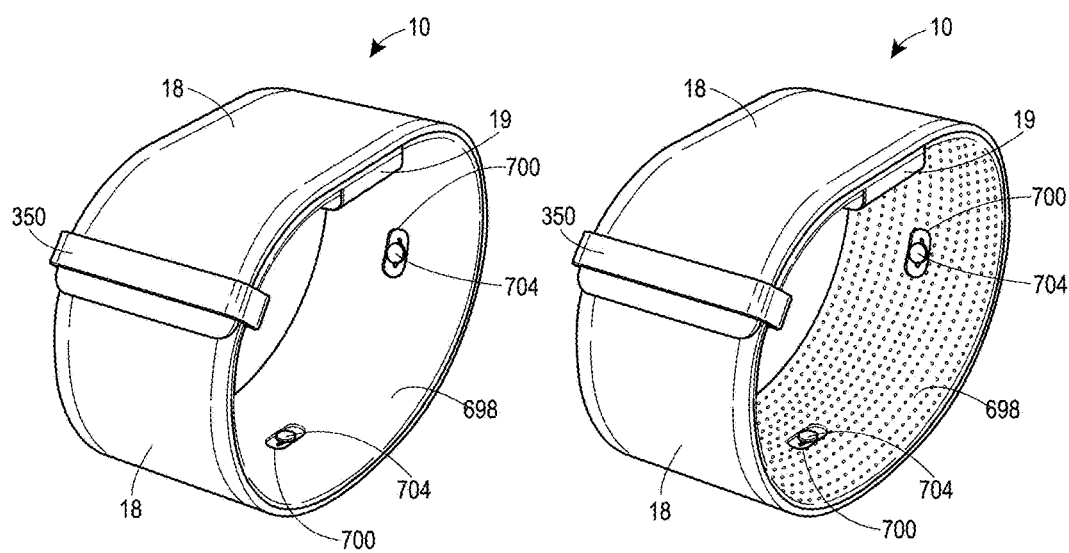
FIG. 45E          FIG. 45F

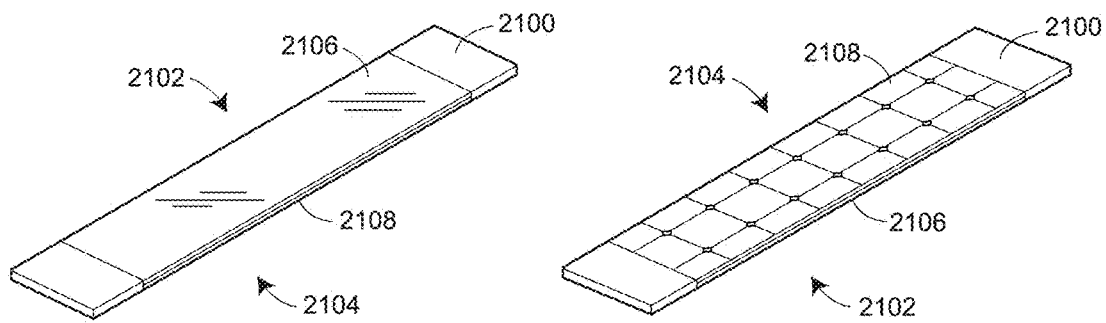
FIG. 48A            FIG. 48B
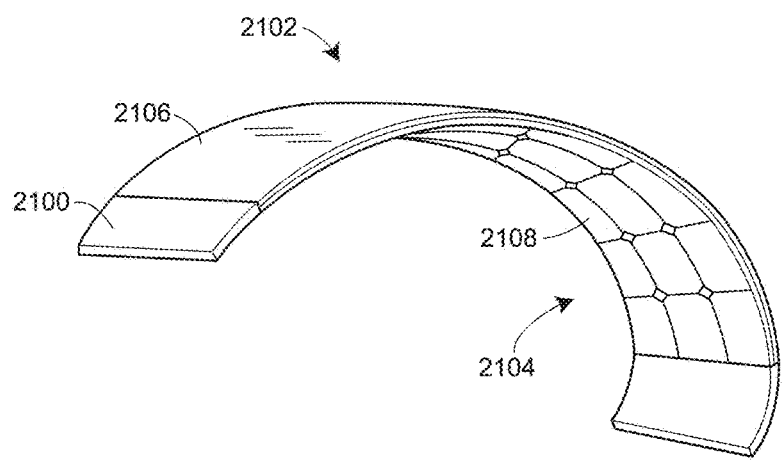
FIG. 48C

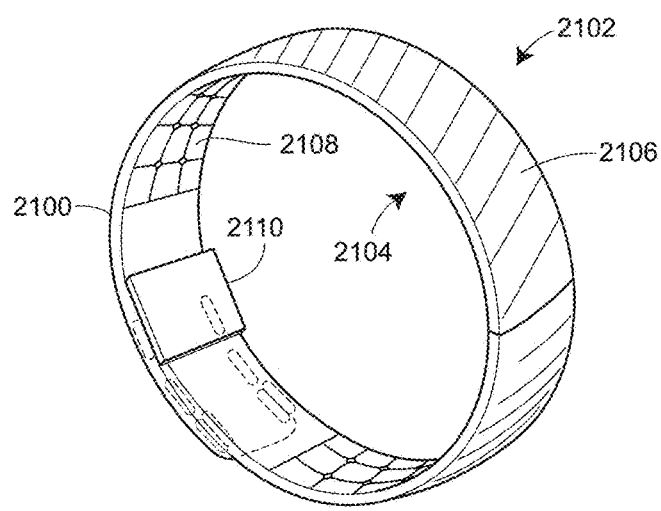
FIG. 48D
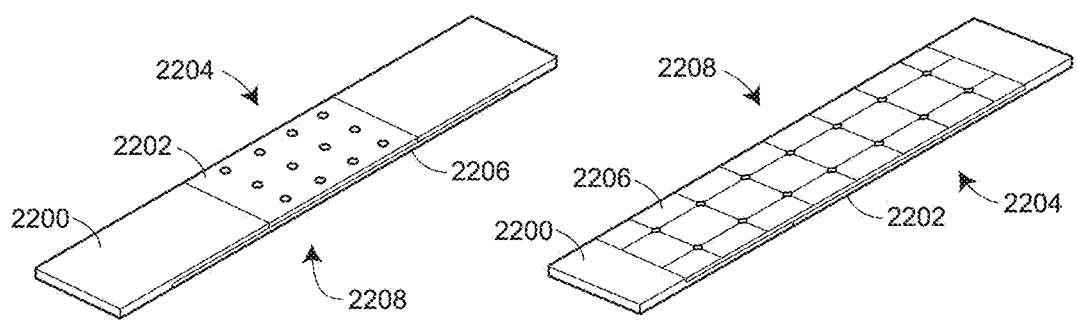
FIG. 49A  FIG. 49B

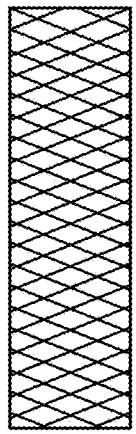   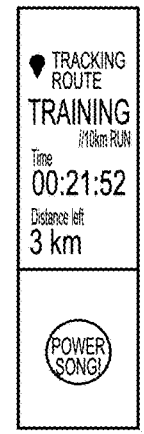 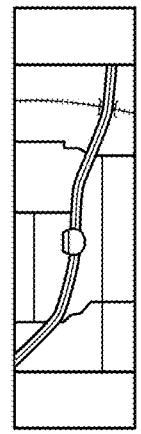
*FIG. 72A*   *FIG. 72B*   *FIG. 72C*   *FIG. 72D*   *FIG. 72E*
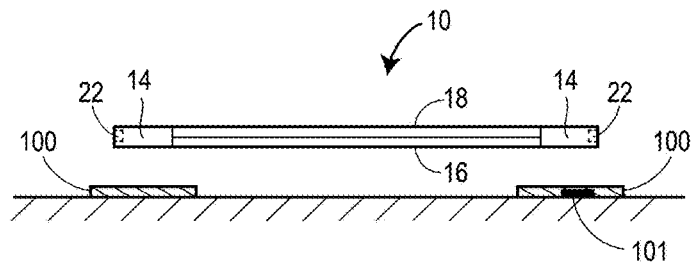
*FIG. 73A*
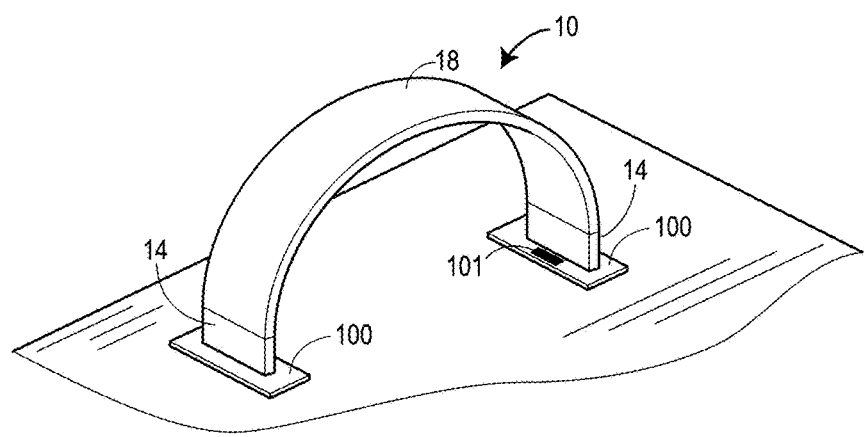
*FIG. 73B*

SUPPORT STRUCTURES FOR A FLEXIBLE ELECTRONIC COMPONENT

RELATED APPLICATIONS

This application is a divisional of U.S. patent application Ser. No. 14/847,693, entitled "Support Structures for a Flexible Electronic Component" which was filed on Sep. 8, 2015 as a continuation application of International Patent No. PCT/US14/72313 filed Dec. 24, 2014, which claims priority to and the benefit of the filing dates of U.S. Provisional Patent Application Ser. No. 61/920,705, entitled "Dynamically Flexible, Attachable Device Having an Integral Flexible Display" which was filed on Dec. 24, 2013; U.S. Provisional Patent Application Ser. No. 61/969,531, entitled "Dynamically Flexible, Attachable Device Having a Flexible Electronic Display" which was filed on Mar. 24, 2014; U.S. Provisional Patent Application Ser. No. 61/979,668, entitled "Support Structure for a Flexible Electronic Component," which was filed on Apr. 15, 2014; and U.S. Patent Provisional Application Ser. No. 62/003,549, entitled "Flexible Electronic Component Movably Coupled to a Flexible Support" which was filed on May 28, 2014, the entire disclosures of each of these applications being hereby expressly incorporated by reference herein for all uses and purposes.

TECHNICAL FIELD

This patent application relates generally to dynamically flexible articles, and more particularly to a support structure for dynamically flexible electronic components, such as flexible OLED lighting, collapsible e-readers, roll-out screens, or displays incorporated into or disposed on articles that are easily attachable to other items, such as arms, mugs, shoes, belts, coffee cups, phones, computers, etc.

BACKGROUND

Electronic components such as electronic displays are commonly installed within flat, hard surfaces of electronic devices, such as computer screens, television sets, smart phones, tablet computers, etc., and in many cases are installed on accessories for the electronic devices, such as removable monitors. Many electronic devices having an electronic display are portable, and have thus become very useful in implementing mobile applications. This fact is particularly true with smart phones which have become ubiquitous. However, unfortunately, typical mobile devices such as smart phones have electronic displays that are flat and rigid in nature. Thus, while these displays are useful in implementing many different applications, the device on which the display is present must still typically be held in a hand, or must be stored in a pocket, a purse, a briefcase or other container, which makes the electronic device less accessible in many situations, such as when a person is carrying other items, undertaking an athletic activity such as running, walking, etc. Moreover, in many cases these traditional electronic devices require two free hands to hold and operate, making these devices cumbersome or difficult to use or to view in situations in which, for example, a person has only one or no free hands or is otherwise occupied.

While flexible displays are generally known and are starting to come into more common usage, flexible displays have not been widely incorporated into easily portable items such as items of clothing, wristbands, jewelry, etc., or on items that are easily attached to other items, much less in a manner that makes the display more useable and visible to the user in many different scenarios.

A flexible electronic component, such as a flexible electronic circuit, a sensor tag, a flexible OLED light, or a flexible display, is a multi-layered stack typically formed of both brittle and organic layers. In some cases, the flexible electronic component may include built-in strains that exist in one or more layers of the component due to the processing conditions of the component (e.g., temperature induced strain). In any case, as a flexible electronic component is typically produced on a flat surface, a curvature or bending of the flexible electronic component creates a certain strain profile in the layers of the component. The strain profile created by the curvature of bending of the component, as well as any built-in strains that may exist within the component, may, in turn, cause one or more of the layers of the flexible electronic component to buckle, crack, or otherwise become damaged. The organic layers in a flexible electronic component can typically withstand strains up to 8% before breaking or deforming in a non-elastic way. The brittle, inorganic layers in a flexible electronic component can, however, only typically withstand strains of approximately 1% before buckling or cracking, depending of course on the processing conditions of the component. As such, the brittle layers of the flexible electronic component generally buckle or crack first in response to excess strain.

When a flexible electronic component is bent or curved, the outer radius of the component will be under tension, while the inner radius will be under compression. At some point in the layer stack of the component, the neutral plane, where there is no tension or compression upon bending, can be found. The layer stacking, the layer thickness, and the layer properties, such as the Young's modulus, determine the position of the neutral plane; for a symmetrical stack of layers the neutral plane is generally located near a middle of the stack. Based on the exact location of the neutral plane and the maximum tolerable strain value (e.g., 1%), the minimum bending radius can be determined for each of the layers in the component. Because, as noted above, the brittle, inorganic layers in the component can typically withstand less strain than the organic layers, the brittle layers typically have a greater minimum bending radius than the organic layers. In turn, the greater minimum bending radius of these brittle layers governs or controls the amount of bending or curvature that the flexible electronic component can undergo before the component is damaged (i.e., the bending range of the component).

To provide support to the flexible electronic component and prevent a user of the flexible electronic component from bending or flexing the component beyond such a minimum bending radius, and, thus, prevent damage to the component, the component can be fixedly attached to a mechanical support structure. International Patent Application Publication No. WO 2006/085271, for example, describes attaching a metal leaf spring to a flexible display. As another example, U.S. Patent Application Publication No. 2013/0044215 describes a wearable article that includes a flexible display and a bi-stable snap metal strip attached to the flexible display.

The problem with attaching a flexible electronic display to a mechanical support structure, such as, for example, a metal leaf spring, is that the attachment of the mechanical support structure to the display typically causes the neutral plane to shift from its initial position (in the display) to a position within the mechanical support structure. Because of the relationship between the location of the neutral plane and the minimum bending radius, shifting the neutral plane in this way significantly increases the minimum bending radius of the layers in the display, particularly the brittle layers in the display. In doing so, the mechanical support structure can serve to significantly reduce, if not effectively destroy, the bending or flexing ability of the flexible electronic display. This is generally true for other flexible electronic components as well.

Moreover, these mechanical support structures, and other known mechanical support structures, do not sufficiently protect the flexible electronic component to which they are attached. Specifically, known mechanical support structures do not sufficiently limit bending of the flexible electronic component, or portions thereof, such that a user of the flexible electronic component can bend or flex the display beyond its minimum bending radius, bend or flex the flexible electronic component in more than one direction, and/or cause defects in the flexible electronic component, thereby damaging the component. The metal leaf spring described above, for example, may help fix the flexible display in the readable position, but does not actually prevent the flexible display, whether in this position or another position, from being bent or flexed beyond its minimum bending radius or from being bent or flexed in multiple directions. Meanwhile, the bi-stable snap metal strip noted above is not concerned with limiting bending of the attached wearable display product. When, for example, the bi-stable snap metal strip is in a flat state, the bi-stable snap metal strip provides little to no resistance against upward (counter-clockwise) bending, such that the wearable product, and, more particularly, the flexible display, can be freely bent in this direction. When the bi-stable snap metal strip is in a curled state, the bi-stable snap metal strip provides little to no resistance against further bending, such that the wearable product, and, more particularly, the flexible display, can be freely bent in this direction. When bending in either or both of these directions exceeds the governing minimum bending radius of the flexible display, the layers of the flexible electronic component can break, crack, or otherwise become damaged.

SUMMARY

A dynamically flexible article or device, such as a wristband, a belt, an armband, a rollable e-reader, mobile device with a foldable display, etc., includes a flexible electronic component (e.g., a flexible display, a flexible OLED light, a flexible electronic circuit, a sensor tag, etc.) and a support structure (e.g., a flexible substrate, a hinged segmented structure, etc.) coupled to the flexible electronic component. The support structure is configured to limit bending of the flexible electronic component to a range within a bending tolerance of the flexible electronic component.

In some cases, the support structure is a flexible support structure that is movably coupled to the flexible electronic component in a manner that allows the flexible support structure and the flexible electronic component to move relative to or independently of one another when the attachable article is moved between different positions (e.g., when the local bending state of the article is changed). Because the flexible electronic component and the flexible support structure are movable independently of one another, the amount of strain that the flexible support structure places on the flexible electronic component when the article is being bent or curved is minimized. In particular, by movably coupling the flexible support structure to or with the flexible electronic component, the flexible support structure does not alter or only minimally alters the neutral plane of the flexible electronic component. This feature, in turn, minimizes the critical bending radius of the flexible electronic component when coupled to the flexible support structure. As such, the flexible support structure provides support to the flexible electronic component while substantially maintaining the bending ability (e.g., the bending range) of the flexible electronic component (i.e., the bending ability of the article is substantially similar to the bending ability of the flexible electronic display itself).

In some cases, the support structure includes a first substrate and a second substrate movably connected to the first substrate such that the support structure is configured to limit bending of the article and provide torsion protection for the flexible electronic component. The support structure generally restricts the amount of torsion that can be applied to the flexible electronic component based on a torsion tolerance of the flexible electronic component. The support structure may, for example, restrict torsion to a range within +/−20 degrees, to a range within +/−10 degrees, or to some other suitable range.

In some cases, the dynamically flexible, attachable article includes a clasping structure that connects the two ends of the substrate together in a manner that maximizes the amount of continuous display surface viewable to the user when the band is disposed on the user's wrist or arm. In particular, the band includes a clasping structure located at the position of the band that lies or falls on the outside of the user's wrist or arm when the band is properly attached to the wrist or arm. In this case, the discontinuity in the display surface falls at a point next to or adjacent to the outside wrist of the wearer, which is the hardest point of the display for the user to view in a natural manner, and which thus minimizes the likelihood that the user will ever need to view a portion of the display at which the discontinuity falls. Moreover, this feature enables the user to view a continuous display along the band as the user, looking at the top of the band, turns his or her palm from a face down to a face up position, thus enabling a user to view a long continuous display screen or to view multiple different display screens without observing the portion of the display at which the discontinuity caused by the clasping mechanism occurs. This feature provides for a more usable and ergonomic band, as this feature provides the maximal amount of continuous viewable display surface to the user when wearing the band.

The band, by the nature of the flexible substrate and flexible electronic display, is dynamically bendable or conformable to a user's wrist, arm or other curved surface, and enables various images to be displayed on the electronic display in a manner that is easily viewable to a user or wearer of the band. The dynamically flexible, attachable article with such a flexible electronic display may be attached to or worn on a user's body, such as in the form of a wristband for example, and may bend to fit the various contours or body surfaces on which the electronic display is located. The dynamically flexible, attachable article is also easily attached to other items, such as mugs, cups, computers, phone covers, bike handles, automobile dashboards, stands, etc., that enable the flexible display to be viewed when not being held in one's hands or on one's body. Still further, the dynamically flexible attachable article may be laid out flat and may be displayed on or attached to a surface in a manner that enables the electronic display to be viewable to a user. In one case, the dynamically flexible, attachable article may be placed on a flat stand having a charging contact in a manner that enables the band device to be charged while also orienting the display of the band device to be visible to those looking at the stand.

In any event, the electronic display of the attachable article is viewable to a user and is capable of being manipulated or actuated by the user without having to be held in one or both of the user's hands, making the electronic device useable while the user is engaged in or performing other activities, such as running, biking, etc.

In one case, the dynamically flexible, attachable electronic device includes a flexible electronic display disposed on a flexible, e.g., bendable, support in the form of a generally rectangular shape, with one, two, or more fasteners or clasping members attached to the support that allow the attachable device to be removably attached to itself, to another object, or worn by a person. The fasteners may be end-pieces, or the fasteners may be located along the length of the support. Control and communication electronics of the device are disposed in one or more electronic modules that may be within, for example, one or more of the fasteners. In some cases, the one or more electronic modules are self-contained and are attached to the flexible support at a location other than the locations of the fasteners or clasping members. For ease of reading, the one or more electronics modules are referred to herein in the singular (i.e., "electronics module"), although it is understood that a dynamically flexible, attachable electronic device may include more than one electronics module.

The electronics module includes a processor for implementing applications or programming, such as an application or program to communicate with a display driver to drive the electronic display to display fixed or changeable messages, artwork, pictures, etc. The electronic module also includes a memory for storing pictures, images, messages, videos, etc., to be displayed on the electronic display at various times, as well as for storing applications and application data, such as configuration data, to be used by applications for performing various display tasks at different times. The electronic module, which may be rigid in nature, may also include a battery for powering the electronic display, the processor, the display driver, and other electronic elements, a battery charging device for charging the battery either in a wireless or a wired manner, and a communications module that enables other computer devices to communicate with the processor, the display driver and the memory to provide new or different images or messages to be displayed on the electronic display, to configure the operation of the electronic display of the attachable electronic device, etc.

The flexible electronic display may be fabricated using any desired flexible electronic display material, such as any of various suitable plastics. If desired, the flexible electronic display may be manufactured as a display having pixel elements disposed on separate frontplane and backplane substrates formed of the same or different flexible material. In some cases, such as the case in which e-paper is used as the flexible display, a separate layer of material may be disposed between the frontplane and the backplane materials to form pixel elements. In any case, these substrate materials may be placed together to form the flexible electronic display, which may then be disposed on the flexible support, such as a leather support, a bendable metal support, etc., the combination of which can be flexed or curved in various manners to conform to the shape of a portion of a wearer's body, such as a wrist, or to conform to the shape of other items to which the attachable article may be attached. In another case, the attachable electronic device may include a flexible, for example, transparent, touch screen interface disposed over or on top of the flexible electronic display to enable a user to input data or take input actions with respect to the flexible electronic display. If desired, the inputs may be in the form of gestures or other inputs that are detected by other sensors included in the dynamically flexible, attachable device, and the gestures detected by the sensors may cause the electronic device to operate in a predetermined manner, such as to change modes of operation, etc.

The electronic display device so formed may, for example, enable a user to have a single type or multiple different types of digital media depicted or displayed on the electronic display at the same time, including, for example, photographs, digital artwork created by the user or others, messages sent to or created by the user, reminders, notes that provide instructive, educational or inspirational messages, e-cards, advertisements, personalized agendas, calendars, such as a personalized Outlook® calendar, etc.

More particularly, the display driver may be configurable to drive the electronic display by displaying thereon one or more images, messages, digital artwork, videos, etc., stored in the memory. In some cases, the display driver is connected to a set of electrodes or connectors that, in turn, are connected to the pixel elements of the flexible display, and the display driver provides respective content to each electrode or connector to produce the image displayed on the flexible display. The display driver may display a fixed image via the flexible electronic display, may change the image being displayed on the flexible electronic display from time to time, such as by accessing the memory and providing a new image to the display, may display videos, such as real time videos, and/or may display other types of digital media. Likewise, the display driver may cause various interfaces associated with many different applications at different times or in different modes of the attachable electronic device to be presented on the flexible display. For example, the display driver may be driven by various different applications executed in the processor to display a calendar interface, an e-mail in-box interface, an alarm clock interface, a keyboard interface, a step-counter interface, etc. These interfaces may be located on the same place on the flexible display and displayed at different times and may be located at different places on the flexible display and displayed at the same or at different times.

Still further, a battery charger unit may be connected to the battery and may operate to charge the battery using, for example, an inductively coupled charging technique or a directly coupled charging technique. The battery charger unit may be, for example, a part of an inductively coupled charging system and may respond to electromagnetic waves produced by an exterior charging unit to charge the battery when the attachable article is disposed near the external charging unit. In another case, the battery charger may be a kinetic energy charger unit that converts motion of the device (such as that associated with movement of an arm when the attachable electronic device is in the form of a wristband) into electrical energy which is then used to charge the battery.

Still further, a communications module may enable the processor, the driver, the memory and/or the flexible electronic display to communicate with external sources or devices, such as a computer, a mobile phone, a tablet device, a remote control unit, etc., using, for example, wireless communications associated with a Wi-Fi network, a cellular network, a Bluetooth connection, a near-field communications (NFC) connection, an infrared communication technique, a radio frequency identification (RFID) device or tag, etc. The communications module may operate to enable the driver to receive new images or other digital media for storage in the memory and ultimate display on the flexible electronic display, new applications for execution by the processor or driver to perform control of the electronic display in various manners and new configuration information for configuring the manner in which the display driver controls the flexible electronic display to operate to display images and other information. In this manner, a user may reprogram the attachable article via, for example, a wireless communication network to display different pictures, images, messages, etc., at different times, to execute different applications at different times or in different locations. The communications module operates to eliminate the need for the attachable device to be plugged into a computer, or otherwise to have wires connected thereto for writing information to the memory of the device.

Still further, the memory may store, and the processor may execute, one or more applications provided or downloaded to the attachable electronic device by the user. These applications may enable the user to direct or program the operational features of the attachable device with the flexible electronic display, such as the particular digital media or images to display at any given time, the order in which images are to be displayed, the speed at which images will change, display features, such as background colors, borders, visual effects, etc. Moreover, the applications may enable or perform communications via the communications module to obtain information that may be displayed on the flexible electronic display, such as e-cards, advertising or promotional information, etc., provided via, for example, a Wi-Fi connection, a cellular connection, a Bluetooth or NFC connection, or any other wireless communications network or connection.

In one case, the processor, which may be a generally purpose micro-processor type of controller or a special purpose controller, the battery, the battery charger unit, the computer readable memory and the communications module may be integrated within, for example, an endpiece or a side wall of the attachable article or in a separate rigid module, and these components may be sealed or otherwise protected from water, air, dirt, etc. to which the exterior of the device is exposed. Any or all of these electronic components may be encapsulated in a hermetically sealed manner to prevent any direct exposure of these components to exterior forces and environmental hazards.

Still further, the flexible support of the attachable article may incorporate various types of structure to protect the flexible display by, for example, limiting the possible types of motion that the flexible display can undergo. These types of structures can, for example, include a set of transverse bars, stays or stints disposed in or on the flexible support to limit the torsional motion of the flexible support to thereby prevent damage to the flexible display due to torsional bending of the flexible display. In a similar manner one or more longitudinal members may be configured within the flexible support to limit the bending motion of the flexible support around either a longitudinal axis of the device or about a transverse axis of the device. This structure thus prevents or limits flexing of the flexible display in one or more directions so as to prevent damage to the flexible display from bending motions that might delaminate the various layers of the flexible electronic display. Still further, the flexible support may include an edge or ridge formed of, for example, a metal wire or other material that is disposed along the edges of the flexible display to prevent or limit damage to the flexible electronic display by impacts at the edge or side of the flexible electronic display.

Still further, the flexible electronic display be configured to present the maximal useable display area on upper the surface of the attachable article by being formed such that the edges of the flexible display on which lead lines that are used to energize a display area of the flexible display are bent or folded down or under the display. Such a configuration limits or reduces the need to have an area on the upper or outer surface of the attachable article at which no display pixels are located.

In one embodiment, an attachable article includes a band having a flexible substrate, a flexible electronic display disposed on the flexible substrate, and an electronics module electronically connected to the flexible electronic display including a display driver and a processor. In this case, the flexible substrate includes bending limiting structure elements that operate together to limit the bending radius of the flexible substrate to a range within a bending tolerance of the flexible electronic display. If desired, the electronics module may be rigid, and may be coupled to the flexible substrate at, for example, an end of the flexible substrate or at any point between two ends of the flexible substrate.

In another embodiment, an attachable article includes a generally rectangular shaped band having first and second lateral ends and first and second transverse sides extending between the first and second lateral ends, the band including a flexible substrate having a multiplicity of interconnected pieces that each extend between the first and second transverse sides of the band and that operate together to limit the bending motion of the flexible substrate to a particular minimum bending radius. The attachable article may also include a flexible electronic display disposed on the flexible substrate, the flexible electronic display having a minimum critical bending radius at which the flexible electronic display can be bent without impairing electronic functionality of the flexible electronic display. Such a minimum critical bending radius may be the bending radius past which the electronic functionality of the flexible display becomes impaired upon a single or a low number of bendings (e.g., bending the flexible display past the minimum critical bending radius the first, second, third, etc., time results in impaired functionality), or may be the bending radius past which the electronic functionality of the flexible display is not reliable or may become impaired upon a significant number of bending motions (e.g., the minimum critical bending radius may be the largest minimum radius at which the electronic display may be reliably bent a significant number of times without becoming impaired). Still further, an electronics module is electronically connected to the flexible electronic display and includes a display driver coupled to the flexible electronic display and a processor coupled to the display driver. In this case, the particular minimal bending radius of the flexible substrate in the lateral direction of the band is greater than or equal to the minimal critical bending radius of the flexible electronic display in the lateral direction of the band.

Additionally, in any of these embodiments, the band may include first and second ends and a clasp mechanism may be coupled to one or both of the first and second ends of the band to couple the first and second ends of the flexible substrate together. The clasp mechanism may include one or more magnets and may further include a first set of uneven grooves or notches disposed at one portion of the band and a corresponding second set of uneven grooves or notches disposed at a second portion of the band for mating with the first set of uneven grooves or notches. In another case, the clasp mechanism may include a multiplicity of magnets disposed in series along at least one end of the band and the clasp mechanism may be adjustable to enable the first and second ends of the band to be moved to different overlapping positions with respect to one another. If desired, the clasp mechanism may include a series of magnets disposed along the first end of the band and a series of magnetically permeable material elements, such as metal or magnets, disposed along the second end of the band, or may include at least one magnet disposed at a first lateral end of the band and a magnetically permeable material disposed at a second and opposite lateral end of the band. The clasping mechanism may further include a tab disposed at one of the first and second lateral ends of the band and a groove that accepts the tab disposed at the other of the first and second lateral ends of the band. In still other embodiments, the clasp mechanism may include a hook and loop structure coupled to the band or a buckle connected to one end of the band that accepts the other end of the band through the buckle.

If desired, the flexible substrate may include a series of rigid pieces of material interconnected with hinges, wherein the hinges limit bending of the flexible electronic display when disposed on the flexible substrate within the bending tolerance of the flexible electronic display. The rigid pieces of material may be disposed laterally along the band and the hinges may include protrusions that interact to limit the range of bending motion of the hinge. Likewise, the flexible substrate may include a flexible material with rigid elements spaced laterally apart along the flexible material and the rigid elements may operate to limit bending of the flexible substrate in the transverse direction of the band more than in the lateral direction of the band. In a still further embodiment, the flexible substrate may include a pliable material having a first uninterrupted section disposed closest to the flexible electronic display and having a second section disposed adjacent the first section and having grooves disposed therein, wherein the grooves extend from one side of the flexible substrate to the other side of the flexible substrate. If desired, the second section may further include one or more lateral grooves disposed therein, wherein the lateral grooves extend at least partially from one lateral end of the flexible substrate to the other lateral end of the flexible substrate. Additionally, the flexible substrate may have two portions disposed laterally adjacent to one another, wherein the first portion can be bent to a minimum radius of curvature that is different than the minimum radius of curvature to which the second portion can be bent. Also, the flexible substrate may have a plurality of sections disposed laterally with respect to one another along the band, wherein each section can be bent to one of a multiplicity of minimum radii of curvature, and wherein at least two of the sections can be bent to a minimum radius of curvature that is less the minimum radius of curvature of one of the other sections. In a still further case, the flexible substrate may have an edge piece that extends above the flexible electronic display at each transverse side (i.e., the sides disposed at the edges in the transverse direction, or the sides extending in the lateral direction between the lateral ends) the of the flexible electronic display and the edge pieces may include a first bendable piece of material disposed inside of a soft pliable material. In this case, the first bendable piece of material may be harder than the soft pliable material.

BRIEF DESCRIPTION OF THE DRAWINGS

FIGS. 7A and 7B illustrate a perspective and top view, respectively, of an example attachable article in the form of a wristband device having magnetic members disposed on one or both ends or sides of the wristband device to form an adjustable connection or clasping structure.

FIGS. 7C-7E illustrate various sensors disposed on a wristband device similar to that of FIGS. 7A and 7B.

FIGS. 8A and 8B illustrate an example attachable article in the form of a wristband device having a flexible display and a connection structure that includes magnets and a tab and recess arrangement.

FIGS. 13A-13C illustrate a bottom view, a side view and a top view, respectively, of a wristband device configured to provide maximal continuous display surface to a user when wearing the band.

FIG. 15 illustrates in more detail the manner in which the clasp structure of the band of FIG. 13 operates.

FIGS. 16A-16C depict the band of FIG. 13 adjusted to fit various different sized wrists to illustrate the positioning of the band overlap with respect to a user's wrist while providing maximal continuous useable display surface area to the user.

FIGS. 21-24 illustrate a still further example attachable article in the form of a wristband device having a flexible electronic display and a connection or clasping structure that includes magnets and a buckle clasp while being configured to provide a maximal continuous usable display surface to a user when wearing the band.

FIGS. 45A-45D illustrate an example attachable article in the form of a wristband having a flexible electronic display and a flexible support slidably and removably coupled therewith in a manner that minimizes or reduces strain on the flexible electronic display during bending.

FIG. 45E illustrates the attachable article depicted in FIGS. 45A-45D when bent or curved.

FIG. 45F illustrates the attachable article depicted in FIG. 45E having a second and different flexible support than that illustrated in FIG. 45E.

FIG. 48A is a perspective view of one side of an example article having flexible electronic components disposed on two surfaces of the article;

FIG. 48B is a perspective view of another side of the example article of FIG. 48A;

FIG. 48C is a perspective view of a flexed or bent state of the example article of FIGS. 48A and 48B;

FIG. 48D is a perspective view of a flexed and overlapping state of the example article of FIGS. 48A, 48B, and 48C;

FIG. 49A is a perspective view of one side of another example article having flexible electronic components disposed on two surfaces of the article;

FIG. 49B is a perspective view of another side of the example article of FIG. 49B;

FIGS. 72A-72E illustrate various example display images that can be provided on a wristband device in different operational modes of the wristband device.

FIGS. 73A and 73B illustrate the wristband device of FIG. 1 or 3 disposed adjacent to one or more location detection strips in a straight configuration and a curved configuration, respectively, to form a wristband detection system.

DETAILED DESCRIPTION

Figure 1:
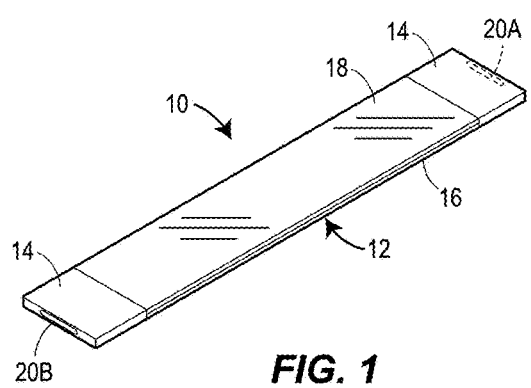
FIG. 1 is a perspective view of an example dynamically flexible, attachable article in the form of a wristband having a flexible display disposed thereon and a first type of magnetic clasp.

Referring now to FIG. 1, a dynamically flexible, attachable article 10, which is illustrated to be in the form of a wristband, includes a flexible band portion 12, which is generally rectangular in shape and configuration, disposed between two ends, which may include end pieces or fasteners 14. The band portion 12 includes a flexible support 16 and a flexible electronic display 18 disposed on the support 16 to be viewable from the top of the band 12, as illustrated in FIG. 1. One or more of the fasteners, end pieces, ends, or clasps 14, each of which may be made of hard plastic, metal, or other rigid material, but could instead be made of a pliable material, may include various electronic components therein for driving the flexible electronic display 18 and for providing other electronic functionality for the article 10. Additionally or alternatively, one or more various electronic components may be disposed in one or more electronic modules that are attached to the band 12 at locations other than at the ends of the band 12, such as in the fasteners 14.

Figure 2:
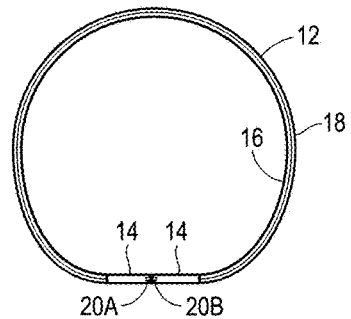
FIG. 2 is a side view of the wristband of FIG. 1 bent to form a fixed length wristband.

As illustrated in FIG. 1, one or both of the end pieces or clasps 14 may include a connection structure therein that functions to connect the end pieces 14 together when the band portion 12 is bent, as illustrated in FIG. 2, to form a circular or oval band. In one case, the connection structure may be in the form of magnetic materials 20A and 20B disposed in or on each of the clasps 14, wherein the materials 20A and 20B operate, when in close proximity to one another, to hold the end pieces or clasps 14 together. The magnetic materials 20A and 20B can each be a permanent magnet, or one of the materials 20A or 20B can be a permanent magnet while the other material 20A or 20B can be a magnetically permeable material, such as many kinds of metal. The magnetic materials 20A and 20B can be disposed at the longitudinal ends of the clasps 14 so that the clasps 14 connect end-to-end when the band 12 is bent to allow the clasps 14 to meet up with each other end-to-end, as illustrated in FIG. 2. In the case in which the materials 20A and 20B are both permanent magnets, the materials 20A and 20B may be disposed in ends of the clasps 14 so that opposite poles of the permanent magnets are facing outwardly from the clasps 14 or so that the magnets have their respective north poles facing in opposite directions when the band portion 12 is bent in the manner shown in FIG. 2 (e.g., so that a south pole of one of the magnets 20A and 20B meets or mates with a north pole of the other one of the magnets 20A and 20B). As will be understood, the configuration and placement of the materials 20A and 20B in the clasps 14 in the manner illustrated in FIG. 1 enables the device 10 to be clasped in a continuous circle with a fixed or predetermined length so that the clasps 14 meet end-to-end.

Figure 3:
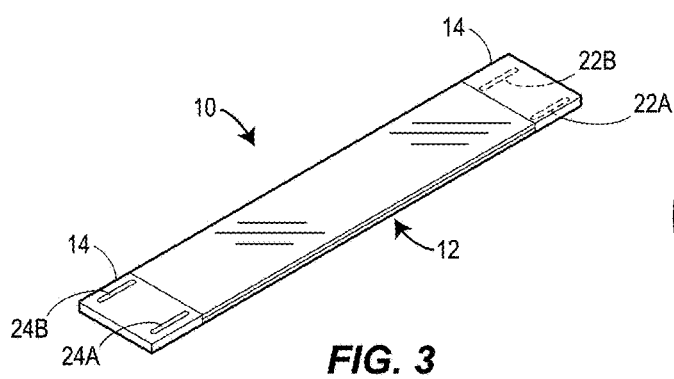
FIG. 3 is a perspective view of an example attachable article in the form of a wristband having a flexible display disposed thereon with a second type of magnetic clasp.
Figure 4:
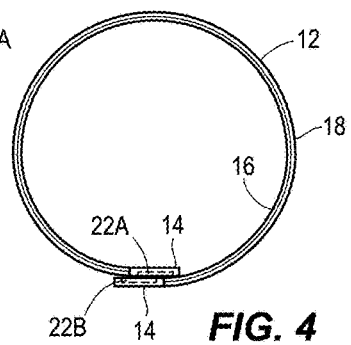
FIG. 4 is a side view of the example attachable article of FIG. 3 bent to form an adjustable length wristband.

In another embodiment illustrated in FIG. 3, the flexible attachable article 10, again illustrated in the form of a wristband, includes a similar band portion 12 and end pieces or clasps 14. However, in this case, the clasps 14 have a connection structure in the form of magnets disposed on the top or bottom sides of the clasps 14 (and possibly even a portion of the band 12) to enable the device 10 to be folded around on itself in an adjustable manner as illustrated in FIG. 4, so as to create a wristband of variable length when disposed around or connected around a wrist or other object. As illustrated in FIGS. 3 and 4, magnets or magnetic members 22A and 22B are disposed on or near a lower side of one the clasps 14, and come into contact or react with magnets or magnetic members 24A and 24B disposed on or near an upper side of the other one of the clasps 14. In some cases, the magnets or magnetically permeable elements or members 24A and 24B may be disposed within the support 16, such as in the center of the support 16, instead of on or near an upper or lower surface of the support 16. In these configurations, the clasps 14 may be disposed near or on top of one another during use and are thus connectable in various different positions with respect to one another, such as that illustrated in FIG. 4, when the flexible band 12 is bent to form a circular or oval member to be placed around a wrist, an arm, etc., for example. In this manner, the dynamically flexible, attachable device 10 may be easily adjustable in size to fit various different sized wrists and arms or other mounting members. As illustrated in FIG. 4, the support or flexible material 16 of the band portion 12 is illustrated as being flexed in a manner that causes the flexible electronic display 18 to be disposed on the exterior or outside of the band portion 12. Of course, in the configuration illustrated in FIG. 4, the magnets or metallic members 22A and 22B on the one side, and the magnets or the metallic members 24A and 24B on the other side of the band portion 12 may slide or move with respect to one another in the longitudinal direction of the device 10 so as to make the device 10 variable in size or circular/oval shape to fit around different sized wrists or other mounting members. If desired, portions of the members 22A, 22B and/or 24A, 24B could be disposed in the band portion 12 in addition to or instead of in the clasps 14 and, if so disposed, could still be considered as being disposed in the end portions of the band 12. Still further, any or all of the magnetic members 22A, 22b, 24A, 24B could be a single, long piece of material, as illustrated in FIGS. 3 and 4, or could be a series of magnetic members disposed near but not contacting each other, to enable better registration of the north and south poles of the respective magnetic members in various different longitudinal locations of the band 12. This second configuration may provide for better adjustability of the length of the band 12 when both magnetic members 22 and 24 are permanent magnets.

Figure 5A:
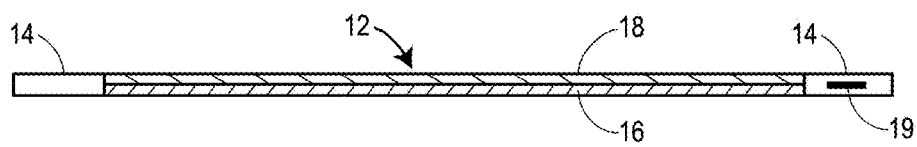
FIG. 5A is a side view of an example attachable article of FIG. 1 having a flexible display disposed on a flexible substrate between two clasps.

Of course, the dynamically flexible, attachable device 10 could take on many different configurations besides those illustrated in FIGS. 1-4. For example, as a reference, FIG. 5A illustrates a side view of the device 10 of FIGS. 1-4 in more detail. In this case, the band portion 12 is illustrated as including a flexible base or a support portion 16 that may be made of any suitable flexible material such as, for example, cloth, leather, plastic, metal, or other material, while the flexible display 18 is disposed on the support 16. The clasps 14 may be the same size as each other and may be the same height as the flexible display 18 and the support 16 together. In another case, the clasps 14 may be larger in height than the flexible display 18 and the support 16 and, in this case, may stick out above surface of the flexible display 18 and/or below the bottom surface of the support 16. As noted above, one or both of the clasps 14 may be or include an electronics module 19 that holds electronics, such as processors, memo-ries, sensors, batteries, etc., that are used to power and drive the flexible display 18 and to provide other communication functionality for the device 10. In some embodiments, the electronics module 19 is not included in the clasps or fasteners 14, but is attached to the band 12 in a location separate from the fasteners 14. In these cases, the electronics module 19 may be even with the bottom of the band 12 or may stick out from the bottom of the band 12. If desired, the components of the electronics module 19 may be sealed or otherwise protected from water, air, dirt, etc., to which the exterior of the device 10 is exposed. For example, any or all of these electronic components may be encapsulated in a hermetically sealed manner to prevent any direct exposure of these components to exterior forces and environmental hazards.

Figure 5B:
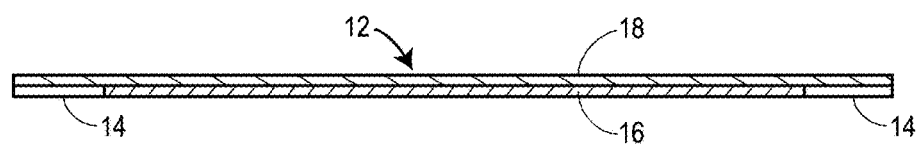
FIG. 5B is a side view of an example attachable article in the form of a wristband having a flexible display disposed over an entire length of a substrate.

In another embodiment, as illustrated in FIG. 5B, a dynamically flexible, attachable article in the form of a device 10 has the flexible display 18 disposed over the entire length of the support 16 and end portions 14, which may be part of the support 16. In this case, the flexible display 18 spans the entire length of the band portion 12 and of the device 10 and thus extends from end to end of the device 10. The connection structure, in the form of for example, magnets (not shown in FIG. 5B) may be disposed in the end pieces 14 and/or, if desired, in portions of the flexible support 16.

Figure 5C:
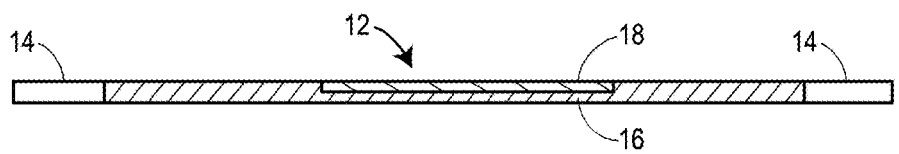
FIG. 5C is a side view of an example attachable article in the form of a wristband having a flexible display disposed on a center portion of a flexible substrate.

In yet another configuration, as illustrated in FIG. 5C, a dynamically, flexible attachable article 10 has a flexible display 18 disposed on a limited portion of the flexible support 16 so that the flexible display 18 is only disposed, in this case, in the center portion of the band 12. Of course, while not shown, the flexible display 18 could be disposed on any other portion of the band 12, including in portions offset from the center of the band 12 and the flexible display 18 could cover any desired amount or portion of uppers surface of the band 12. Here again, any desired connection structure could be provided in the ends of the support 16, including in the clasps 14, to connect the two ends of the band 12 together.

Figure 5D:
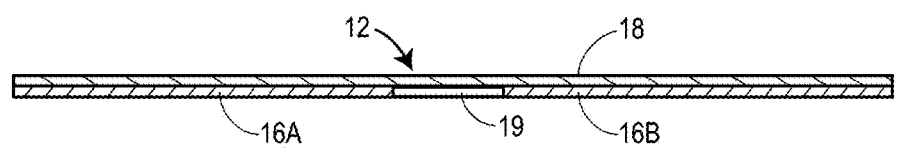
FIG. 5D is a side view of an example attachable article in the form of a wristband device having a flexible display disposed over a substrate having two flexible end pieces connected by an electronics module.

In a still further case, as illustrated in FIG. 5D, a dynamically flexible, attachable article 10 has a flexible display 18 disposed over a support 16 having two flexible end pieces 16A and 16B connected by an electronics module 19 which, in this case, is illustrated as being disposed in the center of the flexible support 16. The electronics module 19 may or may not be made of a flexible material and in either case may still be part of the flexible support 16. Moreover, while being illustrated in the center of the support 16, the electronics module 19 could be disposed at any other location along the support 16 including at any position offset from the center of the support 16. Again, any desired connection structure could be attached to or disposed in or on the end portions of the device 10, including the ends of the support 16.

Figure 6:
FIG. 6 is a side view of an example attachable article in the form of a wristband device having a flexible touch screen disposed on a flexible display and a flexible substrate which are disposed between two clasps.

In another embodiment, as illustrated in FIG. 6, the dynamically flexible, attachable article 10 may be configured similarly to that of FIGS. 1-5D, but may also include a touch screen interface 26 disposed over the flexible display 18. In particular, in this case, the touch screen interface 26 can be a capacitive touch screen or any other type of touch screen interface that is transparent in nature, and thus can be laid over top of the flexible display 18 to allow the flexible display 18 to be viewable there-through. As will be understood, the touch screen interface 26 of FIG. 6 is powered by and controlled by the electronics disposed within one or more electronics modules 19 illustrated as being disposed, in this case, in both of the clasps 14 to perform various different types of touch detection functionality associated with a typical touch screen display. Of course, the touch screen interface 26 could be added to any of the configurations of FIGS. 5A-5D or to any of the other attachable article embodiments described herein.

While the device 10 of FIGS. 1-6 is generally illustrated as having a flexible display and a flexible support disposed between or including two magnetically coupled clasps 14, with at least one of the clasps 14 containing or operating as an electronics module 19 or with an electronics module 19 disposed in the center of the band 12, other manners of disposing connection structure on the device 10 and of locating the electronics module 19 could be used instead. For example, FIGS. 7A and 7B illustrate an example dynamically, flexible attachable article 10 in the form of a wristband having a clasp member 14, such as one of clasps members 14 of FIGS. 1-6, disposed at one end of the flexible display 18 and a set of magnets 22 and 24 or other magnetically permeable material disposed on or in an end piece or end portion attached to or formed as part of the other end of the flexible support 16. In this case, individual magnets 22A and 22B are disposed in a spaced apart manner within the end piece 14 or are disposed in the flexible support 16 next to the end piece 14 and operate in conjunction with the individual magnetic materials 24 which are spaced apart and disposed on the other end piece of the band 12 to form a secure magnetic connection when the band portion 12 is wrapped around a user's wrist, for example. The spaced apart nature of the individual magnetic members 22 and 24 enable the band to be adjustable in length so that a pair of magnetic members 22A and 22B (on opposite sides of one end of the band 12 or support 16) may meet up with any of a number of different pairs of magnets 24A and 24B (on opposite sides of the other end of the band 12 or support 16) to enable the length of the band, when connected, to be adjustable. Of course, the magnetic members 22 and 24 may each be permanent magnets, or one may be made of permanent magnets while the other is formed of magnetically permeable material. Moreover, the spaced apart magnetic material configuration of FIGS. 7A and 7B may be used in any of the embodiments illustrated in FIGS. 1-6 or other embodiments discussed herein.

FIGS. 7C-7E illustrate attachable articles similar to that of FIGS. 7A and 7B but including various different types of sensors that may be used for various purposes, including in detecting the orientation of the band, such as whether the band is wrapped around a user's wrist or other element. In particular, FIGS. 7C-7E illustrate various examples of an attachable article in the form of a wristband device 10 that includes and adjustable clamp or connection mechanism for enabling the ends of the band of the device 10 to overlap one another by different distances when worn so as to enable the wristband device 10 to be used on wrists of different sizes. In addition, however, each of the various devices in FIGS. 7C-7E include mechanisms for determining or enabling the electronics module 19 of the device 10 to determine the orientation of the band with respect to the user's wrist when being worn to enable better operation of the display features of the device 10. While a magnetic connection or clamping structure is illustrated in each of the devices 10 in FIGS. 7C-7E, other types of adjustable clamping or connection structure could be used instead.

More particularly, FIG. 7C illustrates an example attachable article in the form of a wristband device 10 having an adjustable clasping mechanism in the form of one or more magnets 22A, 22B, 24A, 24B such as that illustrated with respect to FIGS. 7A and 7B and an electronics module 19 disposed or centered on the flexible substrate or band support 16 at approximately one third of the length of the band 16 from one end of the band 16 and two-thirds of the length of the band 16 from the other end of the band 16. In addition, the device 10 of FIG. 7C includes a flexible touchscreen interface 26 disposed over the flexible electronic display 18.

FIG. 7D illustrates another example attachable article in the form of a wristband device 10 having an adjustable clasping mechanism in the form of one or more magnets 22A, 22B, 24A, 24B such as that illustrated with respect to FIGS. 7A and 7B and an electronics module 19 disposed or centered on the flexible substrate or band support 16 at approximately one third of the length of the band support 16 from one end of the band 16 and two-thirds of the length of the band 16 from the other end of the band support 16. However, in this case, one or more pressure sensors 27 are disposed in or on the band support 16 and are electronically connected to the electronics module 19 to provide signals to the electronics module 19 indicative of pressure, strain, or force applied to those locations of the band 16. While the pressure sensors 27 are indicated to be disposed at various points along the length on the band support 16 on both sides of the band support 16 near the ends of the support 16, these sensors may be disposed along the entire band support 16, only on one side of the support 16, or on any suitable portion of the support 16 for the purpose of detecting pressure or force applied to the band support 16 or display screen 18. Still further, the pressure sensors 27 may be any desired or suitable pressure sensors including piezoelectric sensors, strain gauges, etc. Additionally, any desired number of sensors 27 may be used and these sensors 27 may be spaced apart from one another any suitable distance along the length of the band support 16. Likewise, the sensors 27 may be disposed in the center of the band support 16 (from side to side) or offset from the center. Also, more than one sensor 27 may be located at any longitudinal or lateral location along the band support 16. Alternatively, the sensors 27 of FIG. 7D could be magnetic sensors which sense magnetic field strength, for example. In this case, the magnetic sensors 27 may detect whether one or more magnets on one end of the band (used a part of the coupling mechanism) are near to or are interacting with magnets or magnetic material on the other end of the band. Here, the magnetic sensors 27 may be used to detect the amount of overlap of the ends of the band.

FIG. 7E illustrates another example attachable article in the form of a wristband device 10 having an adjustable clasping mechanism in the form of one or more magnets 22A, 22B, 24A, 24B such as that illustrated with respect to FIGS. 7A and 7B and an electronics module 19 disposed or centered on the flexible substrate or band support 16 at approximately one third of the length of the band support 16 from one end of the band 16 and two-thirds of the length of the band 16 from the other end of the band support 16. However, in this case, a gyroscopic detection element 29 is disposed in the electronic module 19 and operates to detect the orientation of the band (or at least the electronics module 19 or other location at which the gyroscopic element 29 is disposed). The gyroscopic element 29 may operate to detect the orientation of the band with respect to gravity or other acceleration forces to which the element 29 is subjected. While a single gyroscopic element 29 is illustrated as being disposed in the electronics module 19 of FIG. 7E, this or similar elements could be disposed at other locations along the band (e.g., within the support 16 of the band) and/or multiple gyroscopic elements 29 could be disposed at various locations along the support 16.

Generally speaking, the embodiments of FIGS. 7C-7E include structure or elements, such as a touchscreen interface 26, pressure or magnetic sensors 27 or gyroscopic elements 29 that can be used to assist the electronics module 19 in determining the orientation or positioning of the wristband support 16 or the display 18 with respect to one or more fixed locations on a user's wrist when the device 10 is wrapped around the user's wrist, to detect gestures made by the wearer of the band, etc. This operation enables the module 19 to then calibrate the display 18 to place or center display information such as display screens at particular locations with respect to the user's wrist, such as being centered on the top of the wrist, on the bottom of the wrist, on the inner side of the wrist, on the outer side of the wrist, etc. Likewise, these elements or sensors may be used to detect user inputs and band orientation or location.

Moreover, while FIGS. 1-7 illustrate magnetic based connection structures, other connection structures, such as one or more mechanical connectors (e.g., buckles, snap components, etc.), any desired hook and loop connection material, like Velcro, or some other connection means, etc. could be used instead of or in addition to any of the above-described magnetically coupled connection structures. In the embodiments in which the article 10 includes a connection structure that utilizes one or more mechanical connectors in combination with one any of the above-described magnetically coupled connection structures, the connection structure can provide both a magnetic connection and a mechanical connection, and, thus, the connection structure provides a stronger and more durable connection between the end pieces 14 of the article 10 or between the various portions of the band or support 16. In these cases, the magnetic connectors can, but need not, be disposed near or proximate to the mechanical connectors.

As an example, FIGS. 8A and 8B illustrate a set of magnetic connectors used in conjunction with a mechanical connector to effect a clasping structure in a fixed length band. In the embodiment illustrated in FIG. 8A, the flexible attachable article 10, again illustrated in the form of a wristband, includes a similar band portion 12 and end pieces or clasps 14. However, in this embodiment, the article 10 has a connection structure that not only includes magnets 20A, and 20B disposed at the lateral ends of the band portion 12, as described above in connection with FIGS. 1 and 2, but also includes mechanical connectors that can effectuate a mechanical connection between the end pieces or clasps 14, such that the clasps 14 can be mechanically and magnetically connected to one another when the device 10 is bent, as illustrated in FIG. 8B, to form a circular or oval band. In FIGS. 8A and 8B, the mechanical connectors take the form of a recess 300 that is formed or defined in the longitudinal or lateral end of one of the clasps 14 and a tab 304 that is formed or defined on, and extends laterally outward from, the longitudinal or lateral end of the other one of the clasps 14. The tab 304 can be disposed or inserted into the recess 300 to mechanically connect the longitudinal ends of the opposing clasps 14 to one another when the flexible band 12 is bent to be disposed around or on a wrist, an arm, etc., for example. At the same time, the magnets 20A and 20B, by virtue of being in proximity to one another as shown in FIG. 8B, create or provide a magnetic force that also serves to hold the clasps 14 together. In this manner, the connection structure described in connection with FIGS. 8A and 8B can provide a stronger, more durable connection when the clasps 14 are connected in an end-to-end arrangement so that the device 10 is clasped in a continuous circle or oval with a fixed or predetermined length.

In another embodiment illustrated in FIGS. 9-12, the flexible attachable article 10, which is again illustrated in the form of a wristband, includes a similar band portion 12 having one or more ends 14, and an electronics module 19 disposed at or on one of the ends 14. In this embodiment, the article 10 also includes the magnets 22A, 22B, 24A, and 24B described above, but includes different mechanical connectors than the article 10 illustrated in connection with FIGS. 8A and 8B. In the band device of FIGS. 9-11, the mechanical connectors take the form of a plurality of grooves or notches 320 formed on the band 12 and a plurality of projections (also called grooves or notches) 324 formed on the module 19 which are configured to, mate with, engage and/or retain the corresponding grooves or notches 320 therein when one end of the band 12 is bent to overlap with the other end of the band.

Figure 10:
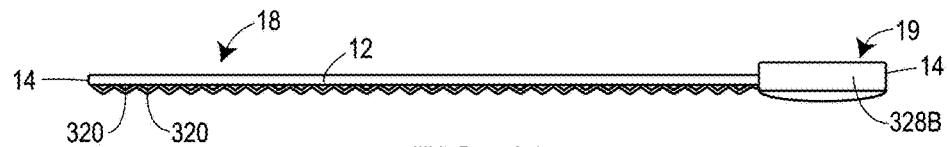
Figure 11:
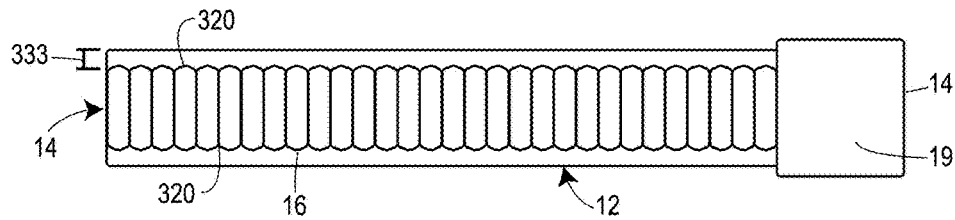
Figure 12:
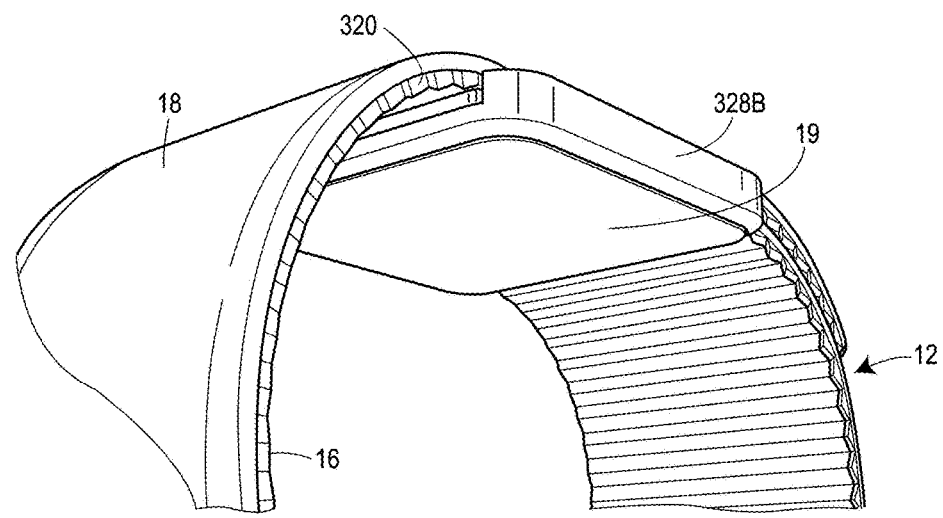

More particularly, as depicted in FIG. 10, which illustrates a side view of the flexible attachable article 10, and FIG. 11, which illustrates a bottom view of the article 10, the grooves 320 (or notches) may be formed in a side of a portion of the band 12 that extends below the flexible electronic display 18. The grooves or notches 320 illustrated herein may also be formed in the transverse edges of the bottom portion of the band 12 and may extend from one end of the band 12 to the other end of the band 12 or may extend along only a portion of the band 12 and need not extend from end to end. As illustrated in FIG. 11, there may be a gap or a space 333 between the outer or transverse edges of the grooves or notches 320 and the outer or transverse edges of the rest of the band 12 or the flexible electronic display 18. In other words, the outer edges of the grooves 320 may be positioned inwardly of the greatest transverse edges of the band 12 or the display 18. In other embodiments, this gap can be reduced or eliminated (i.e., the edges of the grooves 320 can be commensurate with the transverse edges of the band 12) or this gap can be increased. In further embodiments, the grooves 320 can extend outward of the transverse edges of the support 16, in which case the grooves 320 can engage and connect with a complementary structure disposed on an interior of the electronics module 19 or another portion of the band 12. In still a further embodiment, the grooves 320 can, alternatively or additionally, be formed in the bottom side of the band 12. As briefly noted above, in other embodiments, the grooves 320 can be formed in the bottom side along the entire length of the support 16 or along only a partial length of the support 16. For example, the grooves 320 may only be formed in the bottom side of the support 16 near or at the end portions of the band 12. As also illustrated in FIGS. 10-12, the grooves or notches 320 each have a generally triangular shape, but, in other examples, the grooves 320 can be differently shaped grooves or notches (e.g., they can be rectangular, semi-circular, etc.)

Figure 9:
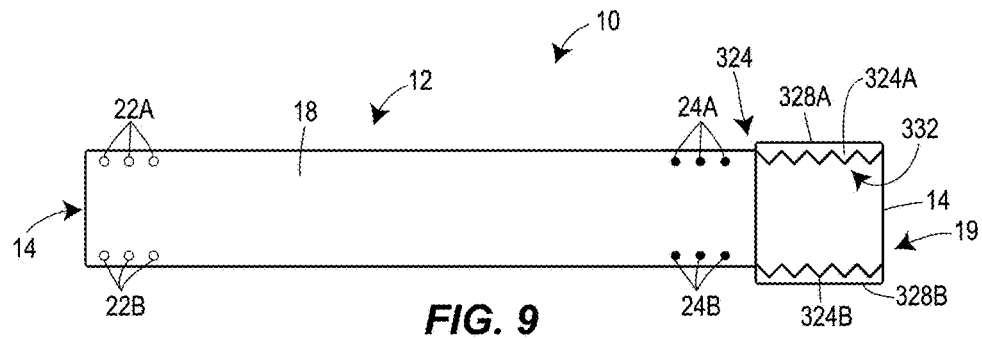
FIGS. 9-12 illustrate an example attachable article in the form of a wristband device having a flexible display and a different connection structure that includes magnets and interlocking grooves and that is configured to provide maximal continuous display surface to a user when wearing the band.

As illustrated in FIGS. 9 and 10, the electronics module 19 may include first and second opposing sidewalls 328A and 328B that border and extend above (at least with reference to FIG. 9) the band portion 12. A first set of inwardly facing projections 324A is formed or defined by the first sidewall 328A, while a second set of inwardly facing projections 324B is formed or defined by the second sidewall 328B. As illustrated in FIG. 9, the projections 324A and the projections 324B are aligned with and extend inward toward one another. When, however, the gap 333 between the edges of the grooves 320 and the edges of the band 12 is decreased, the projections 324A and 324B can be modified so as not to extend quite as far inwardly. On the other hand, when the gap 333 is increased, the projections 324A and 324B can be modified so as to extend further inwardly. In any event, the projections 324A and 324B are configured to accept or mate with the grooves or notches 320 when one end of the band 12 is disposed so that the lower portion of the band 12 including the grooves 320 is disposed in the space between the projections 324A and 324B. As such, the projections 324A and 324 are spaced apart a distance that is the same as or slightly larger than the distance between corresponding grooves 320 on either side of the band 12. In some cases, the distance between the projections 324A and 324B may be slightly smaller than the distance between the corresponding groove 320 on either side of the band 12, in which case the material forming the grooves 320 may be flexible or compressible.

When the flexible band 12 is bent to be disposed on or around an object (e.g., a wrist, an arm, etc.), such that one of the ends 14 is disposed on or near an upper side of the other one of the ends 14, a portion of the device 10 (e.g., one of the ends 14) can be disposed or seated in a receiving area 332 (FIG. 9) defined by the bottom of the electronics module 19 at the other end 14, the receiving area 332 including the projections 324, and the sidewalls 328A and 328B. In this manner, as illustrated in FIG. 12, one or more of the grooves 320 will be disposed or seated in the receiving area 332 between one or more of the projections 324A and 324B, such that one or more of the projections 324A and 324B, which extend inwardly, engage and serve to mate with and retain respective ends of the grooves 320. As such, a mechanical connection may be formed between one or more of the grooves 320 and one or more respective projections 324A and 324B. At the same time, the magnets 22A, 22B, 24A, and 24B, if present, by virtue of being in proximity to one another, create or provide a magnetic force that also serves to help hold the ends 14 together. So configured, the end pieces 14 are mechanically and magnetically connectable in various different positions with respect to one another, such as that illustrated in FIG. 12, when the device 10 is bent or curved to be placed around a wrist, a leg, a bicycle handle bar, etc., for example. As a result, the attachable device 10 may be easily adjustable in size to fit various differently-sized mounting members or wrists while still providing for a strong connectivity between the ends 14 of the band 12. As one of ordinary skill in the art will appreciate, the grooves 320 disposed or seated in the receiving area 332 can be repositioned, relative to the projections 324A and 324B, to adjust the attachable device 10 to fit a differently sized mounting members (e.g., different sized wrists). It will be understood that, while the band construction and clasping concepts discussed with respect to FIGS. 1-12 are provided in the context of specific examples, any of these concepts or techniques can be applied to any of the other embodiments described herein in any combination.

Importantly, it is desirable to maximize the amount of the electronic display 18 that is continuously viewable to a user when, for example, the user has the band device 10 mounted on the user's wrist. To do so, the device 10 may be configured to cause the connection between and/or the overlap of the ends 14 of the band 12 to fall in a region that is near or adjacent to the outer side or edge of the user's wrist (i.e., the edge of the user's wrist that is on the side of the hand at which the pinky finger is located). Generally speaking, when the band 12 is disposed around a user's wrist, the flexible electronics display 18 forms a continuous display around the wrist from one end to the other end (when the ends 14 of the band 12 attach end-to-end) or from one end to a position at which one side of the band begins to overlap the other side of band (when the ends 14 of the band 12 overlap). It is desirable to place the discontinuity in the flexible electronics display 18 at the outer side of the user's wrist so that the flexible electronic display 18 is continuous through the portions of the band disposed near the top of the wrist, the inner side of the wrist and the bottom of the wrist (i.e., so that the discontinuity of the electronic display 18 caused by the connection of the ends of the band or the overlap of the ends of band falls at a position adjacent to the outer wrist of the user). When configured in this manner, the user may view a continuous display, i.e., one without a discontinuity caused by the ends of the band, as the user looks at the band at the top of his or her wrist (i.e., when the user's palm is facing downwardly), and as the user turns his or her wrist over to cause the user's palm to face upwardly. During this motion, the user views the display adjacent the top of the user's wrist, the display adjacent the inside of the user's wrist (on the index finger side of the hand), and the display adjacent the bottom of the user's wrist (on the same side of the wrist as the user's palm). As this is a natural range of motion of the user's wrist, it is desirable to provide a continuous display to the user during this motion.

To provide this maximal continuous usable display to the user, the device 10 may be configured to have a fixed position of the band that is to be placed adjacent to a fixed position of a user's wrist, such as on the top of the user's wrist. In this case, the ends of the band are sized or spaced from this fixed position to overlap or connect at a position that will end up being adjacent to the user's outer wrist when the band is disposed on or wrapped around the user's wrist. The outer wrist or outside of the wrist, in this case, may be defined by any position that is substantially within a particular quarter of the circumference of a circle, oval, or ellipse defined around a user's wrist, with the particular quarter being centered at the middle of the outer side of the user's wrist.

FIGS. 13-17 illustrate one embodiment of the band device 10 which provides for a maximal continuous usable display surface by assuring that the discontinuity in the electronic display falls at a position adjacent to the user's outer wrist. In particular, the device 10 illustrated in FIGS. 13A-C includes a band 12 extending between two end pieces 14A and 14B which may be metal, plastic or other material that provides a pleasing look. An electronics module 19 having an exterior casing or cover is disposed on the band 12 at a position between the two end pieces 14A and 14B, but is not centered between the two end pieces 14A and 14B. In particular, the electronics module 19 is disposed closer to one end piece 14B than the other end piece 14A. FIG. 13C illustrates a top view of the device 10 showing a continuous flexible electronic display 18 extending between the two end pieces 14*a* and 14B. In this configuration, the end pieces 14A and 14B form at least a portion of a clasp or clasping mechanism that is similar in nature to that described with respect to FIGS. 9-12. As such, and as illustrated in FIG. 13A (depicting a bottom view of the device 10), notches or grooves 320 are formed into the transverse edges of a lower portion of the band 12 and these notches or grooves 320 are received in a mating structure 332 formed in one of the end pieces 14B (as illustrated in FIG. 13C).

Figure 14A:
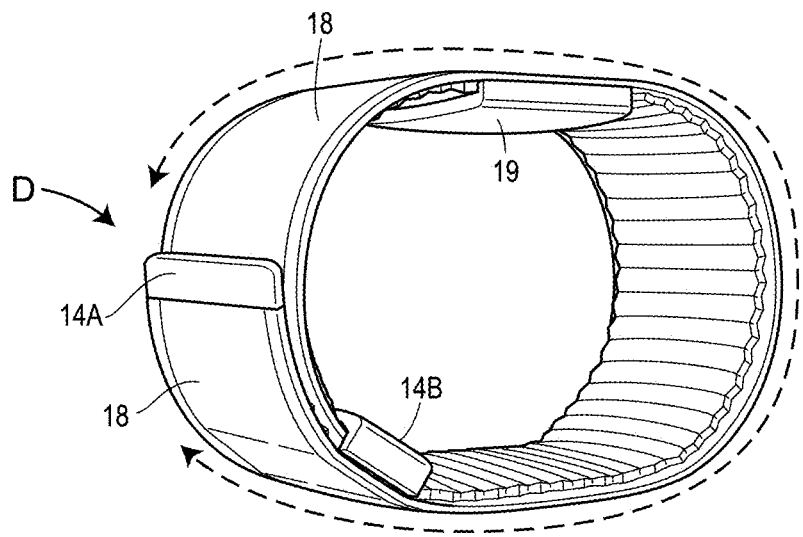
FIG. 14A illustrates the band of FIG. 13 when the ends thereof are connected together to form a maximal continuous display surface for a user.
Figure 14B:
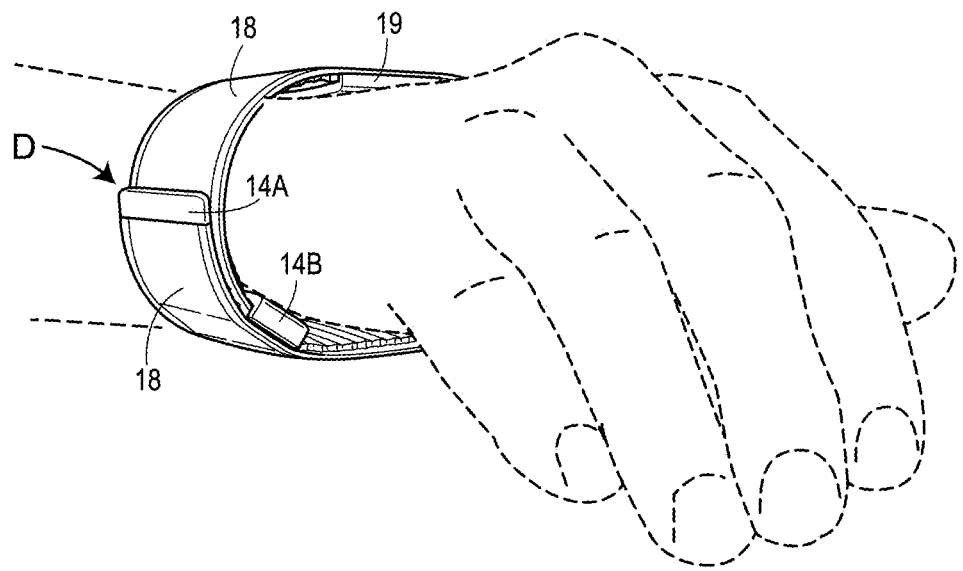
FIG. 14B illustrates the band of FIG. 14A when connected around a user's wrist.

In this case, the electronics module 19 (or the cover associated with that module) acts as a reference mark or reference location that is to be placed at a particular position on a user's wrist, in this case, on the top of a user's wrist. When so placed, the sections of the band 12 extending out from the module 19 are sized to overlap at a position adjacent to the outer side of the wrist of the user. FIGS. 14A and 14B illustrate the band device 10 of FIGS. 13A-C flexed to overlap, with the connection structure on the end 14B being used to hold or attach the ends together. Here, as illustrated by a user's wrist in dotted relief in FIG. 14B, the ends of the band 12 overlap or come together on the outer side of the user's wrist. As such, the flexible electronic display 18 forms a continuous display from the top of the wrist, through the inner side of the wrist to the bottom of the wrist as illustrated by the arrow in FIG. 14A. This continuous usable display enables a user to view a long continuous screen or multiple serial display screens disposed next to one another on the display 18 without there being any discontinuity in the display of these screens, as the user turns his or her wrist between a palm up and a palm down position or vice versa. While the illustration of FIGS. 14A and 14B depict the band device 10 on a right wrist of a user, the band device 10 could be similarly placed on the left wrist with the module 19 still adjacent to the top of the wrist and the ends of the band 12 overlapping on the outer side of the wrist.

FIG. 15 illustrates in more detail the manner in which the end pieces 14A and 14B operate to enable the opposite ends of side of the band 12 to be coupled together. In particular, as illustrated in FIG. 15, the lower end clasp 14B includes a receiving area 332 and notches or grooves 324A and 324B (as described with respect to FIG. 9) to accept a portion of the band 12 from the other end 14A of the band 12 therein. Here, the notice 320 in the band 12 or in the end piece 14A may interact with or fit into the notches 324A and 324B of the end piece 14B to provide a frictional force that holds the ends of the band 12 from moving laterally with respect to one another. Of course, the size or inner circumference of the device 10 can be adjusted by using different ones of the notches 320 on the band near the end 14A. Additionally, as described in earlier embodiments, magnets (not shown in FIGS. 13-15) may be disposed in the end pieces 14A and/or 14B and/or in the ends of the band 12 adjacent to the end pieces 14A and/or 14B to enable or provide a magnetic connection between the ends of the band 12 when the opposite ends 14A and 14B of the band 12 are disposed in an overlapping manner. The magnets may provide an attractive force between the ends of the band 12 to help prevent the ends of the band 12 from moving away from one another in the direction of the arrow in FIG. 15.

FIGS. 16A-16C illustrate the device 10 of FIGS. 13-15 disposed in three different overlapping band positions to illustrate that this device 10 can take on or be adjusted to various different sizes while still providing a flexible electronic display 18 with maximal continuous usable surface area. In this case, the band 12 is approximately 246 mm long, when laid out flat. As will be noted, by coupling the ends 14A and 14B of the band 12 together at different locations, the band device 10 can take on different sizes which may accommodate different sized wrists. For example, in each of the configurations of FIGS. 16A-16C, the inner side of the band device 10 generally forms an oval with different dimensions. In this example case, the smaller band device configuration of FIG. 16A includes a smaller dimension of 35.5 mm (measured from the electronics module 19 across to the band 12) and a larger dimension of 62 mm (from one inner side of the band device 10 to the other inner side of the band device 10). In similar manners, the medium sized band device configuration of FIG. 16B includes a smaller dimension of 41.5 mm and a larger dimension of 69 mm while the large sized band device configuration of FIG. 16C includes a smaller dimension of 45 mm and a larger dimension of 73 mm. In each of these cases, the discontinuity D in the band device 10 (illustrated as the point at which the end 14A of the band begins to overlap the portion of the band below it) is disposed adjacent to the side of the user's wrist and, in particular, the outer side of the user's wrist (as shown in FIG. 14B). Moreover, as can be seen, the band 12 could be adjusted further to be smaller or larger in size and, in most cases the discontinuity D in the band will lie adjacent to the outer side of the wrist.

Figure 17:
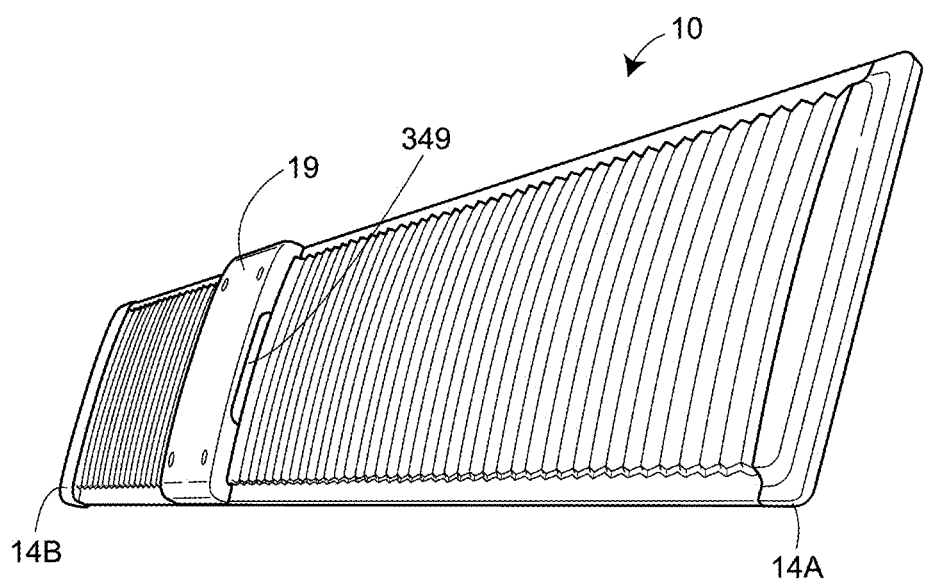
FIG. 17 is a perspective view of the band of FIG. 13 laid out in a flat configuration.

For the sake of completeness, FIG. 17 illustrates the back of the device 10 of FIGS. 13-16 when the band 12 of the device 10 is laid out flat or straight. As can be easily seen in FIG. 17, the electronics module 19 sticks up (or down) from the surface of the band 12 and thus provides a tactile sensation to the user when the user wears the band. This feature, in turn, makes using the module 19 as the reference point for the user when placing the band on the user's wrist more natural, as the user can feel the presence of the module 19 in the correct location on the top (or bottom) of his or her wrist, and thus will know that the band is properly aligned on the wrist to provide for a maximal continuous usable display surface in the manner described above. Still further, as illustrated in FIG. 17, the electronics module 19 may have a single or multiple contact points 349 that may be used to charge a battery (not shown) disposed within the electronics module 19, or to provide other communications between the electronics module 19 and another device such as a base station or a base unit.

Figure 18:
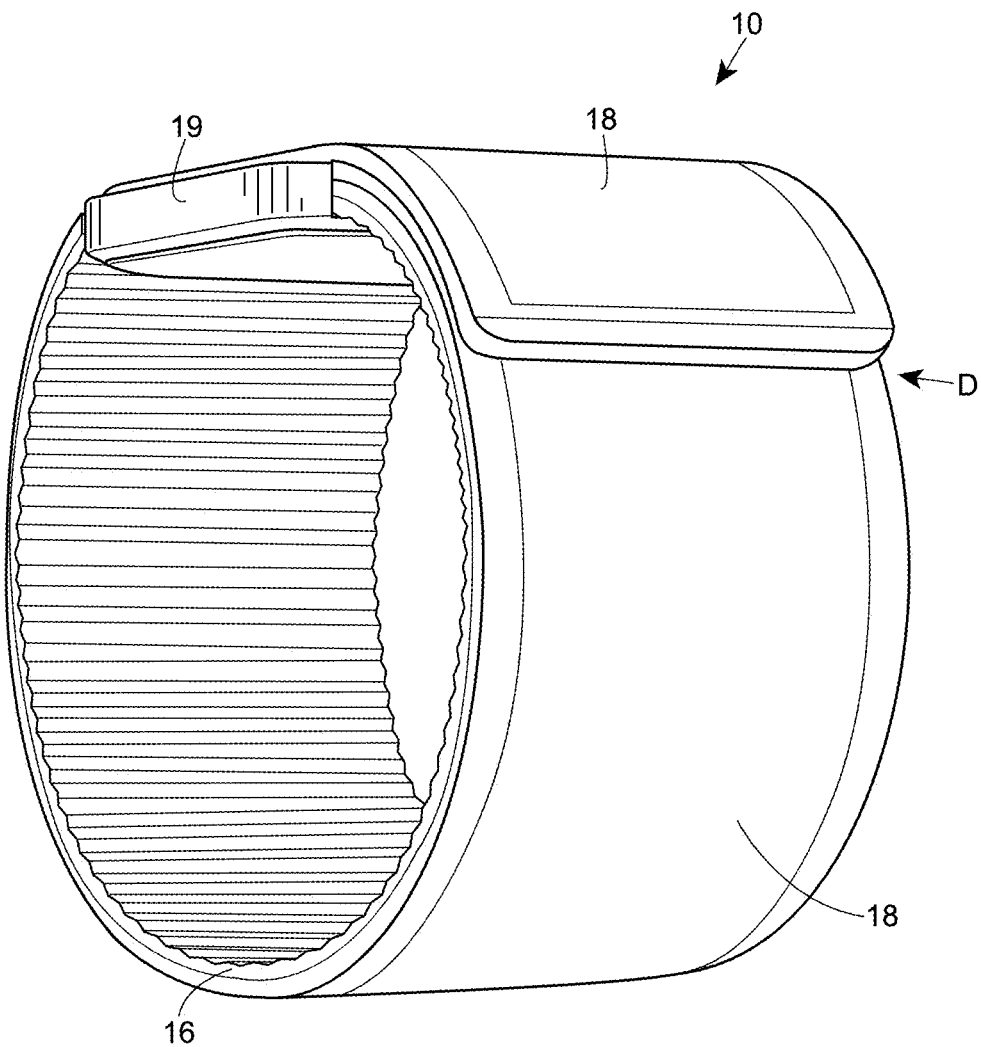
FIG. 18 depicts a further configuration of a band similar to that of FIG. 12, having an electronics module disposed on one end and that is configured to provide maximal continuous display surface to a user when wearing the band.

FIG. 18 illustrates the embodiment of FIGS. 9-12 in more detail to illustrate another example of a band device 10 configured to have a maximal continuous usable display surface by having the clasping or overlapping portions of the band 12 disposed adjacent a side of a user's wrist, such as the outer side of the user's wrist. In this case, the electronics module 19 is disposed on one end of the band 12, but still operates as a reference member or point that is to be located as a particular position on the user's wrist, such as on the top or the bottom of the user's wrist. As illustrated in FIG. 18, when so located, the ends of the band 12 overlap to create a discontinuity D on the side of the device 10 that is adjacent to the outer (or inner) side of the user's wrist. Moreover, further adjustment of the band 12 in the embodiment of FIG. 18 to make the band 12 configured to be smaller will still place the overlapping ends of the band 12 and thus the discontinuity D of the band device 10 on a side of the user's wrist.

Figure 19:
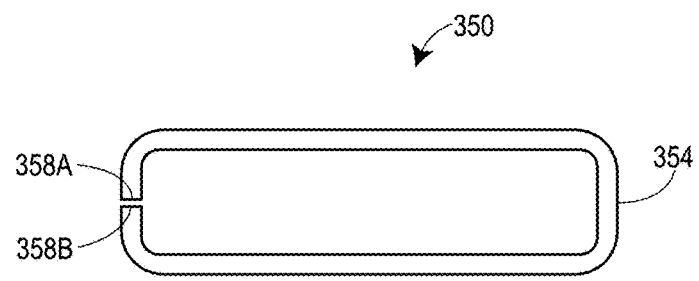
FIGS. 19 and 20 illustrate a further example of an attachable article in the form of a wristband having a flexible display and a connection or clasp that includes magnets and a clasp loop while being configured to provide a maximal continuous display surface to a user when wearing the band.
Figure 20:
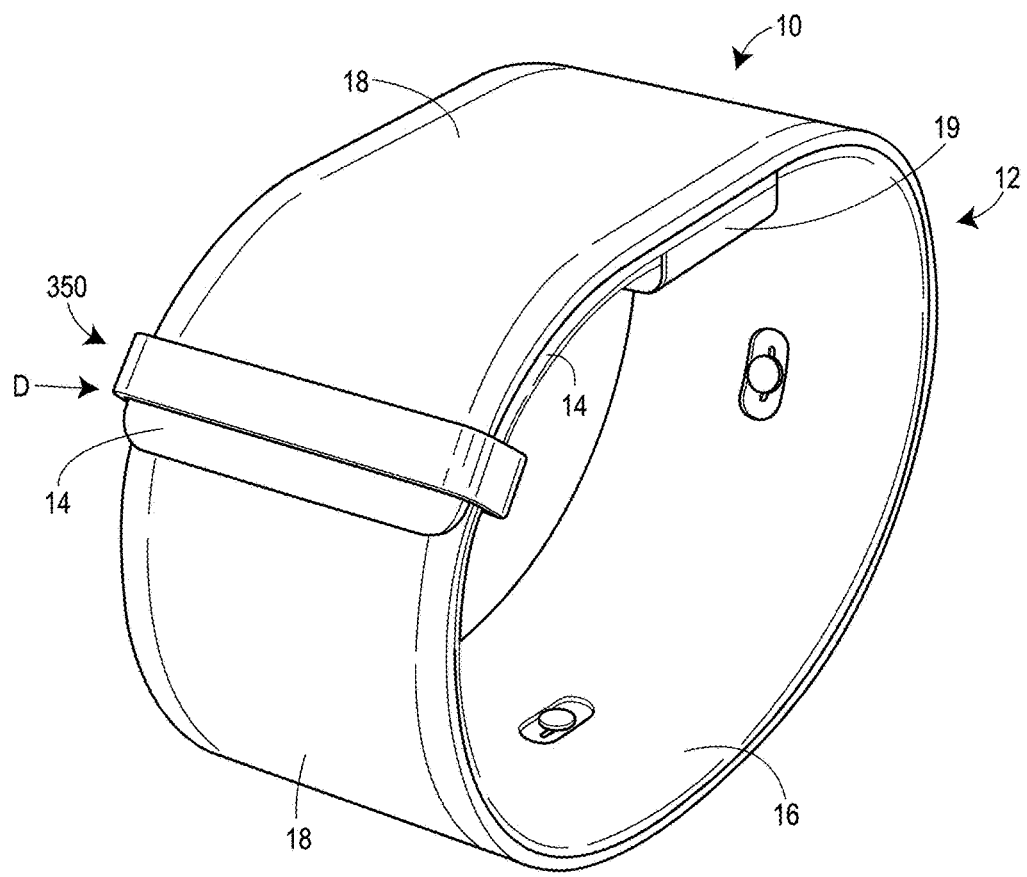

In another embodiment illustrated in FIGS. 19 and 20, the flexible attachable article 10 is similar to the article 10 described above in connection with FIGS. 9-12. In this embodiment, however, the article 10 includes a mechanical connector 350 instead of the mechanical connectors 320 and 324 described above in connection with FIGS. 9-12. As illustrated in FIG. 19, the mechanical connector 350 is or takes the form of a clasping structure. The clasp 350 has a flexible body 354 that has an oval-shaped cross-section and two opposing end portions 358A and 358B spaced apart from but closely adjacent to one another.

When the flexible band 12 of the device 10 is bent to be disposed on or around an object (e.g., a wrist), and after portions of the device 10 are magnetically connected to one another (e.g., via the magnets 22A, 22B, 24A, and 24B not shown), the clasp 350 can be installed on the device 10 to mechanically connect two overlapping portions of the device 10, as illustrated in FIG. 20. Specifically, the flexible body 354 of the clasp 350 can be manipulated such that the clasp 350 can be slid or positioned over the two overlapping portions of the article 10. For example, the opposing end portions 358 of the clasp 350 can be pulled apart from one another, after which the clasp 350 can be slid or positioned over the two overlapping portions of the band 12. The clasp 350 can, in some cases, be positioned over one or both overlapping ends 14 (e.g., proximate to the magnets 22A, 22B, 24A, 24B), while, in other cases, the clasp 350 can be positioned over other overlapping portions of the band 12. In any event, because the body 354 is flexible, the body 354 can be restored to its original shape after being manipulated and positioned over the two overlapping portions of the device 10. The clasp 350 can be retained in the installed position by virtue of the shape of the body 354 and the thickness of the overlapping portions of the device 10.

Of course, the clasp 350 can be constructed differently and yet still perform the intended function. In other embodiments, the clasp 350 can have a differently-shaped body 354. The body 354 can, for example, have more of a circular shape, more of a rectangular shape, or have some sort of other suitable shape. In other embodiments, the body 354 can be formed of two or more discrete sections that can be removably coupled to one another to facilitate the installation or removal of the clasp 350. These sections could, for example, be snapped or hooked to one another. Depending on the construction of the clasp 350, the clasp 350 can, in other embodiments, also be installed differently and yet still perform the intended function. When, for example, the body 354 is formed of two or more sections that can be removably coupled to one another (such as by being hinged), one or more of the sections could be removed from the other section(s) to allow the clasp 350 to be installed on the device 10. Once the clasp 350 is positioned properly, the sections could be again coupled together to install the clasp 350 thereon. In still another embodiment, the clasp 350 could be rigid or semi-rigid and form a member that encircles (partially or completely) one portion of the band 12 and that slides over the other end portion of the band 12 when the band 12 is folded over on itself as illustrated in FIG. 20.

However, as further illustrated in FIG. 20, the device 10 is configured to provide maximal continuous usable display surface to a user wearing the device 10 as the discontinuity D in the display 18 occurs at the side of the device (i.e., adjacent a side, such as the outer side, of a user's wrist when worn on the wrist). Here again, the electronics module 19 may act as the reference point that is disposed adjacent a particular part of the user's wrist, such as the top of the wrist, so that the discontinuity D in the electronic display 18 which now occurs at or near the clasp 350 is disposed at a point adjacent to the side of the user's wrist. In this embodiment, as in the embodiment illustrated in FIGS. 9-12, the electronics module 19 is the reference point and is also disposed at one end of the band 12.

In another embodiment illustrated in FIGS. 21-24, the flexible attachable article 10, again illustrated in the form of a wristband, includes a similar band portion 12 and ends 14A and 14B. However, in this embodiment, the article 10 has a connection structure that includes the magnets 22A, 22B, 24A, and 24B described above, but also includes a buckle clasp 380 that can effectuate a mechanical connection between the ends 14A and 14B, such that the ends 14A and 14B can be mechanically and magnetically connected to one another when the device 10 is bent, as illustrated in FIG. 24, to form a circular or oval band with the display 18 on the outside of the band 12 while also providing maximal continuous usable display surface to a user. As illustrated in FIG. 21, the buckle clasp 380 is connected to the end 14A (although it can be connected to the end 14B in other embodiments) and has a frame 384. The frame 384 includes a first frame portion 386A, a second frame portion 386B, and a pair of sides 388 that each connect the first frame portion 386A and the second frame portion 386B. The buckle clasp 380 further includes an opening 390 defined between the first and second frame portions 386A, 386B. As depicted in FIG. 22 (which illustrates a partial side view of the band 12), the article 10 in this embodiment includes a plurality of grooves or notches 392 defined in the end of each of the opposing sides 394 of the article 10 which may cooperate with similar grooved structure on the inside surfaces of the sides 388 of the frame 384.

When the flexible band 12 is bent to be disposed on or around an object (e.g., a wrist), the end 14B can be inserted or fed through the opening 390 in the buckle clasp 380, as shown in FIGS. 23 and 24, and manipulated (e.g., pushed, pulled, etc.) to the desired position (which is based on the desired size of the article 10 and the size of the wrist, for example). In turn, the buckle clasp 380 and the magnets 22A, 22B, 24A, and 24B serve to connect the ends 14A and 14B in the desired position while mechanical interactions between the frame portions 386A and 386B and the upper and lower sides of the band 12, as well as mechanical interactions between the sides 388 and the sides 394 of the band 12 limit movement of the band 12 in the lateral direction. Specifically, the first frame portion 386A applies a resistive force on a top or upper side of the device 10, which prevents movement of the ends 14A and 14B relative to one another. In addition, as depicted in FIG. 23, an interior portion of each of the sides 388 (which may be grooved or otherwise provided with a rough surface treatment) engages or contacts a respective plurality of corresponding grooves or notches 392, which also serves to prevent movement of the ends 14A and 14B relative to one another. At the same time, the magnets 22A, 22B, 24A, and 24B, by virtue of being in proximity to one another, create or provide a magnetic force that also serves to hold the ends 14A and 14B together. In this manner, the ends 14A and 14B can be both mechanically and magnetically connected to one another when the device 10 is disposed on or around the desired object, as shown in FIG. 24.

In the embodiment of FIG. 24, the electronics module 19 is illustrated as being on the bottom of the device 10 when the ends 14A and 14B are connected and, in this case, the electronics module 19 may be a reference point or reference element that is to be located near or adjacent the bottom of the user's wrist so as to provide the discontinuity in the electronics display 18 on the outer side of the user's wrist, as illustrated in FIG. 24.

Each of the embodiments of FIGS. 9-24 use the electronics module 19 or a portion thereof, such as the casing or cover of the electronics module 19, as a reference element which is to be placed at or adjacent to a particular point on a user's wrist, such as on the top or bottom of the user's wrist, so that the discontinuity in the electronic display 18 (e.g., where the ends of the band 12 meet or begin to overlap) is on one of the sides of the user's wrist, and preferably is on or adjacent to the outer side of the user's wrist. However, other things could be used as the reference element instead or as well. For example, the reference element could be any rigid element (e.g., other than the electronics module 19) such as a rigid bar or a point on the band 12 to be disposed at a particular location on the user's wrist. Alternatively, the reference element could be a printed, etched, or other non-rigid member or indication on the band 12 indicating the location of the band 12 that is to be placed on or adjacent to a particular point of the user's wrist, such as the top of the wrist or the bottom of the wrist or even one of the sides of the user's wrist. The reference element could additionally or alternatively be a weighted element that has, for example, more weight per unit volume than the other components of the band device 10. The reference element could be a surface treatment, such as a particular rough surface, a point, a line that is distinguishable by touch or sight (e.g., a ridge extending across the band 12 in the transverse direction), etc. The reference element could be disposed on the bottom of the band 12 so that it is viewable and/or able to be felt (e.g., by the wrist) from the underside of the band 12 or could be located on the top of the band 12, one or more of the sides of the band 12, or the edges of the band 12, or any combination thereof and be viewable or able to be felt by the user. If desired, the reference element could be displayed on the flexible electronic display 18 at a particular point on the display instead of being located on or printed on the band (in which case the reference element is still coupled to the band 12). Moreover, the reference element could stick out from the upper or lower surface of the band 12 to be able to be seen or felt better or could be an indentation or reduced surface or void disposed within the band 12. As examples, the reference element could be a harder point on the band 12 that can be felt by the user when, for example, placing the band 12 on a wrist, but could otherwise not be viewable or distinguishable by sight. To the contrary, the reference element could be visible by sight but not be distinguishable by touch. Moreover, the reference element may be located at a point or position on the band 12 that is to be adjacent to any part of the wrist, such as the top of the wrist, the bottom of the wrist, the inner side of the wrist or even the outer side of the wrist.

Moreover, while the embodiments having maximal continuous useable display surface features as described herein are generally described using an adjustable band with overlapping ends, the same principles could be used on a non-adjustable (in length) band having an end-to-end connection mechanism, such as that described with respect to FIGS. 1 and 2, and 8A and 8B. In this case, the end-to-end connection will be located at a position disposed adjacent to the outer (or possibly inner) side of the user's wrist.

In other embodiments, the connection structure can include any of the above-described mechanical connectors in combination with a different configuration of magnets. For example, the connection structure can include the clasp 350 in combination with the magnetic materials 20A and 20B described in connection with FIGS. 1 and 2. Moreover, in other embodiments, the connection structure can utilize one or more of the above-described mechanical connectors and/or other mechanical connectors in combination. For example, the connection structure could alternatively include the recess 300 and the tab 304 as well as the clasp 350. Such a connection structure would provide an even stronger and more durable connection between the end pieces 14 of the device 10. In further alternative embodiments, different mechanical connectors, other than those described above can be used. For example, the connection structure can include a recess formed on a top or bottom side of one of the clasps 14 and a cooperating tab that extends upward from one of the clasps 14 and can be inserted into the recess.

Figure 25A:
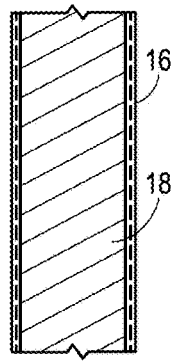
FIGS. 25A-25B illustrate a top and a cross-sectional view of a flexible wristband device having a structure that protects the edges of a flexible electronic display disposed thereon.
Figure 25B:
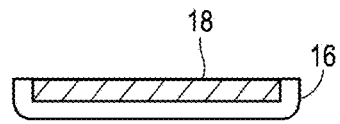
Figure 26:
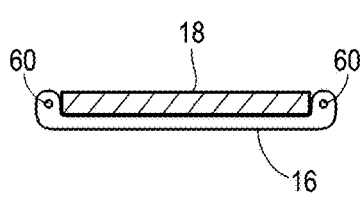
FIG. 26 illustrates a cross-sectional view of a flexible wristband device illustrating further side protection structure for protecting the edges of a flexible electronic display.

It may be important to limit in the manner in which the flexible support 16 can bend or flex so as to protect the flexible display 18 and/or the touch screen interface 26 of FIGS. 1-24, as well as to provide or protect the edges of those devices, which might be subject to impact if the dynamically flexible article or device 10 is hit from a lateral side. FIG. 25A illustrates a top view of the flexible support 16, showing the flexible display 18 disposed thereon. In this case, the flexible display 18 is disposed on top of the flexible support 16 over the center portion of the support 16, while the edges of the support 16 extend out transversely towards the sides of the device 10 beyond the flexible display 18 at least a little bit. This additional area of material of the support 16 may be used to protect the flexible display 18 from being bent or torn in the case of a side impact to the device 10, as this material will operate to blunt or absorb some of that impact. As illustrated in FIG. 25B, which provides a cross-sectional view of the device 10 of FIG. 25A, the flexible support 16 can be thicker in the area at the edges of the device 10 and may extend upward to be even with or disposed above the lateral or transverse sides of the flexible display 18, to provide additional side impact protection for the flexible display 18. In this case, as illustrated in FIG. 25B, the display 18 is seated in a space or crevice formed within the center of the support 16, wherein the support 16 has sidewalls that extend above or up against the edges of the flexible display 18, in order to provide side impact protection to the display 18. In some cases, the edge or sidewalls of the support 16 that extend upward to protect the edges of the flexible display 18 and/or the touch screen interface 26 (if present) may be formed with stitching when the support 16 is made of leather for example. In another embodiment, illustrated in FIG. 26, additional side impact protection is provided by a wire or other harder, rigid or semi-rigid material 60 (having a density greater than that of the flexible support material 16, but that is still flexible) disposed within or along the flexible support 16 along the edges of the flexible display 18 near or adjacent to the sides of the flexible display 18. As illustrated in FIG. 26, the wires 60 are provided within the flexible support material 16 and extend along the edge of the band portion 12 next to or adjacent the transverse sides of the flexible display 18 to provide superior support or edge protection for the display 18 in the case of a side impact to the device 10. Of course, other types of edge protections besides those illustrated in FIGS. 25 and 26 can be used to protect the edges of the of the flexible display 18. Here, the transverse sides are the sides extending in the lateral direction between the lateral ends of the display 18.

FIGS. 27-44 illustrate structures that can be used to protect the flexible display 18 and the touch screen interface 26 (if it exists) by limiting the certain flexing, bending and/or torsional movement of the flexible support 16, and thus the display 18 disposed thereon, to certain predefined bending motions or ranges. In particular, because the flexible display 18 is formed as a set of separate substrates having different electronic components formed or etched thereon, as will be described herein, certain types of movement or bending motions may cause damage to the flexible display 18 by causing these layers to delaminate or come apart from one another. In particular, while it is generally possible to flex or bend the band portion 12 in one direction (e.g. around a wrist to form a circular band such as that shown in FIGS. 2 and 4) without delaminating the separate layers of the flexible display 18, it is typically not generally desirable or possible to be able to flex or bend the display 18 in the opposite direction or in multiple different directions, such as forming a circular band with the flexible display 18 facing the inside of the band, as doing may cause the layers of the flexible display to delaminate from one other and thus stop functioning.

More particularly, while it is desirable to bend the flexible support 16, as illustrated in FIGS. 2 and 4, such that the display 18 faces towards the outside of a circular ring (i.e., wherein the display surface of the flexible electronic display through which the image content is viewable is bent to be convex and the surface of the flexible electronic display disposed near or adjacent the support structure is bent to be concave), it would be disadvantageous and potentially destructive to the flexible display 18 to bend the device 10 to far in the opposite manner (referred to herein as a counter-rotational direction), i.e., with the display 18 on the inside of the ring (wherein the display surface of the flexible electronic display through which the image content is viewable is bent to be concave and the surface of the flexible electronic display disposed near or adjacent the support structure is bent to be convex). In particular, bending in the counter-rotational direction would or could potentially delaminate the various layers of the flexible display 18 from one another. Still further, it would be undesirable to provide too much flexing of the sides of the flexible display 18 around the longitudinal axis of the band 12 or too much torsional bending on the flexible display 18, wherein such torsional bending rotates one of the ends 14 around the longitudinal center line of the band 12 with respect to the other of the ends 14, thus forming a helical structure in the band 12. In this case, torsional rotation would occur when one end of the flexible display 18 is rotated in one direction while the other end of the flexible display 18 is rotated in the other direction, such as by rotating one of the end pieces 14 about the center longitudinal axis of the band 12 in a clockwise direction while simultaneously rotating the other end piece 14 about the center longitudinal axis of the band 12 in a counterclockwise direction (from the same viewpoint) simultaneously. Again, as will be understood, too much of such a bending movement could delaminate the flexible display 18 and/or otherwise damage the flexible display 18.

FIGS. 27-44 illustrate various mechanisms for limiting the bending or flexing motion of the flexible support 16 of the device 10 to the desired bending motions like those illustrated in FIGS. 2, 4, 7A, 8B, 12, 14, etc., while limiting undesirable bending motion such as, for example, longitudinal flexing and torsional or counter-rotational flexing of the display 18. In particular, these or other mechanical structures can be used to limit the bending motion of the flexible substrate to a minimal radius of curvature (e.g., in the rotational direction, such as when the display surface of the flexible electronic display through which the image content is viewable is bent to be concave and the surface of the flexible electronic display disposed near or adjacent the support structure or flexible band is bent to be convex) to be greater than or equal to the minimum critical bending radius of the flexible electronic display. Here, the minimum critical bending radius of the flexible electronic display is the minimal or smallest bending radius at which further bending will impair or destroy the functionality of the flexible electronic display by, for example, breaking the electronic connections or other components in the flexible electronic display. Such a minimal critical bending radius may be defined by a single bend or by multiple repeated bends.

Figure 27A:
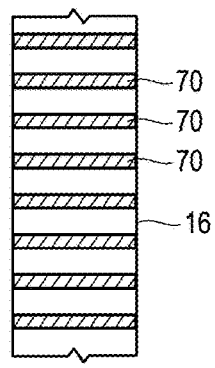
FIG. 27A illustrates a top view of a flexible support of a wristband device having a torsional and transverse bending limiting structure in the form of a number of transverse spacers.
Figure 27B:
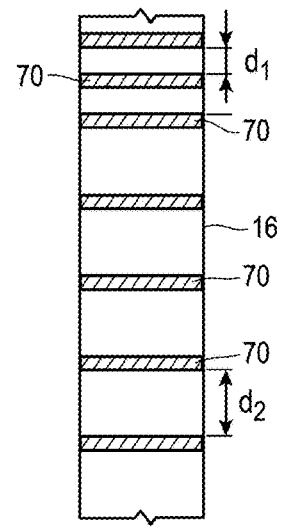
FIG. 27B illustrates a top view of a flexible support of a wristband having a torsional and transverse bending limiting structure in the form of a number of transverse spacers spaced at different distances from one another.

As shown in FIGS. 27A and 27B the support 16 can include a series of spacers or bars 70 disposed between sections of the band portion 12 from one side of the band 12 to another side of the band 12 (i.e., oriented transversely) across the band portion 12. The spacers 70 operate to limit or reduce the amount of torsional rotation that is able to be applied to the substrate 16 and also limit the amount of longitudinal rotation that can be applied to the band 12. More specifically, the material, size, number, and/or spacing of the spacers 70 within the flexible support 16 may be varied to define, and thus limit, the amount of torsional motion that can be applied to the support 16. To this end, the spacers 70 can be made of a material, such as a rigid or semi-rigid material like hard plastic or metal, that is stiffer or more inflexible than the material from which the band 12 is made. In other embodiments, the spacers 70 and the support 16 can be made of the same material, but the spacers 70 may comprise a thicker or denser configuration of that material. In yet other embodiments, the support 16 may be made of a bendable metal that bends easily at large radii of curvatures (i.e., small bending angles) but that increases in stiffness or non-elasticity at smaller radii of curvatures (i.e., larger bending angles). The spacers 70 may be separately formed and then disposed within or on the support 16 or may be manufactured as part of the support 16. For example, the spacers 70 can be molded on the underside of the band portion 12. In FIG. 27A, the spacers 70 are evenly spaced across the band portion 12, such that all portions of the band portion 12 are subject to the same bending or flexing limit. Alternatively, one or more of the spacers 70 can be spaced at different distances from one another across the band portion 12. In FIG. 27B, the spacers 70 are spaced at different distances across the band portion 12 (i.e., d2 is greater than d1), such that different portions of the device 10 (e.g., the sides) can be bent or flexed more than other portions of the device 10 (e.g., the top and the bottom). The spacers 70 may also operate to absorb side impacts to the band 12. For example, the support 16 can have a width that is at least slightly larger than the width of the flexible display 18, such that the spacers 70 also act as side impact protection structure.

Figure 28:
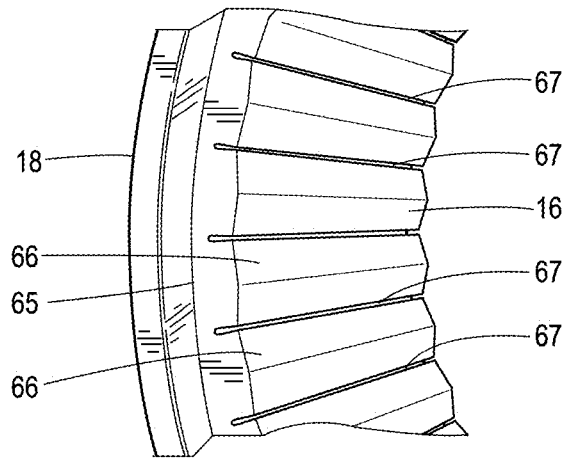
FIGS. 28-29 illustrate a flexible support of a wristband having a torsional, transverse and lateral bending limiting structure in the form of a plurality of grooves formed in an underside of the flexible support and evenly spaced from one another.
Figure 29:
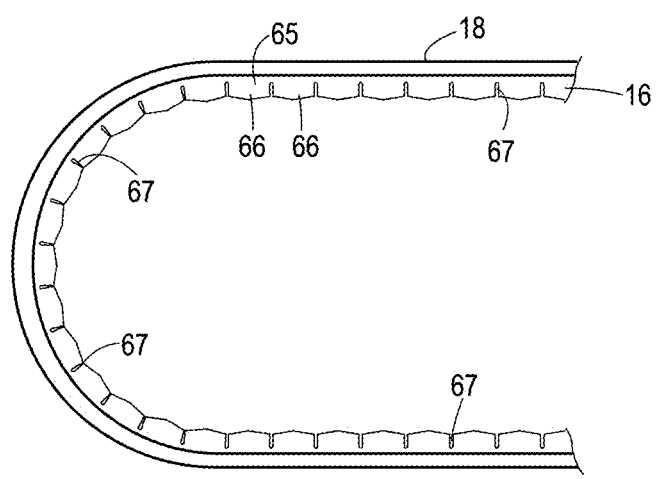

In FIGS. 28-29, the support 16 and the flexible display 18 are integrally formed with one another. As illustrated in FIG. 28, a plurality of grooves 67 are formed (e.g., molded) in an underside of the support 16 of the band 12 from one side of the band 12 to another side of the band 12 (i.e., oriented transversely) across the band portion 12. As illustrated in FIG. 28, each groove 67 extends through only a portion of the thickness of the support 16, such that the support 16 includes a continuous bottom layer of material 65 immediately adjacent an underside of the flexible display 18 and a plurality of sections or islands 66 that jut or extend upward from the bottom layer 65 adjacent respective grooves 67. The grooves 67 illustrated herein each have a U-shape, but can, in other embodiments, have a different shape (e.g., a rectangular shape, a triangular shape, can be more curved, can be flatter, etc.) So defined, each groove 67 forms a sort of "living hinge" that operates to control (e.g., limit or reduce) the amount of bending between the sections 66 of the support 16 that are adjacent to that groove 67. FIG. 29 illustrates how the grooves 67 can, when the band 12 is being bent, operate to control the amount of bending between the sections 66 of the support 16, and, in turn, control the amount of bending applied to the display 18. Because the grooves 67 are evenly spaced apart across the band portion 12, all of the sections 66 of the support 16 are subject to the same bending or flexing limit. The material forming the bottom layer of material 65 and the material forming the islands 66 may be made of the same or different material and each may be made of either compressible (such as foam, rubber, etc.) or non-compressible materials (such as hard plastic, metal, etc.) In fact, both of the layers 65 and 66 may be made of non-compressible materials, one of the layers 65 and 66 may be made of a compressible material while the other layer may be made of a non-compressible material, or the layers 65 and 66 may be both made of compressible materials with the same or different compressibility. Of course, the spacing between the various groove 67 can vary to provide for more or less flexing of the support 16. Moreover, for the sake of illustration, the embodiment of FIGS. 13-17 may include the living hinge material or support illustrated in FIGS. 28 and 29 to limit the bending motion thereof as well as to provide for a soft feel or touch to the user.

As with the spacers 70, the size, number, spacing and/or compressibility of the material forming the grooves 67 may be varied to define, and thus limit, the amount of torsional or other bending motion that can be applied to the support 16. For example, while the grooves 67 shown in FIG. 28 only extend through a portion of the support 16, the grooves 67 can, in other embodiments, may extend through more or less of (deeper or less deep into) the support 16, which would, in turn, affect the degree of curvature permitted by the grooves 67. As noted above, the grooves 67 illustrated in FIGS. 28-29 are evenly spaced across the band portion 12, such that all portions of the band 12 are subject to the same bending or flexing limit.

Figure 32:
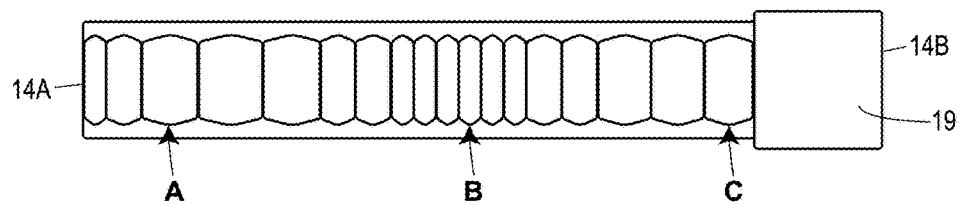
FIGS. 32 and 33 illustrate a flexible support of a wristband having a torsional, lateral and transverse bending limiting structure in the form of a plurality of grooves formed in an underside of the flexible support and spaced apart from one another at various distances.
Figure 33:
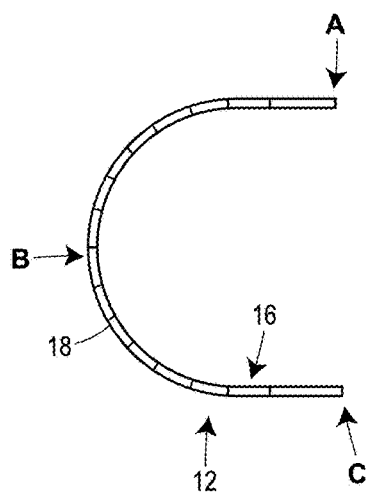

Alternatively, however, one or more of the grooves 67 can be spaced at different distances across the band 12, with the effect that different portions of the device 10 (e.g., the sides) can be bent or flexed more than other portions of the device 10 (e.g., the top and the bottom or one side versus the other side of the band). For example, in an embodiment illustrated in FIGS. 32 and 33, the grooves 67 are spaced at different distances across the longitudinal span of the band 12. As illustrated in FIG. 32, the distance between the grooves 67 near or at the end 14A is greater than the distance between the grooves 67 near or at a middle portion of the band 12, and the distance between the grooves 67 near or at the end 14B is greater than the distance between the grooves 67 near or at the middle portion. As illustrated in FIG. 33, different portions of the device 10 can thus be bent or flexed more than other portions of the device 10. Specifically, the portion of the band 12 labeled B, by virtue of having grooves 67 that are spaced closer to one another, can be bent or flexed more than the portion of the band labeled A and the portion of the band 12 labeled C, which have grooves 67 that are further apart. Moreover, the width of the grooves 67 can be varied to provide more or less flexing in the band at particular locations.

Figure 30:
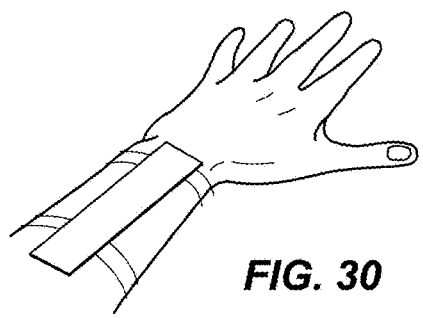
FIG. 30 illustrates a wristband device disposed along an arm of a user to form an armband.

In some cases, a user of the device 10 may find it necessary (e.g., for viewing the display 18) to bend the band 12. A user of the device may, for example, find it necessary to apply a small amount of torsional rotation to portions of the flexible display 18 and/or flex the side of the flexible display 18 around the longitudinal axis of the band 12. Such motion may be necessary when, for example, the device 10 is disposed along an arm of the user, as illustrated in FIG. 30. To permit such operations, but at the same time prevent bending that may comprise the effectiveness or even destroy the flexible display 18, the article 10 can include one or more transverse grooves or spacers formed or disposed in the support 16.

Figure 34:
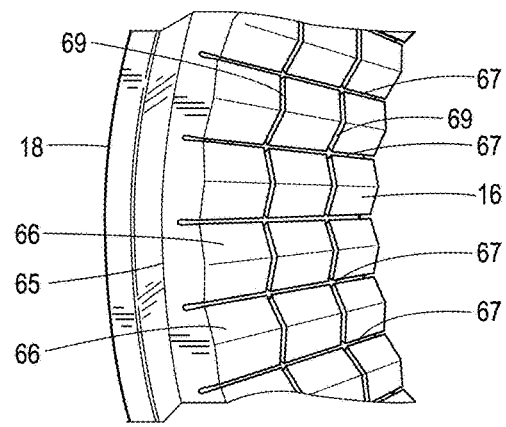
FIG. 34 illustrates a partial perspective view of a flexible support of a wristband having torsional, transverse and lateral bending limiting structure in the form of a number of longitudinal and transverse grooves formed in the flexible support.

In FIG. 34, for example, the article 10 includes a plurality of longitudinal grooves 69 formed in the support 16 between the ends 14 and along the longitudinal axis of the band 12. The grooves 69 can thus be oriented perpendicular to the grooves 67 described in FIGS. 28-29. The grooves 69, like the grooves 67, operate to permit a desired maximum amount of flexing and torsional rotation of the display 18. The grooves 69, however, permit a desired amount of flexing and torsional rotation in a direction perpendicular to the longitudinal axis of the band 12.

As with the transverse grooves 320, the size, width, number, and/or spacing of the longitudinal grooves 69 may be varied to adjust this maximum amount, limit flexing or rotation at certain points along the display 18, and/or facilitate flexing or rotation at certain points along the display 18. For example, the grooves 69 can be larger (e.g., wider) than what is illustrated in FIG. 34, can be formed in only a portion of the support 16, or can be more numerous (e.g., there can be a groove 69 between each of the transverse grooves) than what is illustrated in FIG. 28. Likewise, the grooves 69 can be spaced and/or positioned differently. As an example, the grooves 69 can be disposed closer to the edges of the band 12 (i.e., not on the longitudinal axis of the band 12). Of course, if desired, one or more of the spacers 70 discussed above in connection with FIGS. 27A and 27B can be disposed in a longitudinal direction (i.e., along the longitudinal axis of the band 12) in the support 16. These grooves can also be equally spaced or the same size, or may vary as they get farther from the longitudinal center of the band to allow more or less torsional bending at different points along the width of the band 12.

Figure 31:
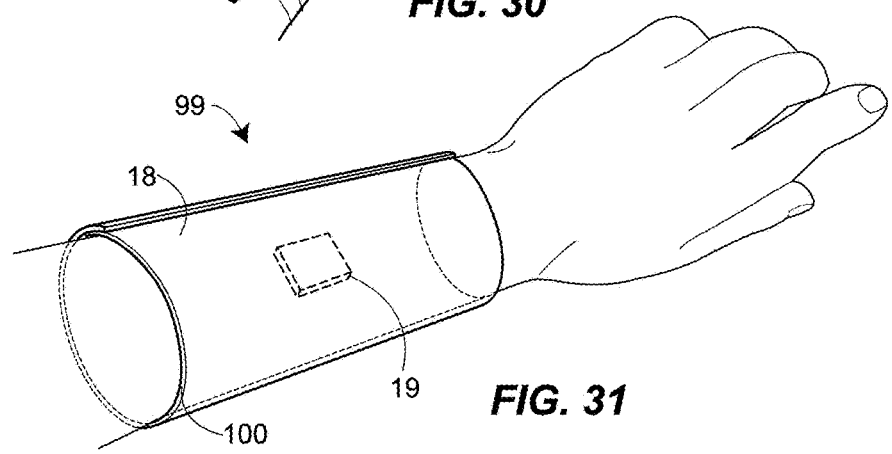
FIG. 31 illustrates an armband device disposed around the arm of a user using the principles described herein.

Still further, while the functioning and configuration of a band and the routines performed on the band have been described with respect to a wrist band that is longer than it is wide, when laid flat, the same structure and techniques can be used for other types of bands, such as arm bands. FIG. 31, for example, illustrates an arm band 99 in which the display 18 wraps around a larger part of a user's arm, as opposed to just the wrist. In this case, the band 100 may be wider (along the transverse direction) than it is long (along the longitudinal or lateral direction) when laid flat. However, in this case, the display 18 and the electronics module 19 may be configured in any of the manners described above. In particular, the band 99 can be configured to have a reference point, such as the electronics module 19, disposed adjacent to the top of a user's wrist while having the discontinuity in the display 18 occur at a point adjacent to the outer side of the user's wrist, as illustrated in FIG. 31. Of course, any of the methods or structures described above may be used to provide a connection between the ends of the arm band 99 at the point at which the ends of the arm band 99 overlap or meet.

There are of course other manners of limiting the counter rotational bending motion of the band 12, i.e., a bending motion that would put the flexible display 18 on the inside of a circular band as opposed to the outside of the circular band as illustrated in FIGS. 2 and 4. For example, a longitudinally spaced rigid or semi-rigid member can be disposed in or on the flexible support 16 that operates to allow bending motion as illustrated in FIGS. 2 and 4 but to limit counter-rotational bending movement to, for example, the minimal critical radius of curvature of the flexible electronic display. FIGS. 35-42 illustrate a bending limiting member 71 configured as a set of interconnected slats or bars rotatable with respect to one another around a pivot point 72.

Figure 35:
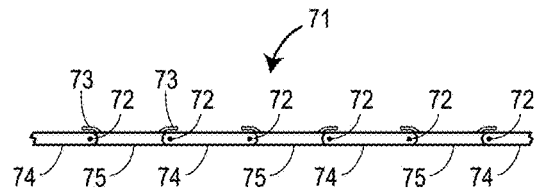
FIGS. 35-41 illustrate views of various bending limiting members that limit the flexing motion of a flexible support in at least one direction while allowing particular flexing motion in another or opposite direction.

In FIG. 35, the interconnected slats or bars have alternating flat members 74 and flat members 75 with wings or protrusions 73 on the edges thereof, wherein the wings 73 are disposed above the adjacent flat members 74. The flat members 74 are pivotally connected to the flat members 75 so that the wings 73, when disposed above a flat member 74, prevent or at least limit rotation about the pivot point 72 in one direction while allowing such rotation in the opposite direction.

Of course, if desired, the shape and/or curvature of the wings 73 can be varied to permit more or less rotation about the pivot point 72. In some cases, it may be desirable to vary the shape and/or curvature of only some of the wings 73. For example, wings 73 that permit greater bending can be used at or along sections of the band 12 (e.g., the sections disposed along the sides of the wrist) where more curvature is desirable.

Figure 36:
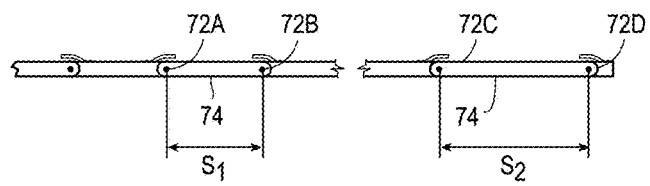
Figure 37:
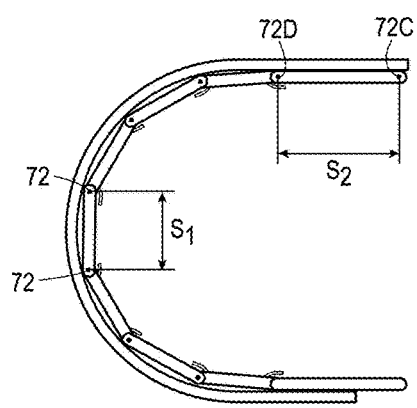

In some cases, the spacing between the pivot points 72 may be adjusted to control (e.g., adjust) the minimum radius of curvature at which the band 12 can be bent, and, in turn, provide a more comfortable oval-shaped band 12 when worn (in contrast to a less comfortable circular-shaped band 12). As shown in FIG. 36, the spacing between the pivot points 72 can be different at different points along the band 12. In other words, the pivot points 72 in one section of the band 12 may be a distance of d1 apart from one another, while the pivot points 72 in another section of the band 12 may be a distance of d2 apart from one another, d2 being greater or less than d1. For example, the spacing between pivot point 72A and 72B ($S_1$ in FIGS. 36 and 37) is less than the spacing between pivot point 72C and 72D ($S_2$ in FIGS. 36 and 37). As such, different sections of the band 12 (e.g., the sections disposed along the sides of the wrist) can be bent or flexed more than other portions of the band 12 (e.g., the sections disposed along the top and the bottom of the wrist), thereby facilitating the formation of a more oval-shaped band 12, as illustrated in FIG. 37.

Figure 38:
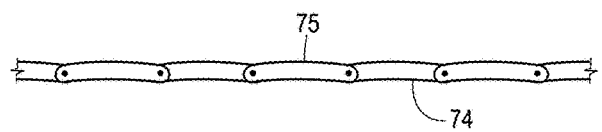
Figure 39:
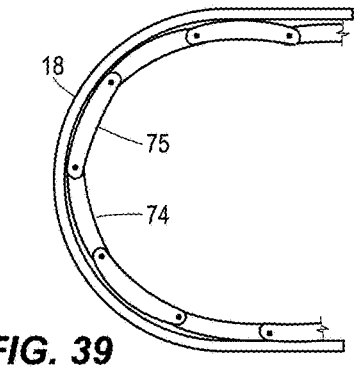

As shown in FIG. 38, the interconnected bars 74 and 75 can be arched or curved. As illustrated in FIG. 39, such a configuration serves to reduce, or even eliminate, the sharpness of the bending at the pivot points 72, thereby providing a more continuous shape when the band 12 is bent. In some cases, it may be desirable to arch the bars 74 and 75 so that the local display bending radii at the pivot points 72 are equal and opposite when the band 12 is both flat and bent (e.g., disposed around the wrist).

Figure 40:
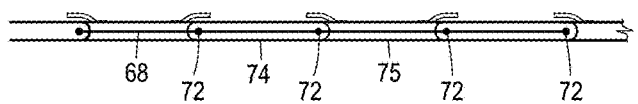

In some instances, it may be desirable to limit the number of configurations that the device 10 can take on, such as, for example, cheap-looking configurations, configurations that provide a confusing user experience, or configurations in which the device 10 is likely to be damaged. To this end, one or more of the pivot points can be connected together with or using an interconnecting wire. As shown in FIG. 40, the pivot points 72 are connected together with or using an interconnecting wire 68. In some cases, several interconnecting wires 68 may be needed to connect different groups of pivot points 72. For example, one wire 68 may be utilized to interconnect pivot points 72 disposed along one side of the band 12, while another wire 68 may be utilized to interconnect pivot points 72 disposed along the opposite side of the band 12. In any event, the interconnecting wire(s) 68 serve(s) to synchronize the movement of the pivot points 72 that are connected to one another, which, in turn, fixes the angle between interconnected bars 74 and 75 for those pivot points 72 that are connected together.

Figure 41:
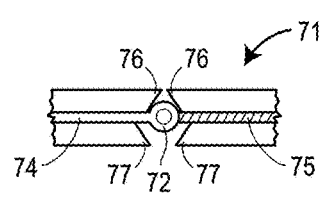

In FIG. 41, interconnected bars 74 and 75 are connected at pivot points 72 and each includes a protrusion 76 that extends at least partially above the pivot point 72. In this case, the protrusions of adjacent bars 74 and 75 contact each other very soon (in response to minimal rotation about the pivot point 72) when rotated in one direction, to thereby limit or prevent such rotation, and allow rotation in the opposite direction. Moreover, the interconnected bars 74 and 75 may additionally include protrusions 77 that extend below the pivot point 72 but that are spaced further apart and thus allow more rotation than the protrusions 76. The protrusions 77 will thus enable the member 71 to bend in one direction (i.e., the down direction in FIG. 41) more than in the other direction (i.e., the up direction in FIG. 41). However, the protrusions 77 will still prevent bending or flexing at large angles of curvature and the spacing and interaction of the protrusions 76 and 77 can be configured to limit the minimal bending radius of the support element 71 to the greater than or equal to the minimum critical bending radius of the flexible electronic display 18 disposed on the support element 71, to thereby protect the flexible electronic display 18. In any event, the spacing and size of the protrusions 76 and 77 can be adjusted to obtain the desired amount of flexing in each direction.

Figure 42:
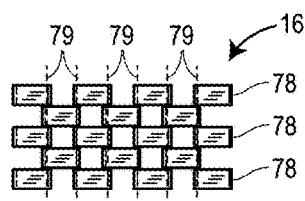
FIG. 42 illustrates a top view of a bending or flexing limiting structure forming a flexible support, formed as a series of transversely interconnected longitudinal members, each longitudinal member made up of a set of longitudinally disposed links.

Still further, FIG. 42 illustrates a top view of a bending or flexing limiting structure forming a flexible support, formed as a series of transversely interconnected longitudinal members 78, each longitudinal member made up of a set of longitudinally disposed links. Here, the various sets of rotatably interconnected links are rotatably interconnected by pivot members disposed along the dotted lines 79 of FIG. 42. The various sets of links as illustrated in FIG. 42 may be used as or may be part of the flexible support 16, and may operate to limit the bending motion of the flexible support 16 in each of the longitudinal, counter-rotational and torsional directions described above. Of course, the interconnected links illustrated in FIG. 42 could additionally have wing or protrusion structure such as that of FIGS. 35, 36, 37, 40 and 41, or other structure that limits rotation of adjacent links about the transverse pivot points 79 interconnecting the links, to provide superior bending or flexing limiting structure.

Figure 43:
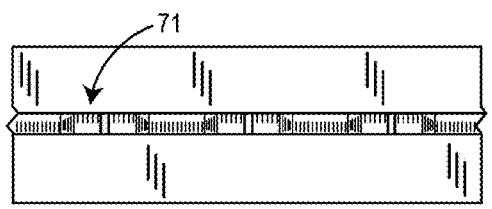
FIG. 43 illustrates a top view of a flexible support of a wristband device having bending limiting structure of any of FIGS. 35-41 disposed therein.

In any event, the configuration of the members 71 of FIGS. 35-42 allow or enable movement of the adjacent slats or flat members 74, 75 and 78 with respect to one another in one direction, e.g., the down direction in FIGS. 36 and 36, limited to a particular minimum bending radius, while limiting the rotational movement of the slats or bars 74 and 75 in the opposite direction, such as the up direction in FIGS. 35 and 36, to the same or a different minimum bending radius. In this case, the member 71 with the alternating flat members 74 and flat members 75 or the interconnected support of FIG. 42 may be disposed along a longitudinal axis or in the longitudinal direction of the support 16, as illustrated in FIG. 43, to allow the bending motion illustrated in FIGS. 2 and 4 while limiting counter rotational bending motion. While only one member 71 is illustrated in FIG. 43 as being disposed longitudinally in the center of the flexible support 16, more such members could be disposed at other locations along the length of the flat support 16, such as on either or both lateral sides of the support 16. Moreover, while only one member 71 is illustrated in FIG. 43, multiple such members could be used to limit the counter-rotational movement of the flexible support 16. Of course, if desired, a bending limiting member similar to that of FIGS. 35 and 36 could be disposed along the edge of the flexible support 16 instead of or in addition to the wire 60 of FIG. 25, so as to both protect the edge of the flexible display 18 (by providing a rigid or semi-rigid structure at the edges of the display 18) and to limit the counter-rotational movement of the flexible support 16, while allowing some rotational movement of the support 16 in the manners described herein. Thus, for example, in FIG. 26, the wire 60 could be replaced with a series of links forming a bar member 71 in accordance with the principles of FIG. 35 or 36, for example, wherein the links 74 and 75 are rotationally connected to one another and are disposed such that they allow rotation or movement in one direction a certain amount while not allowing or at least limiting movement relative to one another in the other direction. Of course, the flat interconnected longitudinal members of FIGS. 35 and 36 could be used in conjunction with the slats or bars of FIG. 27 to limit both the torsional and the counter rotational movement of the flat support 16 in the manners described above.

Figure 44:
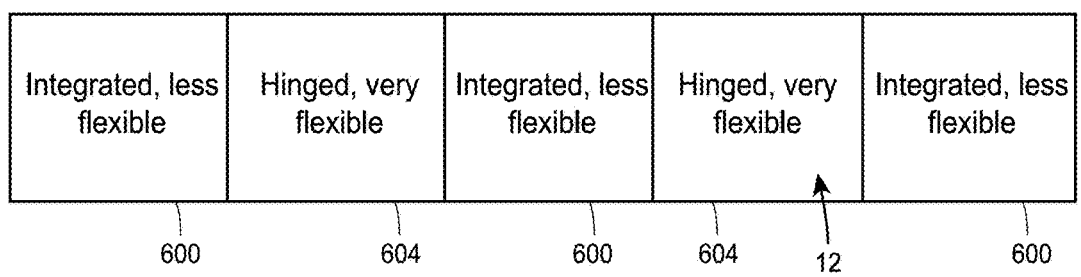
FIG. 44 illustrates a top view of a flexible support of a wristband device that includes a combination of uniformly constructed portions and hinged portions with each portion have a different flexibility from an adjacent portion, to provide a support for a flexible electronic display, to produce a device that includes various different bending characteristics at different locations or sections of the flexible support.

In the embodiment illustrated in FIG. 44, the band 12 includes or is formed of one or more monolithically integrated, less flexible portions 600 combined with one or more hinged, more flexible portions 604. In other words, the band 12 depicted in FIG. 44 can include one or more portions constructed in accordance with different configurations of any one of the bands 12 described herein to provide generally uniformly constructed or configured bending structure at different portions or sections of the band.

Generally speaking, the position of the less flexible portions 600 corresponds to portions of the article 10 where the required amount of flexing is limited (e.g., the portions of the article 10 disposed on the top and bottom of a wrist), while the position of the more flexible portions 604 corresponds to portions of the article 10 where the required amount of flexing is greater (e.g., the portions of the article 10 disposed adjacent the sides of the wrist). In any event, as illustrated in FIG. 44, the band or support member 16 can have any number of different sections of portions that allow or enable more or less bending (e.g., that have different minimum radii of curvature in either or both the rotational and counter-rotational directions) to effectuate different degrees of bending in these directions.

As discussed above, a flexible electronic component, such as the flexible display 18, has a minimum critical bending radius at which the flexible electronic component can be bent without impairing electronic functionality of the flexible electronic component. Generally speaking, the minimum critical bending radius can be measured based on a single bending motion (i.e., the bending radius past which one or more of the electronic component layers (e.g., display layers) will break or not function based on a single bending motion) or may be measured based on multiple bending actions over time (i.e., the bending radius past which multiple bending actions will, over time, stress and break one of the electronic component layers or the components on one of the electronic component layers). Thus, the minimum critical bending radius helps to determine a bending range of the flexible component at which the flexible component may be bent and still function. Of course, a flexible component may have different minimum critical bending radii in different bending directions. As used herein, the phrase "bending range" may refer to or encompass a bending range for the entire flexible electronic component, a local bending range (i.e., a bending range for at one or more portions of the electronic component), and/or local variations in the bending range.

As also briefly discussed above, a flexible support structure or substrate can be attached or fixedly coupled to the flexible electronic component (e.g., the display 18) to limit the bending range of the flexible electronic component (e.g., prevent the flexible electronic component from being bent or curved beyond its minimum critical bending radius) and/or to comply with product requirements (e.g., bending requirements/restrictions). Doing so, however, may cause the neutral plane of the electronic component to shift from its initial position (in the component) to a position closer to or even within the mechanical support structure (i.e., outside of a plane of the component), which, in turn, may significantly increase the minimum critical bending radius of the layers in the component, thereby significantly reducing, if not effectively destroying, the bending ability of the flexible electronic component.

To prevent the flexible electronic component (e.g., the display 18) from being bent or curved beyond its minimum critical bending radius, but at the same time substantially maintain the bending ability of the flexible electronic component, the article 10 can, in some cases, include a flexible support that is movably (e.g., slidably) coupled with or to the flexible electronic component in a manner that allows the flexible support and the flexible electronic component to move (e.g., slide) relative to or independently of one another when the article 10 is moved between different positions (e.g., between a substantially flat position and a bent position). Examples of different arrangements are described in connection with FIGS. 45A-45F, 46A-46H, and 47A-47L. While these arrangements are generally described as including a flexible display 18, it will be appreciated that these arrangements can instead include a different type of flexible electronic component (e.g., a flexible electronic circuit, a sensor tag, a flexible OLED light).

Generally speaking, because the flexible electronic component (e.g., the display 18) and the flexible support are movable independently of one another, the amount of strain that the flexible support places on the flexible electronic component (e.g., the display 18) when the article 10 is being bent or curved is minimized as these structures do not alter or only minimally alter the neutral plane of the flexible electronic component (e.g., the display 18). This feature, in turn, minimizes the minimum critical bending radius of the flexible electronic component when coupled to the flexible support.

Advantageously, in some of these cases, the flexible support can be removably coupled to the flexible electronic component (e.g., the display 18) so that the flexible support can be separated from the flexible electronic component. In turn, the flexible electronic component can be easily and quickly placed and associated with any number of different objects, items, or devices, such as, for example, a coffee cup, a phone case, a charging stand, or a different flexible support. In the latter case, the flexible support can be removed and interchanged with a different flexible support selected from one or more different flexible supports. This plurality of different flexible supports can include, for example, flexible supports made of a different material (e.g., leather, plastic, cloth), having a different texture (e.g., smooth, perforated), made of one or more different colors (e.g., brown, black, white, etc.), associated with a different style, or any combinations of these features. In this manner, the flexible support, and, more generally, the flexible attachable article 10, can be customizable. It will be appreciated that, in the same manner, the flexible electronic component can be removed from the flexible support and the flexible support can be interchanged or connected to a different flexible electronic component selected from one or more different flexible components. The different flexible components can include, for example, one or more different types of flexible components (e.g., different flexible displays 18, one or more OLED lights, one or more sensor tags, etc.), flexible components made of one or more different materials, flexible components having different thicknesses, etc., or combinations thereof. In this manner, the flexible electronic component (e.g., the flexible display 18), and, more generally, the flexible attachable article 10, can be customizable.

FIGS. 45A-45D illustrate a dynamically flexible, attachable article 10, again in the form of a wristband, that includes a flexible electronic component in the form of a display element 696 and a flexible support structure or feature 698. The display element 696 includes a flexible electronic display 18 disposed (e.g., mounted) on or over a substrate or interlayer 699. The flexible support structure 698 can generally take the form of any of the supports 16 described herein or any other support structure consistent with the present disclosure. The flexible support structure 698 and the substrate 699 generally cooperate to provide support to, and guide and limit the movement of, the flexible electronic display 18. The flexible support structure 698 is slidably and removably coupled to the display element 696 in a manner that permits the display element 696 and the flexible support structure 698 to slide independently of one another. For those reasons discussed above, this feature minimizes, i.e., allows for the minimum critical bending radius of the flexible electronic display 18 when coupled to the flexible support structure 698.

Figure 45A:
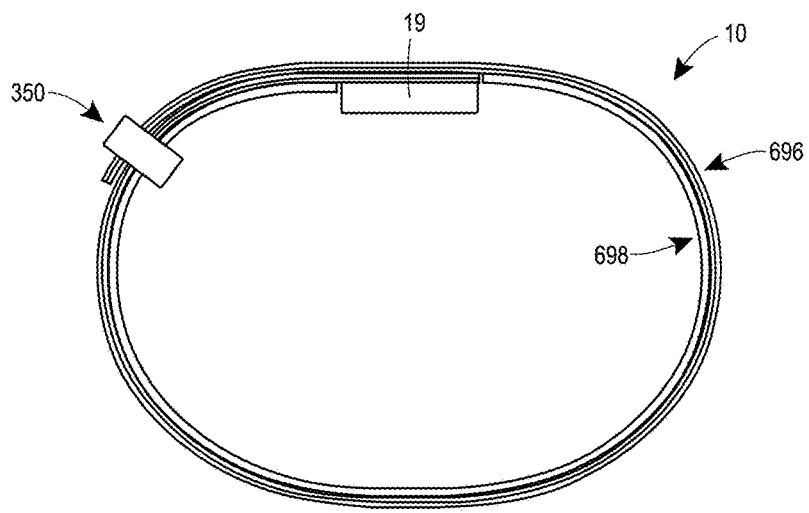
Figure 45B:
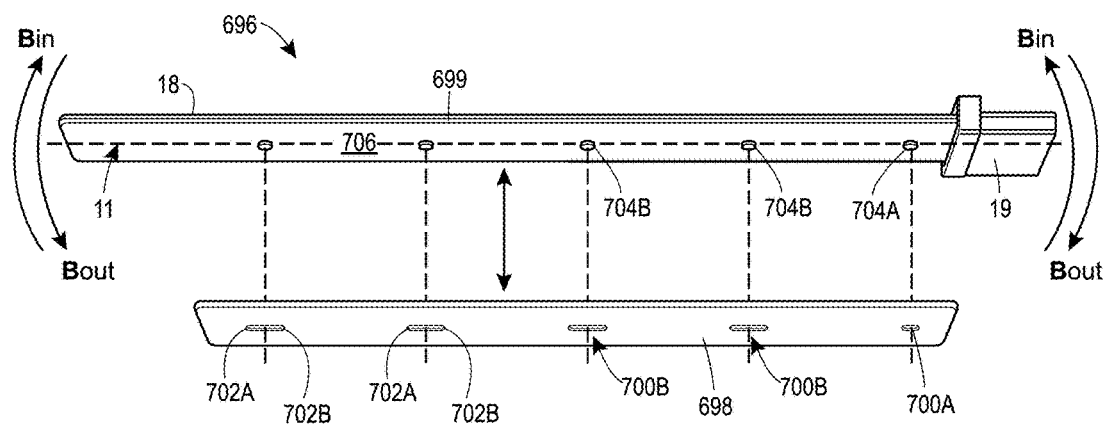

As illustrated in FIGS. 45B and 45C, the article 10 includes a horizontal or longitudinal axis 11. The article 10 illustrated in this example also includes the grooves 320 and the projections 324 illustrated in FIGS. 9-11. However, these grooves 320 and projections 324 are not substantially visible in FIGS. 45A-45E. Still further, the article 10 is illustrated in FIGS. 45A-45F as including the clasping structure 350 illustrated in FIGS. 19 and 20. In other examples, the article 10 can include additional, different, or fewer connectors, such as, for example, the recess and tab 300, 304, the magnets 22A, 22B, 24A, and 24B, and/or any of the other connectors described herein.

As illustrated in FIG. 45B, the flexible support 698 of the article 10 includes a plurality of elongated slots 700 formed or defined therein along the horizontal axis 11. The plurality of slots 700 includes a first elongated slot 700A and second elongated slots 700B that are longer (i.e., more elongated) than the first slot 700A. The first and second slots 700A, 700B are illustrated as being evenly spaced apart from one another across the length of the flexible support 16 but uneven spacing may be used in some embodiments. Each of the second slots 700B has a first stop surface 702A and a second stop surface 702B opposite the first stop surface 702A. The first stop surface 702A generally defines or corresponds to the most extreme bending that will be permitted in the inward direction (see the arrows labeled $B_{IN}$ in FIG. 45B). The second stop surface 702B generally defines or corresponds to the most extreme bending that will be permitted in the outward direction (see the arrows labeled $B_{OUT}$ in FIG. 45B).

As illustrated in FIG. 45B, the display element 696 of the article 10 includes a plurality of rivets 704 formed on and extending inward from a bottom side 706 of the substrate 699. Like the slots 700, the rivets 704 are formed along the longitudinal axis 11. The rivets 704 each have a substantially circular shape and are evenly spaced apart from one another across the length of the display element 696. The rivets 704 are thus generally aligned with the slots 700, respectively, when the display element 696 and the flexible support structure 698 are both flat. More specifically, the rivets 704 are aligned with a center or middle portion of the slots 700, respectively (i.e., between the first and second stop surfaces 702A, 702B), when the display element 696 and the flexible support structure 698 are both flat. As also illustrated in FIG. 45B, when the article 10 is in a substantially flat position, the display element 696 is longer than the flexible support structure 698.

As illustrated in FIGS. 45C and 45D, when the display element 696 and the flexible support structure 698 are aligned with one another and placed together, the flexible support structure 698 can be slidably coupled with the display element 696 so that the flexible support structure 698 is slidable independently of or relative to the display element 696. To this end, when the display element 696 and the flexible support structure 698 are placed together, the rivets 704 can be disposed in a corresponding one of the slots 700. In this example, the rivet 704A, which is the rivet most proximate to the electronics module 19, is disposed in the slot 700A. Due to the shape of the slot 700A (the slot 700A is just wide enough to accept the rivet 704A), the rivet 704A is fixedly disposed within the slot 700A (i.e., the rivet 704A does not move or only moves slightly relative to the slot). The remaining rivets 704B are disposed in the slots 700B. Because the slots 700B are longer than the slot 700A, the rivets 704B are slidable within the slots 700B, respectively, along the horizontal axis 11 of the device 10. Thus, with the exception of the rivet 704A, which is fixedly disposed within the slot 700A, the flexible support structure 698 is horizontally slidable relative to or independently of the display element 696.

Accordingly, as the device 10 is bent to form a circular or oval band, as illustrated in FIG. 45E, portions of the flexible support structure 698 slide or move relative to the electronic display 18 (and vice-versa). More specifically, when the device 10 is bent in the outward direction (see the arrows labeled $B_{OUT}$ in FIG. 45B) to form a circular or oval band, as illustrated in FIG. 45E, the rivets 704B slide within the slots 700B, respectively. At some point, the device 10 will be bent to such a degree that the rivets 704B contact the first stop surface 702B of a respective slot 700B. At this point, the device 10 has reached its pre-defined bending limit and any further bending of the device 10, particularly the flexible display 18, in the outward direction is prevented. Conversely, the device 10 can be returned to the substantially flat position, as illustrated in FIG. 45B-45D, in a similar manner. When the device 10 is in the substantially flat position, and the device 10 is bent or curved in the inward direction (see the arrows labeled $B_{IN}$ in FIG. 45B), the applied bending force causes the rivets 704B to slide away from a respective first stop surface 702B and toward a respective second stop surface 702A. At some point, the device 10 will be bent to such a degree (i.e., corresponding to the maximum bending amount in this direction) that the rivets 704B will contact the second stop surface 702A of a respective slot 700B. At this point, the device 10 has reached its pre-defined bending limit and any further bending of the device 10, particularly the flexible display 18, in the inward direction is prevented. In some cases, the slots 700B may need to be of varying or different lengths (and may need to increase in length) as they are disposed further away from the slot 700A to allow movement of the entire flexible support structure 698 so that each of rivets 704B hits a corresponding stop 702A or 702B at the same bending radius (simultaneously).

At the same time, because the flexible support 16 is slidably coupled to the flexible electronic display 18 (and is essentially fixedly attached to the display 18 at only one point), the arrangement of FIGS. 45A-45E does not alter the central bending or neutral plane of the flexible electronic display 18, thereby substantially maintaining the bending ability (e.g., the bending range) of the electronic display 18. In other words, such an arrangement leaves the article 10 with a bending range that is substantially similar to the bending range of the flexible electronic display 18 itself.

In view of the foregoing, it should be appreciated that the flexible support structure 698 is removably and slidably coupled with the flexible electronic display 18. Accordingly, the flexible support structure 698 is both customizable and provides for a larger bending range of the display 18 when the display element 696 is disposed on and coupled to the support structure 698. As a result, the flexible support 698 can be removed (in a similar manner as described above) and interchanged with a different flexible support 698. The different flexible support 698 can have a similar structure (i.e., the different flexible support 698 also includes the slots 700), can have a different structure, have a different color (e.g., brown, black, white), be made of a different material (e.g., leather, plastic, cloth, metal), can have or be associated with a different style (e.g., classic, professional), have a different texture (e.g., smooth, perforated), or combinations thereof. As illustrated in FIG. 45F, the flexible support 698 illustrated in FIG. 45E has been removed and interchanged with a different flexible support that is similarly structured but has a different color and a different texture. Of course, this process can be repeated any number of times, as desired.

In some cases, other components of the article 10, such as, for example, the clasping structure 350 and/or the rivets 704, can be removed and interchanged with different structures. These different structures can, but need not, be selected based upon the selected different flexible support 698. The clasping structure 350 can, for example, be removed from the article 10 and interchanged with one or more different mechanical connectors. These different mechanical connectors may include a structurally similar clasping structure 350 made of a different color and/or may include structurally different connectors. Similarly, the rivets 704 can be removed from the display element 696 and interchanged with structurally similar rivets 704 having a different color and/or different structures (e.g., projections, tabs, etc.).

In other examples, the article 10 can vary from the one illustrated in FIGS. 45A-45D in other manners. The flexible support 698 can, for example, include a different number of slots 700, can include differently positioned slots 700 (e.g., slots 700 positioned closer to or further from one another), and/or can include differently constructed slots 700 (e.g., slots 700 having a different length and/or shape). In one example, the flexible support 698 can include two rows of slots 700 (e.g., two parallel rows of slots 700). The slots 700 can, for example, instead take the form of openings, apertures, tracks, channels, grooves, recesses, or any other suitable structure. The flexible electronic component can, for example, take the form of a collapsible e-reader, a roll-out screen, an OLED light, or other electronic component instead of the display element 696. The flexible substrate 699 can, for example, include a different number of rivets 704, can include differently positioned rivets 704 (e.g., rivets 704 positioned closer to or further from one another), and/or can include differently constructed rivets 704 (e.g., rivets 704 having a different length and/or shape). When, for example, the flexible support 698 includes two rows of slots 700, the flexible substrate 699 can likewise include two rows of rivets 704. Such an arrangement would advantageously provide torsion control. The rivets 704 can, as another example, instead take the form of latches, tabs, hooks, knobs, bumps, projections, or any other suitable structure. In one example, the slot 700A and the rivet 704A (the fixedly attached portions) can be located at a different location, such as, for example, at the other end of the article 10, in the middle of the article 10, or in some other location. In another example, the article 10 can include more than one slot 700A and more than one rivet 704A (i.e., more than one fixedly attached portions). In some examples, the display element 696 and the flexible support 698 can be movably coupled to one another in a different way. The display element 696 and the flexible support 698 can, for example, be snapped together, hooked together, latched together, or coupled to one another in some other manner at one or more locations such as at the location of the rivet 704A and the slot 700A.

FIGS. 46A-46D illustrate a dynamically flexible, attachable article 10, again in the form of a wristband, that includes a flexible support structure 16 and a flexible electronic component in the form of a flexible electronic display 18 movably disposed within the flexible support structure 16. The article 10 also includes a horizontal or longitudinal axis 11 and a spring element 21. Though not expressly illustrated herein, the article 10 can include one or more connectors described herein, such as, for example, the grooves 320 and the projections 324 illustrated in FIGS. 9-11, the clasping structure 350 illustrated in FIGS. 19 and 20, and/or any of the other connectors described herein.

Figure 46A:
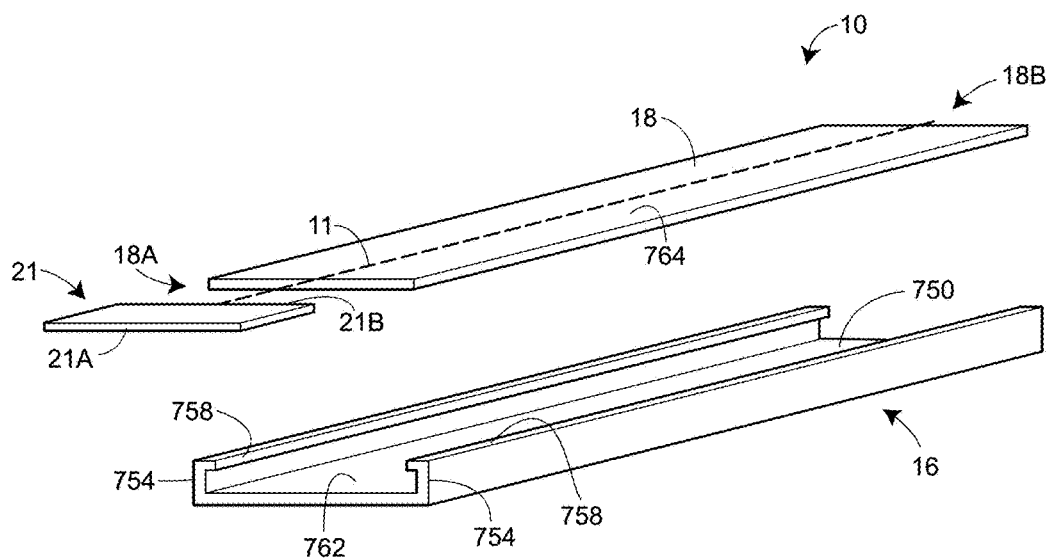
FIGS. 46A and 46B illustrate another example attachable article in the form of a wristband having a flexible electronic display slidably coupled to a flexible support in a manner that minimizes or reduces strain on the flexible display during bending.
Figure 46B:
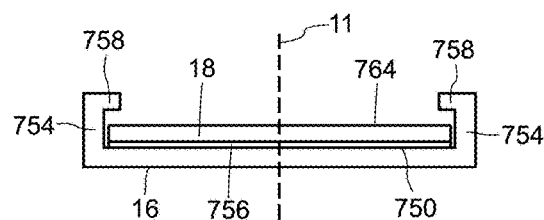

The flexible support structure 16 is generally configured to provide support to the flexible electronic display 18. The flexible support structure 16 can be made of any suitable flexible suitable material such as, for example, cloth, leather, plastic, metal, or other material. As illustrated in FIGS. 46A and 46B, the flexible support structure 16 in this example has or is defined by a longitudinally-extending, elongate bottom wall 750 and a pair of opposing sidewalls 754 that extend upward, at an angle substantially perpendicular to the longitudinal axis 11, from a longitudinally-extending perimeter edge of the bottom wall 750. As illustrated in FIG. 46B, a lubricant 756 (e.g., oil, graphite, PTFE) can be disposed on (e.g., applied to) the bottom wall 750, or portions thereof, to facilitate movement between the support structure 16 and the flexible electronic display 18. The flexible support structure 16 further has a retaining portion 758 that extends laterally inward from a top portion of each of the opposing walls 754, such that the retaining portions 758 hang over the bottom wall 750 of the support structure 16. Together, the bottom wall 750, the sidewalls 754, and the retaining portions 758 define a cavity 762 sized to support and receive the flexible electronic display 18 therein. As illustrated in FIG. 46B, the cavity 762 has a substantially rectangular-shape in cross-section.

Figure 46C:
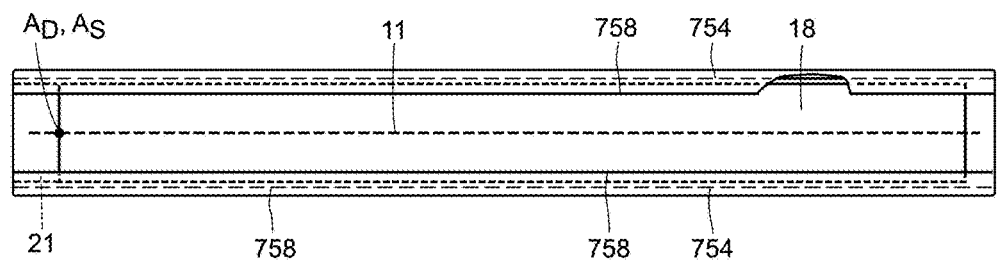
FIG. 46C illustrates a top view of the attachable article depicted in FIGS. 46A and 46B.

The flexible electronic display 18 can generally take the form of any of the displays 18 described herein or a different display 18 consistent with any of the embodiments described herein. Although not illustrated herein, the flexible electronic display 18 can, but need not, include an anti-reflective coating applied thereon in an effort to optimize the optical performance of the display 18. As illustrated in FIG. 46C, when the article 10 is in a substantially flat position, the flexible display 18 is shorter than the flexible support structure 16, though this need not be the case (e.g., the display 18 and the support 16 can have the same length).

The spring element 21 is provided to apply tension to one end of the flexible electronic display 18. This applied tension facilitates the sliding movement between the flexible support structure 16 and the flexible electronic display 18 and helps to keep the electronic display 18 taut (i.e., in a substantially flat configuration) at all times. In the illustrated example, the spring element 21 is a substantially flat spring having a first end 21A and a second end 21B opposite the first end 21A. In other examples, the spring element 21 can be a different type of spring (e.g., a coil spring, a leaf spring) or take a different form and yet still be suited for the intended purpose. For example, the spring element 21 can take the form of a small cylinder with an axle disposed therethrough. As another example, the spring element 21 can take the form of a mechanical slider.

As illustrated in FIG. 46B, the flexible electronic display 18 can be seated or disposed in the cavity 762. In turn, the sidewalls 754 of the flexible support structure 16 extend upward adjacent and in some cases above the edges of the flexible display 18, such that the sidewalls 754 can provide side impact protection for the flexible display 18. In addition, the retaining portions 758, which extend inward of the edges of the flexible display 18, can contact a top surface 764 of the flexible display 18 to prevent the flexible display 18 from exiting the flexible support structure 16, thereby retaining the flexible display 18 within the flexible support structure 16.

As illustrated in FIG. 46C, the spring element 21 is coupled to a portion of the flexible support structure 16 and coupled to a portion of the flexible electronic display 18 at one end of the flexible electronic display 18. Specifically, as illustrated in FIGS. 46A and 46C, the end 21A of the spring element 21 is fixedly attached (e.g., adhered) to a portion of the bottom wall 750 of the support structure 16, and the end 21B is fixedly attached (e.g., adhered) to a bottom surface of the flexible display 18 at one end 18A of the flexible electronic display 18. The spring element 21 in this example is thus disposed between the flexible support structure 16 and the flexible electronic display 18. In other examples, the spring element 21 can be coupled in a different manner. The spring element 21 can be coupled to a different portion of the flexible support structure 16 (e.g., to the sidewalls 754), can be coupled to a different portion of the flexible electronic display 18 (e.g., to the end 18A itself), and/or can be coupled at the other end 18B of the flexible electronic display 18. When, for example, the spring element 21 takes the form of a small cylinder with an axle disposed therethrough, the display 18 can be attached to the cylinder (e.g., to one or both ends of the cylinder) such that the display 18 can be rolled or unrolled when the article 10 is bent. In one case, the display 18 can be attached to the cylinder such that the display 18 can partially rotate (i.e., turn by a certain amount of degrees) when the article 10 is bent, thereby rolling or unrolling a part of the display that is attached to the cylinder. Alternatively, the cylinder can be coupled to or at one end of the display 18 and the axle can be movably coupled to the flexible support structure 16 (e.g., via a slot formed in the sidewalls 754) when the article 10 is bent. When, for example, the spring element 21 takes the form of a mechanical slider, the mechanical slider can be attached to or at one end of the display 18 and movably coupled to the flexible support structure 16 (e.g., via rails disposed on the bottom wall 750 of the support structure 16). It will be appreciated that the article 10 can also include an additional spring element 21, with one spring element 21 being configured to apply tension to each of the ends 18A, 18B of the flexible electronic display 18.

Figure 46D:
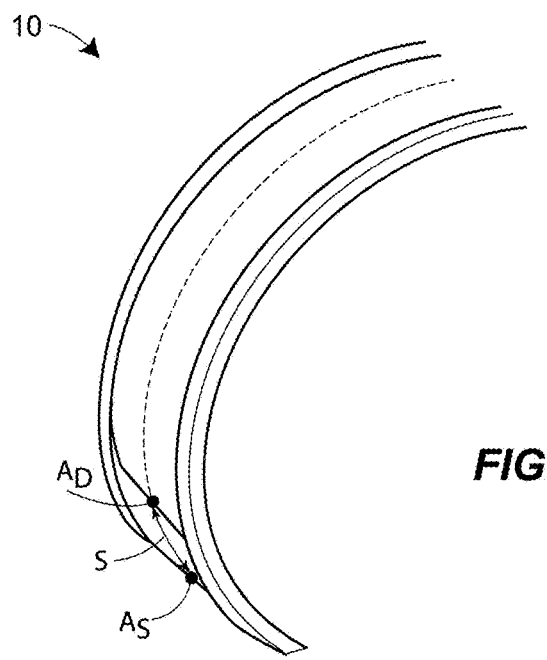
FIG. 46D illustrates the attachable article depicted in FIGS. 46A and 46B when bent or curved.

In this manner, the flexible display 18 is slidably coupled with or to the flexible support structure 16 (and vice-versa), with the flexible display 18 being slidable independently of or relative to the flexible support structure 16 (and vice-versa). Accordingly, as the article 10 is bent to form a circular or oval band, as illustrated in FIG. 46D, the flexible display 18 moves independently or relative to corresponding portions of the flexible support structure 16 (and vice-versa). At the same time, the spring element 21 applies a tension force to the end 18A of the flexible electronic display 18, thereby facilitating this movement and helping to keep the flexible electronic display 18 taut. Like the spring element 21, the lubricant 756 helps to facilitate the movement between the support structure 16 and the display 18. More specifically, when the article 10 is bent to form a circular or oval band, as illustrated in FIG. 46D, the spring element 21 pulls on the end 18A of the flexible display 18 and the ends 18A, 18B of the flexible display 18 slide within the cavity 762, relative to the flexible support 16 and toward one another, thereby creating a small degree of separation between ends of the flexible display and ends of the bottom wall 750. With reference to FIGS. 46C and 46D, when the article 10 is bent to form a circular or oval bend, point $A_D$ of the flexible display 18 slides, relative to point $A_S$ of the flexible support structure 16, thereby creating spacing S between point $A_D$ and $A_S$. At some point, the article 10 can be bent to such a degree that the retaining portions 758 contact corresponding portions of the top surface 764 of the display 18. However, the support structure in the bottom wall 750 may limit the bending motion of the bottom wall and thus the bending motion of the display 18 to a predetermined minimal bending radius. At this point, the article 10 has reached its pre-defined bending limit and any further bending of the article 10, particularly the flexible display 18, in the outward direction is prevented. Conversely, the article 10 can be returned to the substantially flat position, as illustrated in FIGS. 46A and 46B, in a similar manner.

At the same time, because the flexible support 16 is slidably coupled to or with the flexible electronic display 18, the arrangement illustrated in FIGS. 46A-46D does not alter the central bending or neutral plane of the flexible electronic display 18, thereby substantially maintaining the bending ability (e.g., the bending range) of the display 18. In other words, such an arrangement leaves the article 10 with a bending range that is substantially similar to the bending range of the flexible electronic display 18 itself.

In other examples, the article 10 can vary from the one illustrated in FIGS. 46A-D. The flexible support 16 illustrated in FIGS. 46A-D can vary in shape and/or size. The flexible support 16 can, for example, be wider, thereby creating more space between the flexible display 18 and the sidewalls 754. The sidewalls 754 can, for example, be angled more or less relative to the bottom wall 750. The retaining portions 758 can, for example, be constructed differently (e.g., can extend along only a portion of the length of the article 10, can be angled more or less relative to the sidewalls 754). The cavity 762 can be of a different size (e.g., smaller, larger) and/or can have a different shape in cross-section. As yet another example, the flexible support 16 need not include the retaining portions 758. Instead, the flexible support 16 can be slidably or otherwise movably coupled with the flexible display 18 in a different way (e.g., using angled sidewalls 754). The flexible electronic display 18 can also take the form of a different flexible electronic component, such as, for example, a sensor tag, a flexible OLED light, a flexible electronic circuit, or a collapsible e-reader.

FIGS. 46E-46H illustrate a dynamically flexible, attachable article 10, again in the form of a wristband, that is substantially similar to the article 10 illustrated in FIGS. 46A-46D. The article 10 in this case includes a flexible support structure 16 and a flexible electronic component in the form of a flexible electronic display 18 that is movably disposed within the flexible support structure 16. The article 10 also includes a horizontal or longitudinal axis 11 and a spring element, similar to the spring element 21 illustrated in FIGS. 46A-46D, though the spring element is not illustrated in FIGS. 46E-46H for clarity reasons. Unlike the article 10 illustrated in FIGS. 46A-46D, the article 10 illustrated in this example further includes a flexible or bendable and transparent sheet of material 800 disposed on the support structure 16 and over the flexible electronic display 18. Though not expressly illustrated herein, the article 10 can include one or more connectors described herein, such as, for example, the grooves 320 and the projections 324 illustrated in FIGS. 9-11, the clasping structure 350 illustrated in FIGS. 19 and 20, and/or any of the other connectors described herein.

Figure 46E:
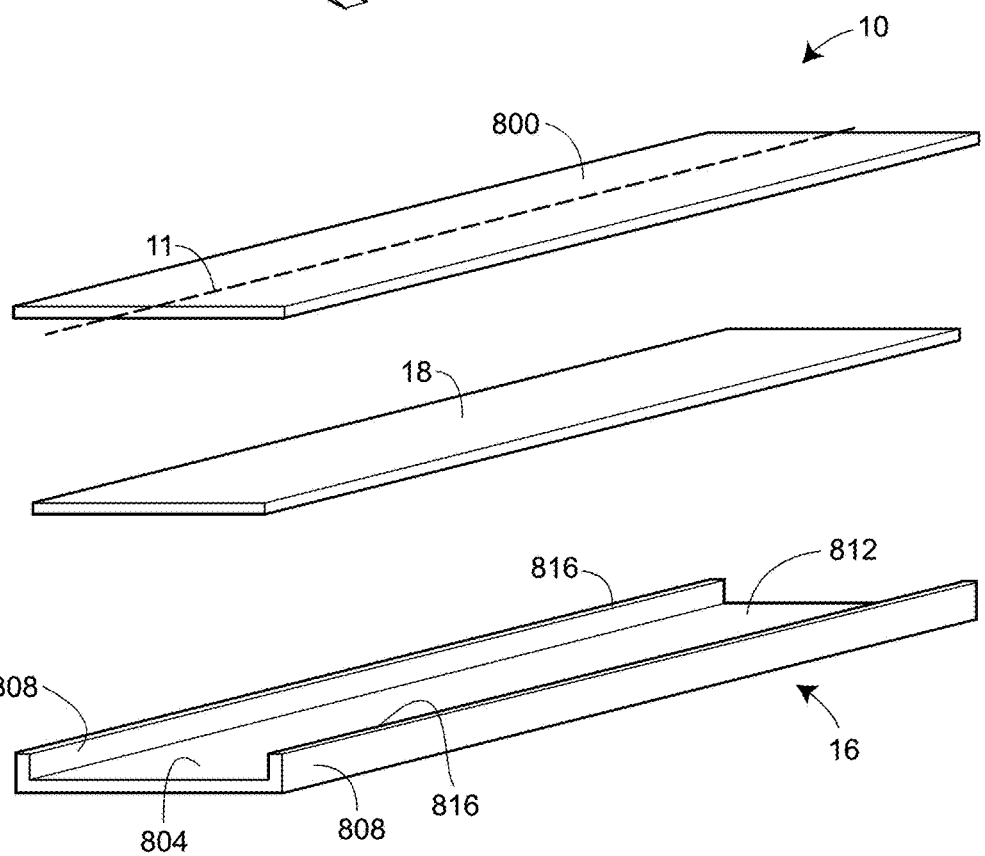
FIGS. 46E and 46F illustrate another example attachable article in the form of a wristband having a flexible electronic display slidably coupled to a flexible support having a transparent layer, in a manner that minimizes or reduces strain on the flexible display during bending.

The flexible sheet 800 illustrated in FIG. 46E has a substantially rectangular shape similar to the shape of the flexible support structure 16 and the display 18. The sheet 800 in this example has a width that is larger than a width of the display 18 and that is substantially equal to the width of the flexible support structure 16. The sheet 800 is a generally transparent layer, such that image content provided on the display 18 is viewable through the sheet 800. The sheet 800 can be made of any suitable flexible or bendable material, such as, for example, plastic (e.g., acrylic), glass (e.g., Plexiglass), and/or any other flexible material(s). Though not illustrated herein, an anti-reflective coating can, in some cases, be applied to the sheet 800 to optimize the optimal performance of the article 10.

Figure 46F:
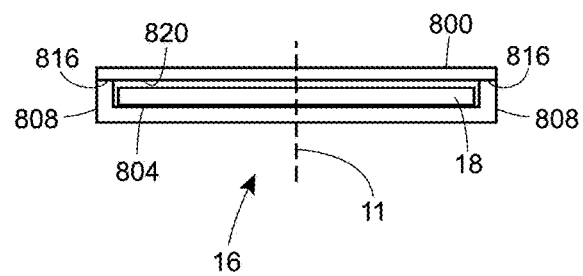

The flexible support structure 16 is generally configured to provide support to the flexible electronic display 18. The flexible support structure 16 can be made of any suitable flexible material such as, for example, cloth, leather, plastic, metal, or other material(s). As illustrated in FIGS. 46E and 46F, the flexible support structure 16 has or is defined by a longitudinally-extending, elongate bottom wall 804 and a pair of opposing sidewalls 808 that extend upward from a longitudinally-extending perimeter edge of the bottom wall 804. Though not illustrated herein, a lubricant (e.g., oil, graphite, PTFE) can be disposed on (e.g., applied to) the bottom wall 804, or portions thereof, to facilitate the movement described below between the support structure 16 and the flexible electronic display 18. Together, the bottom wall 804 and the sidewalls 808 define a cavity 812 sized to support and receive the flexible electronic display 18 therein. As illustrated in FIG. 46F, the cavity 812 has a substantially rectangular-shape in cross-section. Each sidewall 808 has an exposed portion 816 sized to support and receive a corresponding portion of the layer 800 thereon.

Figure 46G:
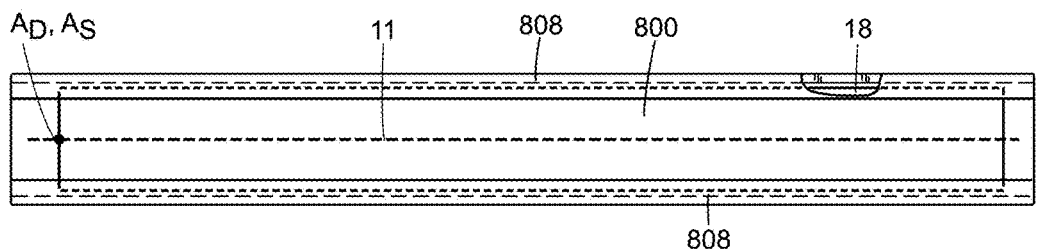
FIG. 46G illustrates a top view of the attachable article depicted in FIGS. 46E and 46F.

The flexible electronic display 18 can generally take the form of any of the displays 18 described herein or a different display 18 consistent with the embodiments described herein. Although not illustrated herein, the flexible electronic display 18 can, but need not, include an anti-reflective coating applied thereon in an effort to optimize the optical performance of the display 18. As illustrated in FIG. 46F, the flexible electronic display 18 can be seated or disposed in the cavity 812. As illustrated in FIG. 46G, when the article 10 is in a substantially flat position, the flexible display 18 is shorter than the flexible support structure 16, though this need not be the case (e.g., the display 18 and the support 16 can have the same length). With reference back to FIG. 46F, the sidewalls 808 of the flexible support structure 16 extend upward above and circumscribe the edges of the flexible display 18, such that the sidewalls 808 can provide side impact protection for the flexible display 18. The flexible sheet 800 can, in turn, be disposed on the flexible support structure 16 and may be attached to the sidewalls 808 via, for example, adhesive. More particularly, portions of an underside 820 of the layer 800 can be disposed on the respective exposed portion 816 of the sidewalls 808 of the flexible support structure 16, as illustrated in FIG. 46F. The layer 800 can be secured (e.g., adhered) in this position in any known manner (e.g., using adhesive). So secured, the layer 800 is configured to retain (e.g., seal) the flexible display 18 within the support structure 16. In this manner, the flexible support structure 16 is slidably coupled with or to the flexible electronic display 18 (and vice-versa), with the flexible support structure 16 being slidable independently of or relative to the flexible electronic display 18 (and vice-versa).

Figure 46H:
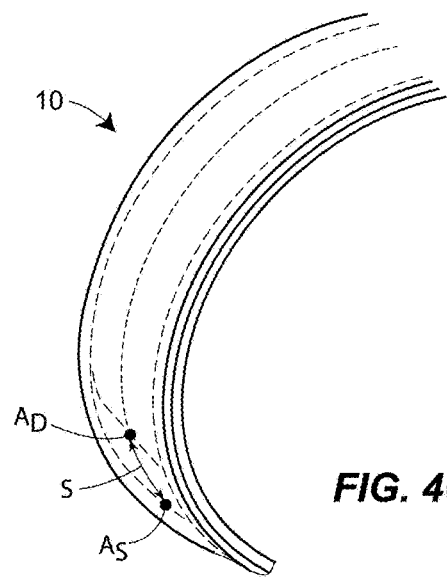
FIG. 46H illustrates the attachable article depicted in FIGS. 46E and 46F when bent or curved.

Accordingly, as the article 10 is bent to form a circular or oval band, as illustrated in FIG. 46H, the flexible display 18 moves independently or relative to corresponding portions of the flexible support structure 16. More specifically, when the article 10 is bent to form a circular or oval band, as illustrated in FIG. 46H, end portions of the flexible display 18 slide within the cavity 762, relative to the flexible support structure 16 and toward one another, thereby creating a small degree of vertical separation between some portions of the flexible display 18 and the bottom wall 750. Moreover, with reference to FIGS. 46G and 46H, when the article 10 is bent to form a circular or oval bend, point $A_D$ of the flexible display 18 slides, relative to point $A_S$ of the flexible support structure 16, thereby creating spacing S between point $A_D$ and $A_S$. At some point, the article 10 can be bent to such a degree that portions of the flexible display 18 contact corresponding portions of the underside 820 of the layer 800 or to the limits of the bending characteristics of the bottom wall 750. At this point, the article 10 has reached its pre-defined bending limit and any further bending of the article 10, particularly the flexible display 18, in the outward direction is prevented. Conversely, the article 10 can be returned to the substantially flat position, as illustrated in FIGS. 46E and 46F, in a similar manner.

At the same time, because the flexible support 16 is slidably coupled to or with the flexible electronic display 18, the arrangement illustrated in FIGS. 46E-46H does not alter the central bending or neutral plane of the flexible electronic display 18, thereby substantially maintaining the bending ability (e.g., the bending range) of the display 18. In other words, such an arrangement leaves the article 10 with a bending range that is substantially similar to the bending range of the flexible electronic display 18 itself.

In other examples, the article 10 can vary from the one illustrated in FIGS. 46E-46H. The flexible support 16 illustrated in FIGS. 46E-46H can vary in shape and/or size. The flexible support 16 can, for example, be wider, thereby creating more space between the flexible display 18 and the sidewalls 808. The sidewalls 808 can, for example, be angled more or less relative to the bottom wall 804. The flexible electronic display 18 can also take the form of a different flexible electronic component, such as, for example, a sensor tag, a flexible OLED light, a flexible electronic circuit, or a collapsible e-reader. The sheet 800 can also vary in shape and/or size. The sheet 800 can, for example, have a width that is smaller than support structure 16 and that is substantially equal to the display 18 (e.g., the sheet 800 can be securely disposed between the sidewalls 808 and over the display 18). The sheet 800 can also be coupled to the support structure 16 in a different manner (e.g., using mechanical connectors) and/or in a different location. In some cases, an index-matched material (e.g., an index-matched fluid) can be disposed between the display 18 and the sheet 800 to optimize the optical performance of the article 10. In any event, as will be understood, the sheet 800 provides protection to the display 18 and helps to retain the display in the cavity 812 during use. The bottom wall 804, the sidewalls 808 and the sheet 800 further operate to prevent dirt and contaminants from entering the cavity 812.

Figure 47A:
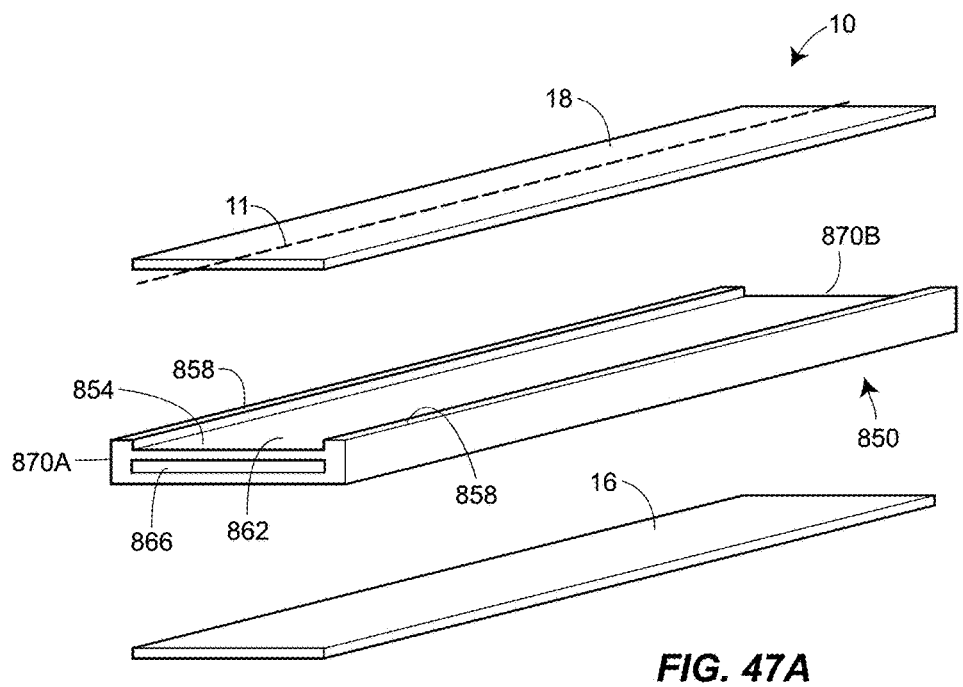
FIG. 47A depicts an exploded view of a further example of an attachable article in the form of a wristband having a flexible electronic display attached to a highly flexible and elastic support structure that is, in turn, slidably coupled to another flexible support structure in a manner that provides support to the flexible electronic display while minimizing or reducing strain on the flexible electronic display during bending.
Figure 47B:
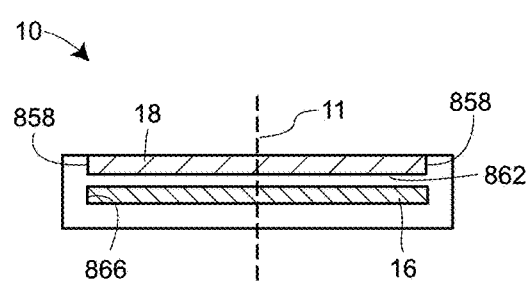
FIG. 47B depicts an end cut-away view of the attachable article of FIG. 47A.
Figure 47C:
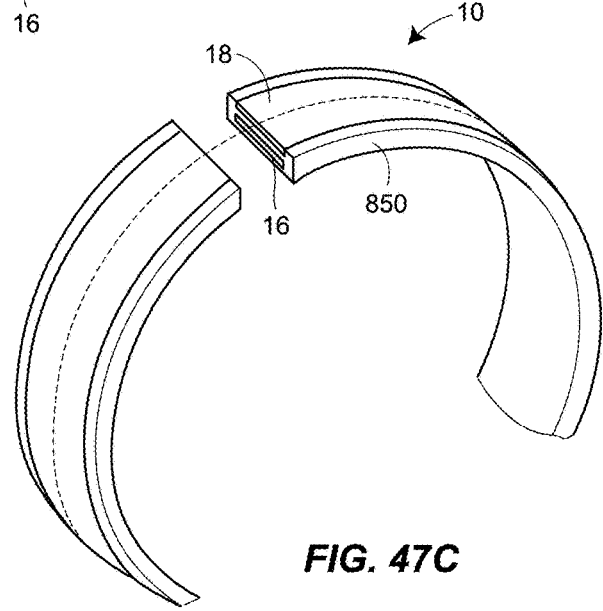
FIG. 47C depicts the attachable article depicted in FIGS. 47A and 47B when bent or curved.

FIGS. 47A-47C illustrate yet another dynamically flexible, attachable article 10, again in the form of a wristband. The article 10 in this example includes a flexible electronic component, again in the form of a flexible electronic display 18, and a pair of flexible support structures, a first flexible support structure 16 and a second flexible support structure 850. The article 10 also includes a horizontal or longitudinal axis 11. Though not expressly illustrated herein, the article 10 can include one or more connectors described herein, such as, for example, the grooves 320 and the projections 324 illustrated in FIGS. 9-11, the clasping structure 350 illustrated in FIGS. 19 and 20, and/or any of the other connectors described herein.

The first flexible support 16 in this example can generally take the form of any of the flexible supports 16 described herein, and is made of a first flexible or bendable material, such as, for example, cloth, leather, plastic, metal, and/or any other suitable flexible material.

As illustrated in FIGS. 47A and 47B, the second flexible support structure 850 has or is defined by a longitudinally-extending, elongate bottom wall 854 and a pair of opposing sidewalls 858 that extend upward, at an angle perpendicular to the longitudinal axis 11, from a longitudinally-extending perimeter edge of the bottom wall 854. Together, the bottom wall 854 and the sidewalls 858 define a cavity 862 sized to support and receive the flexible electronic display 18 therein. As illustrated in FIG. 47B, the cavity 862 has a substantially rectangular-shape in cross-section.

The second flexible support structure 850 also has or includes a slot or channel 866 formed therethrough. The slot 866 extends between one end 870A of the support structure 850 and the other end 866B of the support structure 850. The slot 866 is formed proximate to, but is spatially separate from, the cavity 862, as illustrated in FIG. 47B. The second flexible support structure 850 is, in this example, made of a second flexible material that has a lower Young's Modulus (i.e., is more elastic) than the first flexible material. Preferably, the second flexible material also has a lower Young's Modulus (i.e., is more elastic) than the flexible display 18 as well, though this need not be the case. The second flexible material can, for example, be cloth, rubber, leather, nylon, plastic (e.g., PTFE), and/or any other suitable flexible material. In one example, the second flexible material can be rubber having a Young's modulus of 0.02 G*Pa. In any event, the second flexible support structure 850 is generally more elastic, or less stiff, than the first flexible support structure 16. In some cases, the second flexible material can be significantly more elastic than the first flexible material and can be highly elastic or bendable.

As illustrated in FIG. 47B, the flexible electronic display 18 can be seated or disposed in the cavity 862 defined in the second flexible support structure 850. In this case, the flexible electronic display 18 is adhered to the second flexible support structure 850 using any known adhesive, such as, for example, glue, though in other examples, the flexible electronic display 18 can be secured thereto in a different manner (e.g., using mechanical connectors). Though not explicitly illustrated herein, the flexible electronic display 18 in this example is shorter than the flexible support structure 16 and the flexible support structure 850, though this need not be the case. In any event, the sidewalls 858 of the flexible support structure 850 extend upward adjacent and circumscribe the edges of the flexible display 18, such that the sidewalls 858 can provide side impact protection for the flexible display 18. Although not illustrated herein, the flexible electronic display 18 can, but need not, include an anti-reflective coating applied thereon in an effort to optimize the optical performance of the display 18.

As also illustrated in FIG. 47B, the first flexible support structure 16 can be movably seated or disposed within the slot 866 of the second flexible support structure 850. The first flexible support structure 16 can be retained within the slot 866 (if desired) via friction, and may, if desired, be secured at, for example, one point in the slot, using adhesive (e.g., glue), or via some other manner. Though not illustrated herein, a lubricant (e.g., oil, graphite, PTFE) can be disposed between the second flexible support structure 850 and the slot 866, or portions thereof, to facilitate movement therebetween. Though also not illustrated herein, the article 10 can include one or more spring elements, such as the spring element 21 illustrated above, for applying tension to one or both ends of the flexible support 16 so as to facilitate the movement between the second flexible support structure 850 and the first flexible support structure 16 and/or to help keep the flexible support 16 taut (i.e., in a substantially flat position) as the article 10 is being bent or curved. In any event, the first flexible support structure 16, by virtue of being made from stiffer material than the second flexible support structure 850, provides some rigidity to the overall support structure for the flexible electronic display 18, thereby providing some support to the flexible display 18. Moreover, because the first flexible support structure 16 is movably coupled to or with the flexible display 18 (and vice-versa), the flexible display 18 is movable relative to or independently of the flexible support structure 16 (and vice-versa).

Accordingly, as the article 10 is bent to form a circular or oval band, as illustrated in FIG. 47C, the flexible support structure 16 and the flexible display 18 move (e.g., bend) independently of one another. More specifically, when the article 10 is bent to form a circular or oval band, as illustrated in FIG. 47C, the first flexible support structure 16 bends within the slot 866, while the flexible display 18 bends within the cavity 862 of the second flexible support structure 850. The first flexible support structure 16 thus moves or slides in the cavity 862 with respect to the second support structure 850.

At the same time, because the flexible support 16 is movably coupled to or with the flexible electronic display 18, the arrangement illustrated in FIGS. 47A-47C does not alter the central bending or neutral plane of the flexible electronic display 18, thereby substantially maintaining the bending ability (e.g., the bending range) of the display 18. In other words, such an arrangement leaves the article 10 with a bending range that is substantially similar to the bending range of the flexible electronic display 18 itself.

In other examples, the article 10 can vary from the one illustrated in FIGS. 47A-47C. The flexible support structure 16 can, for example, vary in shape (e.g., the flexible support structure 16 need not have a substantially rectangular-shape) and/or vary in size (e.g., the flexible support structure 16 can be shorter than the flexible support 850). Alternatively or additionally, the flexible support structure 850 can vary in shape and/or size. The sidewalls 858 can, for example, be angled more or less relative to the bottom wall 854. The sidewalls 858 can, for example, include retaining portions (similar to the retaining portions 758 described above) that contact a top surface of the flexible display 18 to retain the flexible display 18 within the flexible support 850. The slot 866 can, for example, have a differently shaped cross-section, be formed through a different portion of the flexible support structure 850, and/or only extend through a portion of the flexible support structure 850. The flexible electronic display 18 can also take the form of a different flexible electronic component, such as, for example, a sensor tag, a flexible OLED light, a flexible electronic circuit, or a collapsible e-reader.

Figure 47D:
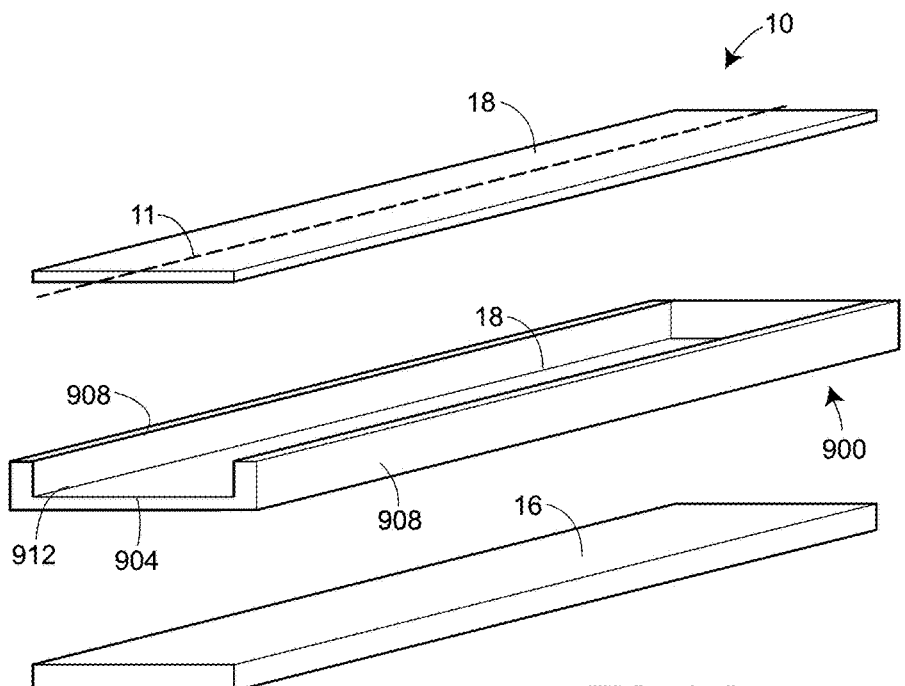
FIG. 47D depicts an exploded view of a further example of an attachable article in the form of a wristband having a highly flexible and elastic support structure configured to receive a flexible electronic display and another flexible support structure, the another flexible support structure being slidably coupled to the flexible electronic display in a manner that provides support to the flexible electronic display while minimizing or reducing strain on the flexible electronic display during bending.
Figure 47E:
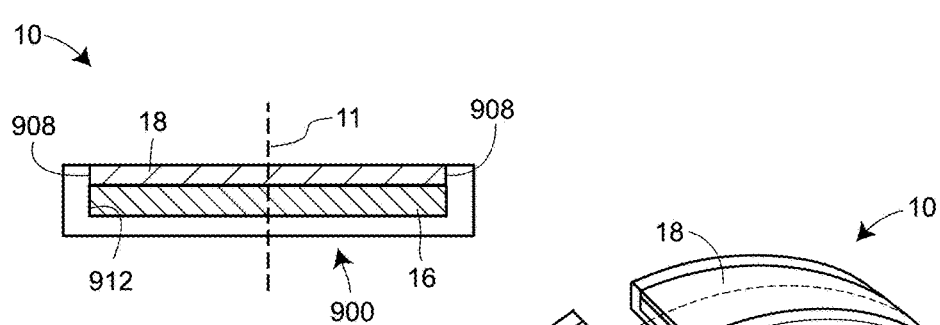
FIG. 47E depicts an end cut-away view of the attachable article of FIG. 47D.
Figure 47F:
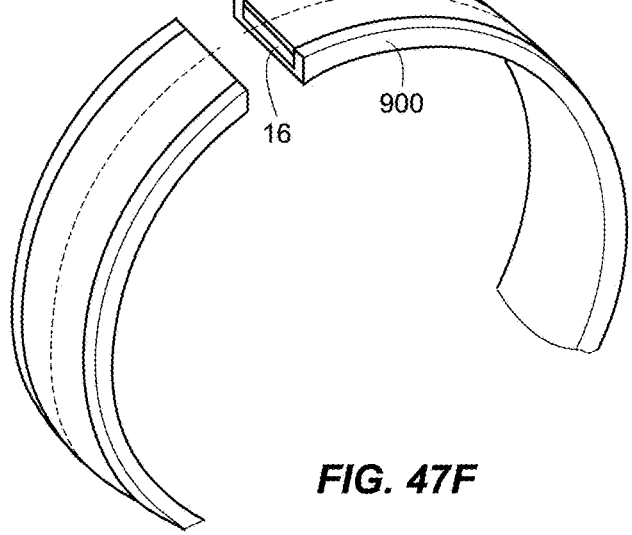
FIG. 47F depicts the attachable article depicted in FIGS. 47D and 47E when bent or curved.

FIGS. 47D-47F illustrate yet another dynamically flexible, attachable article 10, again in the form of a wristband, that is substantially similar to the article 10 illustrated in FIGS. 47A-47C. The article 10 in this example includes a flexible electronic component, again in the form of a flexible electronic display 18, and a pair of flexible support structures, a first flexible support structure 16 and a second flexible support structure 900. The article 10 also includes a horizontal or longitudinal axis 11. Though not expressly illustrated herein, the article 10 can include one or more connectors described herein, such as, for example, the grooves 320 and the projections 324 illustrated in FIGS. 9-11, the clasping structure 350 illustrated in FIGS. 19 and 20, and/or any of the other connectors described herein.

The first flexible support 16 in this example can generally take the form of any of the flexible supports 16 described herein, and is made of a first flexible material, such as, for example, cloth, leather, plastic, metal, and/or any other suitable flexible material.

As illustrated in FIGS. 47D and 47E, the second flexible support structure 900 has or is defined by a longitudinally-extending, elongate bottom wall 904 and a pair of opposing sidewalls 908 that extend upward, at an angle perpendicular to the longitudinal axis 11, from a longitudinally-extending perimeter edge of the bottom wall 904. Together, the bottom wall 904 and the sidewalls 908 define a cavity 912 sized to support and receive the flexible electronic display 18 therein. As illustrated in FIG. 47E, the cavity 912 has a substantially rectangular-shape in cross-section.

Like the second flexible support structure 850 described above, the second flexible support structure 900 is, in this example, made of a second flexible material that has a lower Young's Modulus (i.e., is more elastic) than the first flexible material. Preferably, the second flexible material also has a lower Young's Modulus (i.e., is more elastic) than the flexible display 18 as well, though this need not be the case. The second flexible material can, for example, be cloth, rubber, leather, nylon, plastic (e.g., PTFE), and/or any other suitable flexible material. In one example, the second flexible material can be rubber having a Young's modulus of 0.02 G*Pa. In any event, the second flexible support structure 900 is generally more elastic, or less stiff, than the first flexible support structure 16. In some cases, the second flexible material can be significantly more elastic than the first flexible material and can be highly elastic or bendable.

As illustrated in FIG. 47E, both the first flexible support structure 16 and the flexible electronic display 18 can be seated or disposed in the cavity 862 defined in the second flexible support structure 850. In this case, the flexible support structure 16 is disposed in the cavity 862 along or on the bottom wall 904, with the flexible electronic display 18 disposed on, and is thus in contact with, the flexible support structure 16. In turn, the sidewalls 908 of the flexible support structure 900 extend upward adjacent and circumscribe the edges of the flexible display 18, such that the sidewalls 908 can provide side impact protection for the flexible display 18. Though not explicitly illustrated herein, the flexible electronic display 18 in this example is shorter than the flexible support structure 16 and the flexible support structure 900, though this need not be the case. Although not illustrated herein, the flexible electronic display 18 can, but need not, include an anti-reflective coating applied thereon in an effort to optimize the optical performance of the display 18.

The first flexible support structure 16 or the flexible electronic display 18 can be secured to the flexible support structure 900, if desired. This can be done via friction, using adhesive (e.g., glue), or via some other manner. Though not illustrated herein, a lubricant (e.g., oil, graphite, PTFE) can be disposed between (i) the flexible support 16 and the flexible display 18, and/or (ii) the flexible support 16 and the flexible support structure 900, to facilitate movement of these components relative to one another. Though also not illustrated herein, the article 10 can include one or more spring elements, such as one or more of the spring elements 21 described above, for applying tension to one or both ends of the flexible support 16 and/or one or both ends of the flexible display 18 so as to facilitate the movement therebetween and/or to help keep the flexible support 16 and/or the flexible display 18 taut (i.e., in a substantially flat position) as the article 10 is being bent or curved. In any event, the first flexible support structure 16, by virtue of being made from stiffer material than the second flexible support structure 900, provides some rigidity to the overall support structure for the flexible electronic display 18, thereby providing some support to the flexible display 18. Moreover, because the first flexible support structure 16 is movably coupled to or with the flexible display 18 (and vice-versa), the flexible display 18 is movable relative to or independently of the flexible support structure 16 (and vice-versa).

Accordingly, as the article 10 is bent to form a circular or oval band, as illustrated in FIG. 47F, the flexible support structure 16 and the flexible display 18 move (e.g., bend) independently of one another. More specifically, when the article 10 is bent to form a circular or oval band, as illustrated in FIG. 47E, the first flexible support structure 16 and the flexible display 18 each bend within the cavity 912 of the second flexible support structure 900, with the first flexible support structure 16 moving or sliding in the cavity 912 with respect to the flexible display 18 (and vice-versa).

Because the flexible support 16 is movably coupled to or with the flexible electronic display 18, the arrangement illustrated in FIGS. 47D-47F does not alter the central bending or neutral plane of the flexible electronic display 18, thereby substantially maintaining the bending ability (e.g., the bending range) of the display 18. In other words, such an arrangement leaves the article 10 with a bending range that is substantially similar to the bending range of the flexible electronic display 18 itself.

In other examples, the article 10 can vary from the one illustrated in FIGS. 47D-47F. The flexible support structure 16 can, for example, vary in shape (e.g., the flexible support structure 16 need not have a substantially rectangular-shape) and/or vary in size (e.g., the flexible support structure 16 can be shorter than the flexible support 900). Alternatively or additionally, the flexible support structure 900 can vary in shape and/or size. The sidewalls 908 can, for example, be angled more or less relative to the bottom wall 904. The sidewalls 908 can, for example, include retaining portions (similar to the retaining portions 758 described above) that contact a top surface of the flexible display 18 to retain the flexible display 18 within the flexible support 850. The flexible electronic display 18 can also take the form of a different flexible electronic component, such as, for example, a sensor tag, a flexible OLED light, a flexible electronic circuit, or a collapsible e-reader.

Figure 47G:
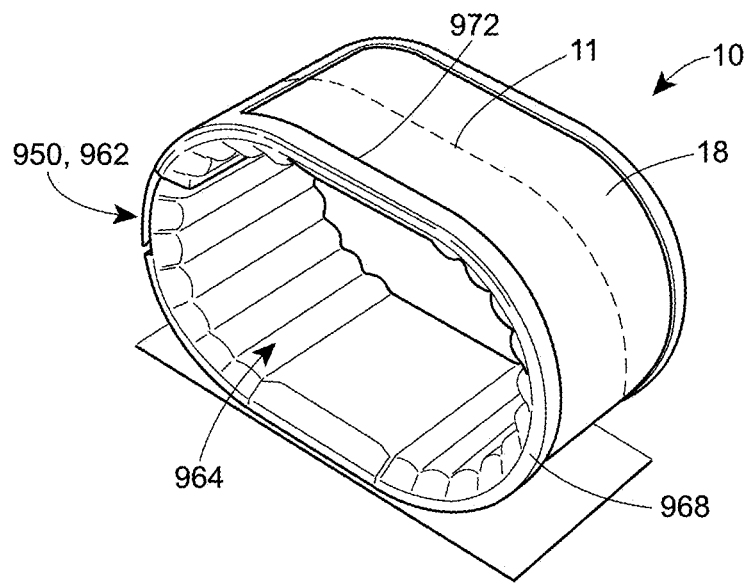
FIG. 47G depicts a perspective view of a further example of an attachable article in the form of a wristband having a highly flexible and elastic support structure configured to receive a flexible electronic display and another flexible support structure, the another flexible support structure being slidably coupled to the flexible electronic display in a manner that provides support to the flexible electronic display while minimizing or reducing strain on the flexible electronic display during bending.
Figure 47H:
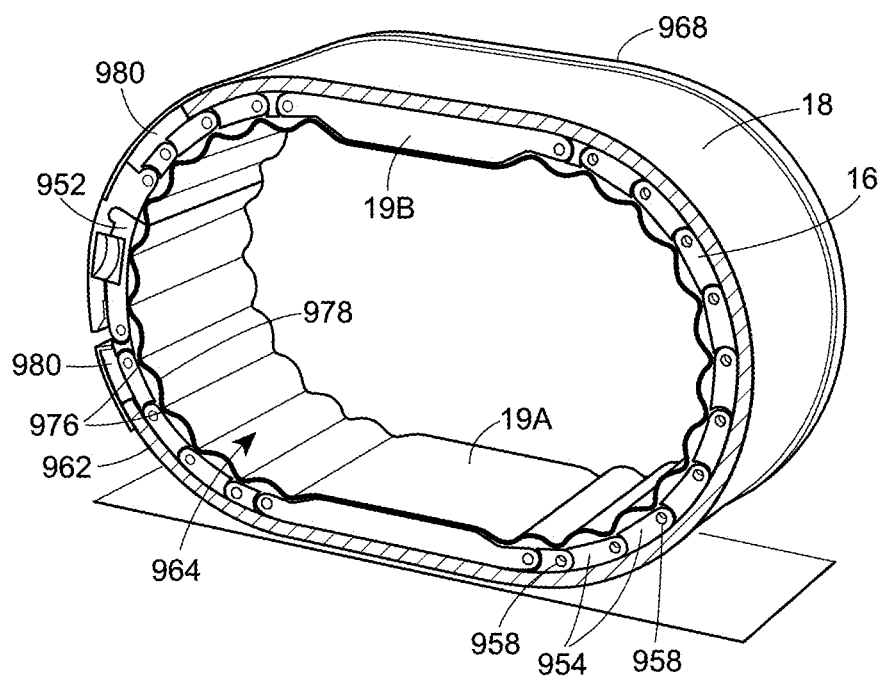
FIG. 47H depicts a cross-sectional view of the attachable article of FIG. 47G when bent or curved.
Figure 47I:
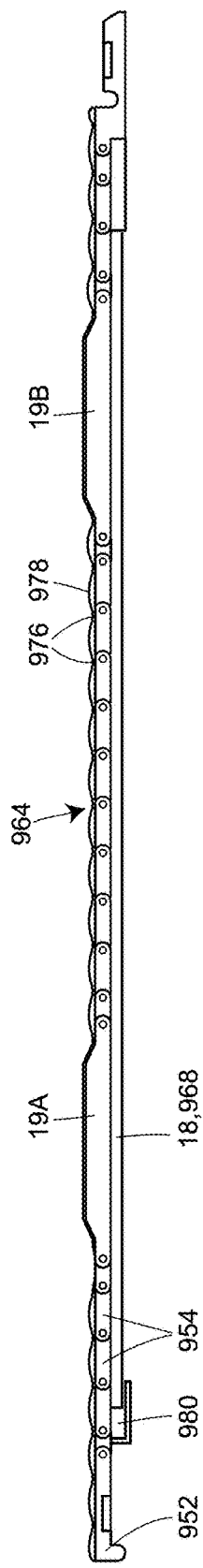
FIG. 47I depicts a cross-sectional view of the attachable article of FIG. 47G when the article is in a substantially flat position.

FIGS. 47G-47I illustrate yet another dynamically flexible, attachable article 10, again in the form of a wristband, that is a more detailed version of the article 10 illustrated in FIGS. 47D-47F. The article 10 in this example includes a flexible electronic component, again in the form of a flexible electronic display 18, and a pair of flexible or bendable support structures, a first flexible support structure 16 and a second flexible support structure 950. The article 10 also includes a horizontal or longitudinal axis 11 and a clasp 952. The clasp 952 can be any type of mechanical clasp or connection structure that functions to connect the end pieces of the article 10 together when the article 10 is bent, as illustrated in FIGS. 47G and 47H, to form a circular or oval band. Though not expressly illustrated herein, the article 10 can alternatively or additionally include one or more connectors described herein, such as, for example, the grooves 320 and the projections 324 illustrated in FIGS. 9-11, the clasping structure 350 illustrated in FIGS. 19 and 20, and/or any of the other connectors described herein.

As shown in FIG. 47H, which depicts a cross-sectional view of the article 10, the first flexible support structure 16 is a generally rectangular, flexible or bendable body or spine. The first flexible support structure 16 includes one or more electronics modules 19 and a plurality of links 954 disposed therebetween. The links 954 are made of a first material, such as, for example, metal (e.g., stainless steel), that is substantially rigid. The electronics module 19 and the links 954 are pivotally connected to one another via a plurality of pins 958. In the depicted version, the first flexible support structure 16 includes two electronics modules 19A, 19B, with the electronics module 19A including a battery, while the electronics module 19B including all of the other necessary electronics components, such as, for example, a processor, a computer-readable memory, a communication module, a display driver, a touch screen controller, one or more sensors, and/or any other electronics components. In the depicted version, each link 954 has an arched or curved shape. By being pivotally connected to one another via the pins 958, the modules 19A, 19B and the links 954 can be moved from the curved or bent position shown in FIG. 47H to the substantially flat position shown in FIG. 47I.

The flexible electronic display 18 can generally take the form of any of the displays 18 described herein or a different display 18 consistent with any of the embodiments described herein. Although not illustrated herein, the flexible electronic display 18 can, but need not, include an anti-reflective coating applied thereon in an effort to optimize the optical performance of the display 18. As illustrated in FIG. 47H, the flexible display 18 is generally shorter than the flexible support structure 16, though this need not be the case (e.g., the display 18 and the support 16 can have the same length).

As illustrated in FIGS. 47H and 47I, the second flexible support structure 950 has or includes a housing 962 that is made of a second material, such as, for example, rubber, leather, nylon, plastic (e.g., PTFE), and/or any other suitable flexible material. The second material is more flexible than the first material from which the structure 16 is made, and, in some cases, is more flexible than the display 18 as well. The second flexible material can, for example, have a lower Young's Modulus (i.e., be more elastic) than the first material. In some cases, the second flexible material can be significantly more elastic than the first material and can be highly elastic or bendable.

As best shown in FIG. 47G, the housing 962 of the second flexible support structure 950 has or is defined by a longitudinally-extending bellowed bottom wall 964 and a pair of opposing sidewalls 968 that extend upward, at an angle perpendicular to the longitudinal axis 11, from a longitudinally-extending perimeter edge of the bottom wall 964. Together, the bottom wall 964 and the sidewalls 968 define a cavity 972 sized to support and receive the first flexible support structure 16 and the flexible electronic display 18 therein. The bottom wall 964 is thus positioned radially inward of the cavity 972, and, thus, the first flexible support structure 16 and the display 18. As shown in FIG. 47H, the bellowed bottom wall 964 includes a plurality of roots 976 and a plurality of crests 978 movably disposed therebetween. In this manner, the bellowed bottom wall 974 is configured to facilitate controlled bending of the first flexible support structure 16 and the display 18, as will be described in greater detail below.

Both the first flexible support structure 16 and the flexible electronic display 18 can be seated or disposed in the cavity 972 defined in the housing of the second flexible support structure 950. In this case, the flexible support structure 16 is disposed in the cavity 972 along or on, and radially outward of, the bottom wall 964. Portions of the flexible support structure 16 can be fixedly attached (e.g., adhered) to portions of the bellowed wall 964. In this version, the electronics modules 19A and 19B are fixedly attached (e.g., adhered) to corresponding portions of the bellowed wall 964, and the roots 976 of the bellowed wall are fixedly attached (e.g., adhered) to the first flexible support structure 16 underneath or proximate to a respective one of the pins 958. Additionally, the flexible electronic display 18 is disposed on, and is thus in contact with, the flexible support structure 16. In turn, the sidewalls 968 of the flexible support structure 950 extend upward adjacent and circumscribe the edges of the first flexible support structure 16 and the flexible display 18, such that the sidewalls 968 can provide side impact protection for both components. The flexible display 18 can, if desired, be secured to the second flexible support structure 950 (e.g., the sidewalls 968) via friction, using adhesive (e.g., glue), or via some other manner. As best illustrated in FIG. 47H, with the first flexible support structure 16 and the flexible electronic display 18 disposed in the described manner, the first and second flexible support structures 16, 950 define a pair of pockets 980 each configured to slidably receive a portion of the flexible display 18. In this way, the pockets 980 facilitate a controlled movement of the article 10 and facilitate movement of the first flexible support structure 16 relative to the display 18 (and vice-versa).

Though not illustrated herein, a lubricant (e.g., oil, graphite, PTFE) can be disposed between the first flexible support structure 16 and the flexible display 18 to facilitate movement of these components relative to one another. Though also not illustrated herein, the article 10 can include one or more spring elements, such as one or more of the spring elements 21 described above, for applying tension to one or both ends of the flexible display 18 so as to facilitate the movement of the display 18 relative to the first flexible support structure 16 and/or to help keep the flexible display 18 taut (i.e., in a substantially flat position) as the article 10 is being bent or curved.

The first flexible support structure 16, by virtue of being made from stiffer material than the second flexible support structure 950, provides some rigidity to the overall support structure for the flexible electronic display 18, thereby providing some support to the flexible display 18, as well as some bending angle control and some torsion control. Moreover, because the first flexible support structure 16 is movably (e.g., slidably) coupled to or with the flexible display 18 (and vice-versa), the flexible display 18 is movable relative to or independently of the flexible support structure 16 (and vice-versa).

Accordingly, when the article 10 is moved between the curved or bent position shown in FIG. 47H and the substantially flat position shown in FIG. 47I, the first flexible support structure 16 and the flexible display 18 move (e.g., slide) independently of one another. When the article 10 is moved from the curved position (FIG. 47H) to the substantially flat position (FIG. 47I), the links 954 and the modules 19A, 19B of the first flexible support structure 16 pivot accordingly relative to one another, the bellowed wall 964 expands (such that the crests 978 move to a substantially flat position), and corresponding portions of the display 18 are forcibly slid further inward into the pockets 980, all while the first flexible support structure 16 and the display 18 slide relative to one another within the cavity 972. When, on the other hand, the article 10 is moved from the substantially flat position (FIG. 47I) to the curved position (FIG. 47H), the links 954 and the modules 19A, 19B of the first flexible support structure 16 pivot accordingly relative to one another, the bellowed wall 964 contracts (such that the crests 978 move to a substantially curved or arched position), and corresponding portions of the display 18 are forcibly driven at least partially out of the pockets 980, all while the first flexible support structure 16 and the display 18 slide relative to one another within the cavity 972.

Because the flexible support 16 is movably coupled to or with the flexible electronic display 18 in this way, the arrangement illustrated in FIGS. 47G-47I does not alter the central bending or neutral plane of the flexible electronic display 18, thereby substantially maintaining the bending ability (e.g., the bending range) of the display 18. In other words, such an arrangement leaves the article 10 with a bending range that is substantially similar to the bending range of the flexible electronic display 18 itself.

In other examples, the article 10 can vary from the one illustrated in FIGS. 47G-47I. The flexible support structure 16 can, for example, vary in shape (e.g., the flexible support structure 16 need not have a substantially rectangular-shape) and/or vary in size. The flexible support structure 16 can, for example, include only one electronics module 16 (e.g., disposed where the module 19B is), instead of two modules 19A, 19B, that contains all of the necessary electronics components. The position of the two modules 19A, 19B can also vary (e.g., the two modules 19A, 19B can be positioned on the sides of the support structure 16). Alternatively or additionally, the flexible support structure 950, particularly the housing 962, can vary in shape and/or size. The bellowed wall 964 can, for example, include roots 976 attached to the support structure 16 in a different manner (e.g., in a different location) and/or crests 978 having more or less curvature. The sidewalls 968 can, for example, be angled more or less relative to the bottom wall 964. The sidewalls 968 can, for example, include retaining portions (similar to the retaining portions 758 described above) that contact a top surface of the flexible display 18 to retain the flexible display 18 within the flexible support structure 950. Further yet, the display 18 can be disposed over or on the sidewalls 968 instead of being disposed therebetween. As noted above, it will also be appreciated that the flexible electronic display 18 can take the form of a different flexible electronic component, such as, for example, a sensor tag, a flexible OLED light, a flexible electronic circuit, or a collapsible e-reader.

Figure 47J:
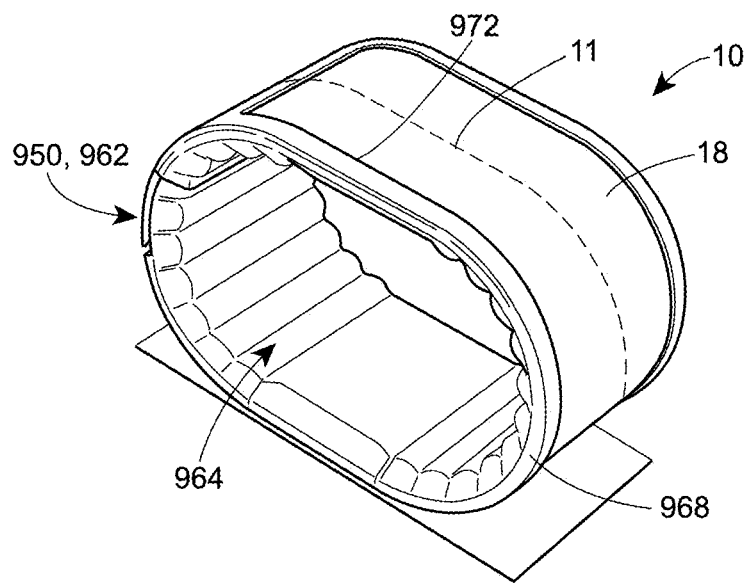
FIG. 47J depicts a perspective view of a further example of an attachable article in the form of a wristband having a highly flexible and elastic support structure configured to receive a flexible electronic display and another flexible support structure, the another flexible support structure being slidably coupled to the flexible electronic display in a manner that provides support to the flexible electronic display while minimizing or reducing strain on the flexible electronic display during bending.
Figure 47K:
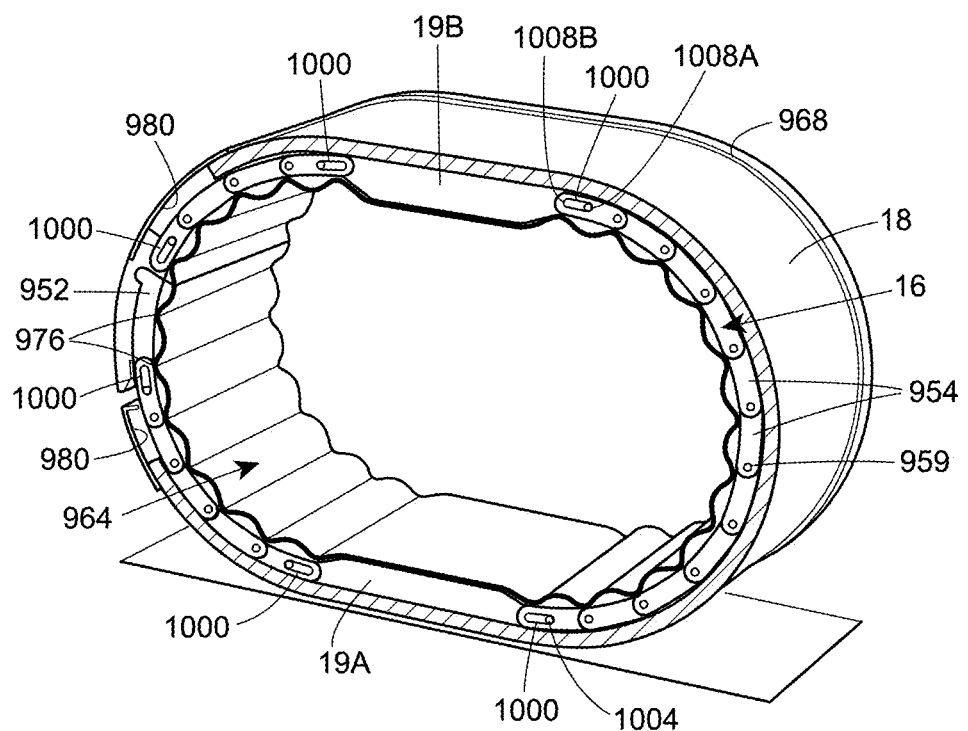
FIG. 47K depicts a cross-sectional view of the attachable article of FIG. 47G when bent or curved.
Figure 47L:
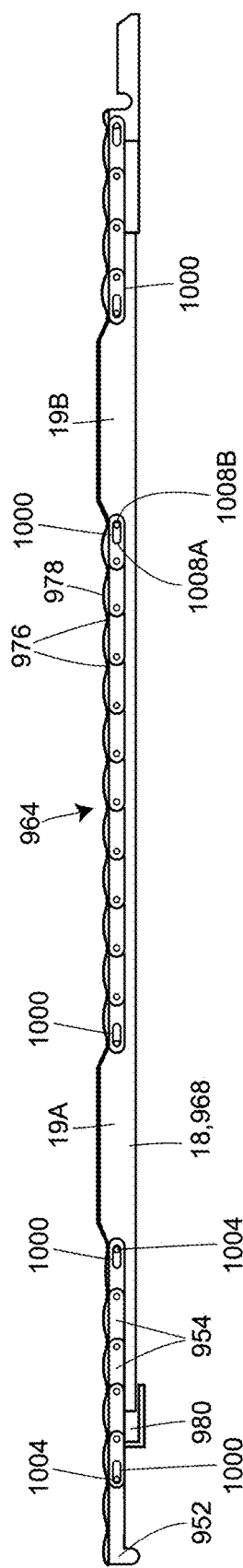
FIG. 47L depicts a cross-sectional view of the attachable article of FIG. 47G when the article is in a substantially flat position.

FIGS. 47J-47L illustrate yet another dynamically flexible, attachable article 10 that is substantially identical to the article 10 illustrated in FIGS. 47G-47I, with common reference numerals indicative of common components. However, unlike the article 10 illustrated in FIGS. 47G-47I, the article 10 illustrated in FIGS. 47J-47L includes a plurality of slots 1000 formed in the first flexible support structure 16 and a plurality of pins 1004 slidably disposed in those slots 1000, respectively. In the depicted version, the article 10 includes six slots 1000 and thus can be said to include six sliding areas. As illustrated in FIG. 47K, two of the slots 1000 are formed adjacent the electronics module 19A, two of the slots 1000 are formed adjacent the electronics module 19B, and two of the slots 1000 are formed adjacent the clasp 952.

As illustrated in FIG. 47K, each slot 1000 has a substantially oval shape. The slots 1000 generally accommodate the length difference between the flexible display 18 and the flexible support structure 16. Each slot 1000 defines a first stop surface 1008A and a second stop surface 1008B that together define or correspond to the permissible bending range for the article 10 (i.e., the slots 1000 help to limit bending of the article 10 and at the same time accommodate the path length difference between the flexible support structure 16 and the flexible display 18 when the article is bent. The first stop surface 1008A defines or corresponds to the most extreme local bending that will be permitted when the article 10 is bent in an outward direction, which in this case is illustrated in FIG. 47K (though this position need not always be the most extreme). The second stop surface 1008B corresponds to the substantially flat position illustrated in FIG. 47L, with the result that the article 10 cannot be bent in the inward direction beyond the illustrated substantially flat position. In other examples, the second stop surface 1008B can correspond to a different position of the article 10, with the result that some bending of the article 10 in the inward direction is tolerated. In any event, each pin 1004 is slidably disposed between the first stop surface 1008A and the second stop surface 1008B of a respective slot 1000.

The slots 1000 and the pins 1004 thus operate to help facilitate a controlled bending of the article 10, but also pivotally and slidably connect some of the links 954 of the first flexible support structure 16. Accordingly, when the article 10 is moved between the curved or bent position shown in FIG. 47K and the substantially flat position shown in FIG. 47L, the pins 1004 are configured to slide within the slots 1000, respectively, such that the slidably connected links 954 slide toward or away from one another. When the article 10 is moved from the curved position (FIG. 47K) to the substantially flat position (FIG. 47L), the pins 1004 slide away from the first stop surfaces 1008A and toward the second stop surfaces 1008B, thereby causing portions of the slidably connected links 954 to slide away from one another and increasing a length of the first flexible support structure 16. When, on the other hand, the article 10 is moved from the substantially flat position (FIG. 47L) to the curved position (FIG. 47K), the pins 1004 slide away from the second stop surfaces 1008B and toward the first stop surfaces 1008A, thereby causing portions of the slidably connected links 954 to slide toward one another and decreasing the length of the first flexible support structure 16. In this manner, the slots 1000 and the pins 1004 help to facilitate a controlled movement of the article 10 and also facilitate movement of the first flexible support structure 16 relative to the display 18 (and vice-versa).

In other examples, the slots 1000 can vary. For example, the slots 1000 can have a different shape (e.g., an elliptical shape) and/or a different size (e.g., the slots 1000 can be longer or shorter, thereby permitting more or less bending). As another example, the article 10 can include more or less slots 1000 and thus can include more or less sliding areas. Although not explicitly illustrated herein, it will be appreciated that it is not necessary to utilize the pockets 980 in combination with the slots 1000 and the pins 1004. Both serve substantially the same purpose, such that alternative articles 1000 may include only the pockets 980 (as illustrated in FIGS. 47G-47I) or only include the slots 1000 and the pins 1004.

In some implementations, a mobile device, such as an attachable or wearable device, may include various flexible electronic components disposed on more than one surface of the mobile device. A user of the mobile device may selectively utilize the various flexible electronic components by exposing certain surfaces of the mobile device, bending the mobile device to certain positions, etc. For example, the mobile device may include an electronic display or light array on one surface and an energy generating component (e.g., including solar panels) on another surface of the mobile device. In the case of the mobile device being a wearable device, a user may attach the device to the user's body with the electronic display or light array facing up (i.e., away from the user's body) to utilize the electronic display or light array. Then a user may "flip" the device over (e.g., by detaching the device and bending the device in an opposite direction), expose the energy generating component, and re-attach the device to utilize the energy generating component.

A wearable computing or communication device or wearable article, such as a smartwatch or other bracelet-type device, may integrate flexible electronic components on multiple surfaces, as discussed herein. For example, a flexible wristband or smartwatch integrating multiple flexible electronic components may integrate a flexible electronic display on one surface (e.g., a "top" of a device) and while also integrating an energy generating component on another surface (e.g., a "bottom" of the device). Generally, however, it is understood that any type of wearable or non-wearable computing, communication, or other mobile device, may integrate flexible electronic components disposed on multiple surfaces, as discussed herein.

FIG. 48A is a perspective view of an example flexible, attachable article 2100, such as a smartwatch or bracelet-type computing or communication device. The article 2100 integrates a first flexible electronic component on a first surface 2102 of the article 2100 and a second flexible electronic component on a second surface 2104 of the article 2100. The first flexible electronic component may include a flexible display 2106 and the second flexible electronic component may include one or more solar panels 2108. FIG. 48B is a perspective view of another side of the example article 2100.

Content, such as images, data, maps, calendars, social media information, etc., may be displayed on a flexible display 2106 at or near a surface 2102 of the article 2100. The article may also include the touch interface (not shown) to allow a user to interact with the flexible display by touching the surface 2102. The solar panels 2108 may generate energy, when exposed to sunlight, to at least partially power the flexible display 2106, charge one or more batteries (not shown), or power other electronic components of the article 2100.

In some implementations, the article 2100 may utilize a flexible display as described in U.S. Provisional Patent Application Ser. No. 61/920,705, filed Dec. 24, 2013, and entitled "DYNAMICALLY FLEXIBLE, ATTACHABLE DEVICE HAVING AN INTEGRAL FLEXIBLE DISPLAY," a touchscreen interface as described in U.S. Provisional Patent Application No. 61/981,132, filed Apr. 17, 2014, and entitled "INFRARED TOUCH SYSTEM FOR FLEXIBLE DISPLAYS," and/or a support structure component as described in U.S. Provisional Patent Application No. 61/946,412, filed Feb. 28, 2014, and entitled "SUPPORT STRUCTURE FOR A FLEXIBLE DISPLAY COMPONENT," the disclosures of which are hereby expressly incorporated by reference herein. Also, the article 2100 may utilize any number of the flexible displays and/or other flexible electronic components described herein.

FIGS. 48C and 48D are other perspective views of the article 2100 bent or flexed into shape to be utilized as a bracelet or watch type device. To this end, the article 2100 may include any suitable number of latches, buttons, Velcro attachments, etc. as further discussed in U.S. Provisional Patent Application 61/003,549, filed May 28, 2014 and entitled "FLEXIBLE ELECTRONIC COMPONENT MOVABLY COUPLED TO A FLEXIBLE SUPPORT," the disclosure of which is hereby expressly incorporated by reference herein. Further, the latches, buttons, etc. may be configured so as to allow the article to be selectively bent or flexed into a bracelet/watch shape with either electronic display 2106 or the solar panels 2108 on the outer peripheral of the article 2100. That is, in one scenario, a user of the article may attach the article to the user's wrist with the electronic display 2106 facing outward and the solar panels 2108 against the body of the user. However, in another scenario, the user of the article may attach the article to the user's wrist with the solar panels 2108 facing outward and the electronic display 2106 against the body of the user. In this manner, a user may selectively position the article 2100 to primarily operate one of the electronic display 2106 or the solar panels 2108, as a primary operating component, in an implementation.

The article 2100 may include an electronics module 2110 disposed between one or more ends of the surface 2104 (as shown in FIG. 48D) and holds electronics, such as processors, memories, sensors, batteries, display drivers, etc. that are used to power and drive the touch interface and the flexible display 2106 and to control the solar panels 2108. It will be appreciated that the electronics module 2110 can be positioned elsewhere in other examples, such as, for example, at other locations on the surface 2102 or between one or more ends of the surface 2102. If desired, the components of the electronics module 2110 can be sealed or otherwise protected from water, air, dirt, etc. to which the exterior of the article 2100 is exposed. For example, any or all of these electronic components may be encapsulated in a hermetically sealed manner to prevent any direct exposure of these components to exterior forces and environmental hazards. Further details of example electronics modules, which may be implemented as the electronics module 210, are discussed with reference to FIG. 65.

Although an article or device, such as a wearable device, may include a flexible display on one surface and a power generating component (e.g., including solar panels) on another surface, articles or devices discussed herein may include any types of flexible electronic components on multiple surfaces and may include more than two flexible electronic components. For example, a wearable device may integrate any combination of flexible electronic components including light arrays (e.g., arrays of LED lights), cameras, biometric sensors (e.g., heart rate monitors or blood pressure monitors), motion sensors, kinematic sensors (gyroscopes, accelerometers, etc.), computer-readable media, etc. disposed on multiple surfaces (two, three, four, etc. surfaces) of the wearable device. Further, although the article 2100 depicts the flexible electronic components 2106 and 2108 covering approximately equal surface areas on either side of the article 2100, an article may include a flexible electronic component on one side of the article of a different size and shape as compared to a flexible electronic component disposed on another side of the article. Flexible electronic components may, in some cases, cover an area up to one of more edges of a surface on which they are disposed. In other cases, flexible electronic components may only cover a portion of a surface of a device with some non-covered area, or border, between the flexible electronic components and an edge of the device.

FIGS. 49A and 49B illustrate example article 2200 integrating an array of lights 2202 (e.g., LEDs) on a first surface 2204 and a power generating component 2206 (e.g., including solar panels) and a second surface 2208. In some implementations, the array of lights 2202 may be, at least partially, powered by energy generated from the power generating component 2206. For example, the power generating component 2206, when operating, may generate energy that is stored in a battery (e.g., of an electronics module). Then, when the array of lights 2202 operates, the array of lights 2202 may receive power from the battery via any suitable combination of electronic leads and power conditioning components.

Figure 50:
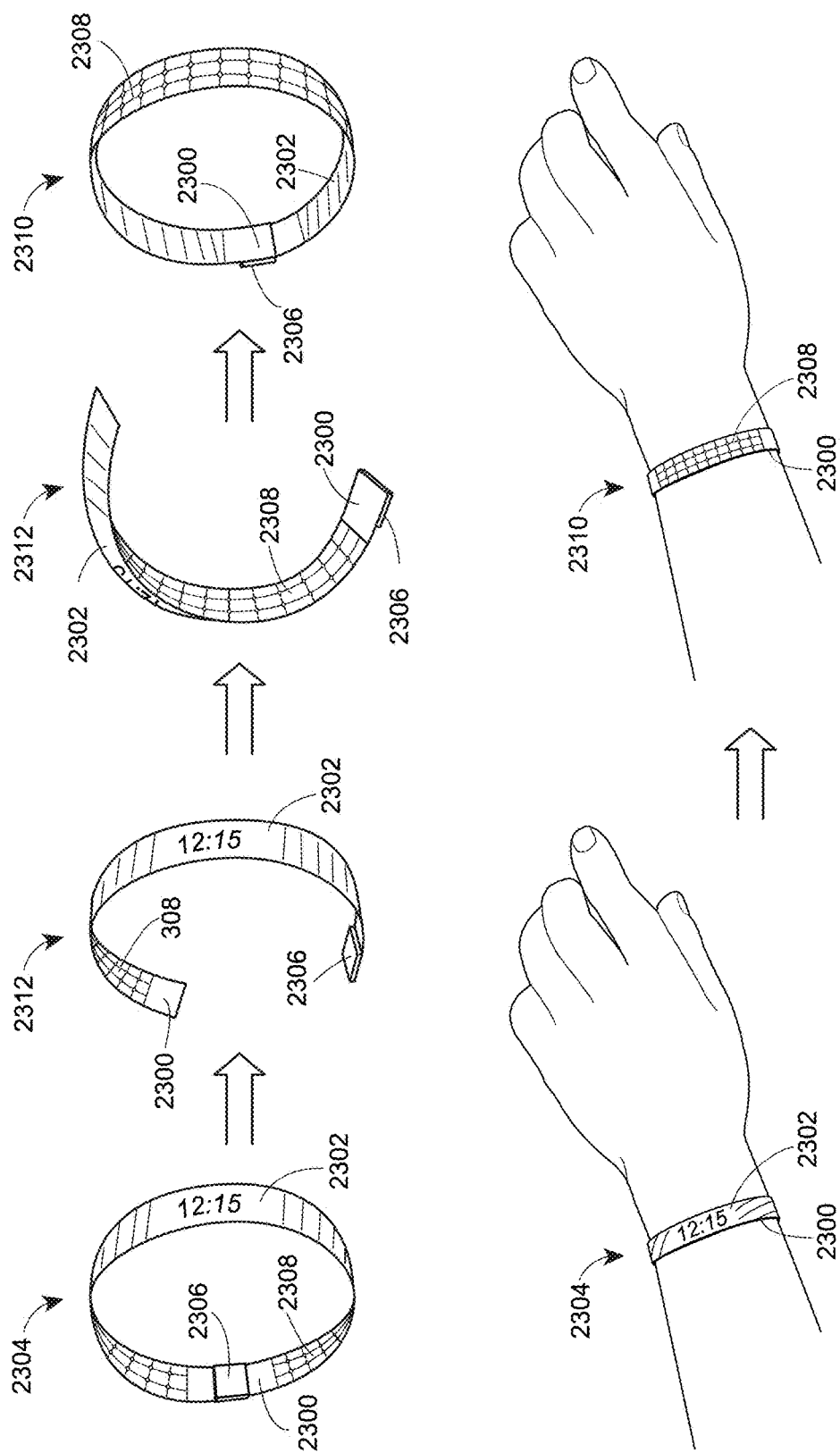
FIG. 50 illustrates a process of bending an article from a first position to a second position so as to utilize flexible electronic components on both sides of the article, such as one of the articles depicted in FIGS. 48A, 48B, 48C, 48D, 49A, and 49B.

FIG. 50 illustrates an example utilization (e.g., by a user) of multiple flexible electronic components disposed on multiple surfaces of an example wearable device 2300. The wearable device 2300 may, for example, integrate flexible electronic components as discussed further with reference to FIGS. 48A, 48B, 48C, and 48D.

In an example scenario, a user may be operating a flexible display 2302 of the wearable device 2300 while the wearable device 2300 is bent or flexed to a position 2304. In the position 2304 the flexible display 2302 may be disposed on a surface of the wearable device 2300 so as to be on or near an outer peripheral of the wearable device 2300. As illustrated in FIG. 50, the position 2304 may allow a user to attach the wearable device 2300 to the user's wrist as a bracelet- or watch-type device so as to view images displayed on the flexible display 2302. For example, the flexible display 2302 (e.g., controlled by an electronics module 2306) may display images, times, weather information, calendar appointments, emails, text messages, etc., as further discussed below.

While flexed or bent to the position 2304, another flexible electronics component disposed on another surface of the wearable device 2300, such as the power generating component 2308 (e.g., including one or more solar panels), may not be exposed. That is, the power generating component may be disposed on a surface of the wearable device 2300 that is against the body of the user (i.e., in back of the flexible display 2302). In such a case, the electronics module 2306 may control the power generating component 2308 and/or other flexible electronic components to be in a sleep, hibernate, or other low-power or non-active state while the flexible display 2302 is active. Thus, in the position 2304, the flexible display 2302 may operate as a primary operating component, in an implementation.

At certain times or to select certain functionality of the wearable device 2300, a user of the wearable device 2300 may flex or bend the wearable device 2300 from the position 2302 to another position 2310, as illustrated by the one or more intermediate positions 2312. Specifically, in an implementation, a user may: (i) detach the wearable device 2300 from the body of the user (e.g., a wrist); (ii) "flip" the device over, as illustrated by the intermediate positions 2312 in FIG. 50, or otherwise adjust the orientation of the wearable device 2300; and (iii) re-attach (e.g., via one or more latches, buttons, etc.) the wearable device 2300 in the position 2310 with the power generating component 2308 on an outer peripheral of the wearable device 2300.

In this manner, a user of the wearable device 2300 may expose the power generating component 2308 so as to operate, or allow an electronic module 2306 to control, the power generating component 2308 as a primary operating component of the wearable device 2300. That is, when in the position 2310, the electronics module 2306 may control the flexible display 2302 and/or other flexible electronic components to be in a sleep, hibernate, or other low-power or non-active state while the power generating component 2308 is active.

By way of example, a user may perform the process illustrated in FIG. 50 to selectively perform certain functions facilitated by the flexible display 2302 and the power generating component 2308. A user may flex or bend the wearable device 2300 to the position 2304 to view digital content (e.g., images) via the flexible display 2302, and a user may flex or bend the wearable device 2300 to the position 2310 to generate power via the power generating component 2308. In one scenario, the user may view images on the flexible display 2302 (while the wearable device is in the position 2304) until a charge of a battery powering the flexible display 2302 runs low. The user may then perform the process illustrated in FIG. 50 to expose the power generating component 2308 and allow the power generating component 2308 to generate power (e.g., one or more solar cells) to re-charge the battery.

Figure 51A:
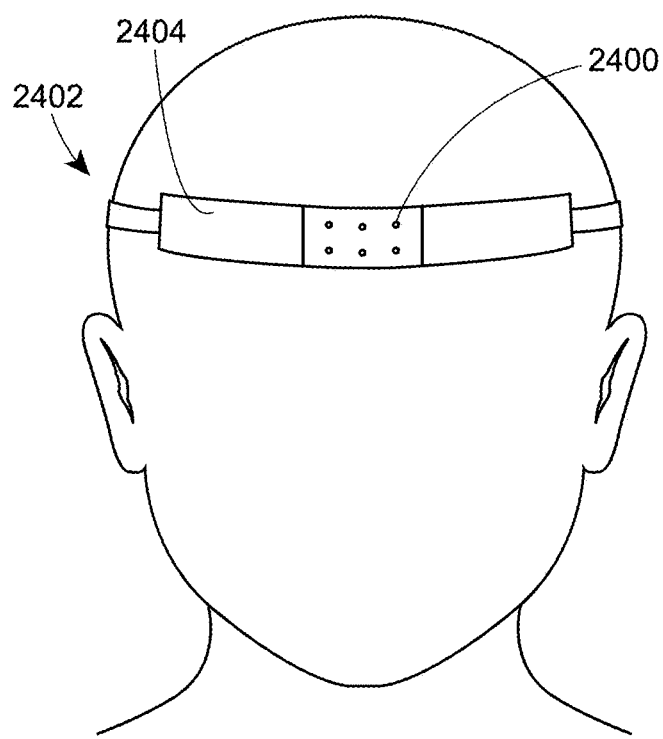
FIGS. 51A and 51B illustrate example wearable applications of an article having flexible electronic components disposed on two surfaces of the article, such as one of the articles depicted in FIGS. 48A, 48B, 48C, 48D, 49A, and 49B.
Figure 51B:
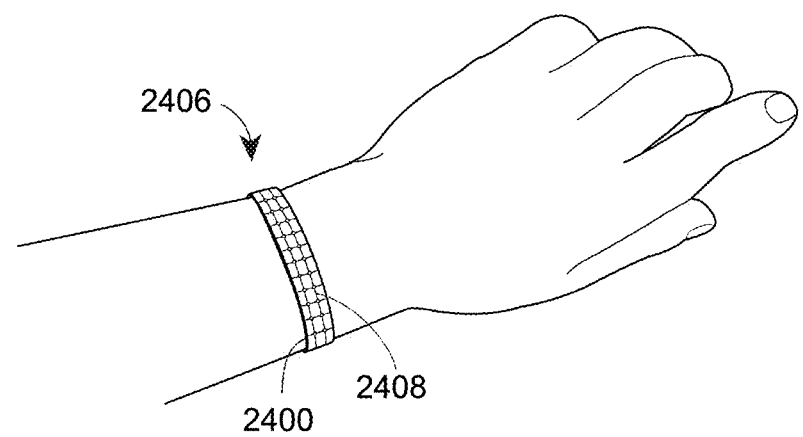

FIGS. 51A and 51B illustrate applications of another example wearable device 2400 which may integrate flexible electronic components on multiple surfaces of the wearable device 2400 as further discussed with reference to FIGS. 49A and 49B. In the position 2402 an array of lights 2404 may be disposed on a surface of the wearable device 2400 so as to be on or near on outer peripheral of the wearable device 2400. As illustrated in FIG. 51A, the position 2402 may allow a user to attach the wearable device 2400 to the user's head (e.g., via one or more bands or clasps) as a headband or head mounted device so as to utilize the array of lights 2404 as a head lamp. For example, a user may attach the wearable device 2400 in the position 2402 to illuminate a walking, hiking, biking, or other path.

As with the example wearable device 2300, a user may flex or bend the wearable device 2400 to another position 2406 (as illustrated in FIG. 51B) to selectively perform other functions facilitated by a power generating component 2408 on another surface of the wearable device 2400. A user may flex or bend the wearable device 2400 to the position 2402 during night or in another dark environment to allow the array of lights 2404 to illuminate a path, and a user may flex or bend the wearable device 2400 to the position 2406 to allow the power generating component 2408 to generate power. The flexible electronic components disposed on multiple surfaces of the wearable device 2400 may provide functionalities that are useful at different times. Thus, a user may position a wearable device to allow the wearable device to provide a specific functionality that is relevant to a current time (displaying images, illuminating a path, charging a battery, etc.), in an implementation.

To prevent flexible electronic components disposed on multiple surfaces of a device/article (e.g., the flexible display 2106 and the solar panels 2108) from being bent or curved beyond minimum critical bending radii, but at the same time substantially maintain the bending ability of the flexible electronic components, the article 2100 can, in some cases, include a flexible support that is movably (e.g., slidably) coupled with or to the flexible electronic components. In particular the flexible support may be coupled with or to the flexible electronic components in a manner that allows the flexible support and the flexible electronic components to move (e.g., slide) relative to or independently of one another when the article 2100 is moved between different positions (e.g., between a substantially flat position and a bent position). Examples of different arrangements are described in connection with FIGS. 52A, 52B, 53A, 53B, 54A, 54B, 55A, 55B, 56A, 56B, 57A, 57B, 58A, 58B, 58C, and 58D. While these arrangements are generally described as including a flexible display and a secondary electronic component, it will be appreciated that these arrangements can include any number of combinations of different types of flexible electronic components (a flexible electronic circuit, a sensor tag, a flexible OLED light, a solar panel, a light array, etc.) including combinations with more than two flexible electronic components. Further, although article 2100 is referred to below for ease of discussion, any of the articles 2100, 2200, 2300, or 2400 or substantially similar articles integrating flexible electronic components on multiple surfaces may utilize the arrangements are described in connection with FIGS. 52A, 52B, 53A, 53B, 54A, 54B, 55A, 55B, 56A, 56B, 57A, 57B, 58A, 58B, 58C, and 58D.

Generally speaking, because flexible electronic components (e.g., the flexible display 2106 and the solar panels 2108) and the flexible support are movable independently of one another, the amount of strain that the flexible support places on the flexible electronic components (e.g., the flexible display 2106 and the solar panels 2108) when the article 2100 is being bent or curved is minimized as these structures do not alter or only minimally alter the neutral plane of the flexible electronic component (e.g., the flexible display 2106 and the solar panels 2108). This feature, in turn, minimizes the minimum critical bending radius of each of the flexible electronic components when coupled to the flexible support.

Advantageously, in some of these cases, the flexible support can be removably coupled to the flexible electronic components (e.g., the flexible display 2106 and the solar panels 2108) so that the flexible support can be separated from the flexible electronic components. In turn, one or more of the flexible electronic components can be easily and quickly placed and associated with any number of different objects, items, or devices, such as, for example, a coffee cup, a phone case, a charging stand, or a different flexible support. In the latter case, the flexible support can be removed and interchanged with a different flexible support selected from one or more different flexible supports. This plurality of different flexible supports can include, for example, flexible supports made of a different material (e.g., leather, plastic, cloth), having a different texture (e.g., smooth, perforated), made of one or more different colors (e.g., brown, black, white, etc.), associated with a different style, or any combinations of these features. In this manner, the flexible support, and, more generally, the flexible attachable article 2100, can be customizable. It will be appreciated that, in the same manner, the flexible electronic components can be removed from the flexible support and the flexible support can be interchanged or connected to a different flexible electronic components selected from one or more different flexible components. The different flexible components can include, for example, one or more different types of flexible components (e.g., different flexible displays 18, one or more OLED lights, one or more sensor tags, etc.), flexible components made of one or more different materials, flexible components having different thicknesses, etc., or combinations thereof. In this manner, the flexible electronic component (e.g., the flexible display 18), and, more generally, the flexible attachable article 10, can be customizable.

Figure 52A:
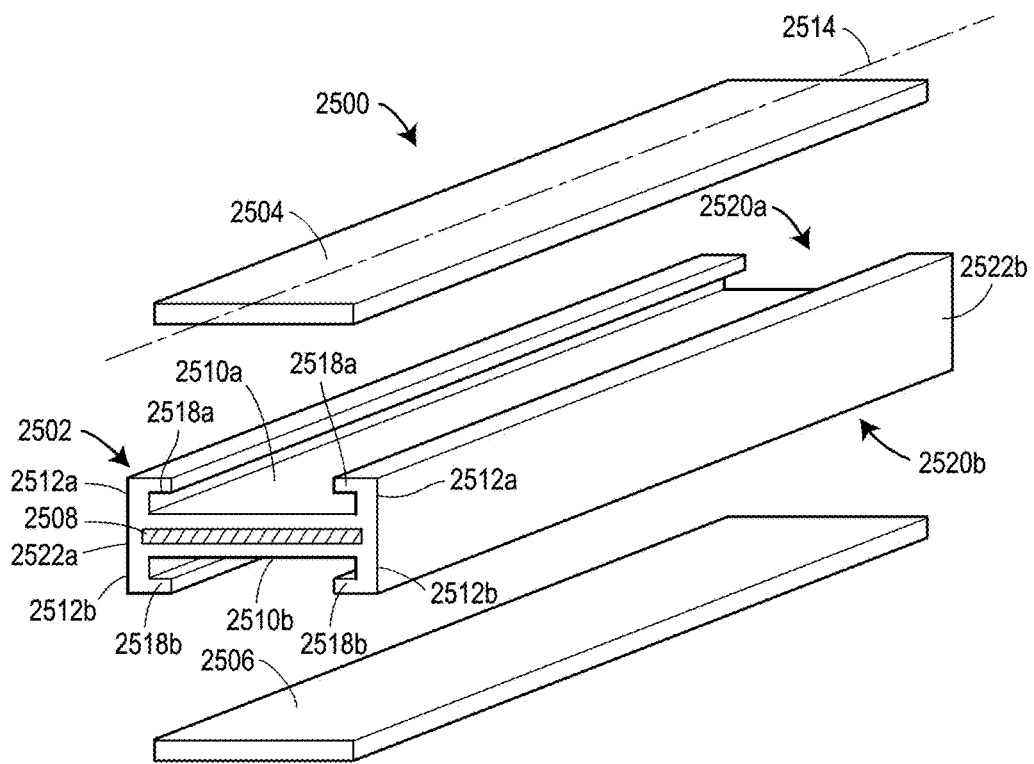
FIGS. 52A and 52B illustrate another example attachable article in the form of a wristband having multiple flexible electronic components slidably coupled to a flexible support.
Figure 52B:
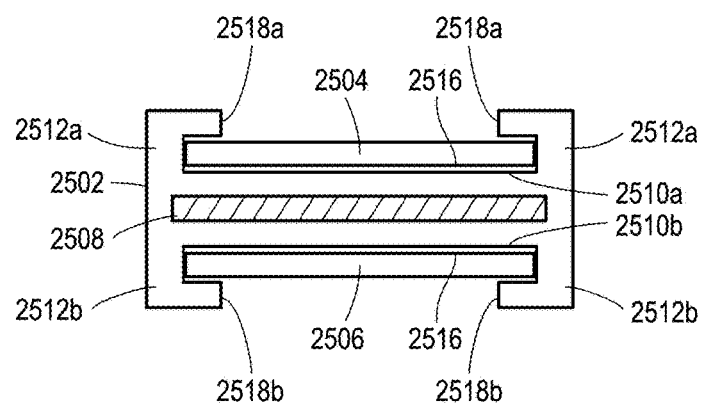

FIGS. 52A and 52B illustrate a dynamically flexible, attachable article 2500, again in the form of a wristband, that includes a flexible support structure 2502, a flexible electronic component in the form of a flexible electronic display 2504, and a secondary electronic component 2506 (e.g., an energy generating component such as a component including one or more solar panels). The flexible electronic display 2504 and the secondary electronic component 2506 of the example article 2500 are movably disposed within the flexible support structure 2502. The article 2500 also includes a mechanical support component 2508 fixedly attached to the flexible support structure 2502. Though not expressly illustrated herein, the article 2500 can include one or more connectors described herein, such as, for example, the connectors illustrated in FIGS. 1-24, and/or any of the other connectors described herein.

The flexible support structure 2502 and the mechanical support component 2508 are generally configured to provide support to the flexible electronic display 2504 and the secondary electronic component 2506. The flexible support structure 2502 can be made of any suitable flexible suitable material such as, for example, cloth, leather, plastic, metal, or other material. As illustrated in FIGS. 52A and 52B, the flexible support structure 2502 in this example has or is defined by a pair of longitudinally-extending, elongated walls 2510a and 2510b. Further, for each of the walls 2510a and 2510b, the flexible support structure 2502 includes a pair of opposing sidewalls 2512a and 2512b that extend upward, at an angle substantially perpendicular to the longitudinal axis 2514, from a longitudinally-extending perimeter edge of the walls 2510a and 2510b.

As illustrated in FIG. 52B, a lubricant 2516 (e.g., oil, graphite, PTFE) can be disposed on (e.g., applied to) the walls 2510a and 2510b, or portions thereof, to facilitate movement between the support structure 2502 and the flexible electronic display 2504 and/or the secondary electronic component 2506. The flexible support structure 2502 further has a retaining portions 2518a and 2518b that extend laterally inward from a top portion of the opposing sidewalls 2512a and 2512b, respectively, such that the retaining portions 2518a and 2518b hang over the walls 2510a and 2510b of the support structure 2502. Together, the walls 2510a and 2510b, the sidewalls 2512a and 2512b, and the retaining portions 2518a and 2518b define a cavities 2520a and 2520b sized to support and receive the flexible electronic display 2504 and/or the secondary electronic component 2506, respectively, therein. As illustrated in FIG. 52B, the cavities 2520a and 2520b have a substantially rectangular-shape in cross-section.

The mechanical support component 2508 may be fixedly disposed in and/or adhered to a slot or channel within the flexible support structure 2502. The mechanical support component 2508 and a corresponding slot in the flexible support structure 2502 may extend between one end 2522a of the flexible support structure 2502 and the other end 2522b of the flexible support structure 2502. The mechanical support component 2508 is, in this example, made of a second flexible material that has a different (e.g., higher) Young's Modulus (i.e., is less elastic or more rigid) than the flexible support component 2502. The mechanical support component 2508 can, for example, be made from cloth, rubber, leather, nylon, plastic (e.g., PTFE), and/or any other suitable flexible material different from a material used to construct the flexible support component 2502. Generally, flexible support structure 2502 is more elastic, or less stiff, than the mechanical support component 2508. In fact, in some cases, the flexible support structure 2502 can be significantly more elastic than the mechanical support component 2508 and can be highly elastic or bendable.

The mechanical support component 2508 can be retained within the flexible support structure 2502 (if desired) via friction, and may, if desired, be secured at, for example, one point in the slot, using adhesive (e.g., glue), or via some other manner. In any event, the mechanical support component 2508, by virtue of being made from stiffer material than the flexible support structure 2502, provides some rigidity to the overall support structure for the flexible electronic display 2504 and the secondary electronic component 2506, thereby providing some support to the flexible electronic display 2504 and the secondary electronic component 2506.

Moreover, because the flexible support structure 2502 is movably coupled to or with the flexible electronic display 2504 and the secondary electronic component 2506 (and vice-versa), the flexible electronic display 2504 and the secondary electronic component 2506 are movable relative to or independently of the flexible support structure 2502 (and vice-versa).

As illustrated in FIG. 52B, the flexible electronic display 2504 and the secondary electronic component 2506 can be seated or disposed in the cavities 2520*a* and 2520*b*, respectively. In turn, the sidewalls 2512*a* and 2512*b* of the flexible support structure 2502 extend upward adjacent and in some cases above the edges of the flexible electronic display 2504 and the secondary electronic component 2506, such that the sidewalls 2512*a* and 2512*b* can provide side impact protection for the flexible electronic display 2504 and the secondary electronic component 2506, respectively. In addition, the retaining portions 2518*a* and 2518*b*, which extend inward of the edges of the flexible electronic display 2504 and the secondary electronic component 2506, can contact a surface of the flexible electronic display 2504 and the secondary electronic component 2506 to prevent the flexible electronic display 2504 and the secondary electronic component 2506 from exiting the flexible support structure 2502, thereby retaining the flexible electronic display 2504 and the secondary electronic component 2506 within the flexible support structure 2502.

In this manner, the flexible electronic display 2504 and the secondary electronic component 2506 are slidably coupled with or to the flexible support structure 2502 (and vice-versa), with the flexible electronic display 2504 and the secondary electronic component 2506 being slidable independently of or relative to the flexible support structure 2502 (and vice-versa). Accordingly, as the article 2500 is bent to form a circular or oval band, similar to the form illustrated in FIG. 48D, the flexible electronic display 2504 and the secondary electronic component 2506 move independently or relative to corresponding portions of the flexible support structure 2502 (and vice-versa). In some implementations utilizing lubricants, such as the lubricants 2516, the lubricants helps to facilitate the movement between the flexible support structure 2502 and the flexible electronic display 2504 and the secondary electronic component 2506. At some point, the article 2500 can be bent to such a degree that the retaining portions 2518*a* and 2518*b* contact corresponding portions of the flexible electronic display 2504 and the secondary electronic component 2506. However, the support structure in the walls 2510*a* and 2510*b* may limit the bending motion of the walls 2510*a* and 2510*b* and, thus, limit the bending motion of the flexible electronic display 2504 and the secondary electronic component 2506 to predetermined minimal bending radii. At this point, the article 2500 has reached its pre-defined bending limit and any further bending of the article 2500, particularly the flexible electronic display 2504 and the secondary electronic component 2506 is prevented. Conversely, the article 2500 can be returned to the substantially flat position, as illustrated in FIGS. 48A and 48B, in a similar manner.

At the same time, because the flexible support 2502 is slidably coupled to or with the flexible electronic display 2504 and the secondary electronic component 2506, the arrangement illustrated in FIGS. 52A and 52B may not alter the central bending or neutral plane of the flexible electronic display 2504 or the central bending or neutral plane of the secondary electronic component 2506, thereby substantially maintaining the bending ability (e.g., the bending range) of the flexible electronic display 2504 and the secondary electronic component 2506. In other words, such an arrangement leaves the article 2500 with a bending range that is substantially similar to the bending range(s) of the flexible electronic display 2504 and/or the secondary electronic component 2506.

In other examples, the article 2500 can vary from the one illustrated in FIGS. 52A and 52B. The flexible support 2500 illustrated in FIGS. 52A and 52B can vary in shape and/or size. The flexible support 2500 can, for example, be wider, thereby creating more space between: (i) the sidewalls 2512*a* and 2512*b*, and (ii) the flexible electronic display 2504 and/or the secondary electronic component 2506. The sidewalls 2512*a* and 2512*b* can, for example, be angled more or less relative to the walls 2510*a* and 2510*b*. The retaining portions 2518*a* and 2518*b* can, for example, be constructed differently (e.g., can extend along only a portion of the length of the article 2500, can be angled more or less relative to the sidewalls 2512*a* and 2512*b*). The cavities 2520*a* and 2520*b* can be of a different size (e.g., smaller, larger) and/or can have a different shape in cross-section. As yet another example, the flexible support 2502 need not include the retaining portions 2518*a* and 2518*b*. Instead, the flexible support 2502 can be slidably or otherwise movably coupled with the flexible electronic display 2504 and/or the secondary electronic component 2506 in a different way (e.g., using angled sidewalls). The flexible electronic display 2504 and/or the secondary electronic component 2506 can also take the form of a different flexible electronic component, such as, for example, a sensor tag, a flexible OLED light, a flexible electronic circuit, or a collapsible e-reader.

Figure 53A:
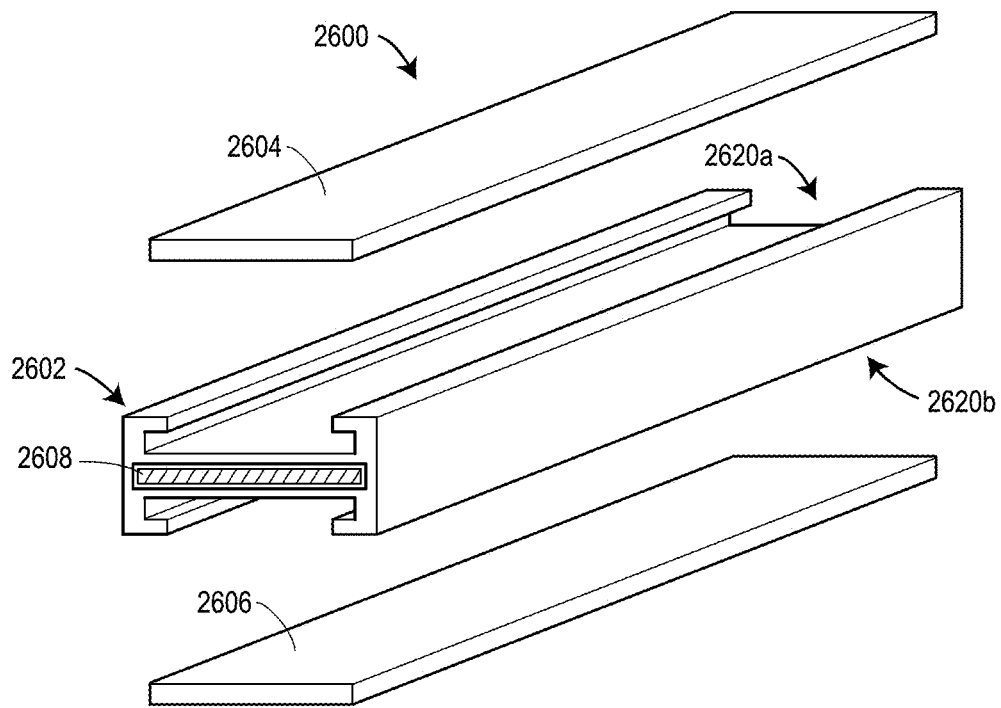
FIGS. 53A and 53B illustrate another example attachable article in the form of a wristband having a flexible electronic component and a mechanical support component slidably coupled to a flexible support.
Figure 53B:
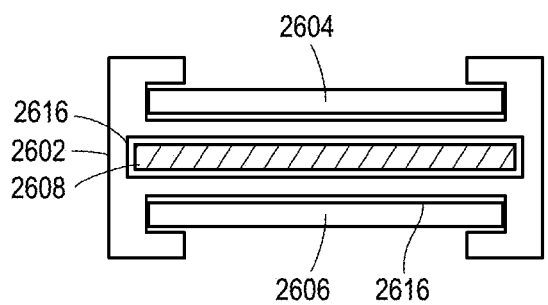

Although FIGS. 52A and 52B illustrate an example article 2500 in which flexible electronic components are slidably coupled to the support structure 2502 and a mechanical support component 2508 is fixedly coupled to the support structure 2502, some implementations of articles having multiple flexible electronic components may include some electronic components fixedly attached to a support structure and/or mechanical support components slidably attached to a support structure. FIGS. 53A and 53B illustrate one such example article. In particular, 53A and 53B illustrate an attachable article 2600, again in the form of a wristband. The article 2600 in this example again includes two flexible electronic component disposed on multiple surfaces of the article 2600. Specifically, the article 2600 includes a flexible support structure 2602, a flexible electronic component in the form of a flexible electronic display 2604, and a secondary electronic component 2606 (e.g., an energy generating component or an array of lights). In this article 2600, however, the flexible electronic display 2604 is fixedly attached to the flexible support structure 2602 while a mechanical support component 2608, within the flexible support structure 2602, is slidably coupled to the flexible support structure 2602. Though not expressly illustrated herein, the article 2600 can also include one or more connectors described herein, such as, for example, the connectors illustrated in FIGS. 1-24, and/or any of the other connectors described herein.

As in the article 2500, the flexible electronic display 2604 and the secondary electronic component 2606 may be seated or disposed in cavities 2620*a* and 2620*b* of the flexible support structure 2602. However, as mentioned above, the flexible electronic display 2604 is fixedly attached to the flexible support structure 2602 (e.g., via glue or friction) within the cavity 2620*a*, while the mechanical support component 2608 and the secondary electronic component 2606 are slidable independent of or relative to the flexible support structure 2602 and the flexible electronic display 2604. In some implementations, lubricants 2616 help to facilitate the movement between: (i) the flexible support structure 2602, and (ii) the mechanical support component 2608 and/or the secondary electronic component 2606.

Because the flexible support 2602 is slidably coupled to or with the mechanical support component 2608 and the secondary electronic component 2606, the arrangement illustrated in FIGS. 53A and 53B may not alter the central bending or neutral plane of the flexible electronic display 2604 or the central bending or neutral plane of the secondary electronic component 2606, thereby substantially maintaining the bending ability (e.g., the bending range) of the flexible electronic display 2604 and the secondary electronic component 2606. In other words, such an arrangement leaves the article 2600 with a bending range that is substantially similar to the bending range(s) of the flexible electronic display 2604 and/or the secondary electronic component 2606. Such an arrangement may be desired, for example, when the article 2600 is to be configured with a bending range similar to that of the flexible electronic display 2604 and/or the secondary electronic component 2606, and the bending range of the mechanical support component 2808 is less of a concern. That is, the secondary electronic component 2606 may drive the bendability constraints of the article 2600, while the mechanical support component 2608 is fixedly attached to the flexible support structure 2602 to conform to these bendability constraints. In other cases, when the flexible support structure 2602 has a flexibility that is very high compared to the flexible electronic display 2604, the neutral plane of the flexible electronic display 2604 is not substantially altered by being adhered to the flexible support structure 2602.

Generally, articles having a plurality of flexible electronic components disposed on multiple surfaces and having various mechanical support components may include any suitable combination of fixed and sliding attachments of the flexible electronic components and/or mechanical support components to a flexible support structure. For example, an article may include an arrangement in which a secondary electronic component (e.g., an energy generating component) is fixedly attached to a flexible support structure while a flexible electronic display and a mechanical support component are slidably attached to the flexible support structure. In another example, an article may include three flexible electronic components, two of which are slidably attached to a flexible support structure and one of which is fixedly attached to a flexible support structure, and may include two mechanical support components, one of which is slidably attached to a flexible support structure and one of which is fixedly attached to a flexible support structure. More generally, articles may include any suitable number of flexible electronic components slidably/fixedly attached to a flexible support structure and any suitable number of mechanical support components slidably/flexibly attached to the flexible support structure so as to conform to bendability constraints of one or more of the flexible electronic components and/or to conform to bendability requirements of a product. In many embodiments, however, articles include one electronic component being adhered to a flexible support structure while other electronic components are free to flex and/or slide.

Figure 54A:
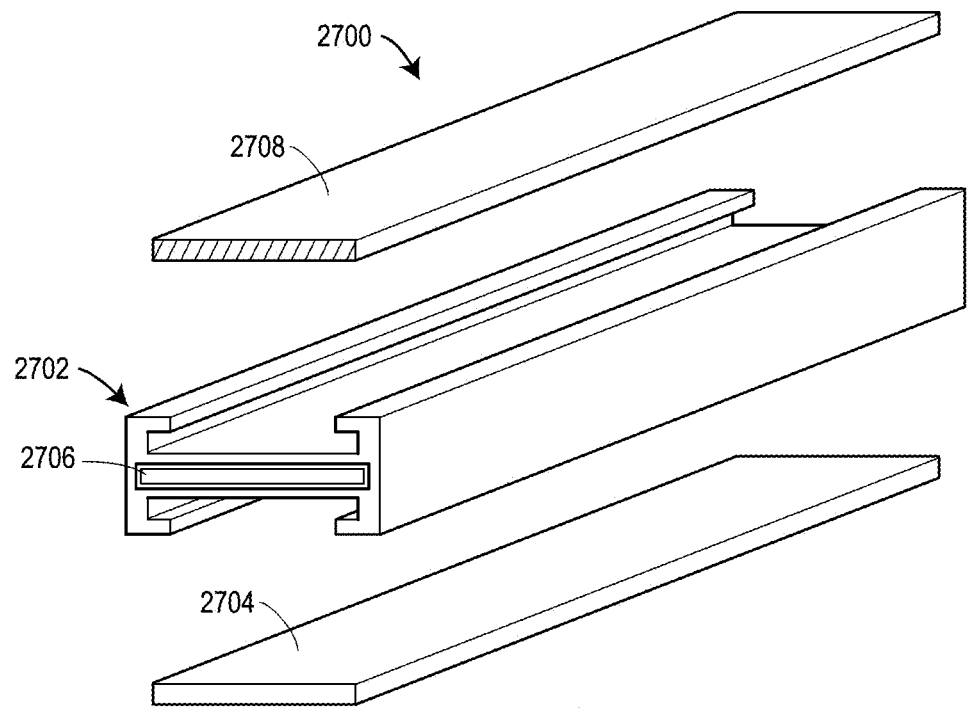
FIGS. 54A and 54B illustrate another example attachable article in the form of a wristband having multiple flexible electronic components slidably coupled to a flexible support.
Figure 54B:
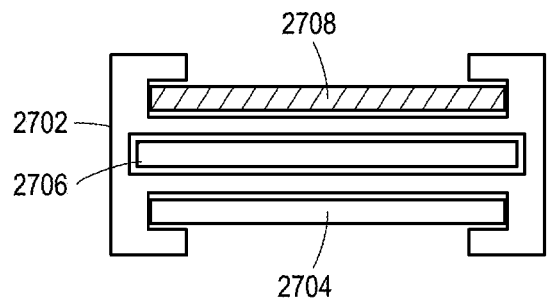

Further, although FIGS. 52A, 52B, 53A, and 53B illustrate flexible electronic components on exterior surfaces of article, some articles may include flexible electronic components disposed on interior surfaces. FIGS. 54A and 54B illustrate one example of such an article. In particular, 54A and 54B illustrate an attachable article 2700, again in the form of a wristband. The article 2700 in this example again includes two flexible electronic component disposed on multiple surfaces of the article 2700. Specifically, the article 2700 includes a flexible support structure 2702, a flexible electronic component in the form of a flexible electronic display 2704, and a secondary electronic component 2706 (e.g., an energy generating component or an array of lights or a flexible electronics circuit). In this article 2700, the secondary flexible electronic component 2706 is disposed in a slot within the flexible support structure 2702 while a mechanical support component 2708 is disposed on an exterior surface or within an exterior cavity of the article 2700. Though not expressly illustrated herein, the article 2700 can also include one or more connectors described herein, such as, for example, the connectors illustrated in FIGS. 1-24, and/or any of the other connectors described herein.

This arrangement, illustrated in FIGS. 54A and 54B, may allow the secondary electronic component 2706 to be positioned behind the flexible electronic display 2704. For example, the secondary electronic component 2706 may include a light array configured to backlight the flexible electronic display 2704. In another example, the secondary electronic component 2706 may be a touch sensor to sense pressure from an object that touches the surface of the flexible electronic display 2704. In these cases the secondary electronic component 2706 and/or the flexible electronic display 2704 may be slidably or fixedly attached to the flexible support structure 2702, as further discussed with reference to FIGS. 52A, 52B, 53A, and 53B. Further, although not illustrated in FIGS. 54A and 54B, the flexible support structure 2702 may include any number of gaps, holes, windows, etc. between the secondary electronic component 2706 and/or the flexible electronic display 2704 to facilitate touch sensor, backlighting, etc. functionality.

Generally, any types of flexible electronic components may be disposed behind other flexible electronic components and/or within flexible support structures of articles. For example, an array of lights may be disposed on an exterior surface of an article and a flexible electronic display may disposed behind the array of light such that the array of lights frontlights the flexible electronic display.

Figure 55A:
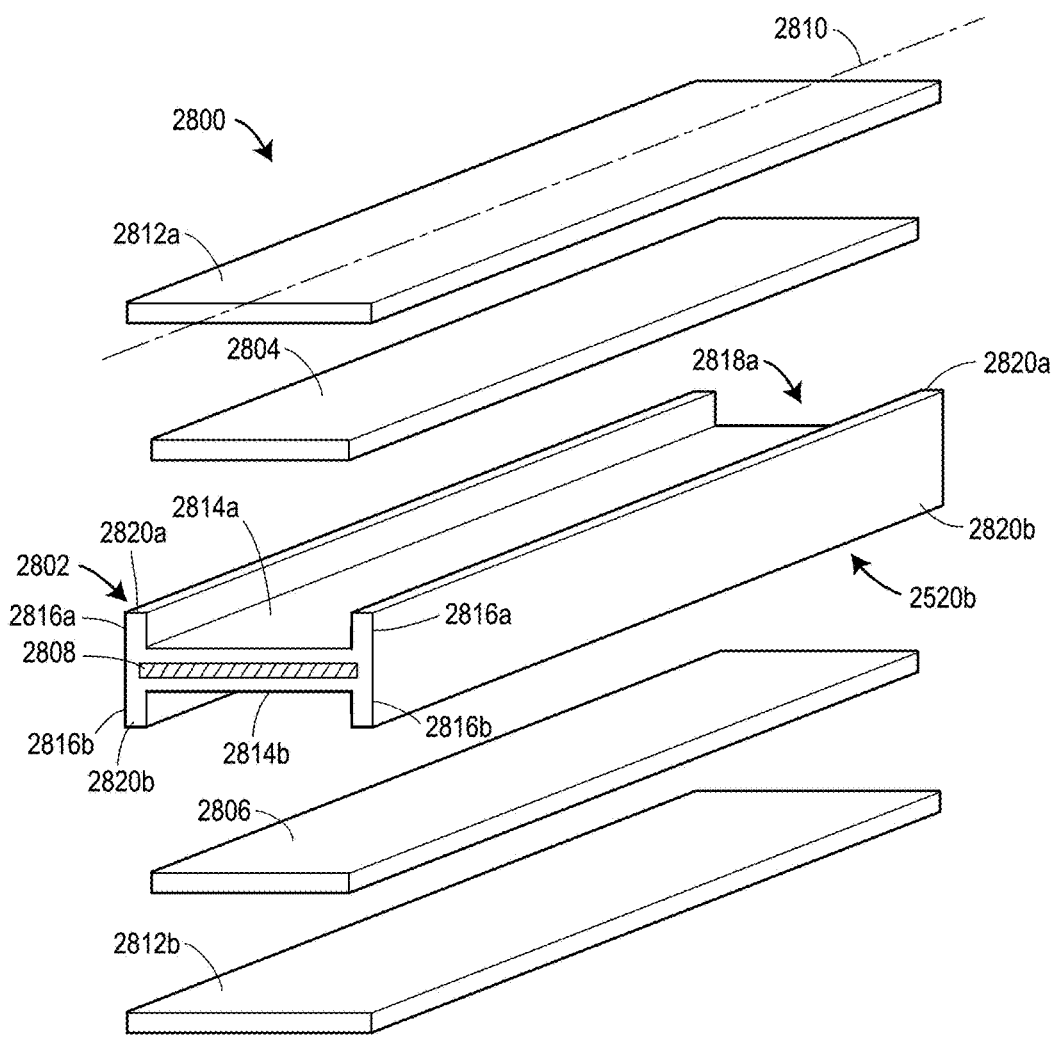
FIGS. 55A and 55B illustrate another example attachable article in the form of a wristband having multiple flexible electronic components slidably coupled to a flexible support.
Figure 55B:
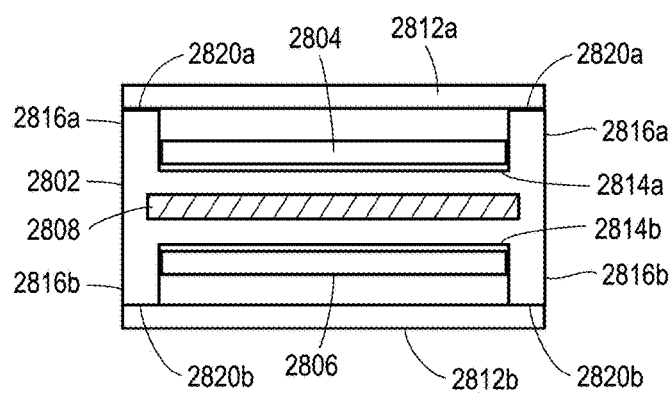

FIGS. 55A and 55B illustrate yet another dynamically flexible, attachable article 2800, again in the form of a wristband, that is substantially similar to the article 2100 illustrated in FIGS. 48A, 48B, 48C, and 48D. The article 2800 in this case includes a flexible support structure 2802, a flexible electronic component in the form of a flexible electronic display 2804, a secondary electronic component 2806, and a mechanical support component 2808. The flexible electronic display 2804 and the secondary electronic component 2806 may be movably disposed within the flexible support structure 2802. The article 2800 also includes a horizontal or longitudinal axis 2810. Unlike the articles 2500, 2600, and 2700 illustrated in FIGS. 52A, 52B, 53A, 53B, 54A, and 54B, the article 2800 illustrated in this example further includes a flexible or bendable and transparent sheets of material 2812a and 2812b disposed on the support structure 2802 and over the flexible electronic display 2804 and the secondary electronic component 2806, respectively. Though not expressly illustrated herein, the article 2800 can also include one or more connectors described herein, such as, for example, the connectors illustrated in FIGS. 1-24, and/or any of the other connectors described herein.

The flexible sheets 2812a and 2812b illustrated in FIG. 55A have a substantially rectangular shape similar to the shape of the flexible support structure 2802, the flexible electronic component 2804, and the secondary electronic component 2806. The sheets 2812*a* and 2812*b* in this example have a width that is larger than a width of the flexible electronic component 2804, and the secondary electronic component 2806 and that is substantially equal to the width of the flexible support structure 2802. The sheets 2812*a* and 2812*b* are a generally transparent layer, such that image content provided on the display 2804 is viewable through the sheet 2812*a* and/or light or other radiation is able to pass through the sheet 2812*b* and impact the secondary electronic component 2806. The sheets 2812*a* and 2812*b* can be made of any suitable flexible or bendable material, such as, for example, plastic (e.g., acrylic), glass (e.g., Plexiglass), and/or any other flexible material(s). Though not illustrated herein, an anti-reflective coating can, in some cases, be applied to the sheets 2812*a* and 2812*b* to optimize the optimal performance of the article 2800.

The flexible support structure 2802 and the mechanical support component 2808 are generally configured to provide support to the flexible electronic component 2804 and the secondary electronic component 2806, as discussed further with reference to FIGS. 52A and 52B. As illustrated in FIGS. 55A and 55B, the flexible support structure 2802 has or is defined by a longitudinally-extending, elongate walls 2814*a* and 2814*b*. Further, the flexible support structure include, for each of the walls 2814*a* and 2814*b*, a pair of opposing sidewalls 2816*a* and 2816*b* that extend upward from a longitudinally-extending perimeter edge of the walls 2814*a* and 2814*b*. Though not illustrated herein, a lubricant (e.g., oil, graphite, PTFE) can be disposed on (e.g., applied to) the walls 2814*a* and 2814*b*, or portions thereof, to facilitate the movement described below between: (i) the support structure 2802, and (ii) the flexible electronic display 2804 and/or the secondary electronic component 2806. Together, the walls 2814*a* and 2814*b* and the sidewalls 2816*a* and 2816*b* define cavities 2818*a* and 2818*b* sized to support and receive the flexible electronic display 2804 and secondary electronic component 2806, respectively, therein. As illustrated in FIG. 55B, the cavities 2818*a* and 2818*b* have a substantially rectangular-shape in cross-section. Each sidewall 2816*a* and 2816*b* has an exposed portion 2820*a* and 2820*b* sized to support and receive corresponding portions of the layers 2812*a* and 2812*b* thereon.

Figure 56A:
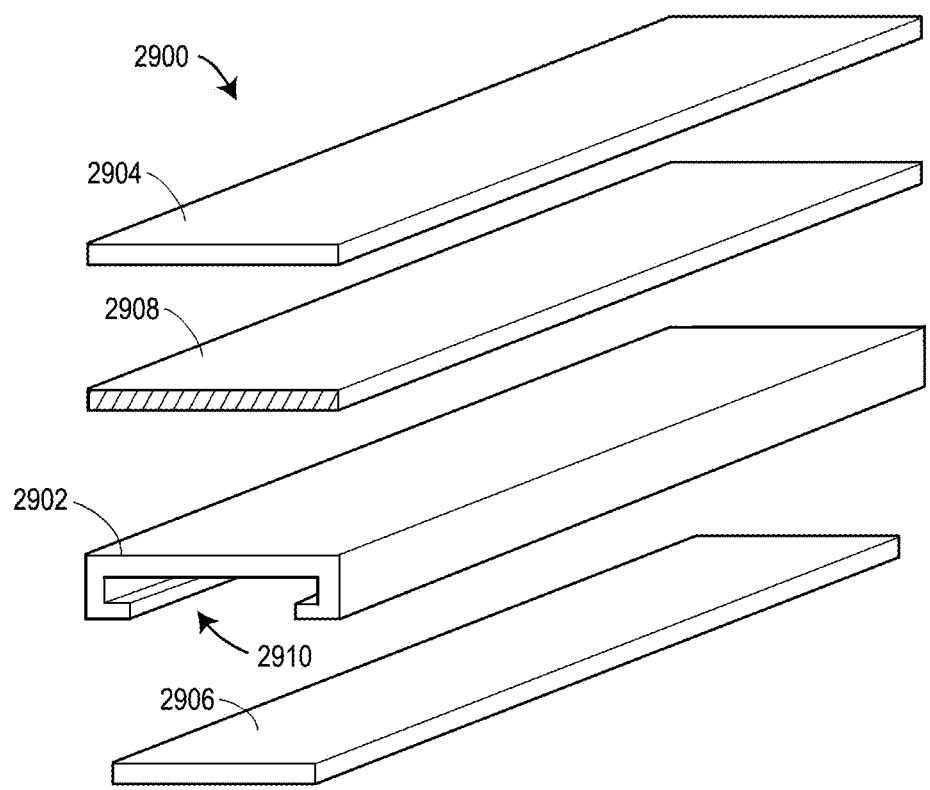
FIGS. 56A and 56B illustrate another example attachable article in the form of a wristband having a flexible electronic display assembly and a secondary flexible electronic component slidably coupled to a flexible support.
Figure 56B:
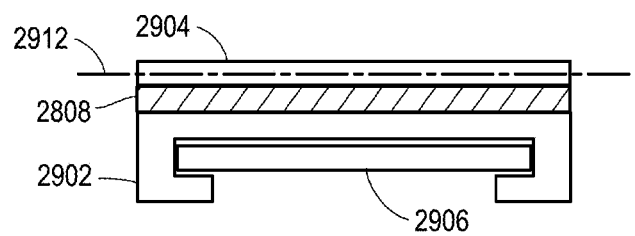

Although FIGS. 52A, 52B, 53A, 53B, 54A, 54B, 55A, and 55B illustrate flexible electronic components and mechanical support components that are disposed within or on cavities or slots of a flexible support structure, some implementations of articles including multiple flexible electronic components may include flexible electronic components attached or adhered to other flexible electronic components and/or mechanical support components (as opposed to a flexible support structure). FIGS. 56A and 56B illustrate an example of one such article. In particular, 56A and 56B illustrate an attachable article 2900, again in the form of a wristband. The article 2900 in this example again includes two flexible electronic components disposed on multiple surfaces of the article 2900. Specifically, the article 2900 includes a flexible support structure 2902, a flexible electronic component in the form of a flexible electronic display 2904, and a secondary electronic component 2906 (e.g., an energy generating component or an array of lights). In contrast to the example articles 2500, 2600, 2700, and 2800, the flexible electronic component 2904 and a mechanical support component 2908 are adhered to one another, possibly with a interlayer (e.g., form, not shown) in between the flexible electronic component 2904 and a mechanical support component 2908. Though not expressly illustrated herein, the article 2900 can also include one or more connectors described herein, such as, for example, the connectors illustrated in FIGS. 1-24, and/or any of the other connectors described herein.

The secondary electronic component 2906 may be slidably coupled to the flexible support structure 2902 within a cavity 2910, as further discussed with reference to FIGS. 52A and 52B. On the other hand, the flexible electronic display 2904 may be fixedly adhered to the mechanical support component 2908 (via an interlayer, glue, etc.), and the assembly of the flexible electronic display 2904 and the mechanical support component 2908 may be adhered (e.g., via glue and/or another interlayer) to the flexible support structure 2902. The flexible electronic display 2904 and the mechanical support component 2908 may be mounted or adhered to one another, along with an interlayer, as described in greater detail below. Further, the flexible electronic display 2904, the mechanical support component 2908, and one or more interlayers of the article 2900 may be assembled, or adhered together, using some or all of the mounting techniques described in U.S. Provisional Patent Application 61/971,100, filed March 27 and entitled "OPTIMAL MOUNTING OF A FLEXIBLE DISPLAY," the disclosure of which is hereby expressly incorporated by reference herein. In particular, the flexible electronic display 2904 and the mechanical support component 2908 may be mounted or adhered to one another such that the neutral bending plane 2912 of the flexible electronic display 2904 is minimally modified or selectively modified by the assembly process. In other embodiments, the mechanical support structure 2908 is constructed such that, when adhered to the display, the mechanical support structure 2908 does not alter the neutral plane of the display.

In addition to being assembled together as discussed above, some implementations of the article 2900 may include implementations of the flexible electronic display 2904 where the flexible electronic display 2904 is formed by multiple (e.g., ten) segmented patches. That is, the flexible electronic display 2904 itself may be made up of multiple laterally segmented patches, which patches are adhered to the mechanical support component 2908 (and possibly an interlayer). Such an assembly of the flexible electronic display 2904 may allow for expansion or compression during bending of the flexible electronic display 2904 without a need for sliding of the flexible electronic display 2904 independent of the mechanical support component 2908 and/or the flexible support structure 2902. In these implementations, the multiple segmented patches may be coupled to one another electronically (e.g., via various electronic leads) and/or physically (e.g., via glue or other linkages).

Moreover, any of the example articles 2100, 2200, 2300, 2400, 2500, 2600, 2700, 2800, or 2900 integrating multiple flexible electronic components may include various components configured to promote sliding of flexible electronic components, keep flexible electronic components taut, maintain certain positions of flexible electronic components relative to ends of flexible support structures, etc. FIGS. 57A, 57B, 58A, 58B, 58C, and 58D illustrate at least some examples of such components.

Figure 57A:
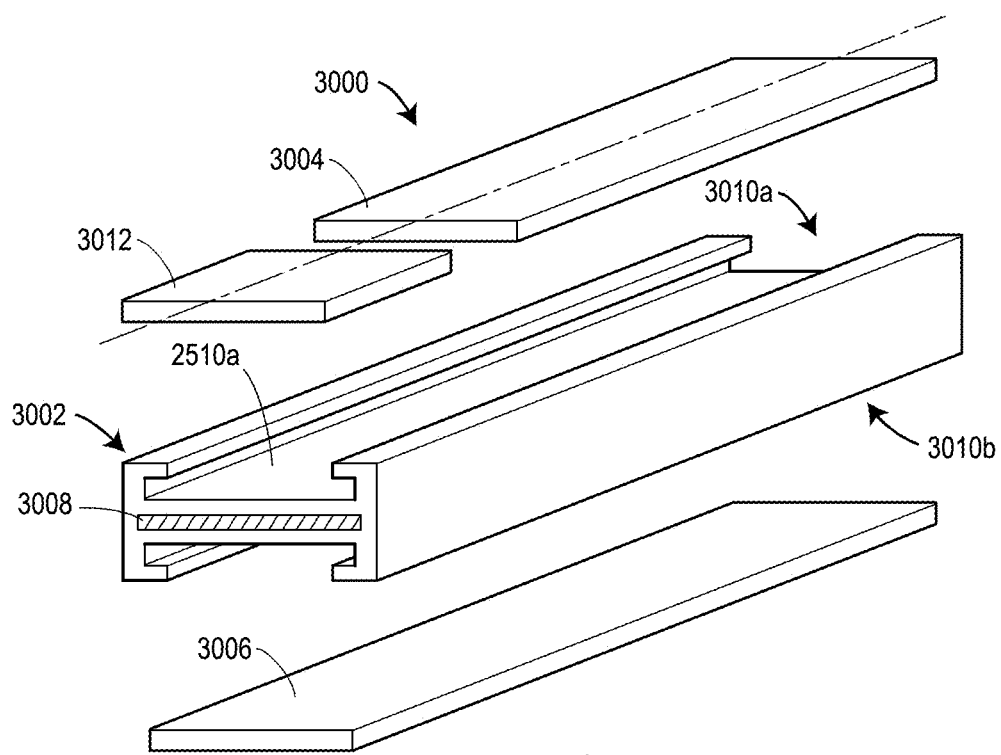
FIGS. 57A and 57B illustrate another example attachable article in the form of a wristband having multiple flexible electronic components slidably coupled to a flexible support and a spring element.
Figure 57B:
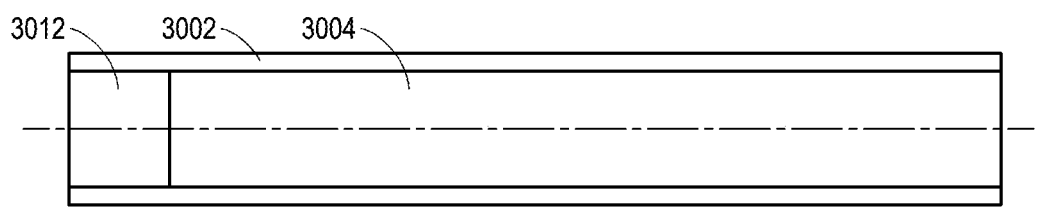

FIGS. 57A and 57B illustrate a dynamically flexible, attachable article 3000, again in the form of a wristband, that includes a flexible support structure 3002, a flexible electronic component in the form of a flexible electronic display 3004, and a secondary electronic component 3006 (e.g., an energy generating component such as a component including one or more solar panels). The flexible electronic display 3004 and the secondary electronic component 3006 of the example article 3000 are movably disposed within cavities 3010a and 3010b of the flexible support structure 3002, as further discussed with reference to FIGS. 52A and 52B. The article 3000 also includes a mechanical support component 3008 fixedly attached to the flexible support structure 3002 and a spring element 3012. Though not expressly illustrated herein, the article 3000 can include one or more connectors described herein, such as, for example, the connectors illustrated in FIGS. 1-24, and/or any of the other connectors described herein.

The flexible electronic display 3004 can generally take the form of any of the displays described herein or a different display consistent with any of the embodiments described herein. As illustrated in FIG. 57B, when the article 3000 is in a substantially flat position, the flexible display 3004 is shorter than the flexible support structure 3002, though this need not be the case (e.g., the display 3004 and the support 3002 can have the same length).

The spring element 3012 is provided to apply tension to one end of the flexible electronic display 3004. This applied tension facilitates the sliding movement between the flexible support structure 3002 and the flexible electronic display 3004 and helps to keep the electronic display 3004 taut (i.e., in a substantially flat configuration) at all times. In the illustrated example, the spring element 3012 is a substantially flat spring having a first end and a second end opposite the first end. In other examples, the spring element 3012 can be a different type of spring (e.g., a coil spring, a leaf spring, elastic fabric, etc.) or take a different form and yet still be suited for the intended purpose. For example, the spring element 3012 can take the form of a small cylinder with an axle disposed therethrough. As another example, the spring element 3012 can take the form of a mechanical slider.

As illustrated in FIG. 57B, the spring element 3012 is coupled to a portion of the flexible support structure 3002 and coupled to a portion of the flexible electronic display 3004 at one end of the flexible electronic display 3004. Specifically, as illustrated in FIGS. 57A and 57B, an end of the spring element 3012 may fixedly attached (e.g., adhered) to a portion of the support structure 3002, and another end may be fixedly attached (e.g., adhered) to a bottom surface of the flexible display 3004 at one end of the flexible electronic display 3004. In other examples, the spring element 3012 can be coupled in a different manner. When, for example, the spring element 3012 takes the form of a small cylinder with an axle disposed therethrough, the display 3004 can be attached to the cylinder (e.g., to one or both ends of the cylinder) such that the display 3004 can be rolled or unrolled when the article 3000 is bent. In one case, the display 3004 can be attached to the cylinder such that the display 3004 can partially rotate (i.e., turn by a certain amount of degrees) when the article 3000 is bent, thereby rolling or unrolling a part of the display that is attached to the cylinder. Alternatively, the cylinder can be coupled to or at one end of the display 3004 and the axle can be movably coupled to the flexible support structure 3002 (e.g., via a slot formed in sidewalls of the flexible support structure 3002) when the article 3000 is bent. When, for example, the spring element 3012 takes the form of a mechanical slider, the mechanical slider can be attached to or at one end of the display 3004 and movably coupled to the flexible support structure 3002 (e.g., via rails disposed on the walls of the support structure 3002).

It will be appreciated that the article 3000 can also include additional spring elements. For example, the article 300 may include another spring element, substantially similar to that described above, being configured to apply tension to another end or side of the flexible electronic display 3004. Also, one or more springs (not shown) may be configured to apply tension to the secondary electronic component 3006 within the cavity 2010b. Generally, the spring elements apply a tension force to ends or sides of flexible electronic components within cavities of a flexible support structure, thereby facilitating movement (e.g., sliding) and helping to keep the flexible electronic components taut.

Figure 58A:
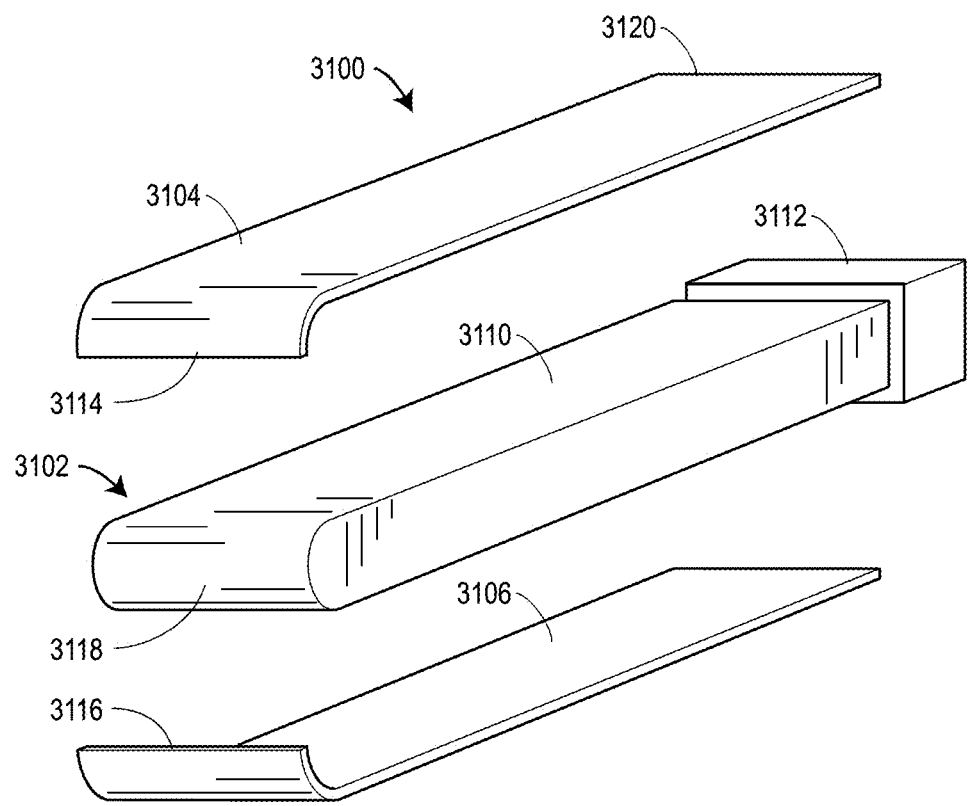
FIGS. 58A, 58B, 58C, and 58D illustrate other example attachable articles in the form of a wristband having multiple flexible electronic components slidably coupled to a flexible support with components or shapes to promote sliding.
Figure 58B:
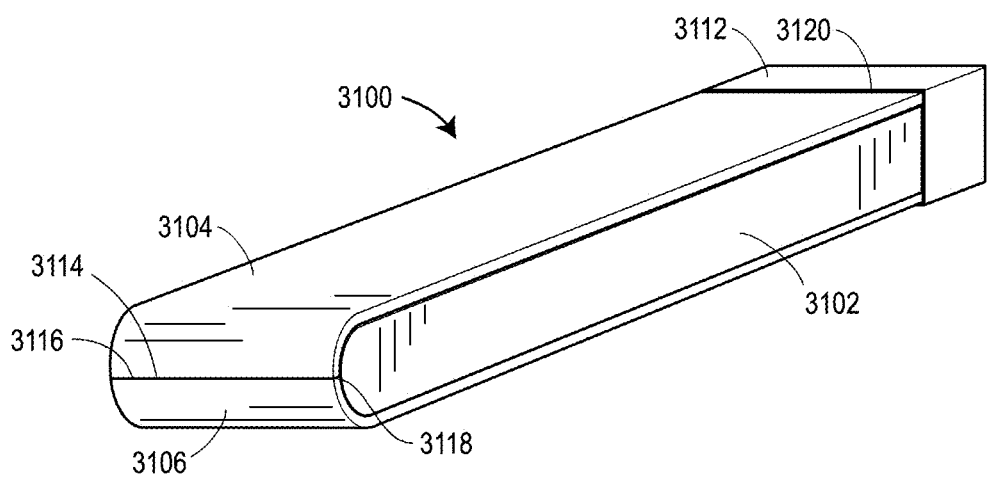

In addition to spring elements, flexible support structures and/or mechanical support components disposed within flexible support structures may be formed in certain shapes or may include certain components to promote sliding of flexible electronic components, keep flexible electronic components taut, maintain certain positions of flexible electronic components relative to ends of flexible support structures, etc. FIGS. 58A, 58B, 58C, and 58D illustrate at least some examples of such flexible support structures. In particular, FIGS. 58A and 58B illustrate a dynamically flexible, attachable article 3100, again in the form of a wristband, that includes a flexible support structure 3102, a flexible electronic component in the form of a flexible electronic display 3104, and a secondary electronic component 3106. The flexible electronic display 3004 and the secondary electronic component 3006 of the example article 3000 are movably disposed along a surface 3110 of the flexible support structure 3102.

An end 3114 of the flexible electronic display 3104 and an end 3116 of the secondary electronic component 3106 may be attached or adhered such that together the flexible electronic display 3104 and the secondary electronic component 3106 form a near continuous sheet that is slidably disposed on the surface 3110 of the flexible support structure 3102. In some implementations, the article 3100 may include lubricants between: (i) the flexible electronic display 3104 and the secondary electronic component 3106, and (ii) the surface 3110. These lubricants may promote sliding of the attached flexible electronic display 3104 and the secondary electronic component 3106 along the surface 3110. Further, an end 3118 of the flexible support structure 3102 may be in the shape of a half cylinder to further promote sliding of the assembly of the flexible electronic display 3104 and the secondary electronic component 3106 along the surface 3110.

Another end 3120 of one of the flexible electronic display 3104 or the secondary electronic component 3106 may be electronically coupled and fixedly attached to an electronic module 3112. The electronics module 3112 may be similar to that described with reference to FIG. 65, for example. Thus, when the article 3100 is flexed or bent, the assembly of the flexible electronic display 3104 and the secondary electronic component 3106 may slide along the surface 3110, independently of the flexible support structure 3102, while the end 3120 remains fixedly attached to the electronic module 3112. Because this attachment to the electronics module 3112 remains fixed, the flexible electronic display 3104 and the secondary electronic component 3106 may easily receive electronic signals from the electronics module 3112 when the article 3100 is in a bent state, without a need for sliding movement of the electronic module or unnecessary slack in electronic leads.

Figure 58C:
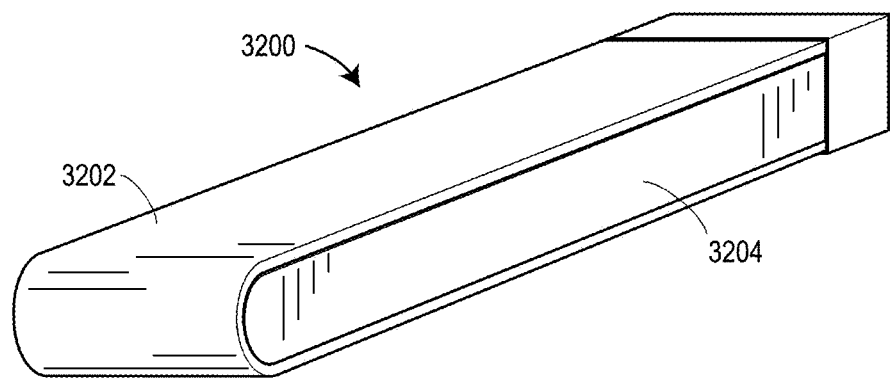

Although an assembly of flexible electronic components sliding over a surface of the flexible support structure 3102 is depicted in FIGS. 58A and 58B, some implementations may include different numbers (one, three, etc.) of flexible electronic components sliding along surfaces of flexible support structures, where the flexible support structures include cylinder like ends promoting sliding of the flexible electronic components. For example, FIG. 58C illustrates an article 3200 including a single flexible electronic component 3202 sliding along a surface of a flexible support structure 3204.

Figure 58D:
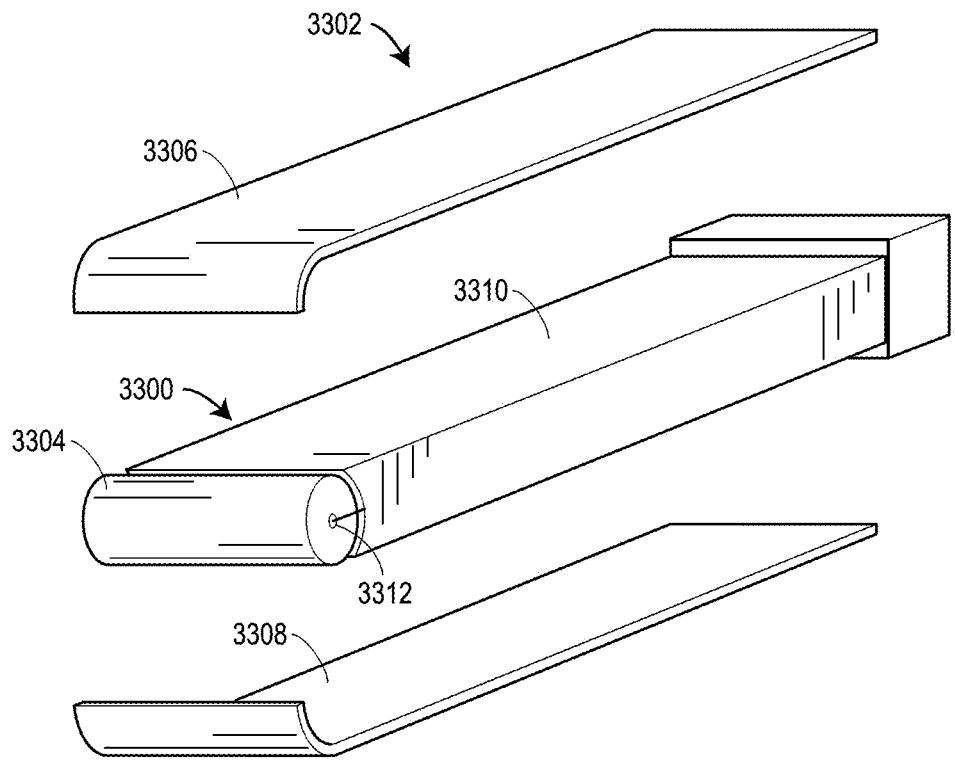

Still further, flexible support structures may include specific components configured to promote sliding of flexible electronic components, in addition to having surfaces in the form of certain shapes (e.g., cylinders). FIG. 58D illustrates one example of such a flexible support structure 3300 of an article 3302. The example flexible support structure 3300 includes a rolling cylinder component 3304 configured to promote sliding of a flexible display component 3306 and a secondary electronic component 3308 along a surface 3310. That is, when an assembly of the flexible display component 3306 and the secondary electronic component 3308 slide along the surface 3310, the rolling cylinder component 3304 may rotate about an axis 3312 so as to promote the sliding of the assembly of the flexible display component 3306 and the secondary electronic component 3308. Generally, flexible support structure may include any number and combination of specific components to promote sliding of flexible electronic components, such as cylinders, wheels, belts, etc.

Figure 59:
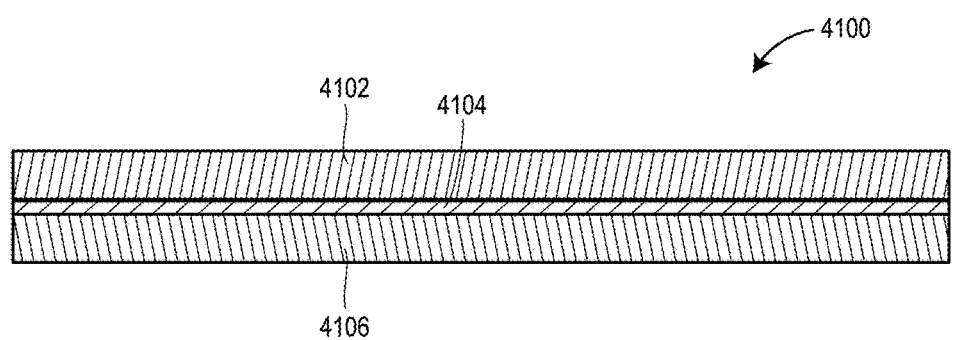
FIG. 59 is a side view of an article having a flexible electronic component, an interlayer coupled to the flexible electronic component, and a flexible support structure coupled to the flexible electronic component via the interlayer, the flexible support structure being configured to limit bending of the flexible electronic component and provide torsion protection for the flexible electronic component.

FIG. 59 generally depicts a dynamically flexible article or device 4100, such as, for example, a wristband, a shoe, a belt, a piece of jewelry, a strip, a lamp, a sticker, a reader, or other flexible electronic device. The article 4100 includes a flexible electronic component 4102, an interlayer 4104, and a flexible support structure 4106 coupled to the flexible electronic component via the interlayer 4104. As will be described herein, the flexible electronic component 4102 can be a flexible display, a flexible OLED light or lamp, a collapsible e-reader, a roll out screen, a flexible sheet or screen, a sensor tag, an electronic circuit, or other flexible electronic component. The interlayer 4104 can be or include one or more layers of foam, rubber, visco-elastic, adhesive, co-elastic material, stretchable material, or other suitable material(s). As will be described herein, the flexible support structure 4106 can be a mono-stable support structure (i.e., the support structure has one stable position) or a multi-stable support structure (i.e., the support structure has more than one stable positions), e.g., the flexible support structure can be a bi-stable support structure (i.e., the support structure has two stable positions). Regardless, the flexible support structure 4106 is generally configured to support and guide movement of the flexible electronic component 4102 to or between any number of mechanical positions.

As such, the article 4100, particularly the flexible electronic component 4102, is dynamically bendable or conformable to any number of surfaces, objects, or devices. The dynamically flexible article 4100 can, in some cases, be attached to or worn on a user's body (e.g., a user's wrist, a user's arm, etc.), and can bend to fit the various contours or body surfaces on which the flexible electronic component 4102 is located. The dynamically flexible article 4100 can also be easily attached to other items or surfaces, such as mugs, cups, computers, phone covers, bike handles, automobile dashboards, stands, etc., that enable the flexible electronic component 4102 to be viewed when not being held in the user's hands or on one's body. The electronic flexible component 4102 of the attachable article 4100, and the content provided via or by the component 4100, is thus, in many cases, viewable to a user and is capable of being manipulated or actuated by the user without having to be held in one or both of the user's hands, making the flexible electronic component 4102 useable while the user is engaged in or performing other activities, such as running, biking, etc.

Unlike known mechanical support structures, which do not sufficiently limit bending of a flexible electronic component and offer little-to-no protection against torsion applied to the flexible electronic component, the flexible support structure 4106 described herein is configured to protect the flexible electronic component 4102 by limiting undesirable bending of the flexible electronic component 4102 (e.g., bending in multiple directions, bending beyond the minimum bending radius of the component 4102) and/or controlling torsion that can be applied to the flexible electronic component 4102.

Figure 60A:
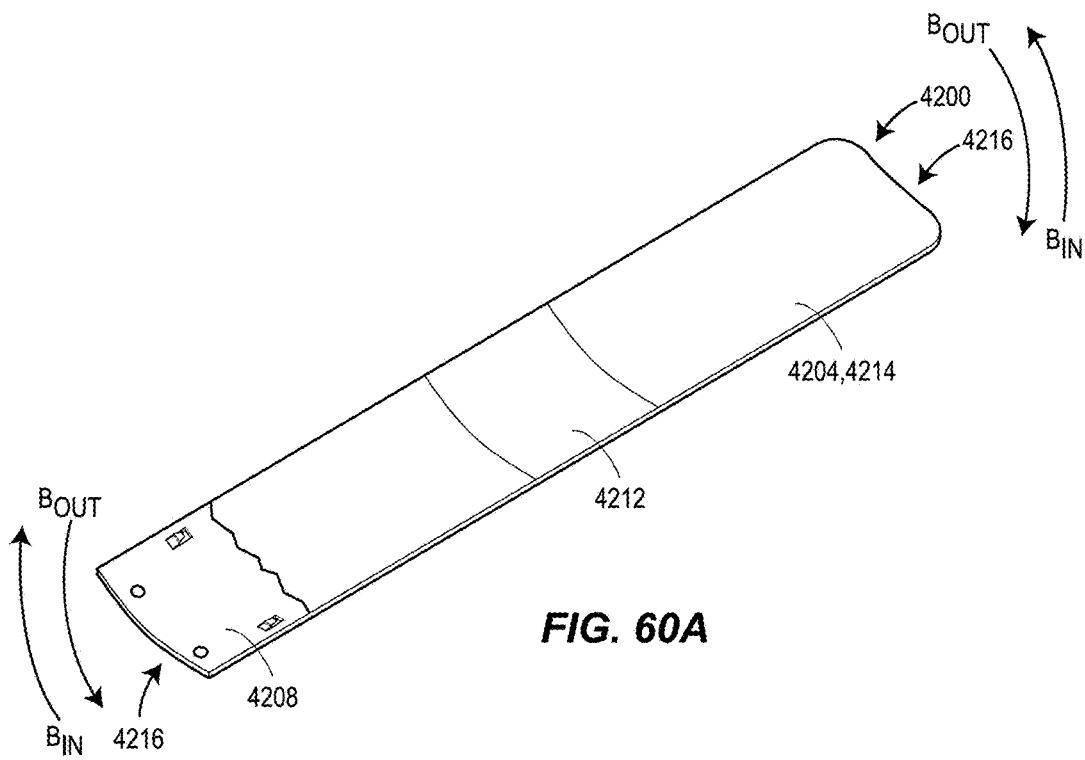
FIG. 60A is a perspective view of an example attachable article, in the form of a wristband, having a flexible display and a first type of flexible support structure coupled to the flexible display via an interlayer, the flexible support structure including a first substrate and a second substrate movably connected to the first substrate, such that the flexible support structure can limit bending of the flexible display and provide torsion protection for the flexible display.
Figure 60B:
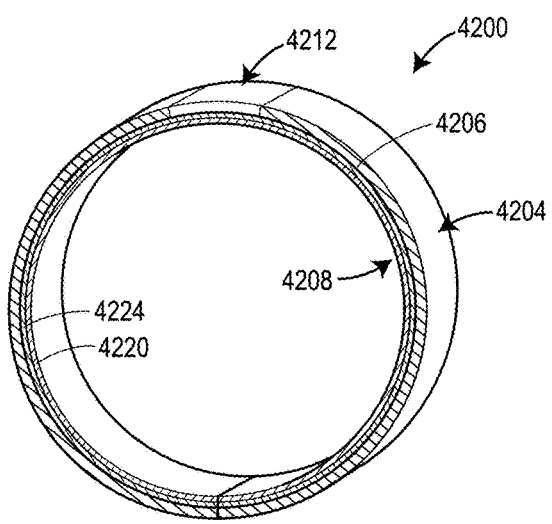
FIG. 60B is a side view of the attachable article illustrated in FIG. 60A bent or curved in an outward direction.

FIGS. 60A-60J illustrate a dynamically flexible article 4200, in the form of an attachable or wearable wristband. As illustrated in FIGS. 60A and 60B, the article 4200 includes a flexible electronic component 4204 and a flexible support structure 4208 coupled to the component 4204. The article 4200 is configured for bending, flexing, or curving in an outward direction (i.e., the component 4204 has a concave shape), which is indicated by the arrows in FIG. 60A. Generally speaking, FIG. 60A depicts the article 4200 in a first or substantially flat position, while FIG. 60B depicts the article 4200 in a second or curved position.

With reference to FIGS. 60A and 60B, the flexible electronic component 4204 is a flexible electronic display that is dynamically bendable or conformable to a surface, object, or device, though in other embodiments the flexible electronic component 4204 can be a collapsible e-reader, roll-out screen, OLED light, or other electronic component. The flexible display 4204 can be manufactured as any type of flexible display, such as an e-paper display, an organic light-emitting diode (OLED) display, etc., further details of which are described in commonly owned U.S. Provisional Patent Application 61/920,705, filed Dec. 24, 2013 and entitled "Dynamically Flexible, Attachable Device Having an Integral Flexible Display, the disclosure of which is hereby expressly incorporated by reference herein. Once manufactured, the flexible display 4204 can be configured for flexing, curving, or bending in an inward direction (i.e., the flexible display 4204 has a convex shape) and/or outward direction (i.e., the flexible display 4204 has a concave shape). As is known in the art, the flexible display 4204 has a minimum bending radius, which is based on the details surrounding the manufacture of the flexible display 4204. When the flexible display 4204 is flexed, curved, or bent beyond this minimum bending radius, one or more layers of the display 4204 can delaminate, buckle, or crack, or otherwise be damaged, causing damage to the display 4204. Likewise, when the flexible display 4204 is flexed, curved, or bent in multiple directions and/or twisted (i.e., torsion is applied), one or more layers of the display 4204 can delaminate, buckle, crack, or other be damaged, causing damage to the display 4204.

With reference still to FIGS. 60A and 60B, the article 4200 includes an electronics module 4212 that is disposed between opposing ends 4216 of the article 4200 and holds electronics, such as processors, memories, sensors, batteries, display drivers, etc. that are used to power and drive the flexible display 4204 and to provide other communication functionality for the device 4200. It will be appreciated that the electronics module 4212 can be positioned elsewhere in other examples, such as, for example, disposed on the flexible display 4204 or at another position between the ends 4216. If desired, the components of the electronics module 4212 can be sealed or otherwise protected from water, air, dirt, etc. to which the exterior of the device 4200 is exposed. For example, any or all of these electronic components may be encapsulated in a hermetically sealed manner to prevent any direct exposure of these components to exterior forces and environmental hazards.

As illustrated in FIG. 60A, the article 4200 further may include a touch screen interface 4214 disposed over the flexible display 4204. The touch screen interface 4214 can be a capacitive touch screen or any other type of touch screen interface that is transparent in nature, and thus can be laid over the top of the flexible display 4204 to allow the flexible display 4204 to be viewable there-through. As will be understood, the touch screen interface 4214 may be powered and controlled by the electronics disposed within the electronics module 4212 to perform various different types of touch detection functionality associated with a typical touch screen display.

The flexible support structure 4208 in this example is a bi-stable flexible support, such that the flexible support structure 4208 is movable between a substantially flat stable state or position, which corresponds to the first position of the article 4200 illustrated in FIG. 60A, and a curled or curved state or position, which corresponds to the second position of the article 4200 illustrated in FIG. 60B. The flexible support structure 4208 includes a first substrate 4220 and a second substrate 4224 movably connected to the first substrate 4220. As such, the flexible support structure 4208 is configured to limit bending of the article 4200, and, particularly, the flexible display 4204, when the structure 4208 is in both the flat stable state and the curved stable state, as will be described in greater detail below. In other words, the flexible support structure 4208 is configured to limit bending of the article 4200, and, particularly, the flexible display 4204 beyond the flat stable state and the curved stable state. Moreover, the flexible support structure 4208 is configured to provide torsion protection for the article 4200 by resisting torsion applied thereto, as will also be described in greater detail below.

As illustrated in FIG. 60B, an interlayer 4206 is disposed between the flexible display 4204 and the flexible support structure 4208. In this example, the interlayer 4206 is an adhesive layer that serves to mechanically couple (i.e., adhere) the flexible display 4204 to the flexible support structure 4208. In other examples, the interlayer 4206 can be or include a stretchable material (e.g., a flexible fabric covering integrally formed with the flexible display 4204 and coupled to the flexible support structure 4208), one or more layers of foam, rubber, visco-elastic, or other suitable material(s), or combinations thereof. In some cases, the interlayer 4206 only serves to couple portions or segments of the display 4204 to corresponding portions or segments of the flexible support structure 4208. In some cases, the interlayer 4206 can reduce, or even eliminate, the local variations in the bending radius of the article 4200. In other words, the inter layer 4206 can serve to smoothen out any local variation in the bending of the article 4200, particularly the local variation of any bending experienced by the flexible display 4204, thereby providing a more continuous local bending radius when the article 4200 is curved or bent. Advantageously, in some cases, the inter layer 4206 can also provide visco-elastic cushioning to the display 4204, thereby making the display 4204 less sensitive (e.g., less prone to damage) to objects dropped thereon. Finally, it will be appreciated that the article 4200 need not include the interlayer 4206, or any layer disposed between the flexible display 4204 and the flexible support 4208. Instead, the flexible display 4204 and the flexible support 4208 can be directly coupled to (e.g., integrally formed with) one another in any known manner.

As illustrated in FIGS. 60A and 60B, the flexible display 4204 is, in this example, disposed over and spans the entire length of the interlayer 4206 and the flexible support 4208, such that the flexible display 4204 extends between the ends of the article 4200 and is viewable from the top of the article 4200. In other examples, the flexible display 4204 may only be disposed over and span a partial length of the flexible support 4208 and/or may be disposed under the flexible support 4208.

Though not depicted in FIGS. 60A and 60B, the article 4200 can also include a connection structure that functions to connect the ends 4216 of the article 4200 together when the article 4200 is bent, as illustrated in FIG. 60B, to form a circular, oval, or other-shaped band. In some embodiments, the connection structure can be a magnetically-based connection structure, such as, for example, a connection structure in the form of magnets disposed within the flexible support 4208 at or proximate to the ends 4216, magnets disposed at the ends 4216 so that the ends 4216 connect end-to-end, or magnets disposed on the top or bottom sides of the support 4208 at or proximate to the ends 4216 so that the article 4200 can be folded around on itself so as to create an article of variable length. One or more mechanical connectors (e.g., buckles, snap components, clasps, cooperating grooves and projections, cooperating tabs and recesses), any desired hook and loop connection material (e.g., Velcro), or some other connection means can be used instead of or in addition to the magnetically-based connection structure. These and other connection structures are described in further detail in commonly owned U.S. Provisional Patent Application 61/920,705, filed Dec. 24, 2013 and entitled "Dynamically Flexible, Attachable Device Having an Integral Flexible Display, the disclosure of which is hereby expressly incorporated by reference herein.

Figure 60C:
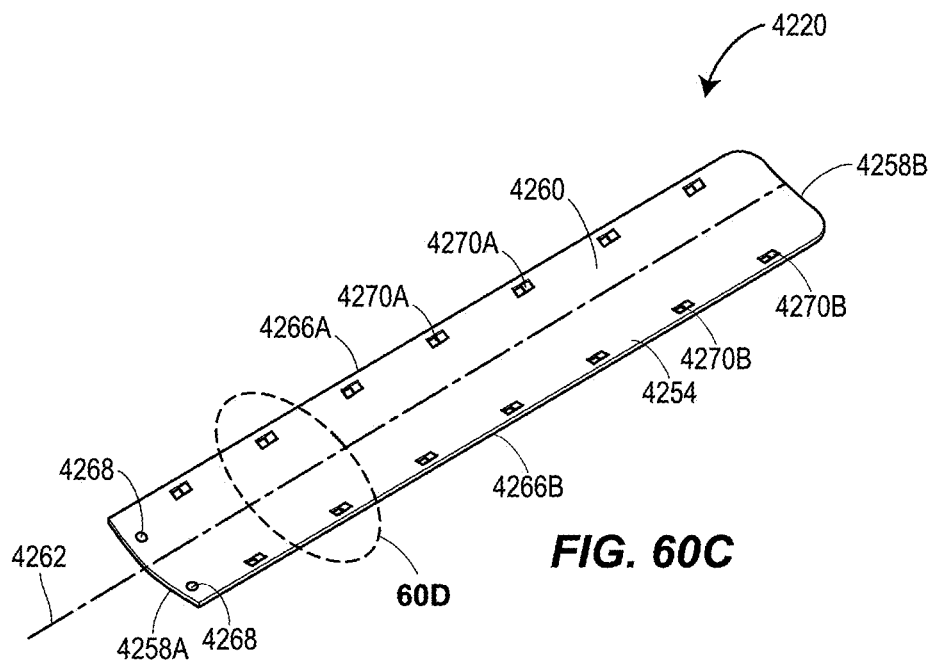
FIG. 60C is a perspective view of the first substrate of the first type of flexible support structure illustrated in FIG. 60A.

Further details regarding the first and second substrates 4220, 4224 will now be described in connection with FIGS. 60C-60F. With reference to FIG. 60C, the first substrate 4220 in this example is a substantially rectangular metal (e.g., brass, aluminum, copper, steel, tin, nickel) strip that has a slightly concave shape (i.e., a large radius of curvature) and is formed as a bi-stable spring, such that the first substrate 4220 may be referred to herein as a bi-stable flexible metal strip. As illustrated in FIG. 60C, the first substrate 4220 has a top side 4260, a bottom side 4254, a pair of opposing ends 4258A, 4258B, a longitudinal axis 4262, and a pair of edges 4266A, 4266B disposed between the ends 4258A, 4258B and parallel to the longitudinal axis 4262.

As illustrated in FIG. 60C, the first substrate 4220 includes a pair of apertures 4268 and a plurality of slots 4270. The apertures 4268 each have a circular shape and are formed in the first substrate 4220 at or proximate to the end 4258A. The plurality of slots 4270 are generally formed in the first substrate 4220 and are disposed from one end 4258A of the first substrate 4220 to the other end 4258B of the first substrate 4220. The plurality of slots 4270 include slots 4270A formed in the first substrate 4220 proximate to the edge 4266A and slots 4270B formed in the first substrate 4220 proximate to the edge 4266B and across from or opposite the slots 4270A. The slots 4270A are evenly spaced apart from one another and formed at the same distance from the edge 4266A as one another, with the slots 4270B being evenly spaced apart from one another and formed at the same distance from the edge 4266B as one another. It will be appreciated that as the distance between the apertures 4268 and the slots 4270A, 4270B increases, the length of the slots 4270A, 4270B increases. In other words, the slots 4270A, 4270B positioned further away from the apertures 4268 generally have a greater length than the slots 4270A, 4270B positioned closer to the apertures 4268. As will be described in greater detail below, the slots 4270 generally define or correspond to the most extreme local bending that will be permitted.

Figure 60D:
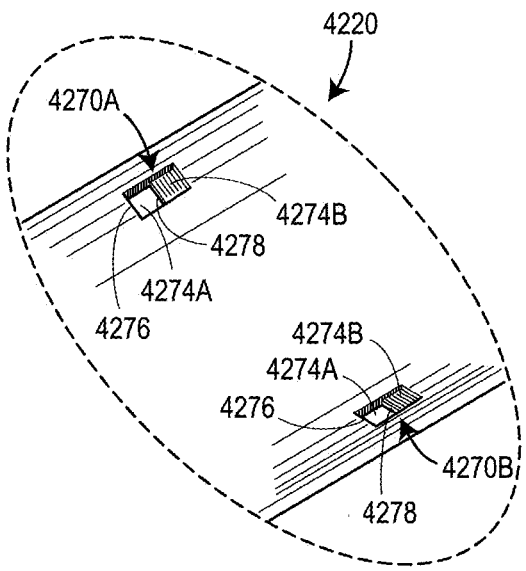
FIG. 60D is a close-up perspective view of a portion of the first substrate illustrated in FIG. 60C.

FIG. 60D is a close-up view of a portion of the first substrate 4220, showing one of the slots 4270A and one of the slots 4270B in greater detail. As depicted, each slot 4270A, 4270B has a rectangular-shape in cross-section, and includes a first portion 4274A that extends entirely through the thickness of the first substrate 4220 and a second portion 4274B that extends through only a portion of the thickness of the first substrate 4220. Each second portion 4274B is thus recessed relative to the top side 4260 of the first substrate 4220. As illustrated in FIG. 60D, each slot 4270A, 4270B has a first stop surface 4276 and a second stop surface 4278 opposite the first stop surface 4276. The first stop surface 4276, which is defined by a perimeter edge of the first portion 4274A, generally defines or corresponds to the most extreme bending that will be permitted in the outward direction when the article 4200 is in the second or curled position (see FIG. 60B). The second stop surface 4278, which is defined by the intersection of the first portion 4274A and the second portion 4274B, generally defines or corresponds to the most extreme bending that will be permitted in the inward direction when the article 4200 is in the first or substantially flat position (see FIG. 60A).

In other embodiments, the first substrate 4220 can vary from the one illustrated in FIGS. 60C and 60D. The first substrate 4220 can have a different shape (e.g., can be substantially or entirely flat, can have a more circular shape, can have an irregular shape, can have a more or less concave shape, can have a convex shape) and/or a different size. In one embodiment, the first substrate 4220 can take the form of one or more (e.g., two) elongated, narrow strips. The first substrate 4220 can alternatively be formed as a mono-stable flexible strip (i.e., the first substrate can have one stable position, similar to a tape measure) or as a multi-stable flexible strip having more than two stable positions. The first substrate 4220 can alternatively or additionally be made of one or more different materials, such as, for example, plastic, leather, or cloth. Further yet, the first substrate 4220 can include a different number of apertures 4268 (e.g., one aperture 4268, four apertures 4268), can include differently positioned apertures 4268 (e.g., apertures 4268 disposed near or at the end 4258B), and/or can include differently constructed apertures 4268 (e.g., apertures 4268 having a differently shaped cross-section). Alternatively, the first substrate 4220 need not include the apertures 4268. The first substrate 4220 can include a different number of slots 4270, can include differently positioned or spaced slots 4270 (e.g., spaced closer to or further from one another, spaced closer to or further from the edges 4258A, 4258B), and/or can include differently constructed slots 4270. For example, the slots 4270 can take the form of openings, apertures, tracks, channels, grooves, recesses, or any other suitable structure.

Figure 60E:
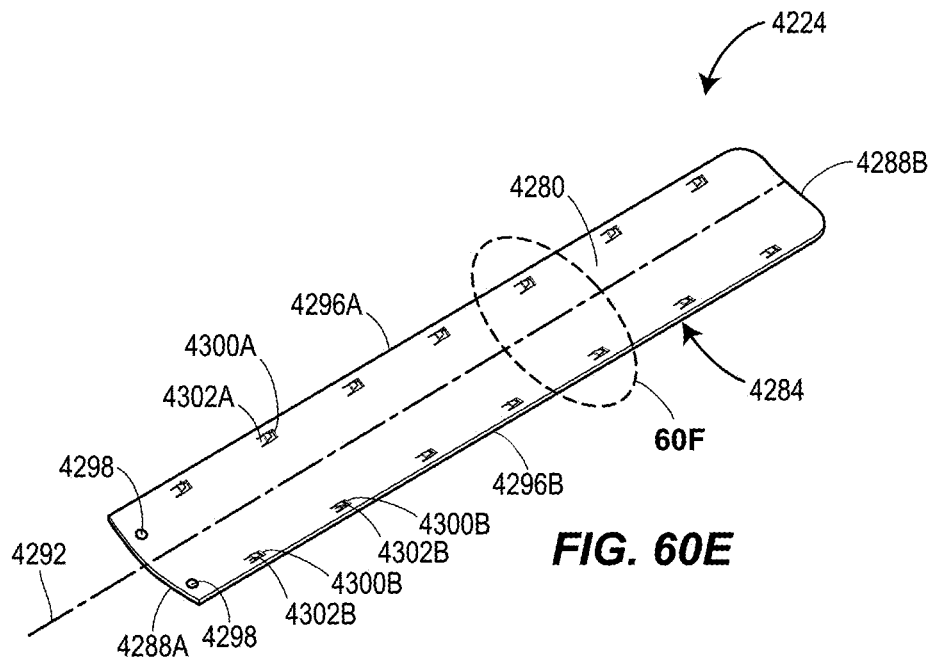
FIG. 60E is a perspective view of the second substrate of the first type of flexible support structure illustrated in FIG. 60A.

With reference to FIG. 60E, the second substrate 4224 in this example is a substantially rectangular metal (e.g., brass, aluminum, copper, steel, tin, nickel) strip that has a slightly concave shape (i.e., a large radius of curvature) and is formed as a bi-stable spring such that the second substrate 4224 may also be referred to herein as a bi-stable flexible metal strip. As illustrated in FIG. 60E, the second substrate 4224 has a top side 4280, a bottom side 4284, a pair of opposing ends 4288A, 4288B, a longitudinal axis 4292, and a pair of edges 4296A, 4296B disposed between the ends 4288A, 4288B and parallel to the longitudinal axis 4292.

As illustrated in FIG. 60E, the second substrate 4224 includes a pair of apertures 4298, a plurality of openings 4300, and a plurality of projections 4302. The apertures 4298 are identical in shape and size to the apertures 4268 but are formed in the second substrate 4224 at or proximate to the end 4288A. The openings 4300 are essentially identical in shape and size to the slots 4270 and are generally formed in the second substrate 4224 from one end 4288A of the second substrate 4224 to the other end 4288B of the second substrate 4224. The plurality of openings 4300 includes openings 4300A formed in the second substrate 4224 proximate to the edge 4296A and openings 4300B formed in the second substrate 4224 proximate to the edge 4296B and across from or opposite the openings 4300A. The openings 4300A are formed the same distance from the edge 4296A as one another, while the openings 4300B are formed the same distance from the edge 4296B as one another. It will be appreciated that as the distance between the apertures 4298 and the openings 4300A, 4300B increases, the length of the openings 4300A, 4300B increases. In other words, the openings 4300A, 4300B positioned further away from the apertures 4298 generally have a greater length than the openings 4300A, 4300B positioned closer to the apertures 4298. The plurality of projections 4302 are generally associated with or correspond to the openings 4300, respectively. The plurality of projections 4302 are generally formed or defined such that each projection 4302 extends outwardly or away from the top side 4280 of the second substrate 4224 at a position over or above a respective one of the openings 4300. The plurality of projections 4302 includes projections 4302A formed or defined proximate to the edge 4296A and projections 4302B formed or defined proximate to the edge 4296B. The projections 4302A are formed at the same distance from the edge 4296A as one another, while the projections 4302B are formed at the same distance from the edge 4296B as one another. As with the openings 4300A, 4300B, it will be appreciated that as the distance between the apertures 4298 and the projections 4302A, 4302B increases, the length of the projections 4302A, 4302B increases. In other words, the projections 4302A, 4302B positioned further away from the apertures 4298 generally have a greater length than the projections 4302A, 4302B positioned closer to the apertures 4298.

Figure 60F:
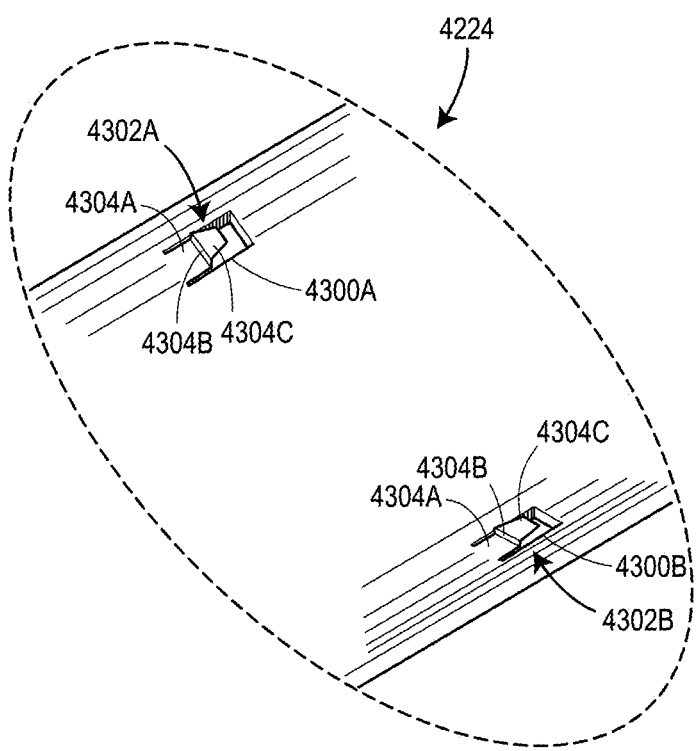
FIG. 60F is a close-up perspective view of a portion of the second substrate illustrated in FIG. 60E.

FIG. 60F is a close-up view of a portion of the second substrate 4224, showing one opening 4300A, one opening 4300B, one projection 4302A, and one projection 4302B in greater detail. As illustrated, each projection 4302A, 4302B is generally shaped like a shelf, with a substantially horizontal first portion 4304A that is coupled to the top side 4280 and extends inward into a portion of a respective one of the openings 4300A, 4300B, a substantially horizontal second portion 4304C disposed over or above a respective one of the openings 4300A, 4300B, and a substantially vertical step portion 4304B that connects the first portion 4304A and the second portion 4304B.

In other embodiments, the second substrate 4224 can vary from the one illustrated in FIGS. 60E and 60F. The second substrate 4224 can have a different shape (e.g., can be substantially or entirely flat, can have a more circular shape, can have an irregular shape, can have a more or less concave shape, can have a convex shape) and/or can have a different size. The second substrate 4224 can alternatively be formed as a mono-stable flexible strip (i.e., the second substrate

4224 can have one stable position, similar to a tape measure) or as a multi-stable flexible strip having more than two stable positions. The second substrate 4224 can alternatively or additionally be made of one or more different materials, such as, for example, plastic, leather, or cloth. Further yet, the second substrate 4224 can include a different number of apertures 4298 (e.g., one aperture 4298, four apertures 4298), can include differently positioned apertures 4298 (e.g., apertures 4298 disposed near or at the end 4288B), and/or can include differently constructed apertures 4298 (e.g., apertures 4298 having a differently shaped cross-section). Alternatively, the second substrate 4224 need not include the apertures 4298. The second substrate 4224 can include a different number of openings 4300 and/or projections 4302, differently positioned or spaced openings 4300 and/or projections 4302 (e.g., openings 4300 spaced closer to or further from the edges 4288A, 4288B or from each other), and/or differently constructed openings 4300 and/or projections 4302 (e.g., projections 4302 having a different shape). For example, the projections 4302 can take the form of tabs, hooks, knobs, bumps, or any other suitable structure(s).

Figure 60G:
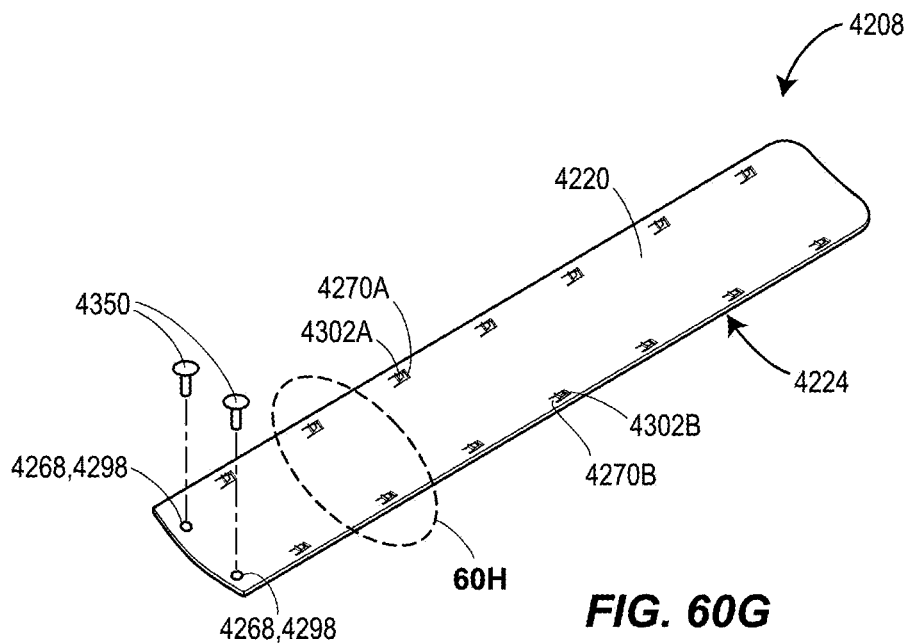
FIG. 60G is a perspective view illustrating the first substrate illustrated in FIGS. 2C and 2D and the second substrate illustrated in FIGS. 60E and 60F movably connected to form the flexible support structure illustrated in FIG. 60A.

FIG. 60G depicts the first and second substrates 4220, 4224 aligned with and movably connected or coupled to one another. It will be appreciated that the first and second substrates 4220, 4224 have a substantially similar shape and size, such that when the assembled flexible support structure 4208 is viewed from the top, the second substrate 4224 is substantially not visible (with the exception of the projections 4302), while when the flexible support structure 4208 is viewed from the bottom, the first substrate 4220 is substantially not visible. In other examples, however, the first and second substrates 4220, 4224 need not have a substantially similar shape and/or size. In some examples, one of the first and second substrates 4220, 4224 can have the shape illustrated in FIGS. 60C-60F, while the other one of the substrates 4220, 4224 can have a different shape, such as, for example, a substantially or entirely flat shape. For example, the first substrate 4220 can be substantially flat, in which case the slots 4270 of the first substrate 4220 can be wider, as compared to the slots 4270 illustrated herein, in order to accommodate the transition of the second substrate 4224 from the concave state to the flat state when the article 4200 is moved from the substantially flat position to the curled position. In this example, the first and second substrates 4220, 4224 would be overlaying and in contact with one another when the article 4200 is in the curled position, but would only touch one another at or along the edges 4266A, 4266B, 4288A, 4288B when the article 4200 is in the substantially flat position. As another example, the second substrate 4224 can have the shape illustrated in FIGS. 60E and 60F, while the first substrate 4220 can take the form of one or more narrow, elongated strips movably coupled to the second substrate 4224.

When the first and second substrates 4220, 4224 are substantially aligned with one another as illustrated in FIG. 60G, the apertures 4268 of the first substrate 4220 are aligned with the apertures 4298 of the second substrate 4224, the slots 4270 of the first substrate 4220 are aligned with the openings 4300 of the second substrate 4224, and the projections 4302 of the second substrate 4224 are movably disposed within the slots 4270 of the first substrate 4220. At least some portion of the first substrate 4220 is fixedly attached to at least some portion of the second substrate 4224. In this example, one end 4258A of the first substrate 4220 is fixedly attached to a corresponding end 4288A of the second substrate 4220 using or via a fastener 4350 (e.g., a pin, a rivet, a screw) inserted into each of the aligned pairs of apertures 4268, 4298. The other ends 4258B, 4288B of the first and second substrates 4220, 4224 are thus freely movable relative to one another.

In other examples, the apertures 4268, 4298 can be formed or defined in different portions of the first and second substrates 4220, 4224, such that the first and second substrates 4220, 4224 can be fixedly attached to one another at different portions. For example, the apertures 4268, 4298 can be formed at or near the ends 4258B, 4288B of the first and second substrates 4220, 4224, respectively, such that the first and second substrates 4220, 4224 can be fixedly attached to one another at or near the ends 4258B, 4288B, rather than at the ends 4258A, 4288A. As another example, the apertures 4268, 4298 can be formed at or near a middle portion of the first and second substrates 4220, 4224, such that the first and second substrates 4220, 4224 can be fixedly attached to one another at or near the middle portion, rather than at the ends 4258A, 4288A. In other examples, the first and second substrates 4220, 4224 can include more or less apertures 4268, 4298. For example, the first substrate 4220 can include one aperture 4268 and the second substrate 4224 can include one aperture 4298, with the first and second substrates 4220, 4224 locally fixedly attached to one another at or via the two apertures 4268, 4298. Further yet, the first and second substrates 4220, 4224 can be locally welded, adhered (e.g., glued), or otherwise fixedly attached to one another in a way such that the apertures 4268, 4298 are not necessary.

Figure 60H:
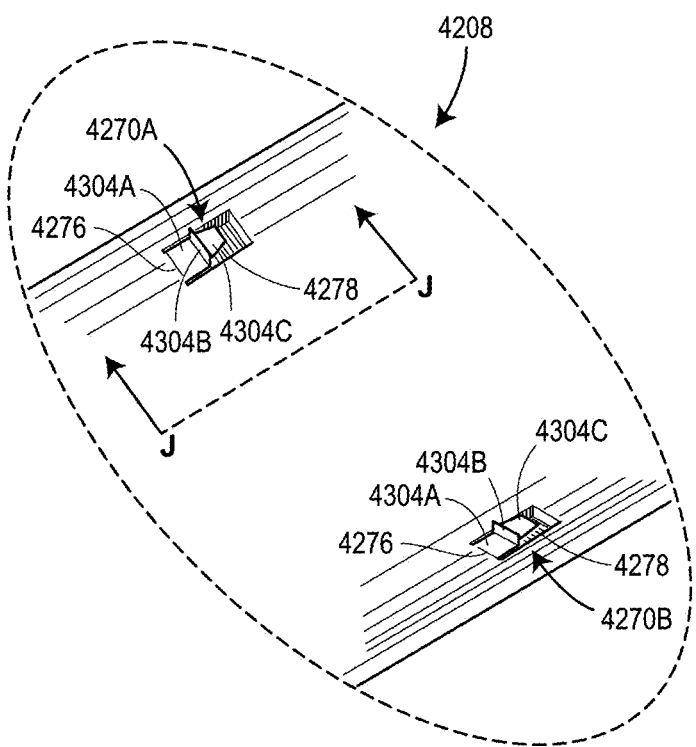
FIG. 60H is a close-up perspective view of a portion of the flexible support structure illustrated in FIG. 60G.

FIG. 60H is a close-up view of a portion of the support structure 4208 illustrated in FIG. 60G. As noted above, the projections 4302 of the second substrate 4224 are movably disposed within the slots 4270 of the first substrate 4220. More specifically, as illustrated in FIG. 60H, the first portion 4304A of each projection 4302 is aligned with, but slightly recessed relative to, the first portion 4274A of a respective slot 4270, the step portion 4304B of each projection 4302 is disposed within the first portion 4274A of a respective slot 4270, and the second portion 4304C of each projection 4302 is seated or disposed on the second portion 4274B of a respective slot 4270. As such, the step portion 4304B of each projection 4302 is movably disposed between the first and second stop surfaces 4276, 4278 of a respective slot 4270.

It will be appreciated that the first and second substrates 4220, 4224 can be movably connected to one another in a different manner. For example, the first substrate 4220 and the second substrate 4224 can be reversed, with the second substrate 4224 including the slots 4270 and the first substrate 4220 including the projections 4302 movably disposed within the slots 4270. As another example, the first and second substrates 4220, 4224 can each include slots 4270 and projections 4302 (e.g., alternating slots 4270 and projections 4302). The first and second substrates 4220, 4224 can, in some examples, be movably connected to one another in a different location, in multiple locations, and/or using components other than the slots 4270 and the projections 4302 illustrated herein. Any number and/or combination of fasteners, grooves, tabs, protrusions, ribs, slots, and other components can be used for this/these purpose(s).

In any event, the flexible support 4208, via the interaction between corresponding slots 4270 and projections 4302, can limit bending of the article 4200, and, more particularly, the flexible display 4204. Because the article 4200 is configured for bending in the outward direction, the flexible support 4208 is configured to permit some bending of the article 4200, and, more particularly, the flexible display 4204, in the outward direction but is configured to prevent bending of the flexible display 4204 in the outward direction (indicated by the arrows BOUT in FIG. 60A) beyond its bending limit (e.g., beyond its minimum bending radius). At the same time, the flexible support 4208 can substantially limit bending of the article 4200, and, more particularly, the flexible display 4204, in the inward direction (indicated by the arrows BIN in FIG. 60A). It will thus be appreciated that the flexible support 4208 is configured to permit more bending of the article 4200 in the outward direction than in the inward direction, though this need not be the case.

Figure 60I:
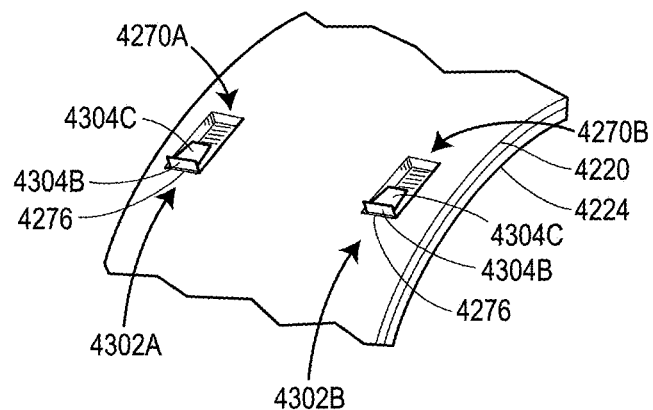
FIG. 60I illustrate a portion of the flexible support structure illustrated in FIG. 60G bent or curved in an outward direction.

When the article 4200 is in the first or substantially flat stable position (i.e., the position illustrated in FIGS. 60A, 60G, and 60H), and the article 4200 is bent or curved in the outward direction (indicated by the arrows in FIG. 60A), the applied bending force causes the projections 4302 of the second substrate 4224 to move relative to the slots 4270 of the first substrate 4220. Specifically, the applied bending force causes the first portion 4304A of each projection 4302 to slide relative to and away from the first portion 4274A of a respective slot 4270 and underneath the first substrate 4220, causes the step portion 4304B of each projection 4302 to slide away from the second portion 4274B and toward the stop surface 4276 of a respective slot 4270, and causes the second portion 4304C of each projection 4302 to slide along the second portion 4274B and toward the first portion 4274A of a respective slot 4270. At some point, the article 4200 will be bent to such a degree that the step portion 4304B of each projection 4302 contacts the first stop surface 4276 of a respective slot 4270, as depicted in FIG. 60I. At this point, the article 4200 has reached its pre-defined bending limit and any further bending of the article 4200, particularly the flexible display 4204, in the outward direction is prevented. This position generally corresponds to the second or curled stable position of the article 4200 (see FIG. 60B), such that the article 4200 cannot be bent or curved beyond the second stable position, though that need not be the case (e.g., a limited amount of bending can be permitted beyond the second or curled stable position).

Figure 60J:
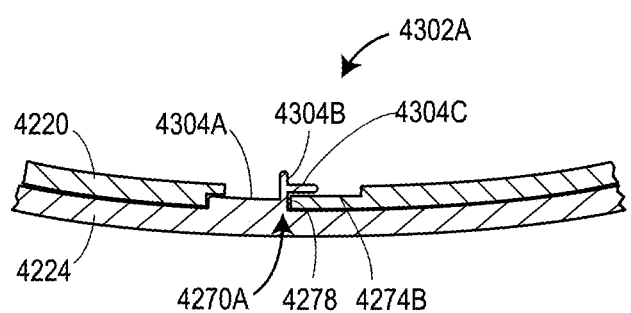
FIG. 60J illustrate a portion of the flexible support structure illustrated in FIG. 60G bent or curved in an inward direction.

When the article 4200 is in the first or substantially flat stable position (i.e., the position illustrated in FIGS. 60A, 60G, and 60H), and the article 4200 is bent or curved in the inward direction, the applied bending force causes the projections 4302 of the second substrate 4224 to move relative to the slots 4270 of the first substrate 4220. Specifically, the applied bending force causes the first portion 4304A of each projection 4302 to slide relative to the first portion 4274A of a respective slot 4270, causes the step portion 4304B of each projection 4302 to slide toward the second portion 4274B and away from the stop surface 4276 of a respective slot 4270, and causes the second portion 4304C of each projection 4302 to slide along the second portion 4274B and away from the first portion 4274A of a respective slot 4270. At some point, the article 4200 will be bent to such a degree (i.e., corresponding to the maximum bending amount in this direction) that the step portion 4304B of each projection 4302 contacts the second stop surface 4278 of a respective slot 4270, as depicted in FIG. 60J. At this point, the article 4200 has reached its pre-defined bending limit and any further bending of the article 4200, particularly the flexible display 4204, in the inward direction is prevented.

The flexible support structure 4208 can also provide torsion control. By virtue of having two substrates 4220, 4224 movably connected to one another and the slots 4270 and the projections 4302 being positioned proximate to the edges 4266A, 4266B and 4296A, 4296B, respectively, and configured to interferingly contact one another, the flexible support structure 4208 can substantially resist or prevent torsion from being applied to the longitudinal sides of the article 4200, and, thus, the flexible display 4204. At the very least, the flexible support structure 4208 described herein will substantially reduce the amount of torsion that can be applied to the article 4200, and, thus, the flexible display 4204. It will be appreciated that the flexible support structure 4208 can thus help to prevent the damage to the brittle layers of the flexible display 4204 that would otherwise be caused by torsion applied to the article 4200. It will be appreciated that the width and/or the length of the slots and the projections 4302, and/or the spacing between the slots 4270 and the projections 4302, can be varied, yet the flexible support structure 4208 can still provide at least some level of torsion control. In some of these cases, the width, length, and/or the spacing can be varied such that the flexible support structure 4208 provides less resistance to torsion, and thus permits more bending in the transverse direction.

Figure 61A:
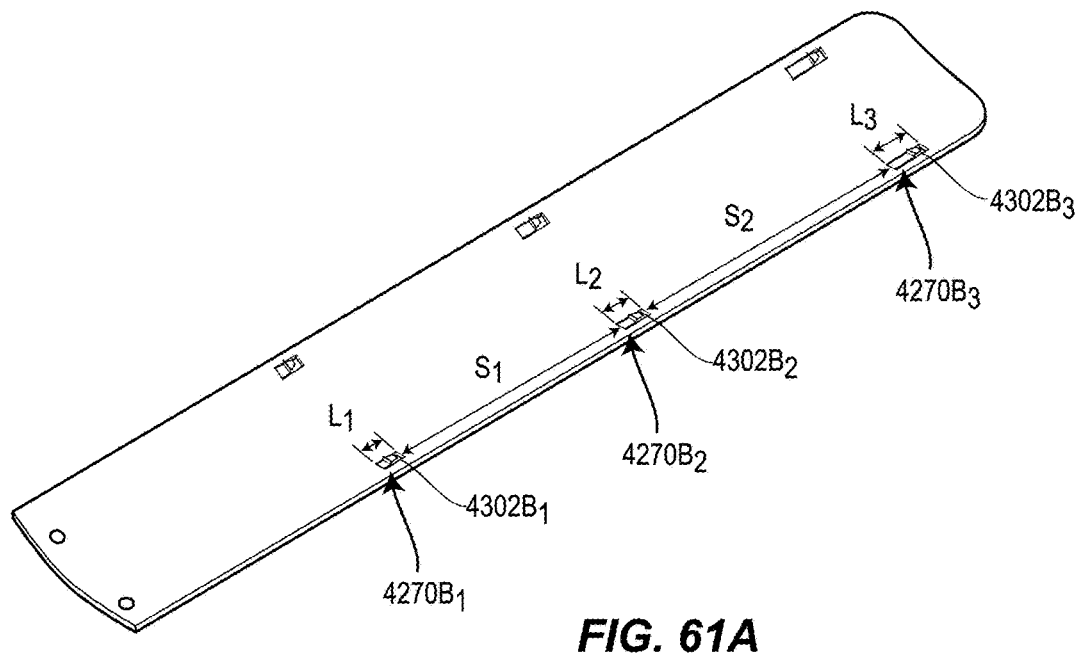
FIGS. 61A and 61B illustrate a different example of the first type of flexible support structure illustrated in FIGS. 60A-60J, the first type of flexible support structure having slots and projections of different lengths such that the first type of flexible support structure has an oval-shape.
Figure 61B:
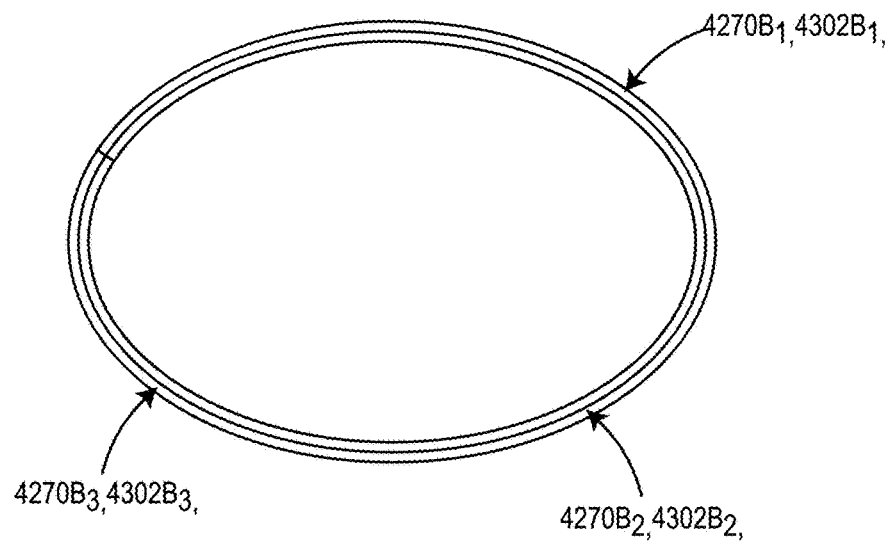

In other examples, the components of the flexible support 4208, e.g., the slots 4270, the projections 4302, can be varied to control (e.g., adjust) the amount of bending between adjacent portions of the article 4200, and, in turn, adjust the shape of the article 4200 in the second or curled stable position. In some examples, the length of the slots 4270 and the projections 4302 can be varied to control (e.g., adjust) the amount of bending between portions of the article 4200 adjacent to those slots 4270 and projections 4302, and, in turn, adjust the shape of the article 4200 in the second or curled stable position. In general, the degree to which the length of the slots 4270 and the projections 4302 is varied relative to adjacent slots 4270 and projections 4302 determines the degree to which the amount of bending can be varied for portions of the article 4200 therebetween. More specifically, the more the length of the slots 4270 and the projections 4302 is increased relative to adjacent slots 4270 and projections 4302, the greater the increase in the amount that portions of the article 4200 between the slots 4270 and the projections 4302 (i.e., between the (i) increased length slots 4270 and projections 4302 and (ii) the slots 4270 and projections 4302 adjacent thereto) can be bent. Conversely, the less the length of the slots 4270 and the projections 4302 is increased relative to adjacent slots 4270 and projections 4302, the smaller the increase in the amount that portions of the article 4200 between the slots 4270 and the projections 4302 (i.e., between the (i) increased length slots 4270 and projections 4302 and (ii) the slots 4270 and projections 4302 adjacent thereto) can be bent. FIGS. 61A and 61B illustrate an example of this concept. As illustrated, the length L3 of the slot 4270B3 and the length of the projection 4302B3 are greater than the length L2 of the slot 4270B2 and the length of the projection 4302B2, respectively, which are much greater than the length L1 of the slot 4270B1 and the length of the projection 4302B1. In other words, the difference between the length L3 of the slot 4270B3 and the length of the projection 4302B3, and the length L2 of the slot 4270B2 and the length of the projection 4302B2, is smaller than the difference between (ii) the length L2 of the slot 4270B2 and the length of the projection 4302B2, and the length L1 of the slot 4270B1 and the length of the projection 4302B1. As a result, the portion of the article 4200 between the slot 4270B1 and the projection 4302B1 and the slot 4270B2 and the projection 4302B2 can be bent to a greater degree than the portion of the article 4200 between the slot 4270B2 and the projection 4302B2 and the slot 4270B3 and the projection 4302B3, which can be seen in FIG. 61B. In this way, different sections of the article 4200 (e.g., the sections disposed along the sides) can be bent or flexed more than other portions of the article 4200 (e.g., the sections disposed along the top and bottom), thereby facilitating the formation of a more oval-shaped article 4200 (see, e.g., FIG. 61B), which can be, when worn, more comfortable than a circular-shaped article. Further yet, the number of and spacing between the different slots 4270 and the number of and spacing between the different projections 4302 can be adjusted to control (e.g., adjust) the amount of bending between adjacent portions of the article 4200, and, in turn, adjust the shape of the article 4200 in the second or curled stable position. As also illustrated in FIGS. 61A and 61B, the spacing between adjacent slots 4270B and the spacing between adjacent projections 4302B can be different at different points along the article 4200. In the example illustrated in FIGS. 61A and 61B, the longitudinal distance or spacing between adjacent slots 4270B1 and 4270B2 and between adjacent projections 4302B1 and 4302B2 (S1) is less than the longitudinal distance or spacing between adjacent slots 4270B2 and 4270B3 and between adjacent projections 4302B2 and 4302B3 (S2) [S2>S1]. It will be appreciated that the length of the components of the flexible support 4208 and, in some cases, the spacing between the components of the flexible support 4208, can be varied in a way such that the article 4200 has any number of other shapes (e.g., an elliptical shaped article).

In further examples, the article 4200 can include an adjustable flexible support structure, such that the article 4200 can be adjusted to reach a desired shape and size (e.g., to produce the shape and size of the wrist of the user wearing the article 4200). This is generally achieved by providing the flexible support structure with one or more user-selectable components (e.g., slots, fixation points). This generally produces an adjustable flexible support structure, such that the article 4200 can be adjusted to reach the desired shape and size. This can be advantageous when, for example, the article 4200 is used by a user with a small wrist, but is then used by another user with a larger wrist (or vice-versa).

Figure 62A:
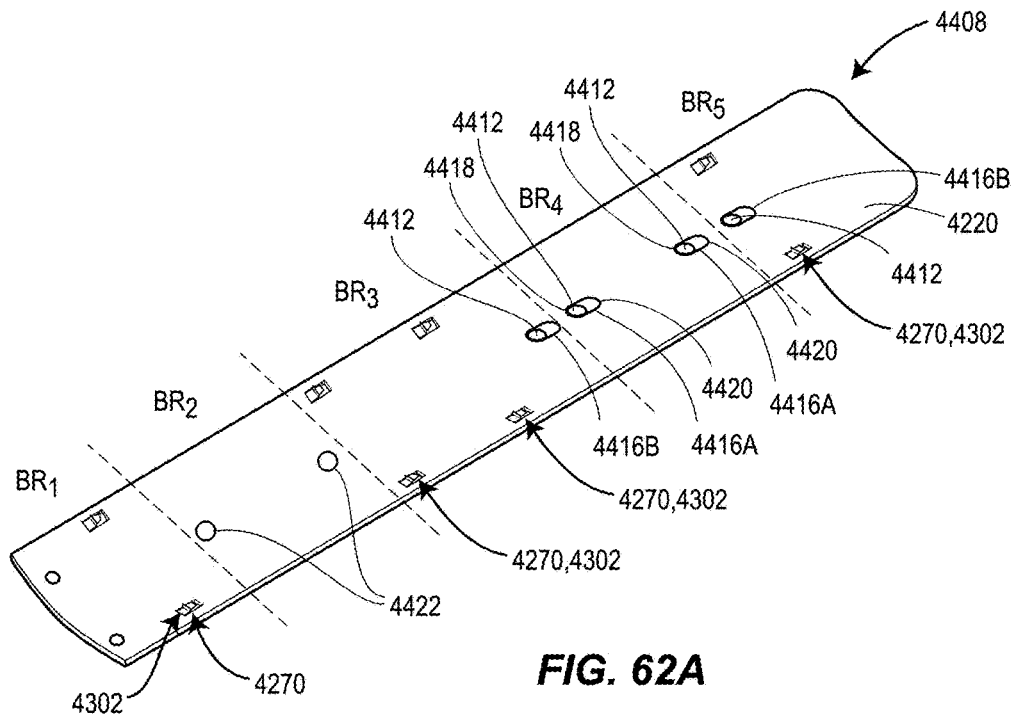
FIGS. 62A and 62B illustrate a first example of an adjustable flexible support structure, the adjustable flexible support structure including two pairs of user-selectable slots that define different lengths and thus permit the user to adjust the shape and size of the flexible support structure.
Figure 62B:
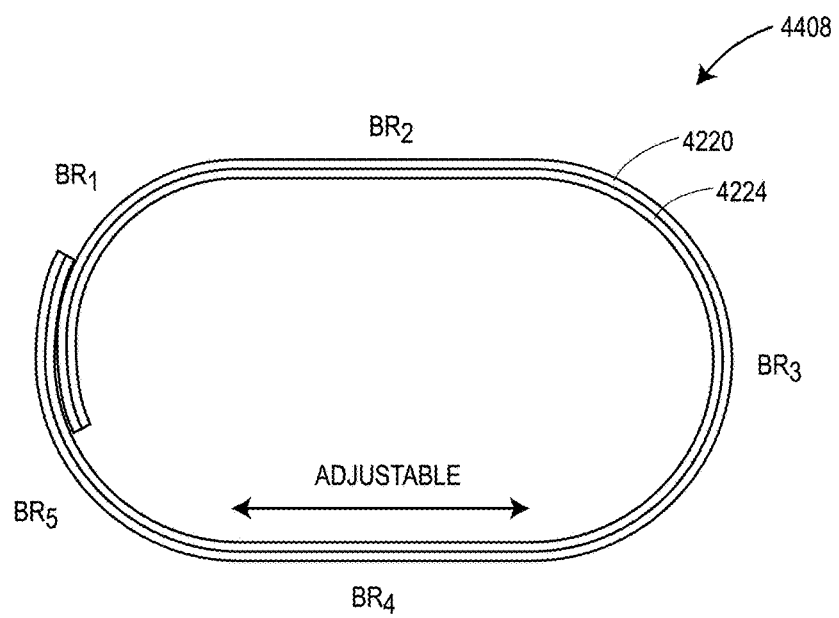

FIGS. 62A and 62B depict an example of an adjustable flexible support structure 4408. The adjustable flexible support structure 4408 includes many of the components described above in FIGS. 60A-60J (with common reference numerals used for common components). For illustrative purposes, the flexible support structure 4408 is divided into five bending regions (BR1-BR5). Unlike the flexible support structure 4208, which includes slots 4270 and projections 4302 in bending region 4 (BR4), the flexible support structure 4408 instead includes two pairs of user-selectable slots, a first pair of user-selectable slots 4416A and a second pair of user-selectable slots 4416B, formed in the first substrate 4220. The slots 4416A and 4416B each have a generally elliptical shape, with the slots 4416A being slightly longer than the slots 4416B. Each of the slots 4416A, 4416B defines a first stop surface 4418 and a second stop surface 4420 opposite the first stop surface 4418.

Generally speaking, the first and second pairs of slots 4416A, 4416B define different sizes of the flexible support structure 4408. More specifically, the slots 4416A are positioned to define a first length of the bending region 4 (BR4) of the flexible support structure 4408, while the slots 4416B are positioned to define a second length of the bending region 4 (BR4) of the flexible support structure 4408, the second length being greater than the first length. It will thus be appreciated that the flexible support structure 4408 will be longer when the second slots 4416B are selected. A user may select the desired slots, and thus the desired length (the first or the second length), by disposing a pair of pins 4412 into the pair of desired slots 4416A or 4416B. More specifically, the user selects the pair of desired slots 4416A or 4416B and fits the pins 4412 into a tight fitting hole (not shown) formed in the second substrate 4224 below each of the desired slots 4416A or 4416B. The pins 4412 are then movably disposed within the slots 4416A or 4416B. In addition, the flexible support structure 4408 also includes a pair of fixation points 4422 at which the first and second substrates 4220, 4224 are fixedly attached to one another. As illustrated in FIG. 62A, one fixation point 4422 is positioned at or near the border between bending region 1 (BR3) and bending region 2 (BR2), and one fixation point 4422 is positioned at or near the border between bending region 2 (BR2) and bending region 3 (BR3).

Because of the fixation points 4422, bending of the flexible support structure 4408 is generally prevented in bending region 2 (BR2). Moreover, because the slots in each pair have the same length as one another, no bending is permitted in bending region 4 (BR4). However, when the flexible support structure 4408 is bent in bending region 3 (BR3), the pins 4412 can move within the selected slots 4416A or 4416B from the position shown in FIG. 62A toward the second stop surface 4420. Depending on the degree of bending in bending region 3 (BR3), the pins 4412 can move toward, but not into contact with, the second stop surface 4420, or the pins 4412 can move toward and into contact with the second stop surface 4420. In any event, when the slots 4416A are selected, the flexible support structure 4408, when bent, will be shorter, and thereby have more of a circular-shape, such that the article 4200 is sized to fit, for example, a user having a smaller wrist. Meanwhile, when the slots 4416B are selected, the flexible support structure 4408, when bent, will be longer, and thereby have more of an oval-shape, such that the article 4200 is sized to fit, for example, a user having a larger wrist.

The flexible support structure 4408 can, in other examples, vary from the support structure 4408 illustrated in FIGS. 62A and 62B. The flexible support structure 4408 can include more or less user-selectable slots (e.g., three pairs of user-selectable slots), the user-selectable slots can have a different shape and/or can have a different size (e.g., the slots 4416A can be the same length as the slots 4416B, the slots in each pair can have a different length, such that bending to a certain minimum radius is permitted in bending region 4 (BR4)), the user-selectable slots can be constructed differently, and/or the user-selectable slots can be positioned differently. For example, the user-selectable slots can be positioned to define different lengths of other bending regions of the support structure 4408 (e.g., the bending region 3). As another example, the user-selectable slots can be positioned closer to one another or further apart from one another.

Figure 62C:
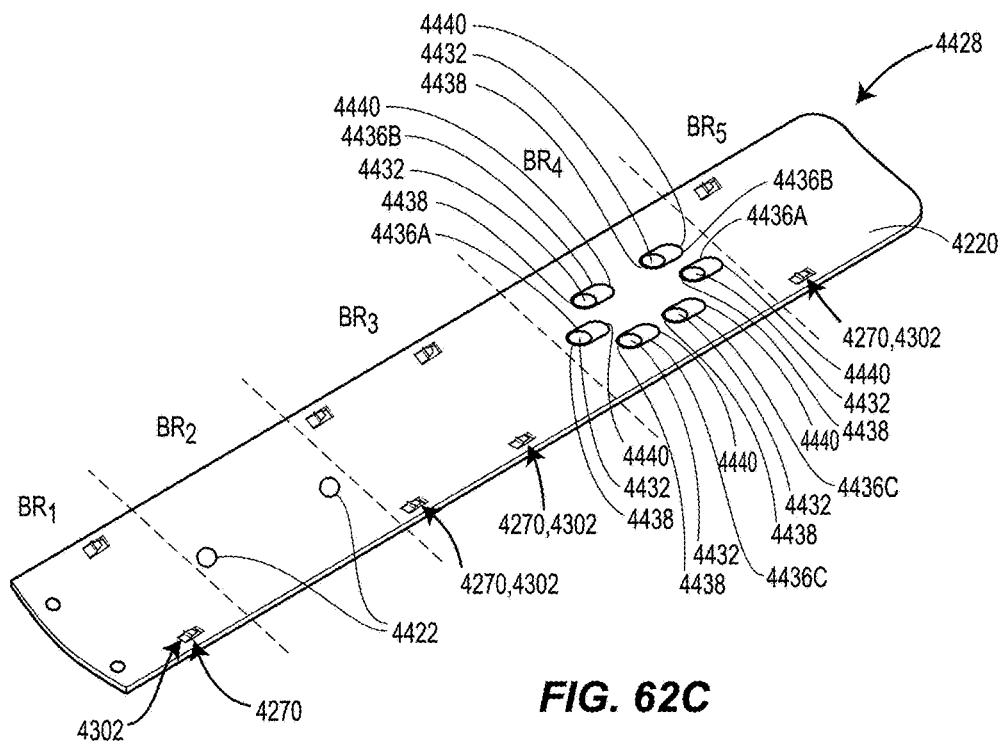
FIGS. 62C and 62D illustrate a second example of an adjustable flexible support structure including three pairs of user-selectable slots that define different lengths and thus permit the user to adjust the shape and size of the flexible support structure.
Figure 62D:
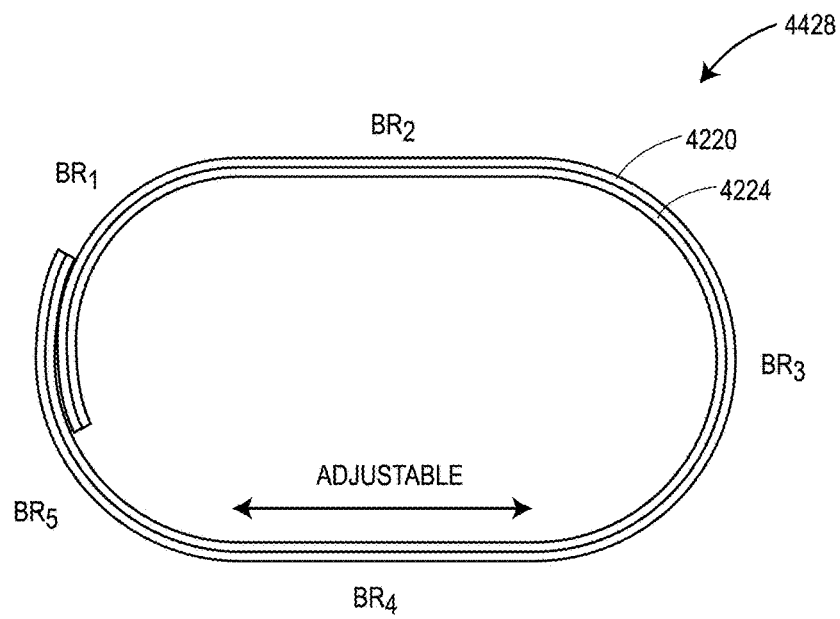

FIGS. 62C and 62D depict another example of an adjustable flexible support structure 4428. The adjustable flexible support structure 4428 is substantially similar to the flexible support structure 4408, with common reference numerals used for common components. For illustrative purposes, the flexible support structure 4428, like the support structure 4408, is divided into five bending regions (BR1-BR5). The flexible support structure 4428 includes three different pairs of user-selectable slots, a first pair of user-selectable slots 4436A, a second pair of user-selectable slots 4436B, and a third pair of user-selectable slots 4436C. The slots 4436A-4436C each have a generally elliptical shape and are of the same length. The slots 4436A-4436C each define a first stop surface 4438 and a second stop surface 4440 opposite the second stop surface 4440.

The pairs of slots 4436A-4436C generally define different sizes of the flexible support structure 4428. More specifically, the slots 4436A are positioned to define a first length of the bending region 4 (BR4) of the flexible support structure 4428, the slots 4436B are positioned to define a second length of the bending region 4 (BR4) of the flexible support structure 4428, and the slots 4436C are positioned to define a third length of the bending region 4 (BR4) of the flexible support structure 4428, the first length being greater than the second length and the second length being greater than the third length. It will thus be appreciated that the flexible support structure 4428 will be the longest when the first slots 4436A are selected and the shortest when the third slots 4436C are selected.

A user may select the desired slots, and thus the desired length (the first, second, or third length), by disposing a pair of pins 4432 into the desired pair of slots 4436A, 4436B, and 4436C. More specifically, the user selects the pair of desired slots 4436A, 4436B, or 4436C and fits the pins 4432 into a tight fitting hole (not shown) formed in the second substrate 4224 below each of the desired slots 4436A, 4436B, or 4436C. The pins 4432 are then movably disposed within the slots 4436A, 4436B, or 4436C. In addition, the flexible support structure 4428 also includes a pair of fixation points 4422 at which the first and second substrates 4220, 4224 are fixedly attached to one another.

Because of the fixation points 4422, bending of the flexible support structure 4428 is generally prevented in bending region 2 (BR2). Moreover, because the slots in each pair have the same length as one another, no bending is permitted in bending region 4 (BR4). Thus, bending regions 2 and 4 (BR2, BR4) generally remain flat at all times. However, when the article, particularly the flexible support structure 4428, is bent in bending region 3 (BR3), the pins 4432 can move within the selected slots 4436A, 4436B, or 4436B from the position shown in FIG. 62C toward the second stop surface 4440. Depending on the degree of bending in bending region 3 (BR3), the pins 4432 can move toward, but not into contact with, the second stop surface 4440, or the pins 4432 can move toward and into contact with the second stop surface 4440. In any event, when the slots 4436A are selected, the flexible support structure 4428, when bent, will be longer, and thereby have more of an oval-shape, such that the article 4200 is sized to fit, for example, a user having a larger wrist. Meanwhile, when the slots 443CA are selected, the flexible support structure 4428, when bent, will be shorter, and thereby have more of a circular-shape, such that the article 4200 is sized to fit, for example, a user having a smaller wrist.

The flexible support structure 4428 can, in other examples, vary from the support structure 4428 illustrated in FIGS. 62C and 62D. The flexible support structure 4428 can include more or less user-selectable slots (e.g., four pairs of user-selectable slots), the user-selectable slots can have a different shape and/or can have a different size (e.g., one of the slots in each slot pair 4436A, 4436B, and 4436C can be bigger than the other slot), the user-selectable slots can be constructed differently, and/or the user-selectable slots can be positioned differently. For example, the user-selectable slots can be positioned to define different lengths of other bending regions of the support structure 4428 (e.g., the bending region 3). As another example, the user-selectable slots can be positioned closer to one another or further apart from one another. Further yet, one or more of the user-selectable slots can be replaced by slots 4270, and the projections 4302 used in combination with the one or more slots 4270, as described above.

Figure 62E:
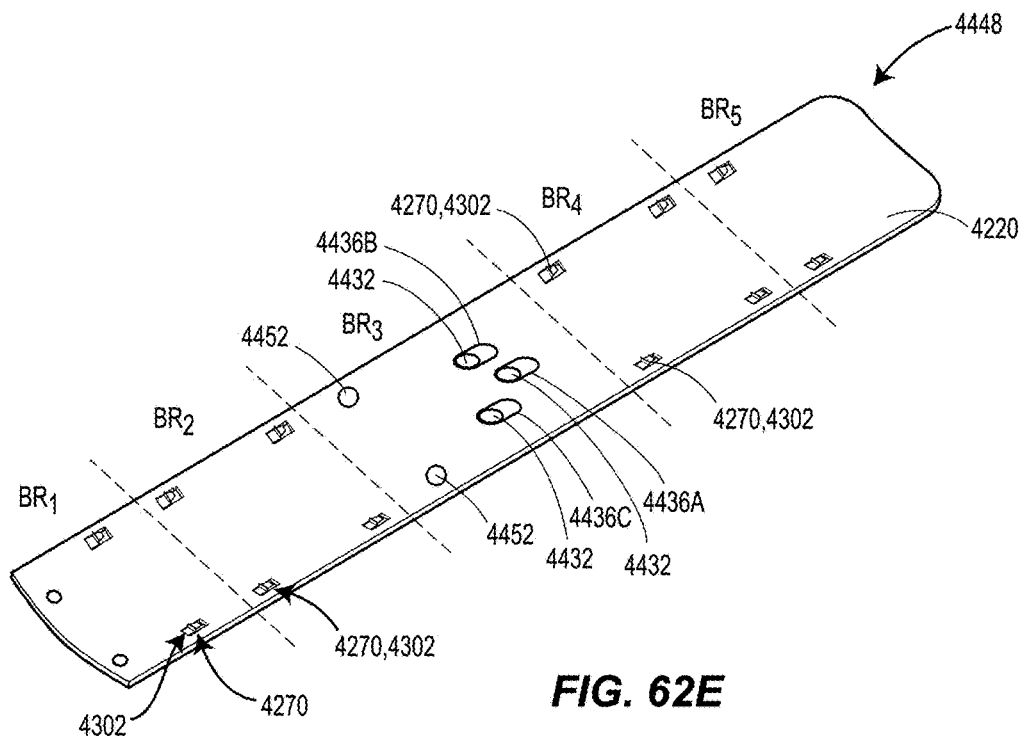
FIGS. 62E and 62F illustrate a third example of an adjustable flexible support structure including three user-selectable slots that define different lengths and thus permit the user to adjust the shape and size of the flexible support structure.
Figure 62F:
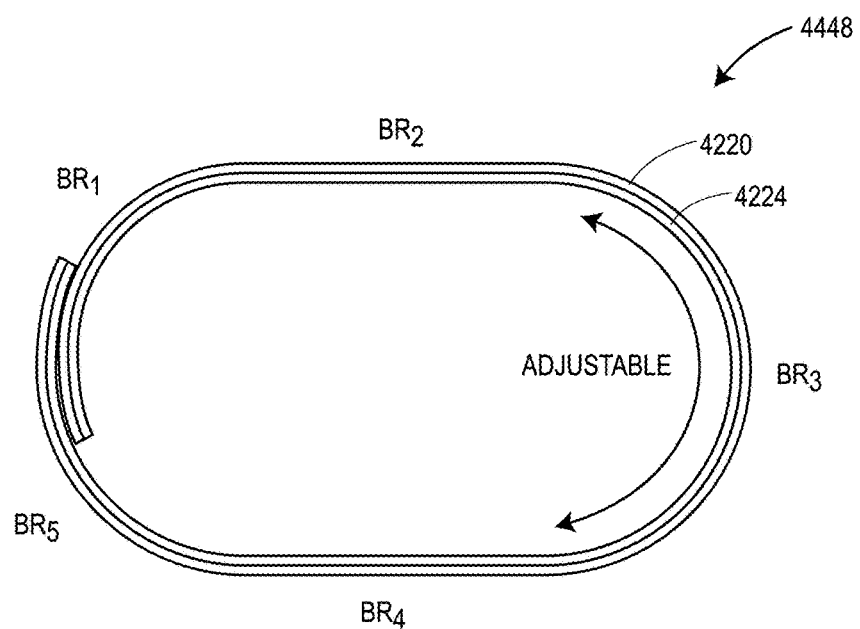

FIGS. 62E and 62F depict another example of an adjustable flexible support structure 4448. The adjustable flexible support structure 4448 is similar to the flexible support structure 4428, with common reference numerals used for common components. For illustrative purposes, the flexible support structure 4448, like the support structure 4428, is divided into five bending regions (BR1-BR5), Unlike the flexible support structure 4428, which includes three pairs of user-selectable slots 4436A, 4436B, and 4436C, the flexible support structure 4448 includes three singular user-selectable slots 4436A, 4436B, 4436C. These singular slots 4436A, 4436B, 4436C similarly define different sizes of the flexible support structure 4448, but do so by defining different lengths of an arc of the bending region 3 (BR3) of the flexible support structure 4448. In addition to these slots 4436A, 4436B, 4436C, the flexible support structure 4448 also includes a pair of fixation points 4452 at or near the border between bending region 3 (BR3) and bending region 3 (BR3).

A user may select the desired slot, and thus the desired arc length (the first, second, or third arc length), by disposing a pin 4432 into the desired slot 4436A, 4436B, and 4436C. More specifically, the user selects the slot 4436A, 4436B, or 4436C and fits the pin 4432 into a tight fitting hole (not shown) formed in the second substrate 4224 below the desired slot 4436A, 4436B, or 4436C. The pin 4432 is then movably disposed within the slot 4436A, 4436B, or 4436C.

Because of the fixation points 4452, bending of the flexible support structure 4448 in bending region 2 (BR2) will have little to no effect on movement of the pin 4432 within the selected slot 4436A, 4436B, or 4436C. However, when the flexible support structure 4448 is bent in bending region 4 (BR4), the pin 4432 can move within the selected slot 4436A, 4436B, or 4436B from the position shown in FIG. 62E toward the second stop surface 4440. Depending on the degree of bending in bending region 4 (BR4), the pin 4432 can move toward, but not into contact with, the second stop surface 4440, or the pin 4432 can move toward and into contact with the second stop surface 4440. Consistent with the discussion above, when the slot 4436A is selected, the flexible support structure 4448, when bent, will be longer, and thereby have more of an oval-shape, such that the article 4200 is sized to fit, for example, a user having a larger wrist. Meanwhile, when the slot 4436C is selected, the flexible support structure 4448, when bent, will be shorter, and thereby have more of a circular-shape, such that the article 4200 is sized to fit, for example, a user having a smaller wrist.

The flexible support structure 4448 can, in other examples, vary from the support structure 4448 illustrated in FIGS. 62E and 62F. The flexible support structure 4448 can include more or less user-selectable slots (e.g., four user-selectable slots), the user-selectable slots can have a different shape and/or can have a different size) and/or the user-selectable slots can be positioned differently. For example, the user-selectable slots can be positioned to define different lengths of other bending regions of the support structure 4448 (e.g., the bending region 2). As another example, the user-selectable slots can be positioned closer to one another or further apart from one another. Further yet, one or more of the user-selectable slots can be replaced by slots 4270, and the projections 4302 used in combination with the one or more slots 4270, as described above. Alternatively or additionally, the flexible support structure 4448 can include more or less fixation points 4452 and/or differently positioned fixation points 4452. For example, when the user-selectable slots are positioned to define different arc lengths of another bending region of the support structure 4448, the fixation points 4452 can be positioned at or near that another bending region.

Figure 62G:
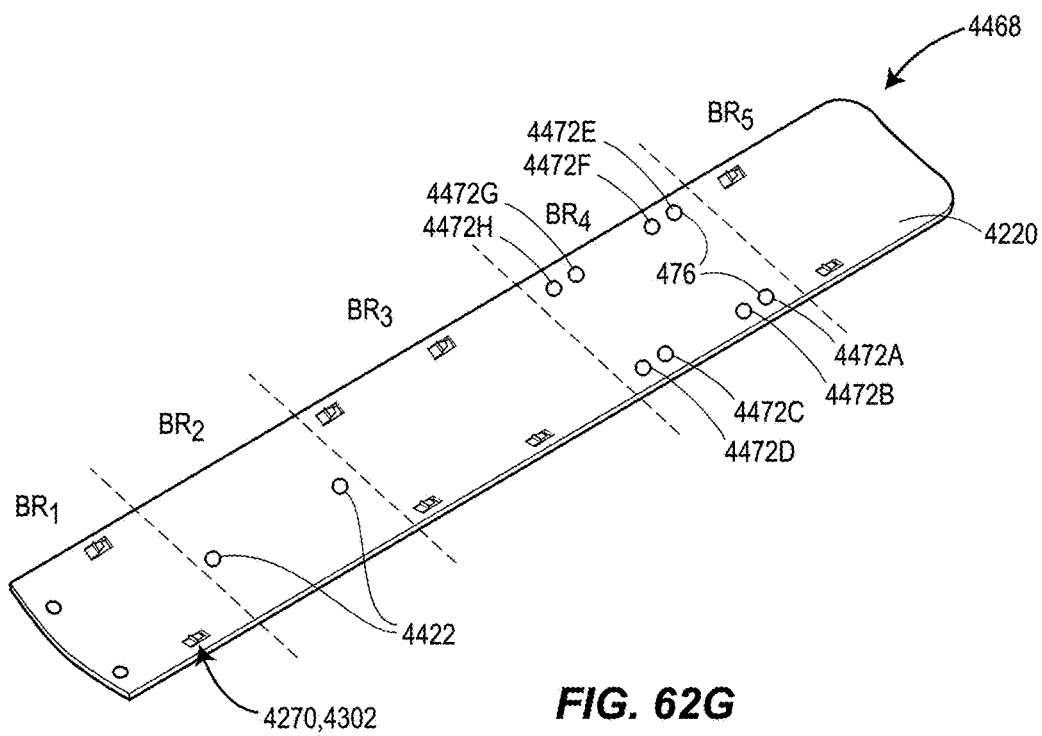
FIGS. 62G and 62H illustrate a fourth example of an adjustable flexible support structure including user-selectable fixation points that define different lengths and thus permit the user to adjust the shape and size of the flexible support structure.
Figure 62H:
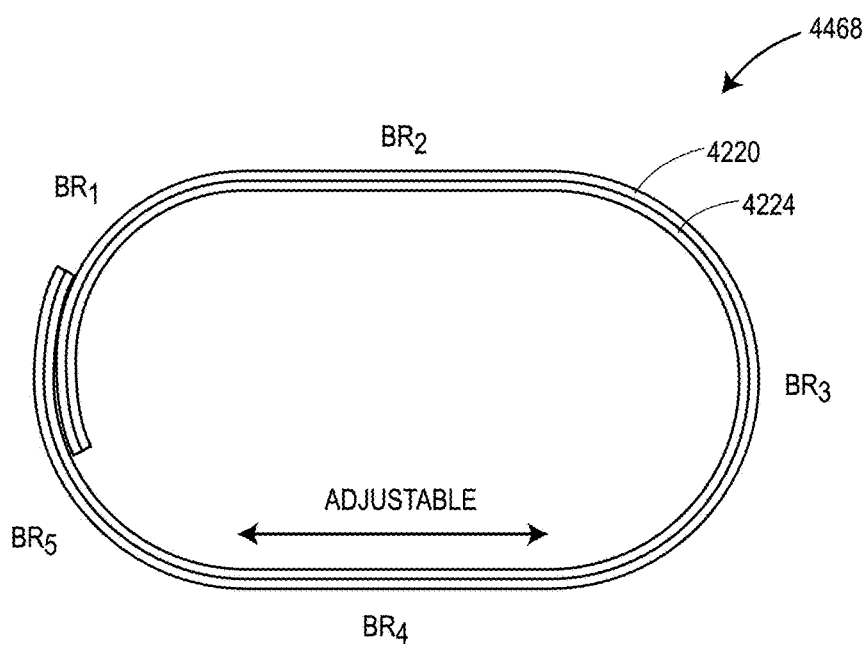

FIGS. 62G and 62H depict yet another example of an adjustable flexible support structure 4468. The adjustable flexible support structure 4468 is substantially similar to the flexible support structure 4408, with common reference numerals used for common components. However, unlike the flexible support structure 4408, which includes the two pairs of user-selectable slots 4416A, 4416B, the flexible support structure 4468 instead includes four user-selected fixation or attachment points, the four user fixation or attachment points being selected from a plurality of possible fixation or attachment points 4472A-4472H. The possible fixation or attachment points 4472A-4472H are points at which the first and second substrates 4220, 4224 can be locally fixed or attached to one another by a fastener 4476, such as, for example, a pin, a rivet, a screw, or other fastening means.

Different combinations of fixation or attachment points 4472A-4472H define different lengths of the bending region 4 (BR4) of the support structure 4468. Thus, by selecting different combinations of fixation or attachment points, a user can vary the length, and thus the shape and size, of the support structure 4468. The user typically selects two fixation points 4472A-4472D and two fixation points 4472E-4472H (i.e., two fixation points on each side), though this is not required (e.g., the user can select more or less points). Generally speaking, selecting combinations of fixation or attachment points 4472A-4472H that include attachment points closer to one another will result in a shorter bending region 4 (BR4) of the support structure 4468. For example, a user-selected combination of fixation or attachment points 4472B, 4472C, 4472F, and 4472G define a first length of the bending region 4 (BR4), while a user-selected combination of fixation or attachment points 4472A, 4472D, 4472E, and 4472H define a second length of the bending region 4 (BR4), the second length being greater than the first length. To form the desired fixation or attachment points 4472A-4472H, the user can dispose the fasteners 4476 into tight fitting holes (not shown) formed into corresponding portions of the first and second substrates 4220, 4224.

The flexible support structure 4468 can, in other examples, vary from the support structure 4468 illustrated in FIGS. 62G and 62H. The flexible support structure 4468 can include more or less user-selectable fixation points (e.g., ten user-selectable fixation points) and/or the user-selectable fixation points can be positioned differently. For example, the user-selectable fixation points can be positioned to define different lengths of other bending regions of the support structure 4468 (e.g., the bending region 3). As another example, the user-selectable fixation points can be positioned closer to one another or further apart from one another. More or less fixation points can also be selected. For example, two or six fixation points can be selected instead of four.

Figure 63A:
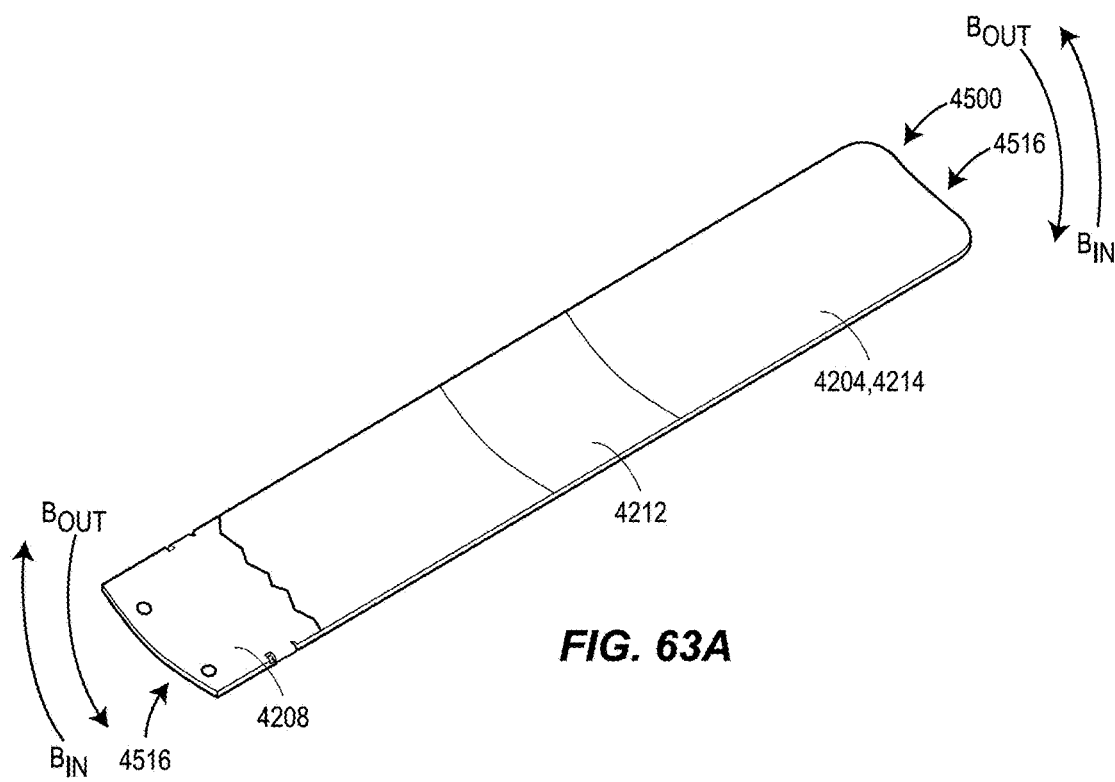
FIG. 63A is a perspective view of an example attachable article, in the form of a wristband, having a flexible display and a second type of flexible support structure coupled to the flexible display via an interlayer, the flexible support structure including a first substrate and a second substrate movably connected to the first substrate, such that the flexible support structure can limit bending of the flexible display and provide torsion protection for the flexible display.
Figure 63B:
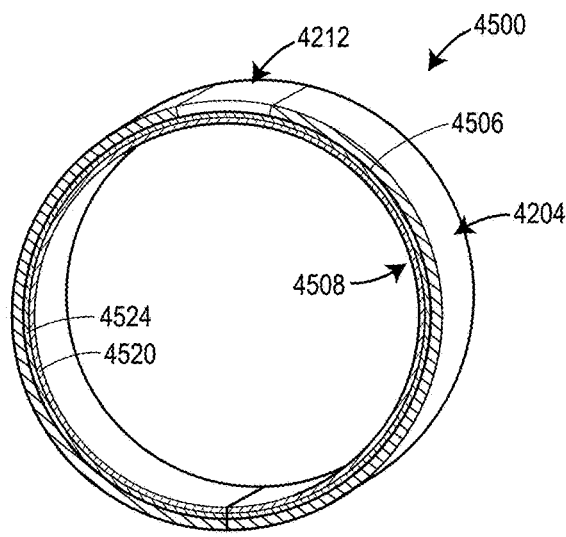
FIG. 63B is a side view of the attachable article illustrated in FIG. 63A bent or curved in an outward direction.

FIGS. 63A-63J illustrate another dynamically flexible article 4500, in the form of an attachable or wearable wristband. As illustrated in FIGS. 63A and 63B, the article 4500 is similar to the article 4200 described above, with common components represented by common reference numerals, but includes a flexible support structure 4508, different from the flexible support structure 4208, coupled to the flexible display 4204. The article 4500 is configured for bending, flexing, or curving in an outward direction (i.e., such that the flexible display 4204 has a concave shape), which is indicated by the arrows in FIG. 63A. FIG. 63A depicts the article 4500 in a first or substantially flat position. FIG. 63B depicts the article 4500 in a second or curved position.

Like the flexible support structure 4208 described above, the flexible support structure 4508 is a bi-stable flexible support, such that the flexible support structure 4508 is movable between a flat stable state or position (see FIG. 63A) and a curled or curved stable state or position (see FIG. 63B). The flexible support structure 4508 includes a first substrate 4520 and a second substrate 4524 movably connected to the first substrate 4520. As such, the flexible support structure 4508 is configured to limit bending of the article 4500, particularly the display 4204, when the structure 4508 is in both the flat stable state and the curved stable state, as will be described in greater detail below. In other words, the flexible support structure 4508 is configured to limit bending of the article 4500, particularly the display 4204, beyond the flat stable state and the curved stable state. Moreover, the flexible support structure 4508 is configured to resist torsion applied to the article 4500, as will also be described in greater detail below.

As illustrated in FIG. 63B, an interlayer 4506 is disposed between the flexible display 4204 and the flexible support structure 4508. In this example, the interlayer 4506 is an adhesive layer that serves to mechanically couple (e.g., adhere) the flexible display 4204 to the flexible support structure 4508. In other examples, the interlayer 4506 can be or include a stretchable material (e.g., a flexible fabric covering integrally formed with the flexible display 4204 and coupled to the flexible support structure 4508), one or more layers of foam, rubber, visco-elastic, or other suitable material(s), or combinations thereof. In some cases, the interlayer 4506 only serves to couple portions or segments of the display 4204 to corresponding portions or segments of the flexible support structure 4508. In some cases, the interlayer 4506 can reduce, or even eliminate, the local variations in the bending radius of the article 4500. In other words, the interlayer 4506 can serve to smoothen out any local variation in the bending of the article 4500, particularly the local variation of any bending experienced by the flexible display 4204, thereby providing a more continuous local bending radius when the article 4500 is curved or bent. Advantageously, in some cases, the interlayer 4506 can also provide visco-elastic cushioning to the display 4204, thereby making the display 4204 less sensitive (e.g., less prone to damage) to objects dropped thereon. Finally, it will be appreciated that the article 4500 need not include the interlayer 4506, or any layer disposed between the flexible display 4204 and the flexible support 4508. Instead, the flexible display 4204 and the flexible support 4508 can be directly coupled to (e.g., integrally formed with) one another in any known manner.

As illustrated in FIGS. 63A and 63B, the flexible display 4204 is, in this example, disposed over and spans the entire length of the interlayer 4506 and the flexible support 4508, such that the flexible display 4204 extends between the ends of the article 4500 and is viewable from the top of the article 4500. In other examples, the flexible display 4204 may only be disposed over and span a partial length of the flexible support 4508 and/or may be disposed under the flexible support 4508.

Though not depicted in FIGS. 63A and 63B, the article 4500 can also include a connection structure that functions to connect the ends 4516 of the article 4500 together when the article 4500 is bent, as illustrated in FIG. 63B, to form a circular, oval, or other-shaped band. In some embodiments, the connection structure can be a magnetically-based connection structure, such as, for example, a connection structure in the form of magnets disposed within the flexible support 4508 at or proximate to the ends 4516, magnets disposed at the ends 4516 so that the ends 4516 connect end-to-end, or magnets disposed on the top or bottom sides of the support 4508 at or proximate to the ends 4516 so that the article 4500 can be folded around on itself so as to create an article of variable length. One or more mechanical connectors (e.g., buckles, snap components, clasps, cooperating grooves and projections, cooperating tabs and recesses), any desired hook and loop connection material (e.g., Velcro), or some other connection means can be used instead of or in addition to the magnetically-based connection structure. These and other connection structures are described in further detail in commonly owned U.S. Provisional Patent Application 61/920,705, filed Dec. 24, 2013 and entitled "Dynamically Flexible, Attachable Device Having an Integral Flexible Display, the disclosure of which is hereby expressly incorporated by reference herein.

Figure 63C:
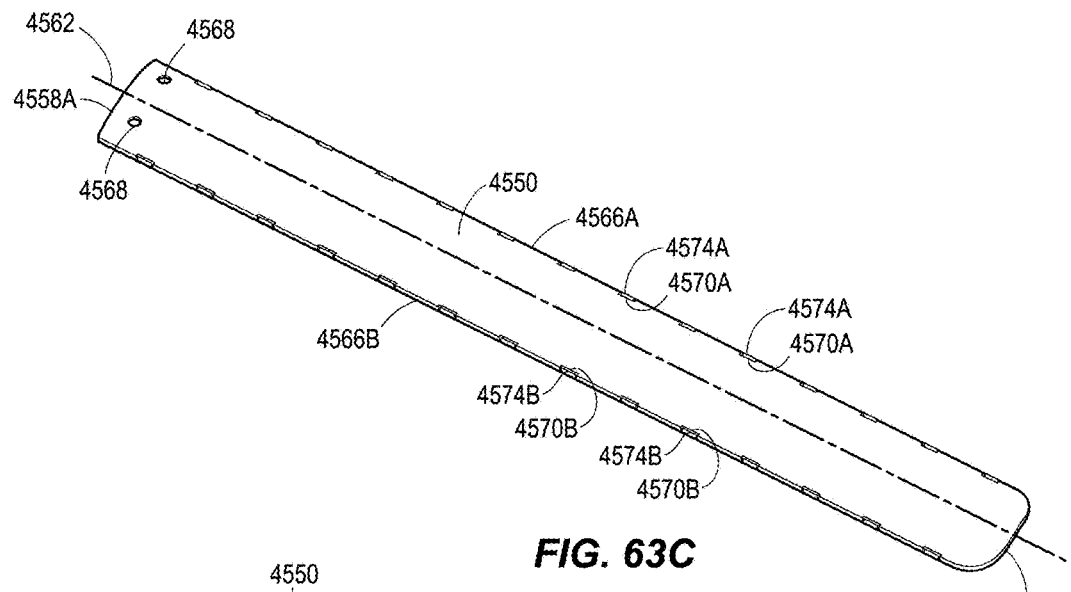
FIG. 63C is a perspective view of the first substrate of the second type of flexible support structure illustrated in FIG. 63A.

Further details regarding the first and second substrates 4520, 4524 will now be described in connection with FIGS. 63C-63F. With reference to FIG. 63C, the first substrate 4520 in this example is a substantially rectangular metal (e.g., brass, aluminum, copper, steel, tin, nickel) strip that has a slightly concave shape (i.e., a large radius of curvature) and is formed as a bi-stable spring, such that the first substrate 4520 can be referred to as being a bi-stable flexible metal strip. As illustrated in FIG. 63C, the first substrate 4520 has a top side 4550, a bottom side 4554, a pair of opposing ends 4558A, 4558B, a longitudinal axis 4562, and a pair of edges 4566A, 4566B disposed between the ends 4558A, 4558B and parallel to the longitudinal axis 4562.

As also illustrated in FIG. 63C, the first substrate 4520 includes a pair of apertures 4568, a plurality of openings 4570, and a plurality of projections 4574. The apertures 4568 each have a circular shape and are formed in the first substrate 4520 at or proximate to the end 4558A. The openings 4570 have a generally rectangular shape in cross-section and are generally formed in the first substrate 4520 from one end 4558A of the first substrate 4520 to the other end 4558B of the first substrate 4520. The plurality of openings 4570 includes openings 4570A formed in or along the edge 4566A of the first substrate 4520 and openings 4570B formed in or along the edge 4566B of the first substrate 4520 across from or opposite the openings 4570A. The openings 4570A are evenly spaced apart from one another and the openings 4570B are evenly spaced apart from one another, although the openings 4570A, 4570B may be unevenly spaced apart from one another if desired. It will be appreciated that as the distance between the apertures 4568 and the openings 4570A, 4570B increases, the length of the openings 4570A, 4570B increases. In other words, the openings 4570A, 4570B positioned further away from the apertures 4568 generally have a greater length than the openings 4570A, 4570B positioned closer to the apertures 4568. The plurality of projections 4574 are generally associated with or correspond to the openings 4570, respectively. The plurality of projections 4574 are generally formed or defined such that each of the projections 4574 extends outward and downward from the top side 4550 of the first substrate 4520 within a respective one of the openings 4570. The plurality of projections 4574 include projections 4574A formed or defined along the edge 4566A and projections 4574B formed or defined along the edge 4566B. The projections 4574A are evenly spaced apart from one another and the projections 4574B are evenly spaced apart from one another, although the projections 4574A, 4574B may be unevenly spaced apart from one another if desired. As with the openings 4570A, 4570B, it will be appreciated that as the distance between the apertures 4568 and the projections 4574A, 4574B increases, the length of the projections 4574A, 4574B increases. In other words, the projections 4574A, 4574B positioned further away from the apertures 4568 generally have a greater length than the projections 4574A, 4574B positioned closer to the apertures 4568.

Figure 63D:
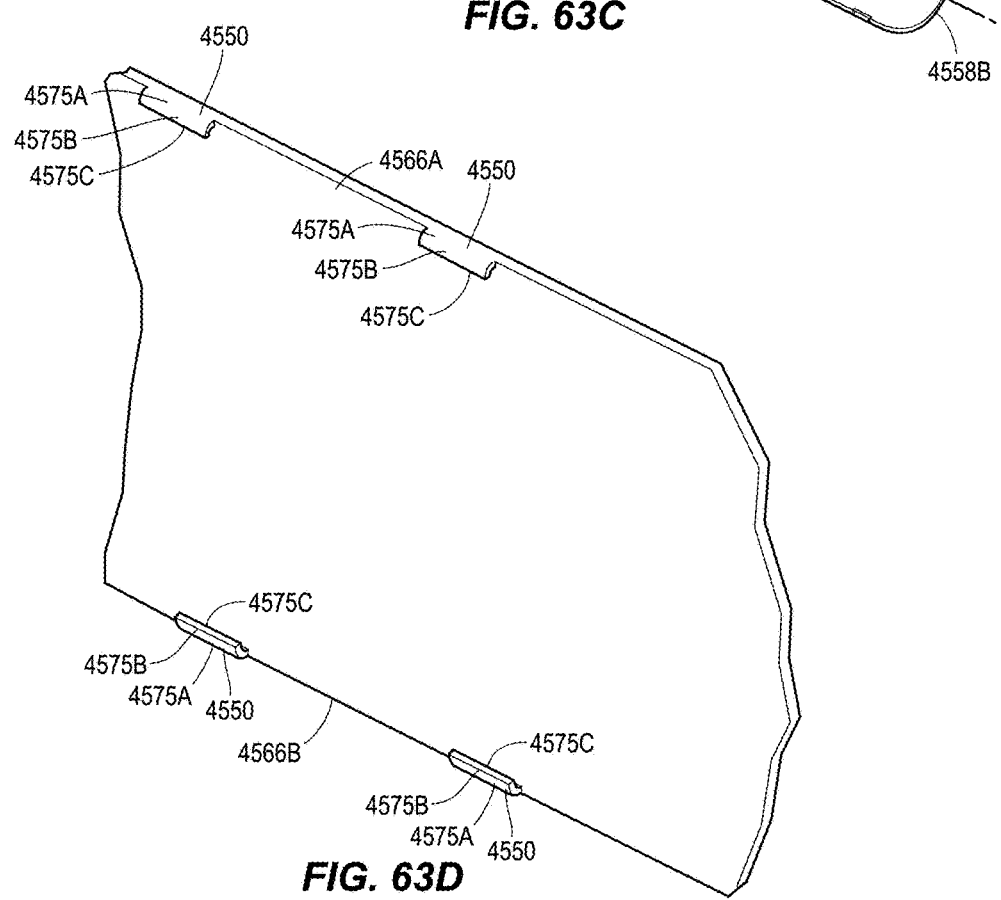
FIG. 63D is a close-up perspective view of a portion of the first substrate illustrated in FIG. 63C.

FIG. 63D is a close-up view of a portion of the first substrate 4520, showing two openings 4570A, two openings 4570B, two projections 4574A, and two projections 4574B. As illustrated, each projection 4574A, 4574B has a generally curved profile, with a first end portion 4575A that is coupled to and extends outward or away from the top side 4550, a middle portion 4575B that extends downward and outward from the first end portion 4575A and is positioned within a respective one of the openings 4570, and a second end portion 4575C, opposite the first end portion 4575A, that extends downward from and inward of the middle portion 4575B. The second end portion 4575C in this example terminates at a position substantially below the first substrate 4520 and substantially vertically aligned with the first end portion 4575A.

In other embodiments, the first substrate 4520 can vary from the one illustrated in FIGS. 63C and 63D. The first substrate 4520 can have a different shape (e.g., can be substantially or entirely flat, can have a more circular shape, can have an irregular shape, can have a more or less concave shape, can have a convex shape) and/or can have a different size. The first substrate 4520 can alternatively be formed as a mono-stable flexible strip (i.e., the first substrate 4520 can have one stable position, similar to a tape measure) or as a multi-stable flexible strip having more than two stable positions. The first substrate 4520 can alternatively or additionally be made of one or more different materials, such as, for example, plastic, leather, or cloth. Further yet, the first substrate 4520 can include a different number of apertures 4568 (e.g., one aperture 4568, four apertures 4568), can include differently positioned apertures 4568 (e.g., apertures 4568 disposed near or at the end 4558B), and/or can include differently constructed apertures 4568 (e.g., apertures 4568 having a differently shaped cross-section). Alternatively, the first substrate 4520 need not include the apertures 4568. The first substrate 4520 can include a different number of openings 4570 and/or projections 4574, can include differently positioned or spaced openings 4570 and/or projections 4574 (e.g., openings 4570 and projections 4574 spaced further from the edges 4566A, 4566B, openings 4570 and projections 4574 spaced further from or closer to one another), and/or can include differently constructed openings 4570 and/or projections 4574. The projections 4574 can, for example, take the form of tabs, hooks, knobs, bumps, or any other suitable structure(s). In one example, the projections 4574 can have a substantially rectangular profile that extends substantially downward from the first substrate 4520. In other examples, the projections 4574 can have a profile with more or less curvature. For example, each projection 4574 can have a second end portion 4575C that terminates at a position inward or outward of, rather than substantially vertically aligned with, the first end portion 4575A.

Figure 63E:
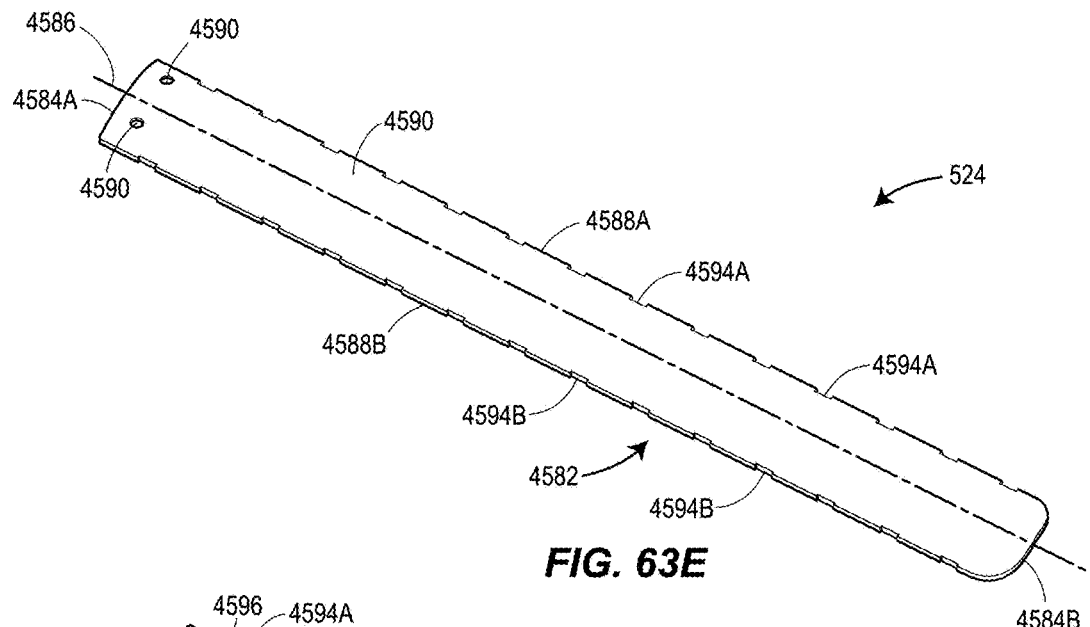
FIG. 63E is a perspective view of the second substrate of the second type of flexible support structure illustrated in FIG. 63A.

With reference to FIG. 63E, the second substrate 4524 in this example is a substantially rectangular metal (e.g., brass, aluminum, copper, steel, tin, nickel) strip that has a slightly concave shape (i.e., a large radius of curvature) and is formed as a bi-stable spring, such that the second substrate 4524 may also be referred to herein as a bi-stable flexible metal strip. As illustrated in FIG. 63E, the second substrate 4524 has a top side 4580, a bottom side 4582, a pair of opposing ends 4584A, 4584B, a longitudinal axis 4586, and a pair of edges 4588A, 4588B disposed between the ends 4584A, 4584B and parallel to the longitudinal axis 4586.

As illustrated in FIG. 63E, the first substrate 4520 includes a pair of apertures 4590 and a plurality of slots 4594. The apertures 4590 are identical in shape and size to the apertures 4568 but are formed in the second substrate 4524 at or proximate to the end 4584A. The slots 4594 are generally formed in the second substrate 4524 from one end 4584A of the second substrate 4524 to the other end 4584B of the second substrate 4524. The plurality of slots 4594 includes slots 4594A formed in or along the edge 4588A of the second substrate 4524 and slots 4594B formed in or along the edge 4588B of the second substrate 4524 across from or opposite the slots 4594A. The slots 4594A are evenly spaced apart from one another and the slots 4594B are evenly spaced apart from one another. It will be appreciated that as the distance between the apertures 4590 and the slots 4594A, 4594B increases, the length of the slots 4594A, 4594B increases. In other words, the slots 4594A, 4594B positioned further away from the apertures 4590 generally have a greater length than the slots 4594A, 4594B positioned closer to the apertures 4590. As will be described in greater detail below, the slots 4594 generally define or correspond to the most extreme bending that will be permitted.

Figure 63F:
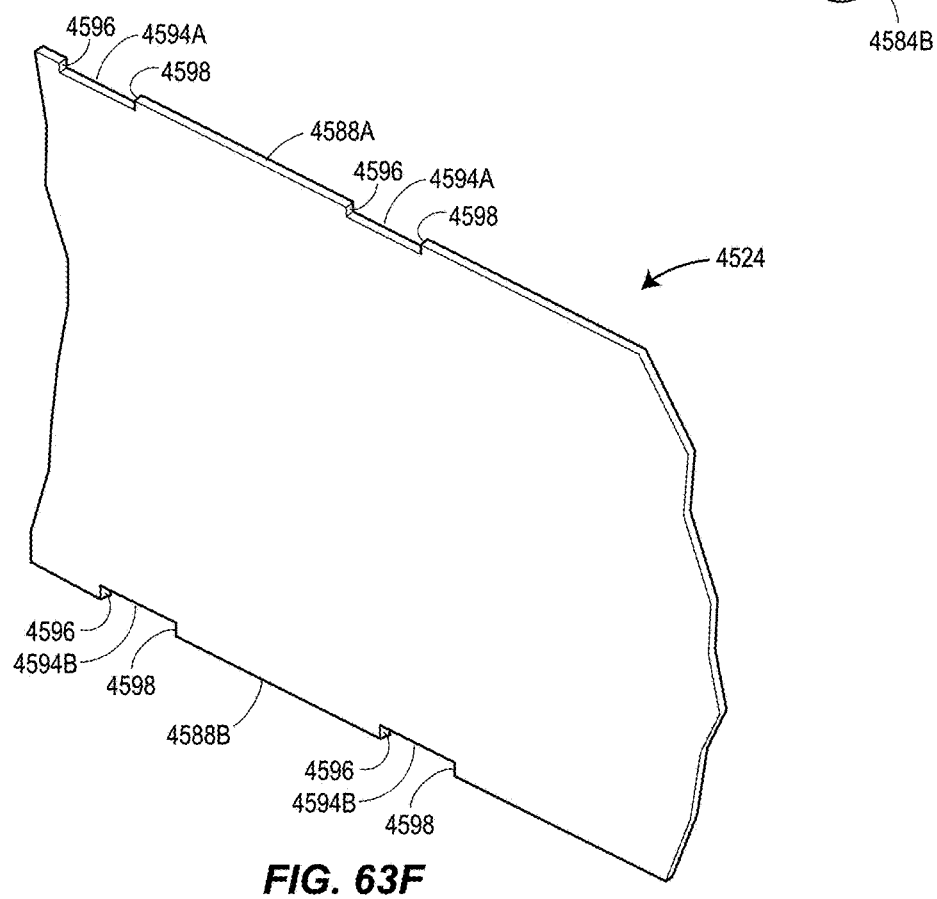
FIG. 63F is a close-up perspective view of a portion of the second substrate illustrated in FIG. 63E.

FIG. 63F is a close-up view of a portion of the second substrate 4524, showing two of the slots 4594A and two of the slots 4594B. As depicted, each slot 4594A, 4594B has a rectangular-shape in cross-section and is wider than the openings 4570 (i.e., larger in a direction along the longitudinal axis 4586). Each slot 4594A, 4594B has or defines a first stop surface 4596 and a second stop surface 4598 opposite the first stop surface 4596. The first stop surface 4596 generally defines or corresponds to the most extreme bending that will be permitted in the outward direction when the article 4500 is in the second or curled position (see FIG. 63B). The second stop surface 4598 generally defines or corresponds to the most extreme bending that will be permitted in the inward direction when the article 4500 is in the first or substantially flat position (see FIG. 63A).

In other embodiments, the second substrate 4524 can vary from the one illustrated in FIGS. 63E and 63F. The second substrate 4524 can have a different shape (e.g., can be substantially or entirely flat, can have a more circular shape, can have an irregular shape, can have a more or less concave shape, can have a convex shape) and/or can have a different size. In one embodiment, the second substrate 4524 can take the form of one or more (e.g., two) elongated, narrow strips. The second substrate 4524 can alternatively be formed as a mono-stable flexible strip (i.e., the second substrate 4524 can have one stable position, similar to a tape measure) or as a multi-stable flexible strip having more than two stable positions. The second substrate 4524 can alternatively or additionally be made of one or more different materials, such as, for example, plastic, leather, or cloth. Further yet, the second substrate 4524 can include a different number of apertures 4590 (e.g., one aperture 4590, four apertures 4590), can include differently positioned apertures 4590 (e.g., apertures 4590 disposed near or at the end 4584B), and/or can include differently constructed apertures 4590 (e.g., apertures 4590 having a differently shaped cross-section). Alternatively, the second substrate 4524 need not include the apertures 4590. The second substrate 4524 can include a different number of slots 4594, can include differently positioned or spaced slots 4594 (e.g., spaced further from the edges 4588A, 4588B, spaced further from or closer to one another), and/or can include differently constructed slots 4594. For example, the slots 4594 can take the form of openings, apertures, tracks, channels, grooves, recesses, or any other suitable structure(s). As another example, the slots 4594 can be essentially identical in shape and size to the openings 4570.

Figure 63G:
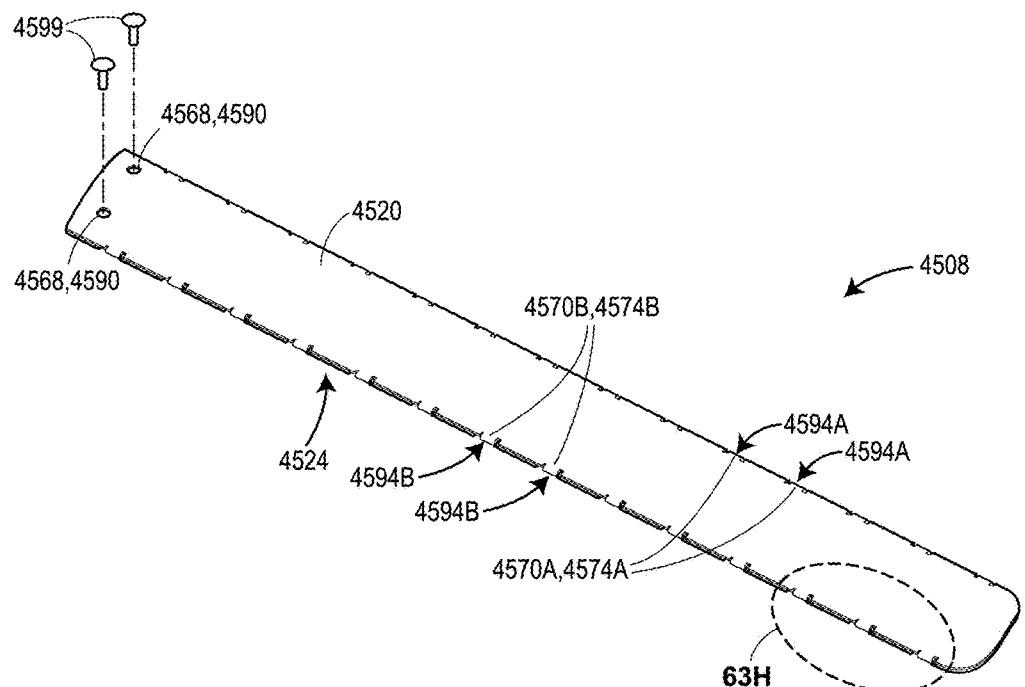
FIG. 63G is a perspective view illustrating the first substrate illustrated in FIGS. 63C and 63D and the second substrate illustrated in FIGS. 63E and 63F movably connected to form the flexible support structure illustrated in FIG. 63A.

FIG. 63G depicts the first and second substrates 4520, 4524 aligned with and movably connected or coupled to one another. It will be appreciated that the first and second substrates 4520, 4524 have a substantially similar shape and size, such that when the assembled flexible support structure 4508 is viewed from the top, the second substrate 4524 is substantially not visible (with the exception of the projections 4574), while when the flexible support structure 4508 is viewed from the bottom, the first substrate 4520 is substantially not visible. In other examples, however, the first and second substrates 4520, 4524 need not have a substantially similar shape and/or size. For example, one of the first and second substrates 4520, 4524 can have the shape illustrated in FIGS. 63C-63F, while the other one of the substrates 4520, 4524 can have a different shape, such as, for example, a substantially or entirely flat shape. As another example, the second substrate 4524 can have the shape illustrated in FIGS. 63E and 63F, while the first substrate 4520 can take the form of one or more narrow, elongated strips movably coupled to the second substrate 4524.

When the first and second substrates 4520, 4524 are substantially aligned with one another as illustrated in FIG. 63G, the apertures 4568 of the first substrate 4520 are aligned with the apertures 4590 of the second substrate 4524, and the openings 4570 of the first substrate 4520 are aligned with the slots 4594 of the second substrate 4524, such that the projections 4574 of the first substrate 4520 are movably disposed within the slots 4594 of the second substrate 4524. At least some portion of the first substrate 4520 is fixedly attached to at least some portion of the second substrate 4524. In this example, one end 4558A of the first substrate 4520 is fixedly attached to a corresponding end 4584A of the second substrate 4524 using or via a fastener 4599 (e.g., a pin, a rivet, a screw) inserted into each of the aligned pairs of apertures 4568, 4590. The other ends 4558B, 4584B of the first and second substrates 4520, 4524 are thus freely movable relative to one another.

In other examples, the apertures 4568, 4590 can be formed or defined in different portions of the first and second substrates 4520, 4524, such that the first and second substrates 4520, 4524 can be fixedly attached to one another at different portions. For example, the apertures 4568, 4590 can be formed at or near the ends 4558B, 4584B of the first and second substrates 4520, 4524, respectively, such that the first and second substrates 4520, 4524 can be fixedly attached to one another at the ends 4558B, 4584B, rather than at the ends 4558A, 4584A. As another example, the apertures 4568, 4590 can be formed at or near a middle portion of the first and second substrates 4520, 4524, such that the first and second substrates 4520, 4524 can be fixedly attached to one another at or near the middle portion, rather than at the ends 4558A, 4584A. In other examples, the first and second substrates 4520, 4524 can include more or less apertures 4568, 4590. For example, the first substrate 4520 can include one aperture 4568 and the second substrate 4524 can include one aperture 4590, with the first and second substrates 4520, 4524 locally fixedly attached to one another at or via the apertures 4568, 4590. Further yet, the first and second substrates 4520, 4524 can be welded, adhered (e.g., glued), or otherwise fixedly attached to one another in a way such that the apertures 4568, 4590 are not necessary. For example, the apertures 4568, 4590 would not be necessary if the openings 4570 and the apertures 4590 were identical in shape and size, as the engagement between the openings 4570 and the apertures 4590 would serve to keep the first and second substrates 4520, 4524 together.

Figure 63H:
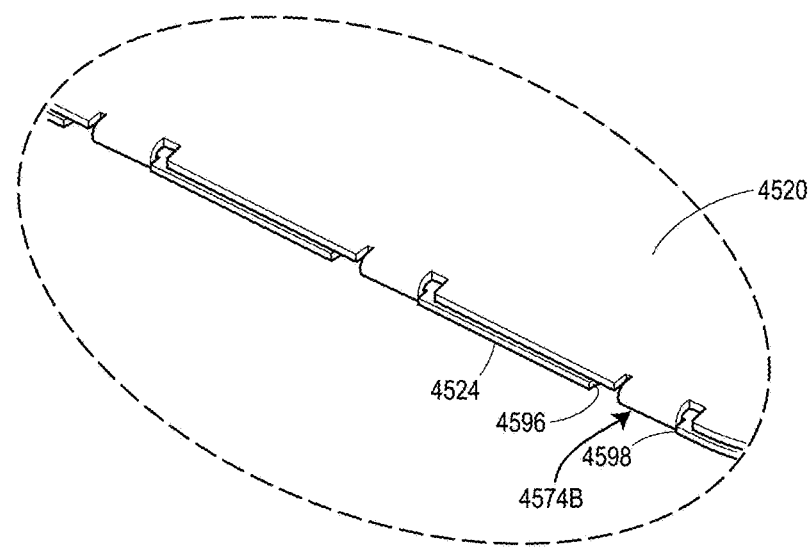
FIG. 63H is a close-up perspective view of a portion of the flexible support structure illustrated in FIG. 63G.

FIG. 63H is a close-up view of a portion of the support structure 4508 illustrated in FIG. 63G. As noted above, the projections 4574 of the first substrate 4520 are movably disposed within the slots 4594 of the second substrate 4524. More specifically, as illustrated in FIG. 63H, each projection 4574 is movably disposed between the first and second stop surfaces 4596, 4598 of a respective slot 4594. Because each projection 4574 has a second end portion 4574C that extends below the first substrate 4520, each projection 4574 is configured to interferingly engage or contact the first and second stop surfaces 4596, 4598, as will be described below.

It will be appreciated that the first and second substrates 4520, 4524 can be movably connected to one another in a different manner. For example, the first substrate 4520 and the second substrate 4524 can be reversed, with the first substrate 4520 including the slots 4594 and the second substrate 4524 including the projections 4574 movably disposed within the slots 4594. The first and second substrates 4520, 4524 can, in some examples, be movably connected to one another in a different location, in multiple locations, and/or using components other than the slots 4594 and the projections 4574 illustrated herein. Any number and/or combination of fasteners, grooves, tabs, protrusions, ribs, slots, and other components can be used for this/these purpose(s).

In any event, the flexible support 4508, via the interaction between corresponding projections 4574 and slots 4594, can limit bending of the article 4500, and, more particularly, the flexible display 4204. Because the article 4500 is configured for bending in the outward direction, the flexible support 4508 is configured to permit some bending of the article 4500, and, more particularly, the flexible display 4204, in the outward direction but is configured to prevent bending of the flexible display 4204 in the outward direction (indicated by the arrows BOUT in FIG. 63A) beyond its bending limit (e.g., beyond its minimum bending radius). At the same time, the flexible support 4508 can substantially limit bending of the article 4500, and, more particularly, the flexible display 4204, in the inward direction (indicated by the arrows BIN in FIG. 63A). It will thus be appreciated that the flexible support 4508 is configured to permit more bending of the article 4500 in the outward direction than in the inward direction, but this need not be the case (e.g., the flexible support 4508 can be configured to permit more bending in the inward direction).

Figure 63I:
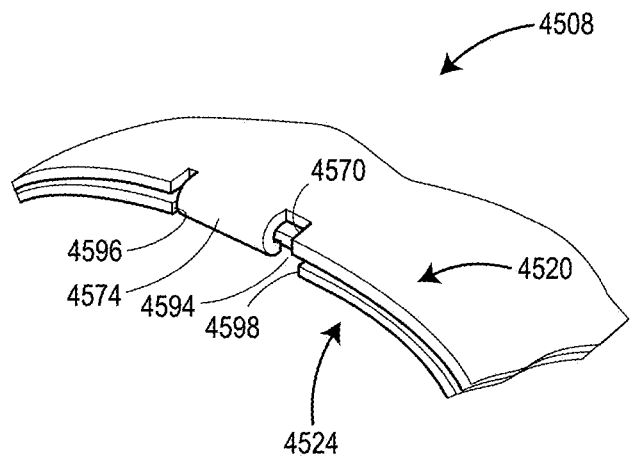
FIG. 63I is a side view of a portion of the flexible support structure illustrated in FIG. 63G bent or curved in an outward direction.

When the article 4500 is in the first or substantially flat stable position (i.e., the position illustrated in FIG. 63A), and the article 4500 is bent or curved in the outward direction (indicated by the arrows in FIG. 63A), the applied bending force causes the projections 4574 of the first substrate 4520 to move relative to the slots 4594 of the second substrate 4524. Specifically, the applied bending force causes each projection 4574 to slide away from the second stop surface 4598 and toward the first stop surface 4596 of a respective slot 4594. At some point, the article 4500 will be bent to such a degree that each projection 4574 contacts the first stop surface 4596 of a respective slot 4594, as depicted in FIG. 63I. At this point, the article 4500 has reached its pre-defined bending limit and any further bending of the article 4500, particularly the flexible display 4204, in the outward direction is prevented. This position also corresponds to the second or curled stable position of the article 4500 (see FIG. 63B), such that the article 4500 cannot be bent or curved beyond the second stable position, though that need not be the case (e.g., a limited amount of bending can be permitted beyond the second or curled stable position).

Figure 63J:
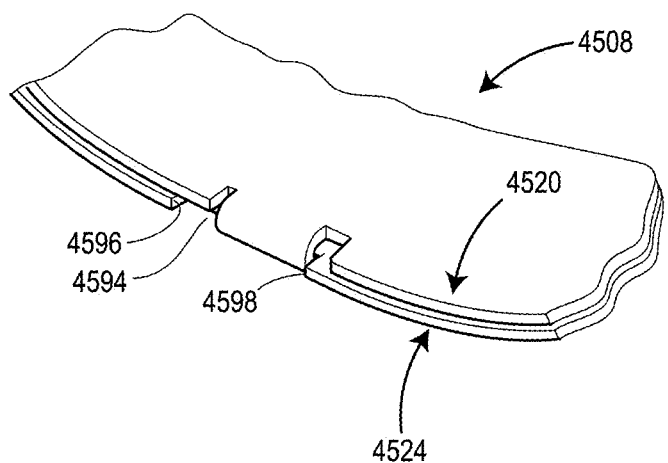
FIG. 63J is a side view of a portion of the flexible support structure illustrated in FIG. 63G bent or curved in an inward direction.

When the article 4500 is in the first or substantially flat stable position (i.e., the position illustrated in FIG. 63A), and the article 4500 is bent or curved in the inward direction, the applied bending force causes the projections 4574 of the first substrate 4520 to move relative to the slots 4594 of the second substrate 4524. Specifically, the applied bending force causes each projection 4574 to slide away from the first stop surface 4596 and toward the second stop surface 4598 of a respective slot 4594. At some point, the article 4500 will be bent to such a degree (i.e., corresponding to the maximum bending amount in this direction) that each projection 4574 contacts the second stop surface 4598 of a respective slot 4594, as depicted in FIG. 63J. At this point, the article 4500 has reached its pre-defined bending limit and any further bending of the article 4500, particularly the flexible display 4204, in the inward direction is prevented.

The flexible support structure 4508 can, like the flexible support structure 4208, also provide torsion control. More specifically, the flexible support structure 4508 can, by virtue of having two substrates 4520, 4524 movably connected to one another and the slots 4594 and the projections 4574 being positioned along or in the edges 4566A, 4566B and 4588A, 4588B, respectively, can substantially resist or prevent torsion from being applied to the longitudinal sides of the article 4500, and, thus, the flexible display 4204. At the very least, the flexible support structure 4508 described herein will substantially reduce the amount of torsion that can be applied to the article 4500, and, thus, the flexible display 4204. It will be appreciated that the flexible support structure 4508 can thus help to prevent the damage to the brittle layers of the flexible display 4204 that would otherwise be caused by torsion applied to the article 4500. It will be appreciated that the width and/or length of the projections 4574 and the slots 4594, and/or the spacing between the projections 4574 and the slots 4594 can be varied, yet the flexible support structure 4508 can still provide at least some level of torsion control. In some of these cases, the width, length, and/or spacing can be varied such that the flexible support structure 4508 provides less resistance to torsion, and thus permits more bending in the transverse direction.

Figure 64A:
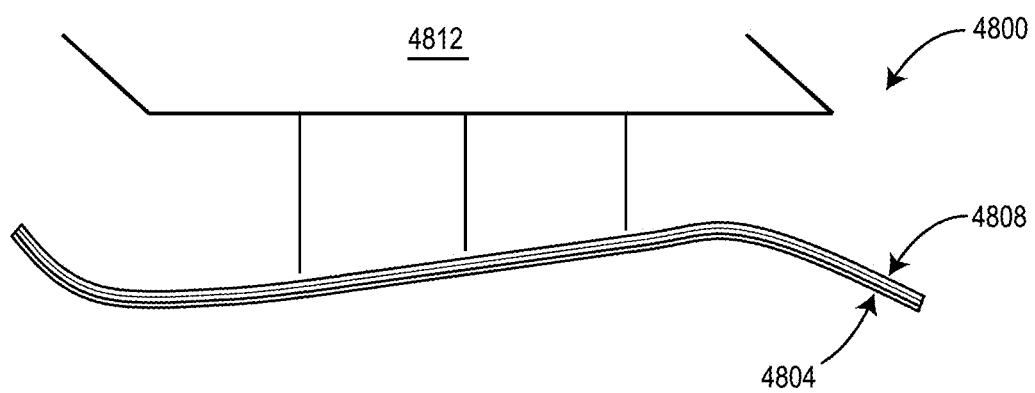
FIG. 64A is a side view of an another example article having a flexible OLED light and a flexible support structure coupled to the flexible electronic component via an interlayer, the flexible support structure including a first substrate and a second substrate movably connected to the first substrate, such that the flexible support structure can limit bending of the flexible OLED light and provide torsion protection for the flexible OLED light.
Figure 64B:
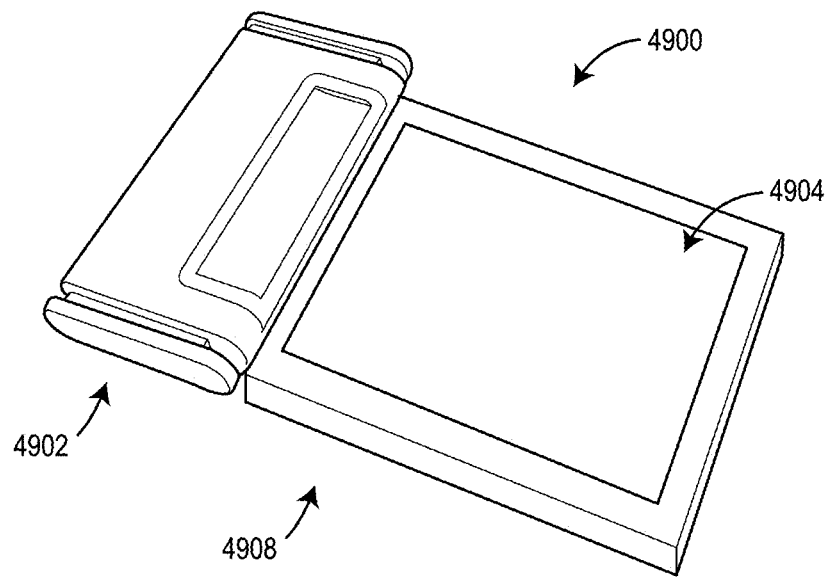
FIG. 64B is a perspective view of another example article having a collapsible e-reader and a flexible support structure coupled to the e-reader via an interlayer, the flexible support structure including a first substrate and a second substrate movably connected to the first substrate, such that the flexible support structure can limit bending of the collapsible e-reader and provide torsion protection for the collapsible e-reader.

FIGS. 64A and 64B illustrate other examples of dynamically flexible articles 4800 and 4900, respectively.

The article 4800 illustrated in FIG. 64A takes the form of a flexible light or lamp. The article 4800 includes a flexible electronic component 4804 and a flexible support structure 4808 coupled to the flexible electronic component 4804 via an interlayer (not illustrated), such as, for example, the interlayer 4206. The flexible electronic component 4804 is similar to the flexible electronic component 4204, but is an organic light-emitting diode (OLED) light instead of a flexible display. As illustrated in FIG. 64A, the flexible electronic component 4804 is coupled (e.g., mounted) to a ceiling 4812. In other examples, the flexible electronic component 4804 can be a different component and/or need not be coupled to the ceiling 4812 (e.g., the component 4804 can be held by a user, the component 4804 can be coupled to or disposed on a different surface). Like the display 4204, the flexible OLED light 4804 is dynamically bendable or flexible based on, for example, the lighting needs for the environment in which the flexible electronic component 4804 is disposed. As such, the flexible OLED light 4804 can have any number of various configurations. Unlike the bi-stable flexible support structures 4208, 4508, the flexible support structure 4808 has more than two bending positions (i.e., the flexible support structure 4808 is a multi-stable support structure). The flexible support structure 4808 can nonetheless include the features of any of the flexible support structures described herein (e.g., the flexible support structure 4208, 4508, 708), such that the flexible support 4808, like the other support structures described herein, is configured to limit bending of the article 4800 and/or resist torsion applied to the article 4800.

The article 4900 illustrated in FIG. 64B includes a base 4902, a flexible electronic component 4904, and a flexible support structure 4908. The flexible electronic component 4904 is partially disposed within and extends outward from the base 4902. The flexible support structure 4908 is coupled to the flexible electronic component 4904 via an interlayer (not illustrated), such as, for example, the interlayer 4106. The flexible electronic component 4904 is similar to the flexible electronic component 4204, but is a collapsible e-reader. Like the display 4204, the flexible electronic component 4904 is dynamically bendable or flexible between, for example, the open or substantially flat in-use position depicted in FIG. 64B and a folded or closed position (not illustrated) in which the flexible electronic component 4904 is folded over and around an exterior surface of the base 4902. Like the flexible support structure 4808, the flexible support structure 4908 has more than two bending positions. The flexible support structure 4908 can nonetheless include the features of any of the flexible support structures described herein (e.g., the flexible support structure 4208, 4508, 4808), such that the flexible support 4908, like the other support structures described herein, is configured to limit bending of the article 4900 and/or resist torsion applied to the article 4900.

Figure 65:
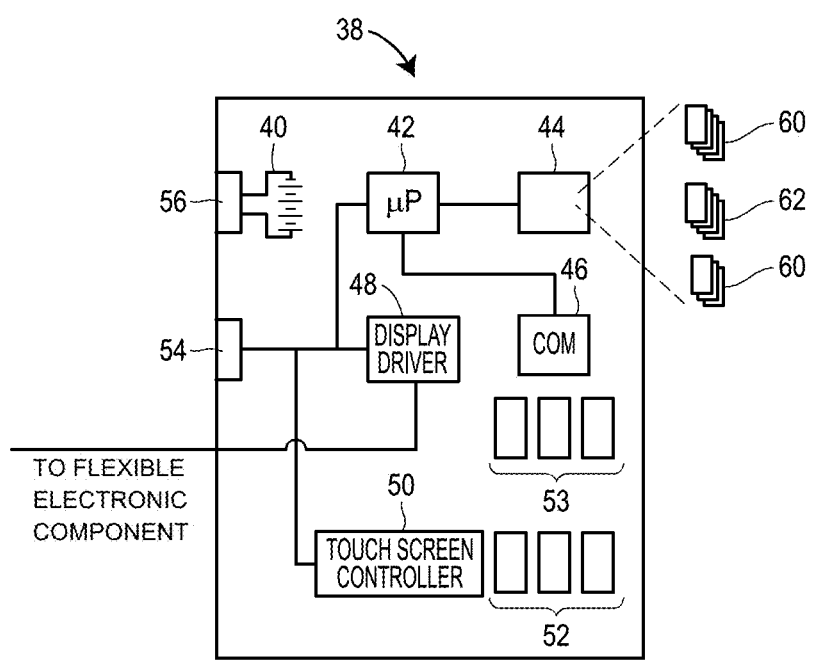
FIG. 65 is a block diagram of an electronics module associated with the attachable articles described herein.

FIG. 65 illustrates a block diagram of various electronic components, referred to herein as an electronics suite 38, that may be used in or disposed in the electronics module 19 of any of the attachable articles described herein to drive a flexible electronic component (e.g., the flexible display 18) of an article (e.g., the dynamically flexible, attachable article or device 10). In particular, the electronics suite 38 illustrated in FIG. 65 includes a battery 40 that powers a number of other modules or electronic components including a microprocessor or other processor 42, a computer readable memory 44, which may be, for example, a flash memory or other suitable type of non-transitory, tangible, data storage medium, a communication module 46, a display driver 48, a touch screen controller 50 and a number of sensors 52 and other secondary devices 53. The sensors 52 may include, for example, an impact sensor or step counter, one or more gyroscopic sensors or gyroscopes, temperature sensors, vibration sensors, pulse rate monitors, pressure sensors, strain gauges, etc. For example, the sensors 52 may include any number of any number of types of sensors, such as strain gauges, gyroscopes, accelerometers, compression sensors, tensional strain sensors, positional sensors, motion or movement sensors, pressure sensors, vibration sensors, temperature sensors, orientation sensors, gravity sensors, light sensors, and piezoelectric sensors, to name a few. The secondary electronic devices 53 may include, for example, an alarm or noise creation device, a speaker, a microphone, a vibrator the operation of which causes the clasp 14 or electronics module 19 to vibrate, etc. Although FIG. 65 illustrates the sensors 52 and the secondary electronic devices 53 as being integral with the electronics suite 38, in some cases, one or more of the sensors 52 and/or the secondary electronic devices 53 are physically disposed at one or more other locations along the band 12 separate from the remainder of the electronics suite 38. In these cases, though, the separately disposed sensors 52 and/or secondary electronic devices 53 remain in communicative connection with the remainder of the electronics suite 38 (e.g., via a wired or wireless connection).

Similarly, although FIG. 65 illustrates the display driver 48 as being integral with the electronics suite 38, in some cases, the display driver 48 is physically disposed at another location separate from the remainder of the electronics suite 38. In an example, the display driver 48 is disposed in a location that is proximate to the electrodes or connectors of the pixel elements of the flexible electronic component, e.g., on the backplane of the flexible electronic component or at some other suitable location. The separately located display driver 48, though, remains in communicative connection with the remainder of the electronics suite 38 (e.g., via a wired or wireless connection) despite of the remote locations.

As will be understood, the memory 44, the communication module 46, the display driver 48 and the touch screen controller 50, as well as the sensors 52 and other secondary electronic devices 53, are communicatively connected to the processor 42 and may operate to perform various functions in conjunction with applications or other programs implemented by the processor 42. Still further, each of these elements is connected to and is powered by the battery 40 in any known or desired manner. Still further, the electronics suite 38 of FIG. 65 may include one or more communication ports, such as communication port 54 (e.g., a USB or other type of digital communication port) and a power or battery charger input port 56. In this case, the power input port 56 may be connected to the battery 40 and enable charging or recharging of the battery 40 using any known or desired recharging circuitry and methodology. Alternatively or in addition, the communications input port 54 (in the form of for example, a USB input port) may be connected to the battery 40 and provide power to the battery 40 for charging battery 40, and the input port 54 may also be connected to the microprocessor 42, as well as to the communication circuit module 46, for performing wired-based communications via the input port 54. Of course, the communication input port 54, while being illustrated as a USB-type connection, could any other type of known wired or physical communication connection, including any desired serial or parallel digital communication port using any number of pins or wires, as is known in the art, an analog communication port, etc. Additionally or alternatively, the input port 54 may include a wireless input port for performing wireless communications.

In an embodiment, the power input port 56 may be a wireless input port for powering the article 10, and in this case may, for example, be part of a battery charger unit that operates to charge the battery 40 using, for example, an inductively coupled charging technique. If the battery charger unit is part of an inductively coupled charging system, it generally responds to electromagnetic waves produced by an exterior charging unit (not shown) to charge the battery 40 when the attachable article 10 is disposed near the external charging unit. In another case, the battery charger of the input port 56 may be a kinetic energy charger unit that converts motion of the dynamically flexible device (such as that associated with movement of an arm when the dynamically flexible device is in the form of a wristband) into electrical energy which is provided to charge the battery 40.

As will be understood, the processor 42, which may be a programmable, general-purpose processor or a specially programmed processor programmed using any desired type of hardware or firmware programming, generally coordinates and implements the operation of the flexible electronic component and the associated electronic components as described in more detail herein. The computer readable memory 44 stores various applications, including for example the general operating system implemented by the processor 42, and various applications (illustrated as a set of applications 60 in FIG. 65) to be run on the processor 42 to implement various different types of functionality via the dynamically flexible device, some of which will be described in more detail herein. The memory 44 may also store one or more data files 62, which may be, for example, image or video data files associated with various images to be displayed on the display screen 18 at various different times. Still further, the memory 44 may store application data that may be created by the various applications 60 or the microprocessor 42 as part of the operation of various applications 60 and to be used by those applications 60 either during runtime of the applications 60 or at other times. If desired, the microprocessor 42 or one of the secondary electronic components 53 may include or be a clock that tracks the current time, day, date, month, year, time zone, etc.

As an example, one or more of the applications 60 may implement various functionalities typically associated with standard computers or other types of electronic devices such as personal handheld electronic devices, including for example an e-mail application, an Internet or web-browsing application, an alarm clock application, a calendar application, a music-playing application such as an MP3 application, a video application, a digital picture slideshow application, a mapping application, an e-reading application which may provide books, notes, magazines or other types of articles, for reading by the user, etc. Still further, one or more of the applications 60 may operate on the processor 42 to turn the flexible electronic component associated with the dynamically flexible, attachable device into a slave display device that may be tied to or communicably coupled to an exterior master device that is generating content to be displayed via the flexible electronic component. The master device, which may be a smart phone or a nearby computer device, may be wirelessly connected to the electronics suite 38 to provide content to be displayed on the flexible electronic component and will typically have more memory, and computing and processing power than the processor 42.

The communication module 46 of FIG. 65 may include or use any type of communication hardware/software/firmware that uses any desired types of communication techniques to enable the microprocessor 42 to communicate with exterior devices or sources. Of course, the communication module 46 could include multiple different types of communication hardware/software/firmware, including any kind of hard-wire-based communication module or wireless-based communication module. As examples, the communication module 46 may be a wired or wireless Internet-based communication module that may provide wired or wireless-based, IP protocol communications between the dynamically flexible, attachable article or device and other devices or a communication network such as a LAN or a WAN to which other devices are communicatively connected. Likewise, the communication module 46 may include a near field communications (NFC) module, a radio frequency identification (RFID) communications module for communicating with, sending messages to and/or receiving messages from RFID tags stored in other devices around or close to the dynamically flexible device. In this case, the communications module 46 may decode signals received from RFID tags in response to pings by the RFID communication module 46 to identify the RFID tags or tag numbers (identifiers) associated with these devices. Likewise, the communication module 46 may be a near field communication (NFC) module or a Bluetooth communication module, which may perform near field communications or Bluetooth communications in any known or desired manner with nearby NFC or Bluetooth enabled devices, thereby enabling wireless communication between the dynamically flexible device and other closely situated or closely located electronic devices. Still further, the communications module 46 may include a USB or other type of wired communication module for decoding and encoding USB-based communication signals to be sent out and received via the USB communication port 54.

As illustrated in FIG. 65, the display driver 48 is coupled to the microprocessor 42 and to the flexible electronic component, and drives the flexible electronic component to present different images to a user and thus implement functionality via the flexible electronic component. The display driver 48 may be associated with or use any type of display driver technology associated with the various different types of flexible displays that might be used, including, for example, e-ink or other bi-stable display drivers, organic light emitting diode (OLED) display drivers, etc. Of course, it will be understood that the display driver 48 is connected to the various pixel elements or pixels of the flexible electronic component to cause the pixel elements to change their visual appearance so as to present content image on the flexible electronic component. Typically, but not necessarily, each pixel element is communicatively connected to two electrodes, lead lines, connecting lines, or connectors corresponding the (x, y) coordinates of the particular pixel element on the flexible electronic component. Thus, the display driver 48 provides image content (e.g., by using electrical signals or other suitable signals) to a set of connecting lines corresponding to a width of the flexible electronic component or its display area (and, in some cases, physically emanating from a width edge or transverse side of the flexible electronic component to the driver 48), and the same display driver 48 may provide image content (e.g., by using electrical signals or other suitable signals) to another set of connecting lines corresponding to a length of the flexible electronic component (and, in some cases, physically emanating from a length edge or longitudinal side of the flexible electronic component to connect to the driver 48). In an example, the display driver 48 provides image content to a set of transverse connecting lines and/or to a set of longitudinal connecting lines so that image content is presented on the display area of the flexible display. In an example, the article 10 includes multiple display drivers 48, each of which provides image content to a respective set of connecting lines.

Returning to FIG. 65, the display driver 48 illuminates or causes the pixel elements to obtain or reach a color, a lighting level, an on-off state, etc., so as to drive the flexible electronic component to present various images and other functionality as determined by the particular application 60 being executed on the microprocessor 42. In some cases, the display driver 48 may cause various images, such as one or more artistic renditions, patterns, etc. or other types of images stored in the memory 44 to be displayed as one of the images 62 on the flexible electronic component. Such an image may be any type of graphic element in the form of artwork, an indication of an association of the user with a particular university or other organization, such as a logo, a mascot, an icon, etc. In the case of a static display, and particularly when the flexible electronic component is a bi-stable type of flexible display, such as an e-ink type of display, the flexible electronic component might display a particular image or background image whenever the dynamically flexible device is in a sleep mode, and thus in which the display driver 48 is not operating to actively drive the flexible electronic component.

Of course, the touch screen controller 50 is connected to a touch screen interface 26, if such an interface exists, and receives input signals from the touch screen interface 26. The controller 50 operates to decode these input signals to identify touch events that occur with respect to the touch screen interface 26. The touch screen interface 26 may be a capacitive touch screen interface or any other suitable type of touch screen interface disposed over the flexible electronic component, and may be transparent in nature to thus enable the pixel elements of the flexible electronic component to be viewable through the touch screen interface 26. Of course, other types of touch screen interfaces may be used instead or as well. In any event, the touch screen controller 50 operates to energize and control the touch screen interface 26, as well as to recognize and decode touch screen events to identify, for example, the location of each touch screen event, a type of a touch screen event, such as a tap or a swipe movement, etc. If desired, the touch screen controller 50 alone or in conjunction with the processor 42 may operate to determine or recognize gestures that are input via the touch screen interface 26, such gestures being, for example, a slide, a swipe, a multi-finger pinch or any other type of gesture that includes one or more finger movements coordinated with one another. Each such gesture may indicate an action to be taken on or via the dynamically flexible device. Of course, the dynamically flexible, attachable article or device may include other or different types of user input devices configured to detect user-generated gestures, such as interfaces that include buttons switches, roller balls, slide bars, pressure sensors, strain gauges, etc., disposed on, for example, one of the clasps 14 or elsewhere along the band 12. Such user interfaces may enable the user to perform more rudimentary functions, such as scrolling movements, on-off powering movements, mode switching, etc. that are traditionally entered via actuate-able buttons or switches. In one case, the processor may determine, based on input from the user via the touchscreen, such as a set up program, a calibration program or a stored user preference, whether the band is disposed on a left wrist or a right wrist of a user and thus determine the relative positioning or orientation of images to be displayed on the flexible electronic component so that they are best viewable by the user.

As previously discussed, the sensors 52 may include any of various different types of sensors. In an embodiment, the sensors 52 may include one or more gyroscopes which detect movement of or the orientation of the band 12, rapid shaking of the band 12, etc. One or more of these types of movements may be considered to be a particular type of input or user input, such as a gesture to reset the dynamically flexible device, to change a mode of the dynamically flexible device, etc. Likewise, the output of such gyroscopes can be used by the microprocessor 42 to determine the orientation or direction of the flexible display 18 to enable the microprocessor 42, or an application 60 executed on the microprocessor 42, to determine the proper orientation of the image to be displayed on the flexible display 18. In some instances, such motion detection and position detection devices might be located in two or more of the fasteners 14 or other electronics modules 19, to enable the dynamically flexible device to more accurately determine whether the device is oriented around a wrist or other circular member or whether it is instead laid out flat or oriented in some other manner. The microprocessor 42 or an application executed thereon may change functionality, behavior, and/or actions of the dynamically flexible device based on the detected orientation of the band 12.

In some cases, the sensors 52 include one or more pressure or force sensors and/or strain gauges which detect pressure, strain, or similar forces that are considered to be an input to cause the functionality, behavior, and/or actions of the dynamically flexible device to change, e.g., reset the device 10, change a mode of the device, change a presentation displayed on the flexible electronic component (e.g., the display 18) of a dynamically flexible device (e.g., the device 10), etc. In one example, two pressure or force sensors are positioned on or attached to the band 12 (e.g., as part of the backplane of the flexible 18 or as part of the support 16 so that when the dynamically flexible device 10 is attached to itself in a generally circular or looped configuration, the pressure or force sensors are diametrically opposed to each other.

Figure 66A:
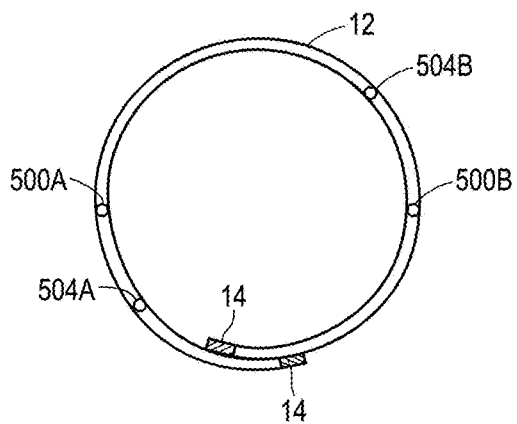
FIG. 66A is a side view of an example attachable article attached to itself in a looped configuration and including pressure sensors.
Figure 66B:
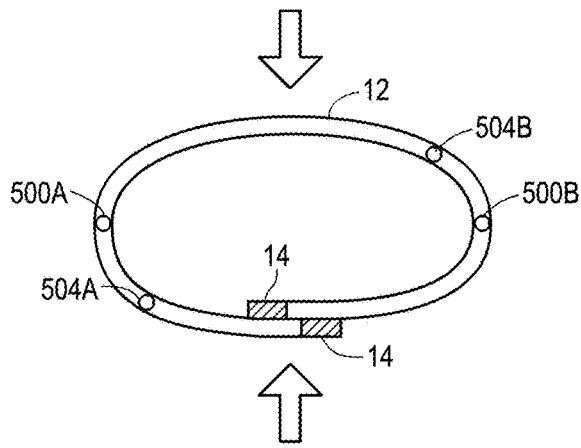
FIGS. 66B and 66C illustrate the attachable article of FIG. 66A being compressed by outside forces.
Figure 66C:
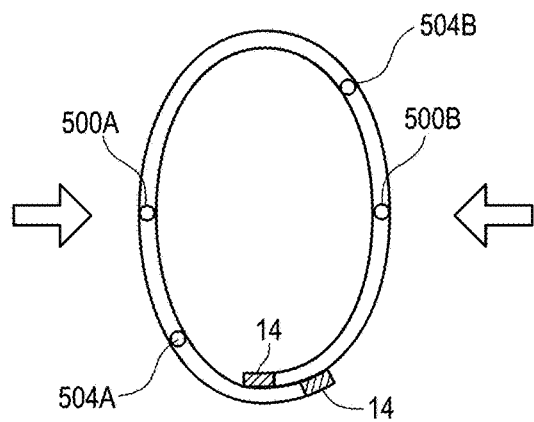

To illustrate, FIG. 66A includes an example looped configuration of a dynamically, flexible attachable device 10 including a band to which two pairs of pressure sensors 500A, 500B and 504A, 504B are attached, where the respective sensors of each pressure sensor pair 500, 504 are diametrically opposed. When a user squeezes or applies force or pressure to the band 12, for example, simultaneously at two or more points along the band 12, this action is detected by the pressure sensors 500A, 500B, 504A, 504B as an input, and the pressure sensors 500A, 500B, 504A, 504B send corresponding signals to the processor 42 (not shown in FIGS. 66A-66C) in response to the detection of the input. Based on the signals received from the pressure sensors 500A, 500B, 504A, and 504B, the processor 42 determines any actions and/or behavior to be taken by the device 10 as a result of the input, and causes the resulting behavior (if any are determined) to occur, e.g., by executing one or more corresponding applications 60. FIG. 66B illustrates the band 12 of FIG. 66A being squeezed simultaneously at locations proximate to the fastener 14 and at a diametrically opposite point of the band 12, and FIG. 66C illustrates the band 12 of FIG. 66A being squeezed along an axis perpendicular to the axis of applied force in FIG. 66B. Of course, the user may squeeze the band 12 at any two or more locations along the band 12, and by judicious placement of multiple sensors along the band 12, the location(s) along the band 12 at which the user applied the squeezing force are able to be determined by the processor 42 from the outputs of the sensors.

Different locations of squeezing along the band 12 of the flexible device 10 may correspond to different desired functionality, actions, modes and/or behaviors. For example, a detected squeeze along a first diametric axis proximate to the fastener 14 may indicate that the device 10 is to be turned off, whereas a detected squeeze along another axis may indicate that a particular application 60 stored in the memory 44 is to be launched.

In some cases, for a given axis of applied force, different signals generated by a same pressure sensor correspond to different degrees of detected force, and thus to different behaviors. For example, a squeeze of a significant force (e.g., so that both sides of the loop almost touch) that is applied over a pre-defined time duration may indicate that the device 10 is to be turned off, whereas a series of less forceful squeezes at the same location(s) may control a speaker volume. In some cases, a resulting behavior of the device 10 is based on a differential between the respective magnitudes of the forces detected at multiple sensors. For instance, if one pressure sensor detects a significantly larger force than another pressure sensor, this condition may be indicative of the device 10 being dropped rather than a user intentionally squeezing the device 10 to elicit a desired behavior or action.

In an embodiment, particular actions that are to be performed by the device 10 are based on types of squeezes or applied forces to the band 12 (e.g., particular magnitudes, locations, durations, and/or numbers of squeezes or applied forces to the band 12). The mappings between type of applied forces and desired resultant device behavior or action may be configurable. For example, the user may change one or more mappings directly at the band 12 via a user interface of the device 10, or the user may cause mapping changes to be downloaded into the memory 44 of the device 10. Of course, all detection and action recognition may be performed by appropriate software running in the processor of the device based on the signals provided by the sensors 500, 504.

Figure 67:
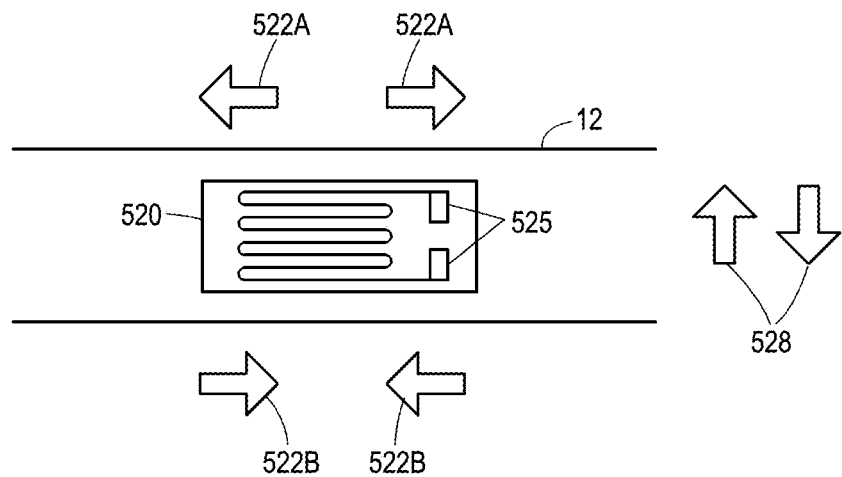
FIG. 67 is a surface view of a portion of a band of an example attachable article including a strain gauge.

FIG. 67 illustrates a surface view of a portion of an example configuration of the dynamically flexible, attachable device 10 that includes one or more strain gauges 520 attached to or included in the band 12 (e.g., on the support 16 or the backplane of the flexible display 18). In FIG. 67, the generally rectangular-shaped strain gauge 520 is oriented in parallel with the orientation of the rectangular-shaped band 12. In particular, the strain gauge 520 is positioned so that a direction or axis 522 along which forces are detected by the gauge 520 is parallel to a longitudinal axis of the band 12. Further, the strain gauge 520 is a unidirectional gauge in which forces along one dimension 522 (e.g., tension 522A or compression 522B) are detected, and signals corresponding to the detected forces (e.g., electrical signals) are transmitted via one more connection pads 525, e.g., to the processor 42 (not shown). Forces in another dimension 528 remain undetected or are ignored by the unidirectional gauge 520. In some cases, the strain gauge 520 is included in a pressure sensor included in the device 10.

Figure 68:
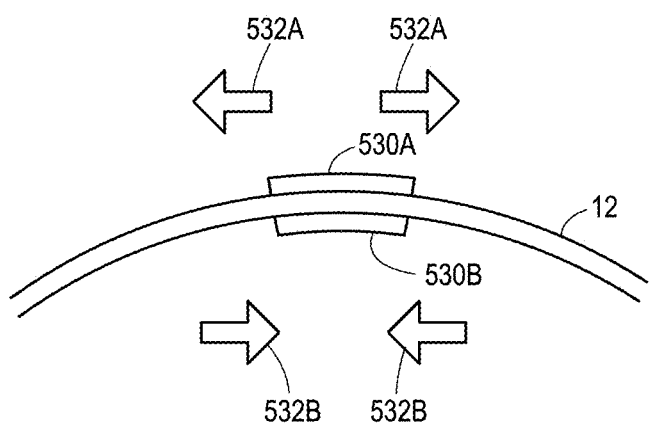
FIG. 68 is a side view of a portion of the band of an example attachable article including two strain gauges.

FIG. 68 illustrates a side view of an example configuration of the dynamically flexible, attachable device 10 that includes two strain gauges 530A, 530B positioned on opposite faces of the band 12. The example configuration of FIG. 68 may or may not be integral with the example configuration shown in FIG. 67, e.g., the gauges 530A, 530B may or may not be instances of the gauge 520. As shown in FIG. 68, the band 12 has been squeezed so that the portion of the band 12 including the strain gauges 530A, 530B is curved, and as such, gauge 530A detects tension forces 532A and gauge 530B detects compression forces 532B. The gauges 530A, 530B send signals corresponding to the magnitude of the respectively detected forces 532 to the processor 42 (not shown) so that the processor 42 may determine the appropriate action or behavior of the device 10, e.g., by executing an application 60. The device 10 may include more than one pair of gauges 530A, 530Bb disposed at various locations on the band 12, e.g., attached to or as part of the flexible support 16 or a substrate of the flexible display 18. In FIG. 68, the strain gauges 530A, 530B are shown as extending from the surfaces of the band 12, however, in some embodiments, the strain gauges 530A, 530B do not extend from the surfaces of the band 12, but instead are positioned within the band 12 between its surfaces.

In FIGS. 67 and 68, the strain gauges 520, 530A and 530Bb are illustrated as unidirectional strain gauges configured to detect and/or send signals corresponding to forces in only one direction. In some cases (not shown), a strain gauge included in the device 10 is a multi-directional strain gauge configured to detect multi-directional forces. In an example, if a user contorts the device 10 to a point that may not be tolerated by the flexible display 18 (e.g., by twisting the band torsionally, stretching the band in one or more directions, etc.), this contortion is detected by multidimensional strain gauges and reported to the processor 42, which then may cause a warning or other alert to be presented on the flexible display 18 or at another user interface (e.g., an auditory alert). On the other hand, a twisting or stretching the band to a tolerated but not excessive degree may correspond to yet another input detected by the multidimensional strain gauges to cause a respective action or behavior of the device 10. Of course, any number of strain gauges or other sensors may be disposed at any positions along the band 12 (and on either the upper surface or lower surface of the band 12 if desired) to detect pressures at any point along the band 12 or a multiple different points along the band 12.

Referring back to FIG. 65, in some devices, the sensors 52 may include step counters or an impact-sensor like and accelerometer, which might be used to count the number of steps a user takes over a particular period time. Alternatively or in addition, the sensors 52 may include one or more temperature sensors, which may detect the ambient temperature, the temperature of the skin of the user when the device 10 is being worn, etc. The sensors 52 could also include a blood-pressure sensor device, which might check blood pressure or heart rate using known exterior blood-pressure sensor device technology.

As will be understood, the various different electronic devices or components disposed in or shown in the electronic suite 38 of FIG. 65 may be used in conjunction with one another in various different manners to provide a whole host of functionality for the dynamically flexible, attachable article or device 10, which might be beneficial in various different uses of that article. However, only some of these uses are described in detail herein.

In a general sense, the flexible display 18 of any or all of the embodiments described herein may be manufactured as any type of flexible display, such as an e-paper display, an organic light emitting diode (OLED) display, etc. and this flexible display, once manufactured, may then be formed, curved or bent in various manners. Generally speaking, flexible display 18 may be made of two flexible substrates including a backplane flexible substrate and frontplane flexible substrate placed back to back, next to one another, or laminated onto each other. In the case of e-paper, an additional layer of material such as an adhesive may be included in the frontplane and disposed between the backplane and the frontplane. In some cases, such as with the use of active-matrix OLEDs, electrophoretic displays (EPDs), e-paper, electronic ink displays, e-reader displays, liquid-crystal displays (LCDs), or other active-matrix type displays, the backplane includes a plurality of semiconductor devices or elements, e.g., an array of transistors and/or other elements, disposed thereon for driving or providing energization to individual lighting, transmitting, or reflective elements disposed in a similar array on the frontplane or on top of the transistors and/or other elements. The semiconductor devices or elements may be formed on the backplane in any known or desired manner, such as by etching, dye cut forming, printing, sputtering, spin-coating, spray coating, other deposition or patterning techniques, or combinations thereof, etc. Likewise, the light emitting, transmitting, or reflective elements may be formed as any desired types of light emitting, transmitting, or reflective elements using these same or different techniques, and the elements may include light emitting diodes (LEDs), OLEDs, e-paper, liquid crystal, etc. In the case of e-paper, for example, the frontplane and the backplane may be formed with black and white, oppositely charged particles suspended in a clear fluid which, when put in an electric field, will cause the black or the white particles to drift to the top of the display to create a white state, a black state, or an intermediate grey state. In any case, the substrate of the backplane and the frontplane may be formed of the same material or of a different flexible material, such as plastic or flexible glass, and these materials may have the same or different flexibility properties, as long as both materials are able to flex to the curvature needed for bending the electronic display 18.

More particularly, the flexible displays illustrated herein, may be manufactured as a flexible display, such as an e-paper display, an organic light emitting diode (OLED) display, etc. Generally speaking, the flexible displays may be constructed on two flexible substrates, or may be constructed on one flexible substrate but having at least two flexible substrates. The flexible substrates may include a backplane display area and frontplane display area placed back to back, next to one another, or laminated onto each other. The frontplane display area comprises an array of optic elements (e.g., electro-optic elements) provided on a first flexible substrate that are capable of displaying an image, while the backplane display area comprises an array of semiconductor devices or elements (e.g., transistor elements) provided on a second flexible substrate for driving or providing energization to the optic elements on the frontplane. Materials suitable for use as the flexible substrate for either the frontplane and/or the backplane include, but are not limited to, various plastic substrates such as polyimide, polyethylene terephthalate (PET), polycarbonate, polyethersulfone, polyether ether ketone (PEEK), and polyethylene naphthalate (PEN). Metallic foils or flexible glass also may be used.

Preferably, the backplane display area comprises an array of thin film transistors (TFTs) provided on a flexible, plastic substrate such as PET. The TFT array may include switching and/or driving TFTs, and additional elements such as storage capacitors, and interconnect wiring. An individual TFT element generally is made by successive deposition and patterning of conductor (i.e., source, drain, and gate electrodes), insulator (i.e., dielectric) and semiconductor thin film layers. The active semiconductor layer can be composed of either organic (small-molecule or polymeric semiconductors) or inorganic materials (such as amorphous silicon, low-temperature polycrystalline silicon, graphene, carbon nanotube, and metal oxide semiconductors).

The TFT array may preferably comprise organic TFTs (OTFTs) based upon an organic semiconductor described in at least one of U.S. Pat. Nos. 6,585,914; 6,608,323; 6,991, 749; 7,374,702; 7,528,176; 7,569,693; 7,605,225; 7,671, 202; 7,816,480; 7,842,198; 7,892,454; 7,893,265; 7,902, 363; 7,947,837; 7,982,039; 8,022,214; 8,329,855; 8,404, 844; 8,440,828; U.S. Patent Publication No. 2010/0252112; U.S. Patent Publication No. 2010/0283047; U.S. Patent Publication No. 2010/0326527; U.S. Patent Publication No. 2011/0120558; U.S. Patent Publication No. 2011/0136333; and U.S. Patent Publication No. 2013/0062598, the disclosure of each of which is incorporated by reference herein in its entirety for all purposes. While OTFTs may include metallic contacts and a dielectric layer composed of silicon oxide ($SiO_2$) or another inorganic oxide or nitride (such as $Al_2O_3$, $HfO_2$, $SiO_2$, or $Si_3N_4$), a dielectric layer composed of an electrically insulating polymer may be preferred. Exemplary polymeric dielectric materials include polyacrylates, polyimides, polyvinyl alcohol, polystyrene, polyester, polycarbonate, polyhaloethylene, epoxy resins, siloxane polymers, benzocyclobutene-based polymers. Other polymeric dielectrics are described in U.S. Pat. Nos. 7,605,394; 7,981, 989; 8,093,588; 8,274,075; 8,338,555; U.S. Patent Publication No. 2011/0175089; U.S. Patent Publication No. 2011/0215334; and U.S. Patent Publication No. 2012/0068314. Conductive polymers such as poly(3,4-ethylenedioxythiophene) poly(styrenesulfonate) (PEDOT:PSS) may be used as alternative materials for metallic contacts in OTFTs.

Preferably, the TFT array may comprise metal oxide TFTs based upon a metal oxide semiconductor. For example, the metal oxide semiconductor can be selected from various mixed oxides including one or more of indium, zinc, tin, and gallium such as indium zinc oxide (IZO), zinc tin oxide (ZTO), indium gallium oxide (IGO), and indium gallium zinc oxide (IGZO). In a more preferred embodiment, the TFT array may comprise IGZO TFTs. While state-of-the art IGZO TFTs usually include thick layers of inorganic materials such as $SiO_2$, $SiO_x$, $Si_3N_4$, and $SiO_xN_y$ as dielectric and passivation layers, it is preferred that if the TFT array backplane comprises metal oxide TFTs, organic materials are used in at least some of the dielectric and passivation layers, such that the thickness of the remaining inorganic layer(s) may be reduced to allow maximum flexibility of the TFT array as whole. Metal oxide TFTs incorporating one or more organic layers are described in U.S. Pat. Nos. 8,017, 458; 8,097,877; 8,395,150; and U.S. Patent Publication No. 2012/0223314, the disclosure of each of which is incorporated by reference herein in its entirety for all purposes.

In some scenarios, such as for an electrophoretic or e-reader display, the frontplane display area may be laminated, sealed to, or otherwise secured onto the backplane display area. The frontplane display area may be produced by forming a subassembly that comprises, in sequence, a flexible substrate, a conductive electrode layer, an electro-optic layer, and optionally, an adhesive layer to allow lamination to the backplane. In the case of an OLED display, the electro-optic layer is sandwiched between two electrode layers and is typically built on the TFT array. Generally, at least one of the two electrode layers is transparent, often composed of a transparent conductive oxide such as indium tin oxide (ITO). The electro-optic layer is composed of an organic material capable of emitting light when a voltage is applied across the two electrode layers. The organic light-emitting material may have a stacked structure including a plurality of different organic layers. In addition to one or more emissive layers, the stacked structure may include additional layers such as a hole-injection layer, a hole-transport layer, an electron-transport layer, a hole-blocking layer, and/or an electron-blocking layer to enhance device performance. Individual OLED elements may have different emitters (for example, a red emitter, a green emitter, or a blue emitter) in their emissive layer to provide a colored image. Exemplary OLED device structures and materials are described in U.S. Pat. Nos. 5,707,745, 5,844,363, 6,097,147, 6,303,238, and 8,334,545, the disclosure of each of which is incorporated by reference herein in its entirety for all purposes.

In the case of an e-paper display, the electro-optic layer may be composed of an encapsulated electrophoretic medium. The encapsulated electrophoretic medium generally comprises numerous small capsules, each of which itself comprises an internal phase containing electrophoretically-mobile (e.g., black and/or white) particles suspended in a liquid suspending medium, and a capsule wall surrounding the internal phase. Typically, the capsules are themselves held within a polymeric binder to form a coherent layer positioned between two electrode layers. Most commonly, one electrode layer has the form of a single continuous electrode, while the other electrode layer is patterned into a matrix of pixel electrodes, each of which defines one pixel of the display. Electronic charges are applied to the capsules to bring particles of a selected color to the surface. Electrophoretic media and related display device structures are described in, for example, U.S. Pat. Nos. 5,930,026; 6,831,769; 6,839,158; and 7,170,670, the disclosure of each of which is incorporated by reference herein in its entirety for all purposes. In addition to electrophoretic displays, other e-paper display technologies include electrowetting displays, and electrofluidic displays as described in, for example, U.S. Pat. Nos. 7,446,945 and 8,111,465, the disclosure of each of which is incorporated by reference herein in its entirety for all purposes.

To integrate the TFT array backplane with the frontplane for a completed display system, the bottom or pixel electrode of the frontplane is (connected) to the drain or source electrode of the switching TFT in an e-paper display, and the driving TFT in an active matrix OLED (AMOLED) display.

Various organic layers on either the frontplane and/or the backplane may be formed on the flexible substrate by solution-phase deposition techniques such as spin-coating, slot coating, die coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Inorganic (e.g., metallic or metal oxide) layers usually are deposited by physical or chemical vapor deposition methods (e.g., sputtering), but may be solution-processed if a soluble precursor is available. The layers may be patterned into specific elements by photolithography, either by use of the intrinsic photosensitivity of the layers (e.g., certain polymeric layers) or by use of a photoresist (e.g., metallic, metal oxide, or small-molecule organic layers).

Figure 69:
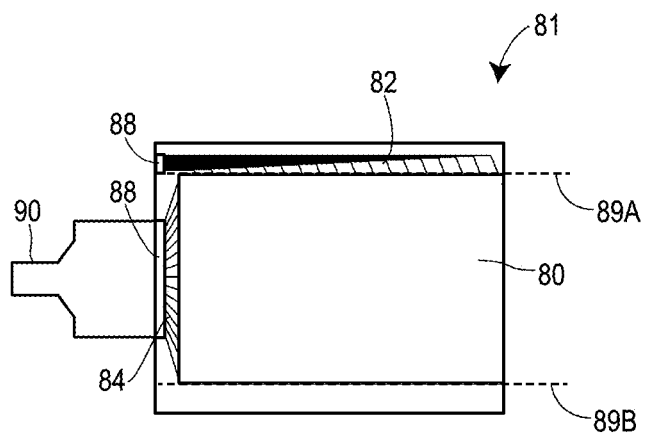
FIG. 69 illustrates a top view of a backplane layer of a flexible electronic display as formed on a flexible display element substrate.

Moreover, it may be desirable to manufacture the flexible display 18 in a manner that maximizes the amount of the display area space viewable on the top layer of the device 10, i.e., that is viewable on the band 12. In this regard, FIG. 69 illustrates a base or backplane layer of a flexible display 18 as manufactured. Generally speaking, the backplane of a flexible display 18 comprises a flat surface, or a first display substrate, and has a display area with various electrical energizing elements (e.g., transistors) formed, printed, etched or otherwise disposed thereon. As is known, the electronically energizing components on the backplane substrate of a backplane component are then operatively connected to electronically energizable components, such as organic light emitting diodes (OLEDs), encapsulated electrophoretic media (e.g., as in an e-paper display), etc., disposed on or formed on a frontplane component. Both the backplane substrate of the backplane component and the frontplane substrate of the frontplane component are flexible, and the backplane substrate and the frontplane substrate are aligned to provide a register between various energizing components and energizable components to thereby form pixels on the display area. In particular, the flexible display may be made of two or more layers including a backplane display substrate on which various display elements, such as pixel elements, associated with each pixel of the display are printed, etched or otherwise manufactured in the form of, for example, transistors or other switching elements, a secondary or frontplane display substrate on which OLEDs, e-ink microcapsules or other energizable components that form black and white or various colors on the display for each pixel, and, in some cases a further flexible substrate layer that operates as a ground layer. In some embodiments, such as in electrophoretic displays, the frontplane and backplane are laminated together as frontplane and backplane components. In some embodiments, the flexible display 48 may be built in layers, e.g., starting with the backplane and ending with attaching the frontplane substrate.

As illustrated in FIG. 69, the display area 80 formed on the backplane component of such a display 18 may be generally rectangular in shape and have a large aspect ratio, e.g., an aspect ratio where the length of the display area 80 is at least two times greater than the width of the display area 80, and, in some configurations, is at least five times greater than the width. The display area 80 includes any number of pixels or pixel elements, each of which may be connected to at least two lines (e.g., electrical lines, lead lines, electrodes, connecting lines or connectors) for energization thereof. The electrical lines or connecting lines are disposed at the pixel elements and exit from the display area 80 via various sides of the display area 80. Generally, each line services a particular row or column of pixel elements. As such, in FIG. 69, the connection lines are illustrated as a first set of connecting lines 82 coming from one of the longitudinal sides and including a line 82 for each of y columns of pixels of the display area 80 (e.g., a set of longitudinal connecting lines), and a second set of connecting lines 84 coming from one of the transverse sides of the display area 80 and including a line 84 for each of x rows of pixels of the display area 80 (e.g., a set of transverse connecting lines). As is known, energization or connection between a particular connecting line 82 of a column $y_n$ and a connecting line 84 of a row $x_m$ of the display area will energize or turn on that corresponding pixel, and, as such, the corresponding pixel may be referred to using its two-dimensional coordinates, e.g., $(x_m, y_n)$ or $(y_n, x_m)$. In any event, as illustrated in FIG. 69, the sets of connecting lines 82, 84 exit from the display area 80 along the same backplane substrate and are connected to one or more multiplexer or IC driving circuits 88, which may be formed, for example, on or near the edge of the backplane display substrate. The driving circuits 88 may be integral with the display driver 48 of the electronic suite 38, or the driving circuits 88 may be disposed separately from but nonetheless communicatively connected to the display driver 48, e.g., the driving circuits 88 are disposed on a flexible connector 90 connecting the backplane layer to the electronics module 19. Typically, the flexible connector 90 is not integral with the backplane layer, but instead is a separate element that couples to the backplane layer to communicate with the electronics module 19 and components included therein, such as the display driver 48.

Figure 70:
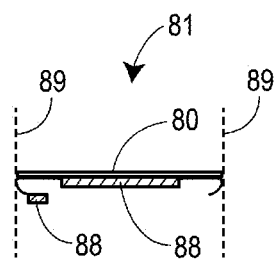
FIG. 70 illustrates a manner of bending the flexible display element substrate of FIG. 69 to form a flexible display with maximal display area on the top of a wristband device.

FIG. 70 illustrates a manner of folding or bending the substrate 81 of FIG. 69, to form a display that includes a maximum amount of display area 80 on the top thereof that is viewable to the user, so as to maximize the amount of area on the band 12 at which the display area 80 is viewable and to minimize the area of edges surrounding the display area 80 that are visible to the user. (For ease of viewing, the flexible connector 90 is not shown in FIGS. 70-71.) In FIG. 70 in particular, the bending may occur along the dotted line 89A, illustrated in FIG. 69, so as to fold over the backplane sections adjacent to the longitudinal side of the display area 80 at which the connecting lines 82 are disposed. This folding enables the connecting lines 82 to be bent down and under the display area 80, and enables the multiplexer or IC driving circuits 88 to be connected to the display driver 48 (disposed in, for example, one of electronics module 19 not shown in FIGS. 69 and 70) via separate electronics or electrical connections. Thus, as illustrated in FIG. 70, which depicts a cross-sectional end view of the flexible display 18, the flexible display 18 so formed and bent enables the separate longitudinal display lines 82 to be connected to different multiplexer or driving IC circuits 88, which are ultimately connected to the display driver 48 of FIG. 65, in order to energize the rows and columns of pixel elements of the flexible display 18 to thereby drive the display 18. As the fold 89A occurs along the edge of the display area 80, the areas of the backplane substrate of the flexible display 18 that are used to form the connecting lines 82 are disposed in a different plane than, and are disposed in some cases under the display area 80, and thus do not require the backplane substrate 81 to extend out towards the sides of the band 12 much beyond the edges of the display area 80. This configuration, in turn, enables the maximal amount of viewable display area to be disposed on the top portion of the band 12 which maximizes the viewable or usable area of the band 12 at which the display 18 can present viewable images. In some embodiments, the backplane substrate 81 may also be bent along the dotted line 89B along the opposite longitudinal side, even if the opposite longitudinal side does not support any electrodes or connectors thereon, e.g., for ease of manufacturing and/or for aesthetic considerations.

Figure 71:
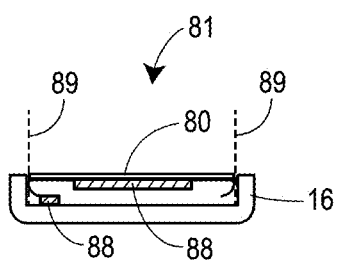
FIG. 71 illustrates an end view of a flexible display configured as provided in FIG. 70 disposed within flexible support with side protection structure

FIG. 71 illustrates a cross-sectional view of the display 18 bent as illustrated in FIG. 70 and disposed in or on a flexible support 16 of the band 12, with the display 18 having the maximal display area 80 thereon disposed up to the edges of the band of the device 10. In this case, the flexible support 16 is illustrated as having sidewalls to form a protective barrier to protect the display 18 at the edges thereof from side impacts. Of course, other manners of manufacturing the display 18 could be used and implemented to produce the dynamically flexible, attachable article or device 10.

In some cases (for example, due to the size of the display area 80, the material composition of the flexible display 18, etc.), bending the backplane layer 81 so that the electrodes or connectors 82 are under the display area 80 may cause undesirable effects, such as interference between various electrical components of the backplane layer 81. Further, in order for the flexible display 18 to be as dynamically flexible as possible, the impact of the more rigid portions of the backplane layer 81 (e.g., the portions which support the less-flexible or rigid driving circuits 88) on the flexibility of the display area 80 is desired to be minimized. Still further, a minimum border extending from the display area 80 and viewable to a user may be necessary to seal the top and bottom layers of the flexible display 18, e.g., by using an environmental barrier material for the frontplane and backplane substrates and the seal, or by some other means. In electrophoretic displays, for instance, the required width of a border for sealing is typically around 2 to 6 mm.

As will be understood, the dynamically flexible, attachable article or device 10 as described above can be configured and operated in many different manners to perform many different functions at the same or at different times. For example, the device 10 may operate to execute any number of different types of applications including, for example, calendar applications, e-mail applications, web-browsing applications, picture, image or video display applications, stop-watch or other timing applications, alarm clock or alarming applications, location based applications including for example mapping applications, navigational applications, etc. In some cases, various different applications or functionality may be performed simultaneously, and different sections or portions of the flexible display 18 may be used to display information associated with the different applications. For example, one portion of the flexible display 18 may be used to illustrate calendar information provided by a calendar application, another portion of the flexible display 18 may be used to illustrate e-mails associated with an e-mail application and a still further portion of the flexible display 18 may be used to display a clock or stop watch associated with a timing application. Still further, the applications 60 executed on the device 10 may be executed on and display information computed solely with the electronics suite 38 of the device 10. In another case, one or more applications 60 may be executed on the processor 42 of the device 10 to interface with and display information received from external computing devices, such as a mobile phone, a laptop computer, a desktop computer, etc. In this case, the device 10 may act as a slave display device or may operate in conjunction with information received from the external computing device to provide information, graphics, etc. to a user on the flexible display 18 of the device 10. The device 10 may communicate with external devices or an external network via any desired communication hardware, software and communications protocol, including any LAN or WAN based protocol, an NFC protocol, a Bluetooth protocol, an IP protocol, an RFID protocol, etc.

FIGS. 72A-72E illustrate various different types of displays or images which may be provided on the flexible display 18 of the device 10 at various different times or even at the same time. For example, in one scenario illustrated in FIG. 72A, the display 18 may depict a pattern, an artistic rendition or other image that is particularly expressive of the wearer or user, including for example, an image provided by the user, a picture or a photo, an image of a hand-drawn sketch, a team, corporate or other organizational logo, a message of some sort, or some other image that expresses some interest or personality trait of the user. Such an image might be displayed whenever the device 10 is in a sleep mode, that is, when the device 10 is not being actively used in other modes. Moreover, such an image could be resident on the display 18 for long periods of time whenever the display 18 is not in use, if the flexible display 18 is a bi-stable display, such as an e-ink display, which requires no power to hold the image in place once image is been formed.

As illustrated in FIG. 72B, in another mode referred to herein as an office mode or a calendar mode, the device 10 displays a calendar screen and an e-mail screen or other images associated with or set up to provide office or business related functionality. Such a mode may provide images that enable the user to easily view e-mails, calendars and to use other business related applications. Thus, for example, the display 55B may provide a calendar of events, and may also display one or more e-mail icons, text messaging icons, etc., indicating e-mails or text messages that may be available and viewable to the user.

FIG. 72C illustrates the device 10 in an alarm/clock mode in which the flexible display 18 provides an alarm or clock display that may be generated by an alarm or clock application. An alarm may ring by sounding a speaker (e.g., one of the electronic devices 53 of FIG. 65) at a particular time according to a preset alarm notification and/or the device 10 might use a gyroscope or accelerometer to vibrate the device 10 to cause a vibration indicating an alarm. Still further, as illustrated FIG. 72D, the device 10 may be placed in an exercise or training mode in which the flexible display 18 displays a stopwatch, a distance traveled or other indications of various athletic parameters that have been met or associated with an exercise routine including, for example, use of the step counter to determine the number of steps that have been taken, to determine the number of lifts that have been performed when, for example, lifting weights, etc. Likewise, in such a mode, the display 18 may display a distance traveled by a runner or walker, the time since the beginning of a run or other exercise, etc. Still further, as illustrated in FIG. 72D, a portion of the display 18 may be used to indicate the current song that is playing via a music application implemented on the article 10.

In a still further mode, illustrated in FIG. 72E, the wristband device might be a slave display to another computer device, such as a navigation device within a car, a phone, a laptop computer, an e-reader. In this case, the display 18 may display, for example, a map, a route, directions, etc. on a map as provided by a navigation device to the device 10 via, for example, a Bluetooth communication module or other communication module that provides communication between the device 10 and the navigation device (not shown). Such a slave display might enable the device 10 to be more visible to the user in a driving situation. Of course, other types of visuals and displays can be provided with other types of applications stored on the device 10 or in other communicatively coupled computer devices, such as phones or computers that communicate with the device 10 to provide images or information for display to the user.

As part of one of these or other uses, the device 10 may be separately connectable to magnetic strips or other exteriorly located magnetic or metallic devices to which the magnets 20 and 22 within the end pieces 14 are magnetically attracted. In this case, the strips may have communication modules therein or associated therewith that communicate with and enable the device 10 to determine the location of the device 10 and to thus control the default functionality of the device 10. That is, the device 10 may be placed around someone's wrist and used in various different modes to provide information to the user as it is wrapped around the wrist. However, the device 10 might also be taken off the wrist and applied to other surfaces, such as on tables, desks, car dashboards, refrigerators, nightstands, or any other surface. In this case, the device 10 may automatically operate to detect its current location and provide various default or automatic functionality based on the determined location. As an example, FIG. 73A illustrates a device 10 having magnets disposed in the clasps or ends 14, which are magnetically coupled to magnetic strips 100 which are separately disposed on a different surface or surfaces to cause the device 10 to have the flexible display 18 laid out horizontally or straight along the surface. In a similar manner, FIG. 73B illustrates the device 10 disposed in a curved manner between two magnetic strips 100 to create a curved display for viewing by a user.

Here, in addition to include a metal, magnet or other magnetic material, one or more of the magnetic strips 100 may include a location detection mechanism 101 therein, such as an RFID tag, a Bluetooth or near field communication module, or any other kind of passive or active communication technology that communicates with the communication module 46 within the device 10, to indicate the location or a unique identifier of the strip 100 and thus the current location of the device 10 when the device 10 is disposed near or adjacent the strips 100. In this case, each or at least one of the strips 100 may include a unique RFID tag, NFC identifier, Bluetooth communication identifier or other identifier that identifies itself and/or its precise location. An application executed within the device 10, such as one of the applications 60 of FIG. 65, may operate to obtain, via the communication module 46 (which may be an RFID communication module, a Bluetooth communication module, an NFC module, etc.), the tag number or the identity of the strip 100 and may locate that tag number within its memory as being associated with a particular functionality. The application 60 may then configure the device 10 to operate in a default manner based on the detected strip identity or location, such as by running one or more other applications 60. Of course, the strips 100 need not be magnetic in nature but could instead be any type of device having an RFID tag, a Bluetooth module (such as Bluetooth tiles) or other communication module therein that is detectable by the device 10 whenever the device 10 is in a certain range of or near the strip 100. That is, the device 10 need not be magnetically connected to the strip 100 to perform the location detection described herein.

Once the RFID tag or other identifier of the strip 100 is determined via communication with the module 101, the device 10 and, in particular, the microprocessor 42 thereof, may execute a particular application indicating or providing certain functionality associated with the location or positioning of the device 10 at that strip 100. Thus, the strips 100 may be placed on a refrigerator, and when so used, may disclose particular information necessary or generally associated with kitchen usage, such as a shopping list, a calorie count of particular foods that the user might be eating, a clock or other type of alarm mechanism for timing the cooking or refrigeration of certain food items, etc. On the other hand, the device 10 may be removed from a strip 100 on the refrigerator, and placed next to a different strip, such as that located in bedroom, and there default to operate as alarm clock. In a still further usage, the device 10 may be removed and taken to an office and, when set on or near strips associated with or pre-identified with the office, automatically display e-mail accounts or calendar information that is typically more useful and associated with an office environment. Still further, the device 10 might be then taken off and put on a car dashboard having strips thereon which identifies the wristband device as being located on the car dashboard. In this case, the device 10 might provide information more useful within a car, such as executing an application that interfaces with a navigation device and acts as a slave display to the navigation device, to thereby display information provided by the navigation device to a user in a more easily accessible manner up on the dashboard. The device 10 may also or instead operate as a compass and show cardinal directions, as a clock, etc.

Figure 74:
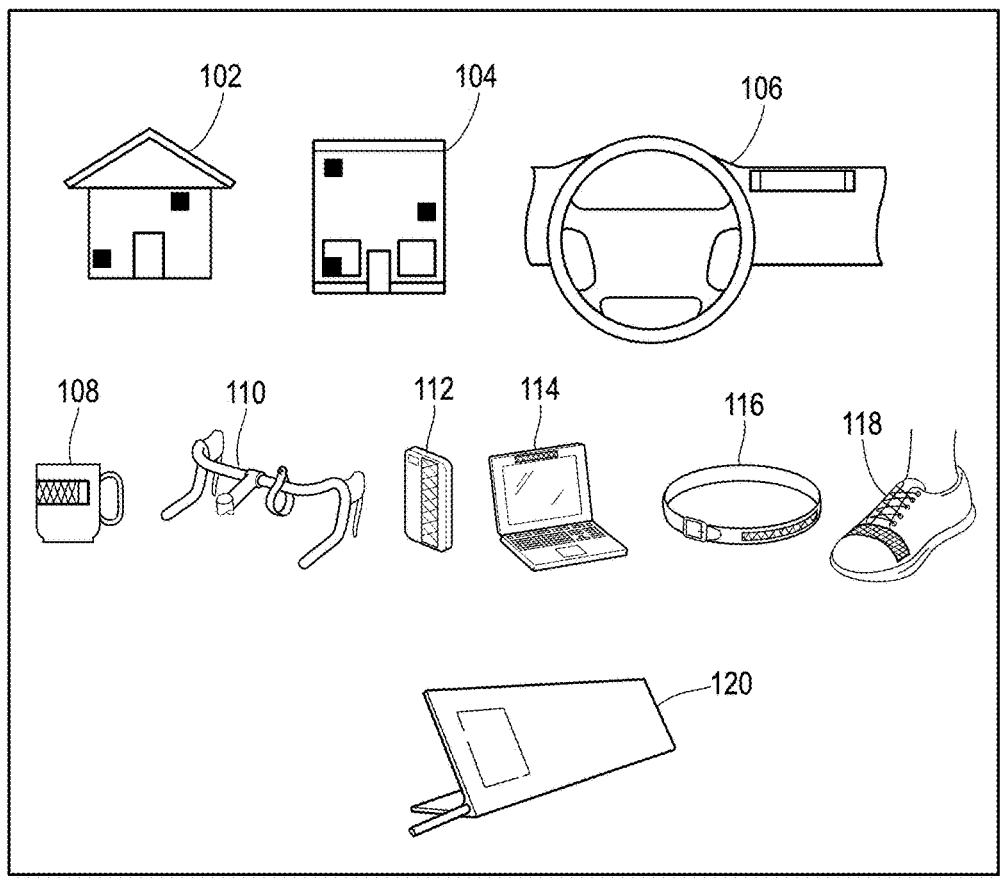
FIG. 74 illustrates the use of the wristband device detection system of FIGS. 73A and 73B in various different places or attached to various different articles to change the default functionality of the wristband device.

FIG. 74 illustrates, for example, various different environments in which the device 10 may be placed and associated with different strips 100 as described above, including a home environment 102, an office environment 104, and an automobile 106 to provide different automatic or default functionality of the device 10. Additionally, as illustrated in FIG. 74, the attachable device 10 can be attached to any other devices such as a coffee cup or mug 108 or other drinking vessel, a bicycle handlebar 110, a phone case 112, a computer 114, a belt 116, a shoe 118, a docking or charging stand 120, or any other device on which or near which a strip 100 having a communication module is located. Of course, the default functionality may be provided by placement of the device 10 close to the strips and the identification of those strips. However, the user could still change the functionality of the device 10 to other functionality associated with other applications or displays that might be necessary or desirable at the time, instead of the default functionality associated with the detected location. Moreover, different default functionality might be associated with different locations within each environment. Thus, for example, FIG. 74 illustrates two different locations within the home environment 102 and three different locations within the office environment 104, with each location having a different detectable strip 100 and thus a potential different default functionality.

Of course, it will be understood, that the use of the strips 100 and the identifiers associated with the strips 100, which might communicate via, for example, RFID, NFC, Bluetooth or any other desired communication hardware and protocols, enables the device 10 to have automatic default functionality based on its location. The sensors 52 and other electronic devices 53 within the device 10 may also be used to provide default functionality. For example, the gyroscopes or accelerometers may be used to detect the orientation of the device 10, e.g., whether the device 10 is located more horizontally or vertically, and this orientation may be used to control the manner or direction in which information is displayed on the flexible display 18. The sensors 52 and devices 53 may also detect whether the device 10 is undergoing movement or acceleration, which might cause the device 10 to have different functionality or to change a display in some manner.

Figure 75:
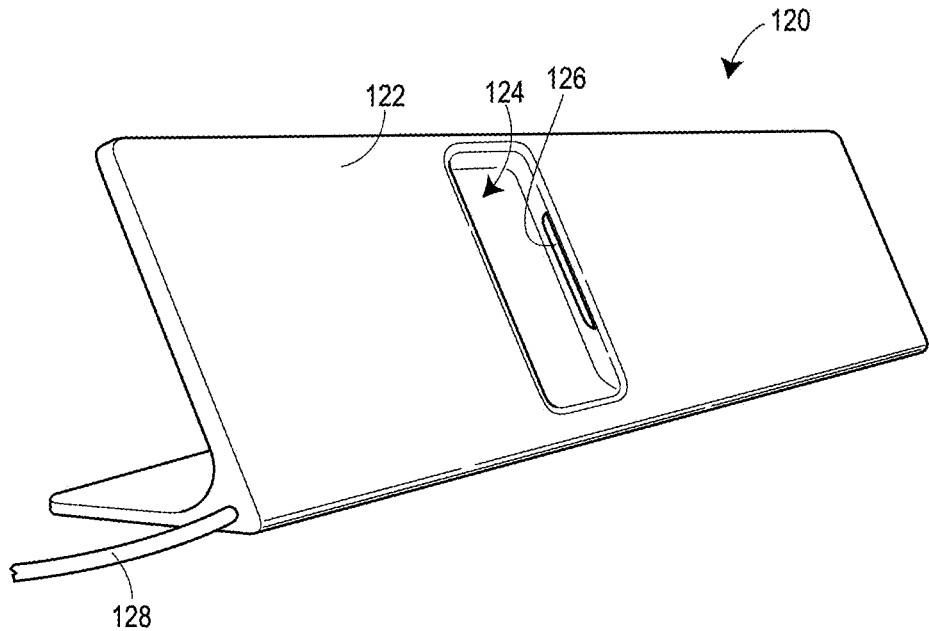
FIG. 75 illustrates a stand that may accept and hold one of the wristband devices disclosed herein, such as that of FIG. 17, when not being worn by a user.
Figure 76:
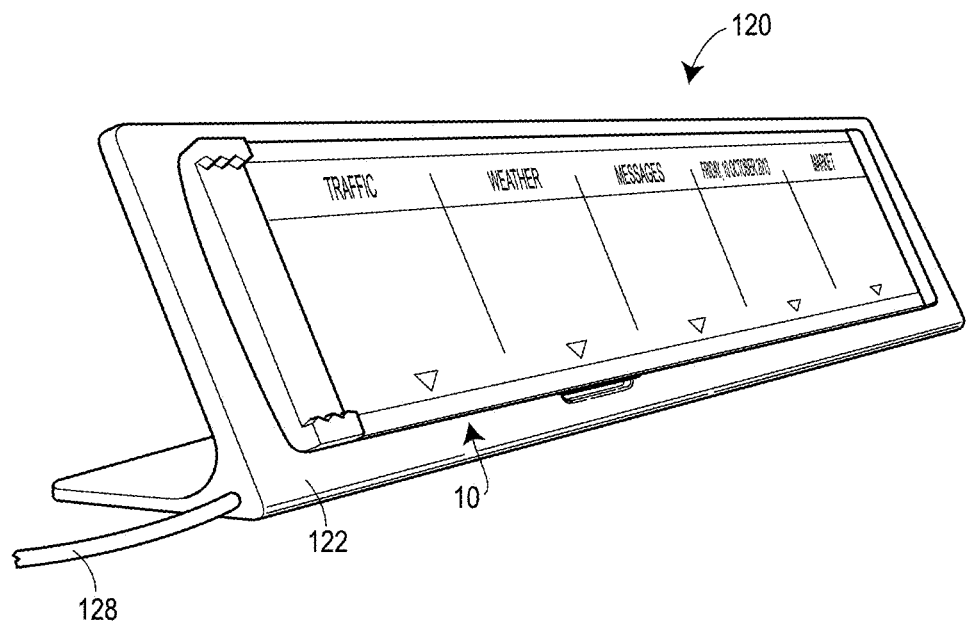
FIG. 76 illustrates the stand of FIG. 75 with the wristband device of FIG. 17 disposed thereon.

As another example, FIGS. 75 and 76 illustrate a base station (such as the charging station 120 of FIG. 74) that can be used to hold and charge a device 10, such as the device 10 illustrated in FIG. 17. As depicted in FIG. 75, the base station 120 may include a flat panel 122 having a recess, an indent or a space 124 formed therein. In this case, the device 10 of FIG. 17, when laid out flat as illustrated in FIG. 17, may be placed against the flat plate 122 so that the electronics module 19 fits within the indent, recess or space 124. Magnets within the band 12 of the device 10 may be magnetically attracted to metal or other magnetically permeable material (including magnets) within the stand 120 (not shown) and help to hold the device 10 in place on the stand 120. When so located, the charging contact 349 of the band 10 as illustrated in FIG. 17, comes into contact with or is disposed near a charging contact 126 of the stand 120, which when plugged into a source of power via a cord 128 operates to charge the battery of the device 10. As noted earlier, the charging contacts 126 and 349 may operate to provide direct charging or inductive charging to the battery within the electronics module 19. Of course, the stand 120 may include a charging unit (not shown) to provide the proper or appropriate charging signals to the charging contact 126 and this charging unit may be a direct charging unit or an inductively coupled charging unit.

Moreover, as illustrated in FIG. 76, the device 10, when disposed on the stand 120 may detect an RFID tag or other communication signal emanating from the stand 120 and operate in a preconfigured manner based on the detection of that signal. For example, as illustrated in FIG. 76, the band 10 may provide a display with various screens or sections including, for example, a traffic section, a weather section, a messages section, an alarm or clock section, etc. Each of these sections may provide information about or related to the traffic (received via a WiFi or other communication connection), weather (received via a WiFi or other communication connection), messages (received via an e-mail or text messaging services or applications), time or alarm information, etc. Of course the operation of the band device 10 when placed on the stand 120 can be configured in any desired manner by a user, for example.

Figure 77:
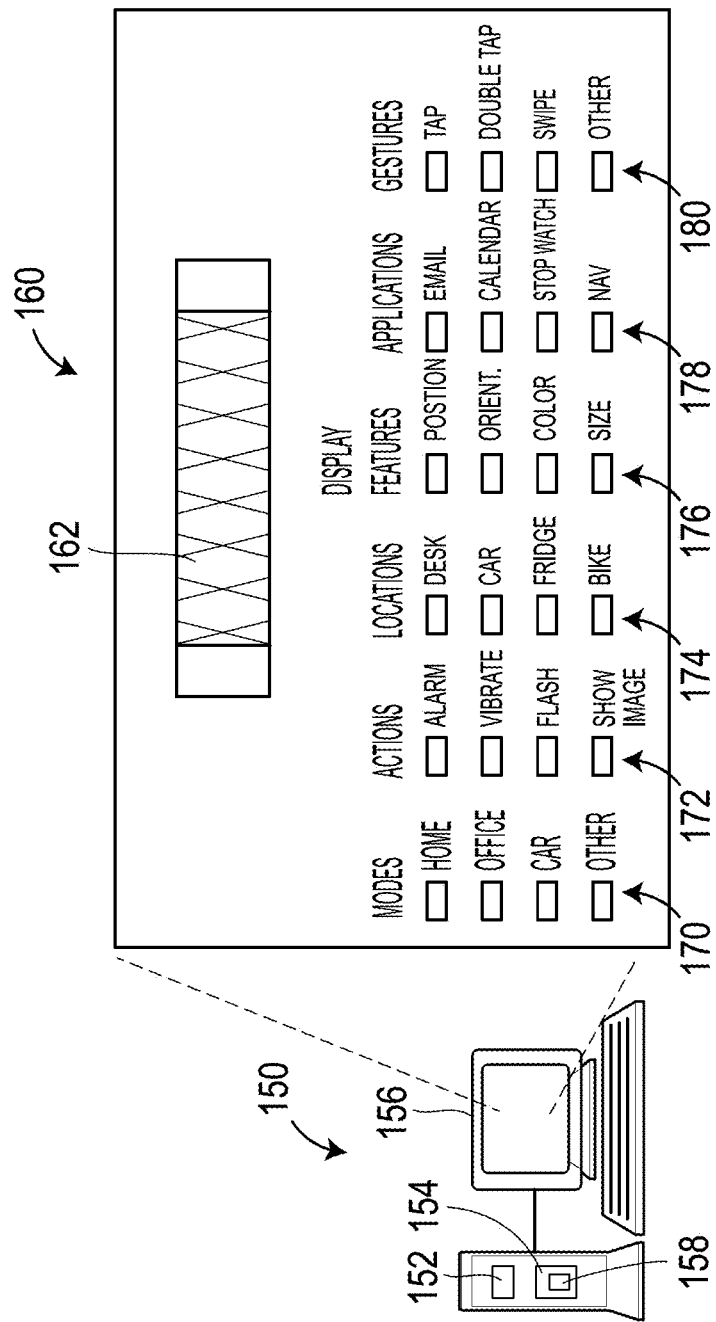
FIG. 77 illustrates an example computer system with a configuration screen that may be used to implement or specify the configuration of a wristband device having a flexible display.

More generally, the user may be able to program or configure the device 10 to operate in any desired manner, including any desired default manner, based on the detected location, position, orientation, or movement of the device 10. In this case, a configuration application may be executed in a processor of a computer device to develop or configure the operation of the device 10, including the various operational modes of the device 10, the various default settings based on the mode of the device 10, the motions or actions or locations that may trigger particular modes of the device 10, inputs or gestures associated with each mode or application of the device 10 and what those inputs or gestures may mean in the context of the device 10, etc. As an example, FIG. 77 illustrates a computer 150 having a processor 152, a memory 154 and a display 156. The memory 154 stores a configuration application 158 that may execute on the processor 152 to enable a user to configure the operation of the device 10. In particular, the configuration application 158, when executed, may produce a configuration screen such as the configuration screen 160 illustrated in FIG. 75. The configuration screen 160 may display an image of the wristband device 162 to illustrate what will be displayed on the display 18 of the device 10 at various times, and the manner in which this information will be displayed, such as the orientation, position on the display 18, etc.

In addition, as illustrated in FIG. 77, the configuration screen 160 may present a number of boxes or drop down menus, etc. which can be used to define various modes or other operational settings of the device 10 and the default operation of the device 10 during each such mode. For example, a user may select one of a set of mode boxes 170 to define the configuration of a particular mode of the device 10. The user may select a sleep mode box, an office mode box, an exercise mode box, a home mode box, a car mode, or may select an "other" box to define a new mode for which the device 10 is to be configured. Upon selecting the appropriate mode box 170, the user may be presented with information or options about the default and other operations of the device 10 during the selected mode. For example, the user may be able to define the actions 172, locations 174, e.g., as defined by the exterior strips 100 (e.g., of FIGS. 73-74) that might be used to enter a particular mode. Thereafter, another set of menus or drop down boxes or windows may be used to enable a user to define the placement, content, orientation, etc. or other display features 176 of information to be displayed on the flexible display 18. Still further, the user may select one or more applications 178 to execute during a particular mode, the placement, size and area of the screen associated with the application display, the orientation of the display on the screen, the background features, borders features or other screen indicia, etc. Likewise, the user may define one or more RFID tag ids or other ids to define exterior locations that are to be associated with or that cause the device 10 to enter or operate in a particular mode. In this manner, the configuration application 158 enables the device 10 to have default functionality based on the functions to be provided, based on the location of the device 10, based on its orientation or position around the wrist or not being connected around the wrist, based on movement of the device 10, etc.

In another case, the configuration screen 160 may enable the user to define one or more gestures 180 associated with a particular mode or a particular application on the device 10. Thus, for example, the user might define a gesture that, when detected on the touch screen interface 26 of the device 10, such as a swipe gesture, a pinch gesture, a double tap gesture, etc. causes the device 10 to operate in a certain manner, such as to switch between modes, to change orientation of the image on the display 18, to cause portions of the displayed information to move or to appear or disappear, or to cause a particular action within an application, such as to pull up new information, etc. Additionally or alternatively, the user might define one or more gestures that are detectable by one or more of the sensors 52, such as a rapid shaking, or such as a magnitude, duration, and/or a number of squeezing forces applied to the outer faces of the device 10 when the device 10 is in a looped configuration. Thus, using the configuration application screen 160, the user may define various different gestures or may preprogram various gestures to define desired device functionality, such as switching between modes, turning on and off the device or applications, switching applications, moving images or content of particular applications on the display 18, taking actions within an application, etc. As a further example, one gesture may be defined by the user to unlock the device 10 or allow operation of the device 10 such as implementing a locking or security feature. In this case, is not necessary that the device 10 display numbers or have the user pick a set of numbers but instead, gestures might enable the user to define an action that will unlock device, such as a swipe in one direction, two taps and a swipe in a particular direction, etc. Of course, the same gesture could be used for different types of operations in different modes of the device 10 or with different applications implemented by the device 10, and any combination of gestures might be used with any combination of applications or modes to enable different functionality or to enable the functionality of the device 10 be programmed in various manners. Once configured as such, the configuration data as selected by the user via the configuration application 158 on the computer 150 can be downloaded to the device 10, either wirelessly or via a wired connection, and stored in the memory 44 thereof and then be used by the operating system of the device 10 to operate.

The following additional considerations apply to the foregoing discussion. As used herein, a groove is any structure that includes a lower surface disposed between two higher surfaces (which may be flat surfaces or ridges, for example), and that is connected to the higher services via straight, sloped or even curved sides. Throughout this specification, plural instances may implement components, operations, or structures described as a single instance. Although individual operations of one or more routines or methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter of the present disclosure.

Additionally, certain embodiments are described herein as including logic or a number of components, modules, or mechanisms or units. Modules and units may constitute either software modules (e.g., code stored on a non-transitory machine-readable medium) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

A hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also include programmable logic or circuitry (e.g., as encompassed within a general-purpose processor or other programmable processor) that is temporarily configured by software to perform certain operations. It will be appreciated that the decision to implement a hardware module in dedicated and permanently configured circuitry or in temporarily configured circuitry (e.g., configured by software) may be driven by cost and time considerations.

Accordingly, the hardware terms used herein should be understood to encompass tangible entities, be that entities that are physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware and software modules can provide information to, and receive information from, other hardware and/or software modules. Accordingly, the described hardware modules may be regarded as being communicatively coupled. Where multiple of such hardware or software modules exist contemporaneously, communications may be achieved through signal transmission (e.g., over appropriate circuits, lines and buses) that connect the hardware or software modules. In embodiments in which multiple hardware modules or software are configured or instantiated at different times, communications between such hardware or software modules may be achieved, for example, through the storage and retrieval of information in memory structures to which the multiple hardware or software modules have access. For example, one hardware or software module may perform an operation and store the output of that operation in a memory device to which it is communicatively coupled. A further hardware or software module may then, at a later time, access the memory device to retrieve and process the stored output. Hardware and software modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, include processor-implemented modules.

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "application," an "algorithm" or a "routine" is a self-consistent sequence of operations or similar processing leading to a desired result. In this context, applications, algorithms, routines and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" is employed to describe elements and components of the embodiments herein. This is done merely for convenience and to give a general sense of the description. This description should be read to include one or at least one and the singular also includes the plural unless it is obvious that it is meant otherwise.

Upon reading this disclosure, those of skill in the art will appreciate still additional alternative structural and functional designs for implementing display features via a flexible electronic display on a dynamically flexible, attachable article as disclosed herein. Thus, while particular embodiments and applications have been illustrated and described herein, it is to be understood that the disclosed embodiments are not limited to the precise construction and components disclosed herein. Various modifications, changes and variations, which will be apparent to those skilled in the art, may be made in the arrangement, operation and details of the methods and structure disclosed herein without departing from the spirit and scope defined in the claims.

The invention claimed is:

1. An article, comprising: a flexible electronic component movable between a substantially flat position and a curved position; and a support structure coupled to the flexible electronic component, the support structure comprising a first substrate and a second substrate movably connected to the first substrate, a plurality of slots being formed in the first substrate and a plurality of projections being formed on the second substrate and movably disposed within a corresponding one of the plurality of slots, the plurality of slots configured to limit bending of the article and configured to limit torsion applied to the article to a range within a torsion tolerance of the flexible electronic component, wherein a bottom side of the first substrate at least partially vertically overlies a top side of the second substrate when the flexible electronic component is in the substantially flat position, wherein the flexible electronic component at least partially vertically overlies both the bottom side of the first substrate and the top side of the second substrate when the flexible electronic component is in the substantially flat position, wherein the first substrate has a first length extending horizontally when the flexible electronic component is in the substantially flat position, wherein the second substrate has a second length extending horizontally along the first length when the flexible electronic component is in the substantially flat position, and wherein the first substrate has a first thickness extending vertically when the flexible electronic component is in the substantially flat position and the second substrate has a second thickness extending vertically when the flexible electronic component is in the substantially flat position, the first thickness being less than the first length and the second thickness being less than the second length.

2. The article of claim 1, wherein the plurality of slots comprises a first subset of slots and a second subset of slots formed across from the first subset, each of the first subset of slots having a different length, and each of the second subset of slots having a different length, and wherein the plurality of projections comprises a first subset of projections and a second subset of projections formed across from the first subset, each of the first subset of projections having a different length, and each of the second subset of projections having a different length, the lengths defined such that the article has a desired shape.

3. The article of claim 1, wherein the plurality of slots are formed proximate to or in a perimeter edge of the first substrate, and wherein the plurality of projections are formed proximate to or in a perimeter edge of the second substrate.

4. The article of claim 1, wherein a portion of the first substrate is locally fixedly attached to a portion of the second substrate at a fixation point.

5. The article of claim 1, wherein each slot defines a first stop surface and a second stop surface opposite the first stop surface, each first stop surface arranged to limit bending of the flexible electronic component when the article is in a first stable position, and each second stop surface arranged to limit bending of the flexible electronic component when the article is in a second stable position.

6. The article of claim 1, wherein the plurality of slots are formed between the bottom side of the first substrate and a top side of the first substrate opposite the bottom side of the first substrate.

7. The article of claim 1, wherein the plurality of projections extend outward, away from the top side of the second substrate.

8. The article of claim 7, wherein the plurality of slots are formed between the bottom side of the first substrate and a top side of the first substrate opposite the bottom side of the first substrate.

9. The article of claim 1, wherein the bottom side of the first substrate substantially overlies the top side of the second substrate when the flexible electronic component is in the substantially flat position.

10. An article, comprising: a flexible electronic component movable between a substantially flat position and a curved position; and a support structure coupled to the flexible electronic component, the support structure comprising a first substrate and a second substrate movably connected to the first substrate, a plurality of slots being formed in the first substrate and a plurality of projections being formed on the second substrate and movably disposed within a corresponding one of the plurality of slots, the plurality of slots configured to limit bending of the article and configured to limit torsion applied to the article to a range within a torsion tolerance of the flexible electronic component, wherein a bottom side of the first substrate at least partially vertically overlies a top side of the second substrate when the flexible electronic component is in the substantially flat position, wherein the flexible electronic component at least partially vertically overlies both the bottom side of the first substrate and the top side of the second substrate when the flexible electronic component is in the substantially flat position, wherein when the flexible electronic component is in the substantially flat position, the flexible electronic component is substantially parallel to both the first substrate and the second substrate, wherein the first substrate has a first length extending horizontally when the flexible electronic component is in the substantially flat position, wherein the second substrate has a second length extending horizontally along the first length when the flexible electronic component is in the substantially flat position, and wherein the first substrate has a first thickness extending vertically when the flexible electronic component is in the substantially flat position and the second substrate has a second thickness extending vertically when the flexible electronic component is in the substantially flat position, the first thickness being less than the first length and the second thickness being less than the second length.

11. The article of claim 10, wherein the plurality of slots comprises a first subset of slots and a second subset of slots formed across from the first subset, each of the first subset of slots having a different length, and each of the second subset of slots having a different length, and wherein the plurality of projections comprises a first subset of projections and a second subset of projections formed across from the first subset, each of the first subset of projections having a different length, and each of the second subset of projections having a different length, the lengths defined such that the article has a desired shape.

12. The article of claim 10, wherein the plurality of slots are formed proximate to or in a perimeter edge of the first substrate, and wherein the plurality of projections are formed proximate to or in a perimeter edge of the second substrate.

13. The article of claim 10, wherein a portion of the first substrate is locally fixedly attached to a portion of the second substrate at a fixation point.

14. The article of claim 10, wherein each slot defines a first stop surface and a second stop surface opposite the first stop surface, each first stop surface arranged to limit bending of the flexible electronic component when the article is in a first stable position, and each second stop surface arranged to limit bending of the flexible electronic component when the article is in a second stable position.

15. The article of claim 10, wherein the plurality of projections extend outward, away from the top side of the second substrate.

16. The article of claim 15, wherein the plurality of slots are formed between the bottom side of the first substrate and a top side of the first substrate opposite the bottom side of the first substrate.

17. The article of claim 10, wherein the bottom side of the first substrate substantially overlies the top side of the second substrate.

18. An article, comprising:
a flexible display movable between a substantially flat position and a curved position; and
a support structure coupled to the flexible display, the support structure comprising a first substrate and a second substrate movably connected to the first substrate, a plurality of slots being formed in the first substrate and a plurality of projections being formed on the second substrate and movably disposed within a corresponding one of the plurality of slots, the plurality of slots configured to limit bending of the article and configured to limit torsion applied to the article to a range within a torsion tolerance of the flexible display,
wherein a bottom side of the first substrate at least partially vertically overlies a top side of the second substrate when the flexible display is in the substantially flat position,
wherein the flexible display at least partially vertically overlies both the bottom side of the first substrate and the top side of the second substrate when the flexible display is in the substantially flat position,
wherein when the flexible display is in the substantially flat position, the flexible display is substantially parallel to both the first substrate and the second substrate,
wherein the first substrate has a first length extending horizontally when the flexible display is in the substantially flat position, and wherein the second substrate has a second length extending horizontally when the flexible display is in the substantially flat position,
wherein the first substrate has a first thickness extending vertically when the flexible display is in the substantially flat position and the second substrate has a second thickness extending vertically when the flexible display is in the substantially flat position, the first thickness being less than the first length and the second thickness being less than the second length, and
wherein the first substrate has a first length and the second substrate has a second length that is substantially equal to the first length.

* * * * *